United States Patent [19]

Kibrick et al.

[11] Patent Number: 4,736,187

[45] Date of Patent: Apr. 5, 1988

[54] ENCODER FOR MEASURING BOTH INCREMENTAL AND ABSOLUTE POSITIONS OF MOVING ELEMENTS

[75] Inventors: Robert I. Kibrick, Santa Cruz; Calvin R. Delaney, Aptos, both of Calif.

[73] Assignee: The Regents of The University of California, Berkeley, Calif.

[21] Appl. No.: 938,164

[22] Filed: Dec. 4, 1986

[51] Int. Cl.⁴ .................. H03M 1/22; H03M 1/30
[52] U.S. Cl. .................. 340/347 P; 250/231 SE; 250/237 G
[58] Field of Search .............. 340/347 P; 250/231 SE, 250/237 G

[56] References Cited

U.S. PATENT DOCUMENTS

| | | | |
|---|---|---|---|
| 3,531,798 | 9/1970 | Dureau | 340/347 P |
| 3,702,471 | 11/1972 | Kennedy | 340/347 P |
| 3,982,106 | 9/1976 | Stutz | 250/237 G |
| 4,628,298 | 12/1986 | Hafle | 340/347 P |
| 4,633,224 | 12/1986 | Gipp | 250/231 SE |

Primary Examiner—Charles D. Miller

Attorney, Agent, or Firm—Owen, Wickersham & Erickson

[57] ABSTRACT

An optical encoding system for determining the absolute and the incremental positions of a movable member relative to a stationary member. For example, three stationary light sources may be supported by the stationary member for emitting three narrow light beams on respective paths. An encoding band may be supported by the movable member in the paths of the light beams. The band has a timing and incremental encoding track comprising at least one series of alternating light-blocking stripes and light-passing stripes, and a data track comprising a series of absolute position tags alternating with spacers, each tag being framed by start bits. A read head may be supported by the stationary member and has three optical sensors, one for each light beam, two preferably in quadrature with each other for the timing and incremental encoding track, and one for the data track. Each optical sensor includes light sensors for generating an analog signal voltage. A decoding system actuated by these analog signal voltages determines the incremental and absolute position of the movable member relative to the stationary member.

69 Claims, 16 Drawing Sheets

180 INCREMENTAL LINES/REVOLUTION -- INCREMENTAL RESOLUTION = 2 DEGREES
9 ABSOLUTE TAGS/REVOLUTION -- ABSOLUTE RESOLUTION = 40 DEGREES

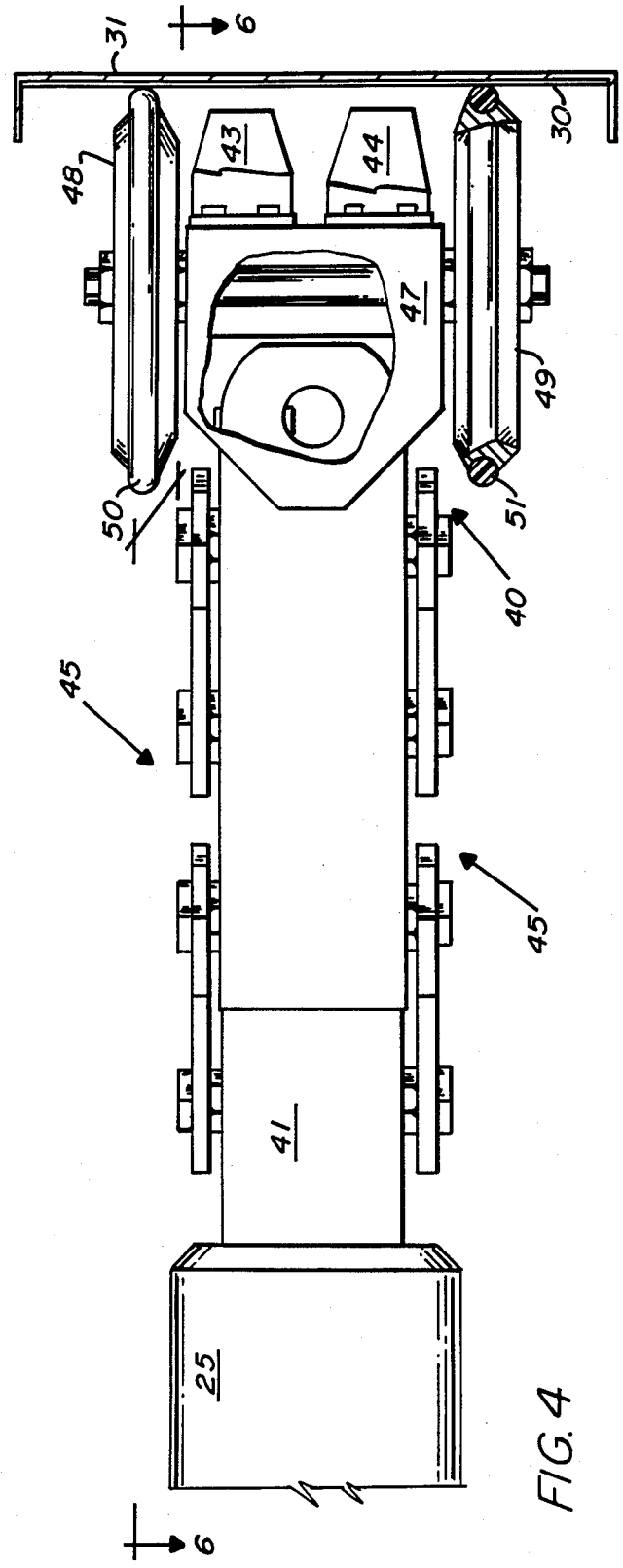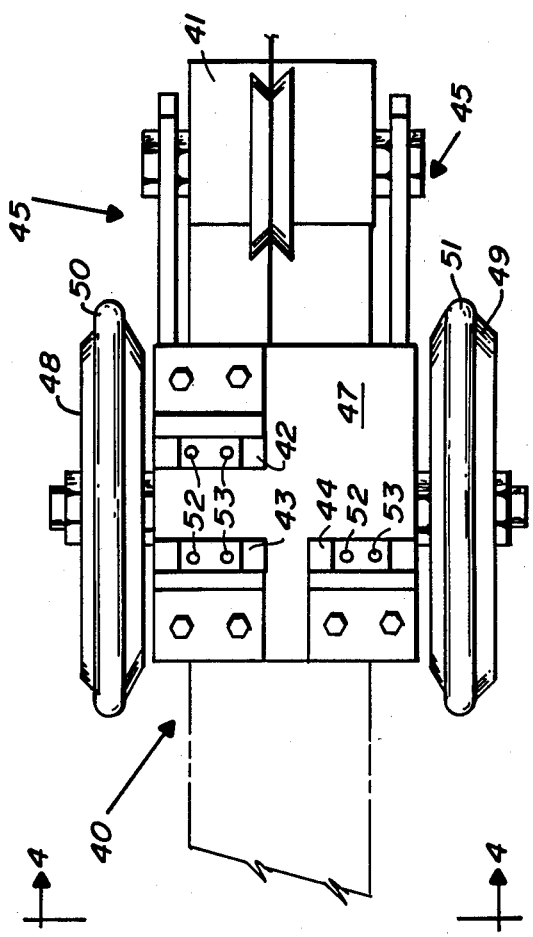

180 INCREMENTAL LINES/REVOLUTION -- INCREMENTAL RESOLUTION = 2 DEGREES
9 ABSOLUTE TAGS/REVOLUTION -- ABSOLUTE RESOLUTION = 40 DEGREES

180 INCREMENTAL LINES/REVOLUTION -- INCREMENTAL RESOLUTION = 2 DEGREES
9 ABSOLUTE TAGS/REVOLUTION -- ABSOLUTE RESOLUTION = 40 DEGREES

PHASE COMPARATOR OPERATING FREQUENCY = 1X LINE SPATIAL FREQUENCY

360 LINES (360 COUNTS/REV.) -- INCREMENTAL RESOLUTION = 1 DEGREE
18 ABSOLUTE TAGS/REVOLUTION -- ABSOLUTE RESOLUTION = 20 DEGREES

PHASE COMPARATOR OPERATING FREQUENCY = 2X LINE SPATIAL FREQUENCY

360 LINES (720 COUNTS/REV.) -- INCREMENTAL RESOLUTION = 0.5 DEGREES
36 ABSOLUTE TAGS/REVOLUTION -- ABSOLUTE RESOLUTION = 10 DEGREES

PHASE COMPARATOR OPERATING FREQUENCY = 4X LINE SPATIAL FREQUENCY

360 LINES (1440 COUNTS/REV.) -- INCREMENTAL RESOLUTION = 0.25 DEGREES
72 ABSOLUTE TAGS/REVOLUTION -- ABSOLUTE RESOLUTION = 5 DEGREES

ENCODER FOR MEASURING BOTH INCREMENTAL AND ABSOLUTE POSITIONS OF MOVING ELEMENTS

This invention relates to an encoder for measuring both the incremental and absolute positions of moving elements, including rotating members.

The encoder of this invention is especially suitable for measuring the azimuthal position of telescope domes. It provides an inexpensive and highly reliable dome-position encoder which has few moving parts and which eliminates the need for a mechanical engagement to the telescope dome. It may also be used to measure accurately the angular or linear position of not only comparably sized moving or rotating objects, such as hangar doors, conveyor belts, and elevators, but also may be used as part of a standard rotary or linear encoder.

Since telescope domes provide an excellent example of how the invention may be used, the application of the invention to such apparatus will be used as the prime demonstrative example in this application, but without limiting the invention to the prime example.

BACKGROUND OF THE INVENTION

A number of techniques have been used to measure the position of large rotating objects such as telescope domes. The most common approach has been a mechanical coupling between a commercial rotary position encoder and the moving surface. Thus, telescope dome position has traditionally been encoded by mechanically coupling a rotary encoder to the edge of the dome.

For example, a pinch roller has been pressed against an inner circumference of the dome, to rotate as the dome revolved. However, if this pinch roller slipped, large errors in position measurement resulted. An alternative approach to the problem has been to attach a chain to the inner circumference of the dome, the chain then driving a sprocket. In either case, the rotating axle of the pinch roller or the sprocket has been used to turn the shaft of a rotary position encoder.

Both incremental and absolute position encoders have been used. When an absolute position encoder was used, a custom-made gear reduction was usually required, so that one rotation of the dome would produce one rotation of the absolute position encoder. Such a custom gear reduction often proved to be more expensive than the absolute position encoder itself. It also tended to introduce errors in position measurement, due to mechanical backlash, and to inexact gearing. When the gear reduction was not exact, the encoder incurred a small incremental error on each rotation; then when the dome was rotated repeatedly in the same direction, this error would accumulate and grow unacceptably large.

While these mechanical couplings sometimes worked well for many years, they could become and eventually became unreliable, especially after decades of mechanical wear. Older domes that shook, wobbled, and nutated as they revolved caused these parts to wear out even faster. For example, the 100-year-old dome on the 1-meter Nickel Telescope and the 30-year-old dome on the 3-meter Shane Telescope, both at Lick Observatory, have suffered from unreliable dome pointing, caused by worn mechanical couplings between the position encoder and the dome.

If an incremental position encoder is used, then some other mechanism is required to establish an initial absolute position. This has often been accomplished by a switch which was tripped whenever the dome was rotated to an index or reference position. However, for a large dome, it can take a considerable period of time to rotate the dome to its initializing position.

In either case, while one can easily obtain commercial position encoders (either absolute or incremental) that are by themselves relatively accurate, reliable, and inexpensive, the accuracy, reliability, and economy of the position measurement that is ultimately achieved is often compromised by the inaccuracy, unreliability, and expense of the mechanical coupling between the encoder and the dome.

Even if an inexpensive and reliable mechanical coupling could be found, currently available rotary encoders do not provide redundancy and are not self-diagnosing. They can and do malfunction, and there is often considerable delay in determining that a malfunction has occurred. In the meantime, valuable observing time is lost when the dome does not point in the proper direction.

Other techniques have been employed, such as having a series of separate switches spaced at regular intervals around the circumference of the stationary part of the dome building; the separate switches were then tripped by a single detent on the moving part of the dome. This method required a tremendous number of switches and wires, and so it was quite costly and complex to maintain. To provide angular resolution comparable to that provided by the present invention, even on an average size dome, would require several thousand separate switches. Clearly, this technique does not offer the requisite economy, accuracy, and reliability.

One object of the invention is to solve these problems and prevent their recurrence.

Because of these problems, various schemes of optical encoding have been tried or considered. All of these schemes involved placing one or more bands of stripes or codes around an inner surface of the rotating portion of the dome. These codes would be sensed by one or more optical sensors attached to the fixed portion of the dome. One such scheme, that of Calvin Delaney in 1979, was a single-track incremental encoder. A similar scheme was used in 1971 for an incremental encoder on the dome of the 40-cm photometric telescope of the Observatoire de Haute Provence, France. Other optical-based schemes that were considered would have used a wider coded band to make a multi-track Gray-code absolute encoder. However, none of these went into general use because of their excessive electronic and mechanical complexity and their susceptibility to skewing errors.

One proposed idea for solving these problems was to use inexpensive commercial fixed-beam bar-code readers to encode the absolute dome position. The idea was to place bar-code symbols around the inside of the rotating part of the dome, with the absolute position at each point encoded in the corresponding bar-code symbol. As the dome rotated, the bar-code symbols would be drawn past a fixed-beam bar-code reader, which would decode them and provide the absolute position of the dome.

Unfortunately, standard bar-code symbols cannot be scanned this way. Although such symbols can be scanned at many different speeds and from either direction, the speed and direction during any single scan must remain reasonably constant. Since the dome speed or direction can change at any time, the normal motions of the dome cannot be used reliably to scan standard bar-code symbols.

Another object of the present invention is to overcome the problems that are inherent in prior-art optical encoders.

A further object is to provide accurate position encoding for both incremental and absolute indications.

Another problem is presented by the fact that many domes are out-of-round. For example, each of the domes at both the 1-meter and 3-meter Lick Observatory telescopes is out-of-round by more than one inch, and this eccentricity exceeds the depth of focus of most inexpensive optical sensors. Further, besides being out-of-round, the encoder track surface at the dome of the 1-meter telescope at Lick Observatory exhibits considerable vertical warping.

An object of this invention is to overcome the problems presented by out-of-round domes and by vertical warping.

A further object is to provide an encoder system having self-diagnosis capabilities, and a related object is to provide such a system with automatic detection of errors.

Other objects and advantages of the invention will appear from the following description.

SUMMARY OF THE INVENTION

The present invention provides both incremental and absolute position encoding. As related to telescope domes it uses the dome itself as a major component of the encoder. In the preferred form of the invention, the encoding is done optically. A band (or series of bands) of reflective material imprinted with a coded pattern of stripes is attached to an inner surface of the rotating portion of the dome. This pattern is made up of two separate tracks: a timing track, which is used in encoding incremental positions, and a data track, which is used to encode the absolute position. The timing track, adjacent to the data track makes the code on the data track self-clocking. Similar effects can be obtained by using electrically conductive bands and brush contacts.

As the dome rotates, these two tracks move past a read head attached either to a stationary part of the telescope housed inside the building or to a stationary part of the building itself. The read head contains three optical sensors that detect changes in reflectivity as the stripes move past the sensors. Two of the three optical sensors scan the timing track, and the horizontal spacing between them is adjusted so that the signals they produce are in quadrature. By comparing the phase relationship between the signals from these two sensors, the direction of dome motion is determined. The amount of motion is given by counting the number of signal transitions, as in most commercial incremental encoders.

As an alternative, the two tracks may be on the stationary member and the read head supported on the movable member.

Each sensor preferably pairs a light-emitting diode with a phototransistor. The light-emitting diode (LED) emits a small infrared beam that, in one form of the invention, is either reflected or absorbed by the light or dark marks on the coded band. The phototransistor measures the reflected light and generates an analog voltage proportional to the intensity of the reflected beam. In another form of the invention, the light is passed through transparent portions of the band or is barred by opaque portions. Thus, in general the optical encoder of this invention uses bands with light-blocking stripes or light-passing stripes.

The resulting analog signals may be used directly with some types of computers but generally are converted to digital TTL levels by a separate operational amplifier and a Schmitt trigger for each phototransistor output. These three TTL levels are fed to separate input lines on an input/output port of a microcomputer, which then computes the dome position from these inputs.

Although it is preferable (for economy and flexibility) to use a microcomputer to process the sensor-derived TTL levels, these functions can also be performed by using conventional digital logic circuits. To simplify the description of these functions, they are described in terms of digital logic circuits, although, preferably, these functions are actually performed by the microcomputer.

In this instance, the TTL levels generated from the two timing track sensors are fed into the computer at a portion programmed to function as a phase comparator; the phase comparator outputs a direction level signal and a clock pulse corresponding to each incremental tick of motion. The computer is so programmed that these outputs control an "up/down counter" function, which measures the incremental position. The computer is also programmed so that the direction level signal and clock pulse control two "shift register" functions that process the signals from the data track. The "up/down counter", "shift registers", and some other registers may be located in the microcomputer's RAM. The logic for the phase comparator and for the clocking and gating of the various registers is implemented in software.

The third optical sensor scans the data track, which consists of discrete absolute-position tags separated by spacers, which may appear as areas of blank space. Each tag is encoded as a serial bit stream, and framed by start bits on either side. Each tag is decoded by the software into a corresponding absolute position. Preferably, the tags may be used as indices to access a look-up table of absolute positions, which is in the microcomputer's memory.

As stated before, the invention is applicable generally to both rotary and linear encoders. The light beam may be reflected, as described above, or the light source and detector may be on the opposite sides of the timing and data tracks, and the reflective portions are then replaced by transparent portions. There are still light-blocking portions (dark or opaque or non-reflective) and light-passing portions (transparent or reflective). The tracks, instead of being on a cylindrical surface, may be on a flat disk for a rotary encoder. For a linear encoder, they will be on a flat surface, whether reflective or transparent. Instead of a single timing track with the light sources and sensors spaced to be in quadrature, it may be better in some circumstances to use two timing tracks themselves spaced or coordinated with the light system to be in quadrature.

BRIEF DESCRIPTION OF THE DRAWINGS

FIG. 4 is a view in side elevation, partly in section, of the read head and its mounting and a portion of the timing and data tracks.

FIG. 5 is a view in front elevation of the read head and its mounting.

FIG. 22 is another similar view with a data track for use with a phase comparator operated at 4× the frequency used for the disk of FIG. 20.

DESCRIPTION OF THE PREFERRED EMBODIMENT

Figure 1:
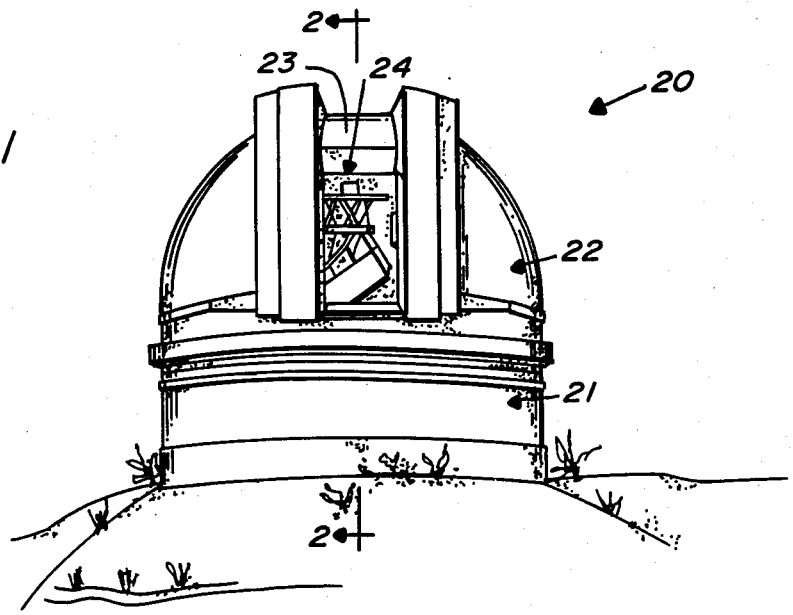
FIG. 1 is a view in elevation of the exterior of an observatory telescope dome building, showing the window or gap in the dome.
Figure 2:
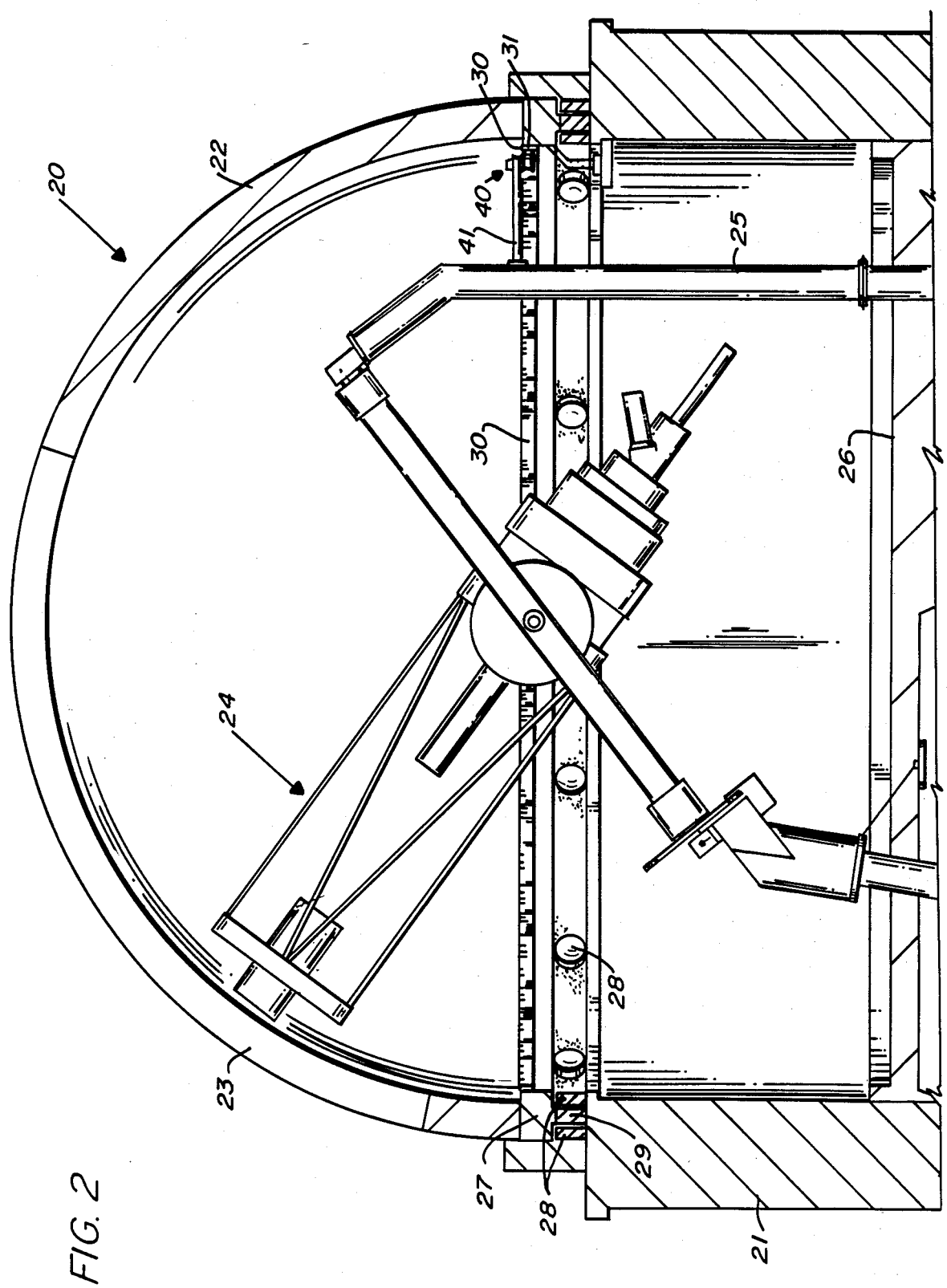
FIG. 2 is a view in elevation and in vertical section taken along the line 2—2 in FIG. 1.
Figure 6:
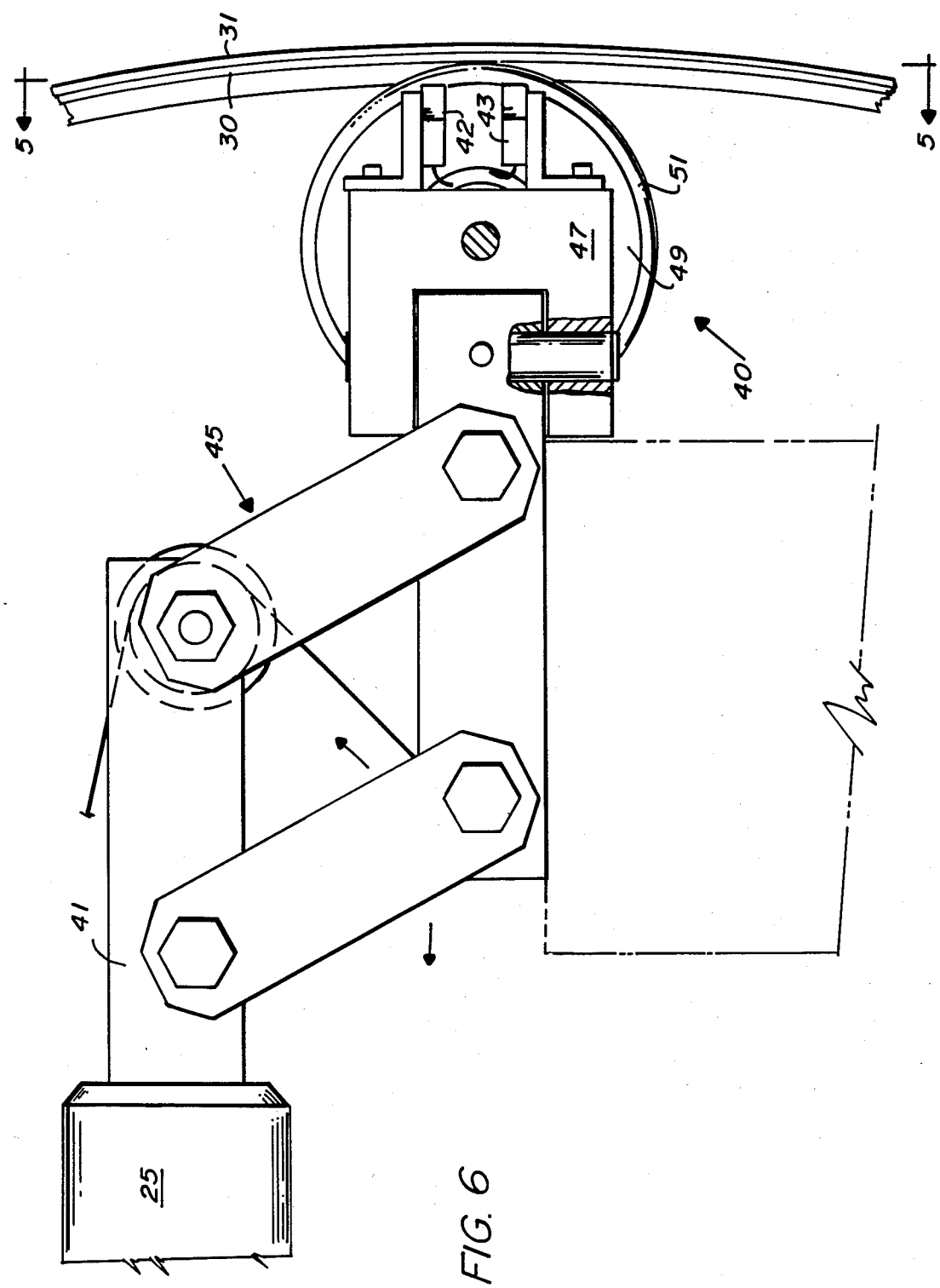
FIG. 6 is a top plan view of the read head and its mounting and a portion of the timing and data tracks.

The dome 22 (FIGS. 1 and 2)

To exemplify the invention, FIG. 1 shows a telescope dome building 20 comprising a stationary cylindrical structure 21 with a rotatable dome 22 having a window, slit, or gap 23 with which a telescope 24 is aligned, the remainder of the dome 22 excluding unwanted stray light and affording shelter. Inside the building 20, as shown in FIG. 2, is the telescope 24 rotatably and pivotally mounted on an upright member 25 that is stationary and is affixed to a floor or foundation 26.

Inside the building 20 is the telescope 24, which moves independently of the rotatable dome. It is very important that they both can be properly aligned so that the telescope 24 can look through the dome slit 23. The basic purpose of the encoder of this invention is to know the absolute position of the slit or window 23 at all times, so that the independent motion of the dome 22 can be coordinated with that of the telescope 24. Since the dome 22 and the telescope 24 may move within different coordinate reference frames, coordinated motion usually requires that they be driven at different rates of speed.

As shown in FIG. 2, the dome 22 has a lower circular edge 27 mounted on rollers 28 that ride on a circular track 29 at the upper edge of the stationary cylindrical structure 21.

Figure 3:
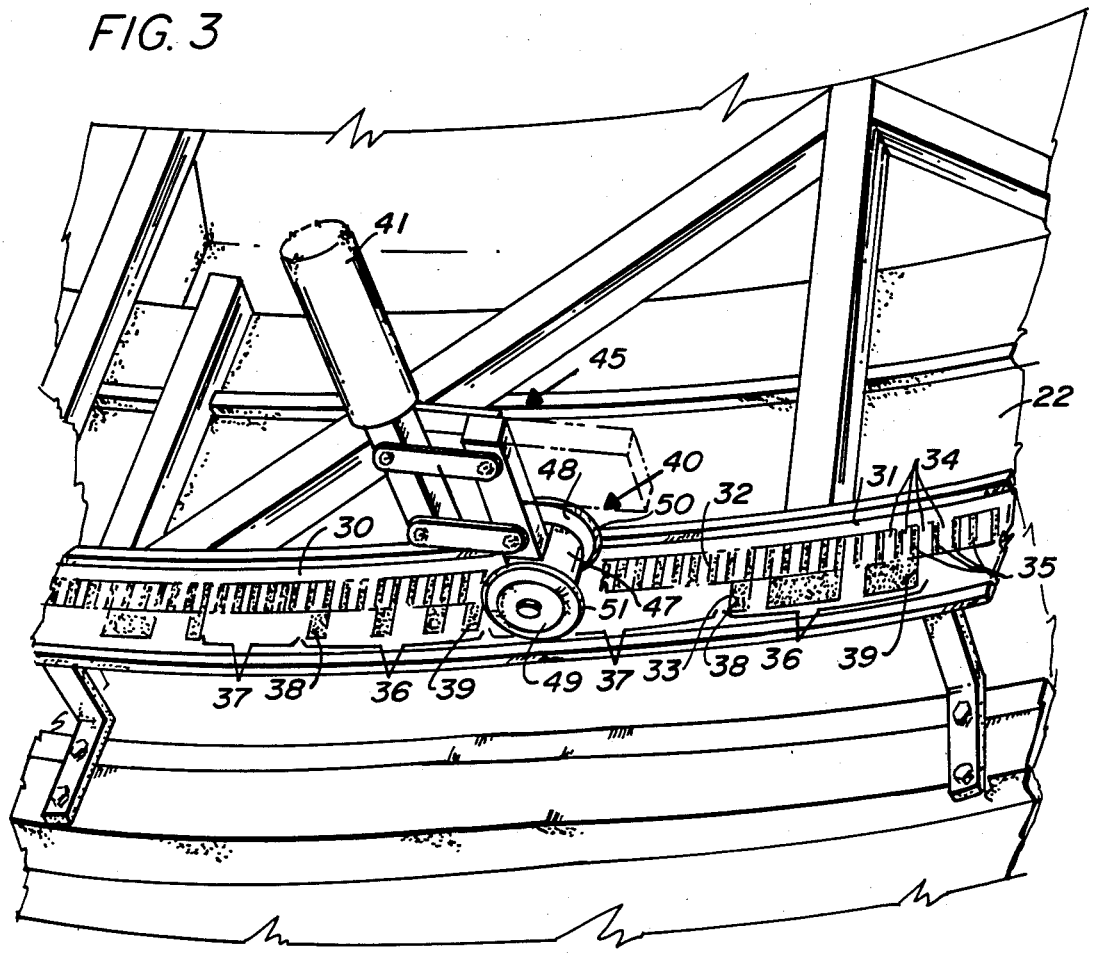
FIG. 3 is an enlarged fragmentary view in perspective of a portion of the dome building, showing portions of the data and timing tracks and a portion of the read head.

The encoder tracks 32 and 33 (FIG. 3)

As shown in FIGS. 2 and 3, the dome 22 itself is a major component of the encoder of this invention. A band 30 imprinted with a coded pattern of stripes is attached to a generally cylindrical inner surface portion 31 of the rotating dome 22. This pattern is made up of two separate tracks: a timing track 32, which is used for encoding incremental positions, and a data track 33, which is used to encode the absolute position.

The timing track 32 may be a continuous, dome-encircling series of identical light-reflecting rectangles 34 alternating with identical, non-reflecting dark rectangles 35, preferably identical in size to the rectangles 34. The rectangles 34 and 35 are narrow stripes that may be numbered adjacent to one edge of each dark stripe 35. They may be about 5 mm. wide and 25 mm high. The stripes 34 may be made of highly reflective metal foil.

The data track 33 is adjacent to the timing track 32. The light-reflecting rectangles 34 and non-reflecting dark rectangles 35 on the timing track 32 define a corresponding series of bit positions on the data track 33. The width of each bit on the data track 33 equals the spatial width of each incremental tick on the timing track, which is in turn determined by the operation of a phase comparator 71 shown in FIG. 9 and discussed in a later section of this description.

A reflective (or light-passing) data bit on the data track 33 is treated as a "one", while a non-reflective (or light-blocking) data bit is treated as a "zero". This convention of light-passing meaning "one" and light-blocking meaning "zero" is arbitrary, and can be reversed should that prove convenient.

The data track 33 is divided into a series of distinct absolute-position tags 36. Each tag is composed of a fixed number of consecutive data bits. The tags 36 are separated by spacers 37, each composed of a minimum number of consecutive data bits. The number of bits in the tags 36 need not be the same as the number of bits in the spacers 37, although they may be the same. These numbers are a function of the size and resolution of a given encoder.

Each tag 36 is composed of a unique bit sequence that distinguishes it from all other tags 36 and spacers 37. Each tag 36 is also surrounded on either side by start bits 38 or 39 which are used to insure a transition (i.e., "one" to "zero" or "zero" to "one") at the boundary between the tag 36 and its neighboring spacers 37.

Each spacer 37 is composed of an identical bit sequence so that all the spacers look alike. The specific bit sequence used for the spacers 37 must not be contained within (i.e., embedded in) the bit sequence of any of the tags 36. Preferably, the spacer bit sequence may be specified as a sequence of consecutive "one" bits so that each spacer will appear as a solid area of blank (i.e., reflective or light-passing) space in between each tag 36 on the data track 33. In this case, any bit sequence containing at least as many consecutive "one" bits as contained in the spacer bit sequence cannot be used as a tag 36. For example, if the spacer bit sequence consists of the sequence "111111" then any bit sequence containing six or more consecutive "one" bits (such as the sequence "01011111110010"), cannot be used as a tag 36.

This arrangement of tags 36, start bits 38 and 39, and spacers 37 simplifies detection of the tags 36 from either direction and insures that it is always possible to recognize when a spacer 37 has become properly aligned (or framed) within the shift registers described below. Once a spacer 37 is properly framed, the adjacent tag 36 must be framed as well, and this allows the data on the data track 33 to be self-synchronizing.

The absolute position tags 36 are not a direct binary encoding of absolute position of the encoder band 30, but are instead codes which are translated or decoded into corresponding absolute positions. This may be accomplished in a number of ways, but preferably the tags 36 may be used as indices to access a look-up table (or equivalent computer memory) of absolute positions. This coding scheme is used because certain bit sequences (i.e., those which have the spacer 37 bit pattern embedded within them) cannot be used as tags 36, and because it reduces the number of data bits needed to represent each position.

The band 30 may be comprised of clear mylar strips upon which the patterns for the timing track 32 and data track 33 are printed, as by a device such as a laser printer, and to which a layer of aluminized mylar tape is applied, against the printed side of the strips, using a clear adhesive. The taped side of the band 30 may be secured to the surface 31 by a suitable adhesive. The printed patterns, which may consist of laser printer toner particles, of the two tracks 32 and 33 are then visible through the clear, non-printed side of the mylar strips and are physically protected since they are sandwiched between these strips and the aluminized mylar tape, which provides a reflective underlayer.

In this case, the light-reflecting rectangles 34, the spacers 37, and the "one" bits within each tag 36, appear as reflective areas of aluminized mylar tape viewed through the clear mylar strip. The non-reflecting rectangles 35, the start bits 38 and 39, and the "zero" bits within each tag 36 appear as non-reflecting areas of opaque laser printer toner particles (which hide the reflective aluminized mylar tape underlayer) viewed through the clear mylar strip.

The read head 40 (FIGS. 3-6)

As the dome 22 rotates, these two tracks 32 and 33 move past a read head 40 at one end of a stationary column 41 mounted either on the stationary telescope support 25 (see FIGS. 4 and 6) or (as shown in FIGS. 11 to 16) on a stationary part of the dome 107. The read head 40 contains three optical sensors 42, 43, and 44 (FIG. 5) that detect changes in reflectivity as the stripes 34 and 35 and tags 36 move past the sensors. If desired, the read head 40 may be mounted on the rotatable dome 22, and the tracks 32 and 33 may be supported by a stationary portion of the building 20.

Theoretically, the read head 40 could be mounted rigidly on the column 41, and if the dome 22 is perfectly round it may be. In fact, the read head 40 can be mounted rigidly with respect to radial motion so long as the out-of-roundness of the dome surface 31 is significantly less than the depth of focus of the optical sensors 42, 43, and 44 that are used. For example, if sensors 42, 43, and 44 with a depth of focus of 0.75 inch were to be used (these are available but at much greater expense than the sensors currently recommended) then the dome's cylindrical surface 31 could be out-of-round by as much as 0.5 inch, (i.e., ±0.25 inch).

However, affordable off-the-shelf sensors do not have sufficient depth of focus (i.e., greater than 1 inch) to enable the use of badly out-of-round domes. Also, while a rigid mount would simplify installation, it might prove less forgiving of earthquakes, which are quite common at some observatories. Unfortunately, many domes 22 are out-of-round. For example, each of the domes at both the 1-meter and 3-meter Lick Observatory telescopes is out-of-round by more than one inch, and this eccentricity exceeds the depth of focus of the optical sensors 42, 43, and 44. As a result, the read head 40 is mounted to move radially, so as to keep the optical sensors 42, 43, and 44 focused on the encoder timing and data tracks 32 and 33.

This is accomplished by a spring-loaded parallelogram linkage 45 between the read head 40 and the column 41. This linkage 45 introduces a small (less than ⅛ incremental tick of motion) uncertainty in the azimuthal position of the read head 40. This, however, is tolerable. A piston (keyed to prevent rotation of the concentric cylinders) may be used instead, but would require more complicated machining.

The proper spacing of the parallelogram linkage 45 relative to the encoder track surface 31 may be provided by two wheels 48 and 49 which are preferably connected to a block 47 in the middle of the parallelogram linkage 45 and which roll along the encoder track surface 31. Neoprene O-rings may be used as tires 50 and 51 on these wheels 48 and 49 because of neoprene's exceptional resistance to ozone. (At altitudes above 4,000 feet, the ozone concentration is sufficient to degrade normal buna-N O-rings.) The traction provided by these tires 50 and 51 is unimportant, for even if they slip, the functioning of the encoder is not affected.

Besides being out-of-round, the encoder track surface 31 at the dome 22 of the 1-meter telescope at Lick Observatory exhibits considerable vertical warping. To correct for such a problem, the optical sensors 42, 43, and 44 are preferably mounted on the block 47 in the center of the parallelogram linkage 45, and the block 47 pivots vertically. The two wheels 48 and 49 which roll along the encoder track surface 31 are preferably connected to this block 47. The wheels 48 and 49 and the tires 50 and 51, which provide for the proper spacing of the parallelogram linkage 45, also provide for the proper alignment of the vertically pivoting block 47. Were the encoder track surface 31 not warped, the block 47 would not need to pivot.

The wheels 48 and 49, their tires 50 and 51, the pivoting block 47, and the parallelogram linkage 45 are the only moving parts in the read head assembly 40, and none of these require machining to any precise tolerance. Even if the more traditional approach of coupling a rotary encoder to the dome were used, a similar assembly would be required to keep the mechanical pick-off for that encoder in contact with an out-of-round or vertically warped dome. Thus, the cost of this assembly should not be viewed as an *added* cost of using the encoder of this invention.

Figure 7:
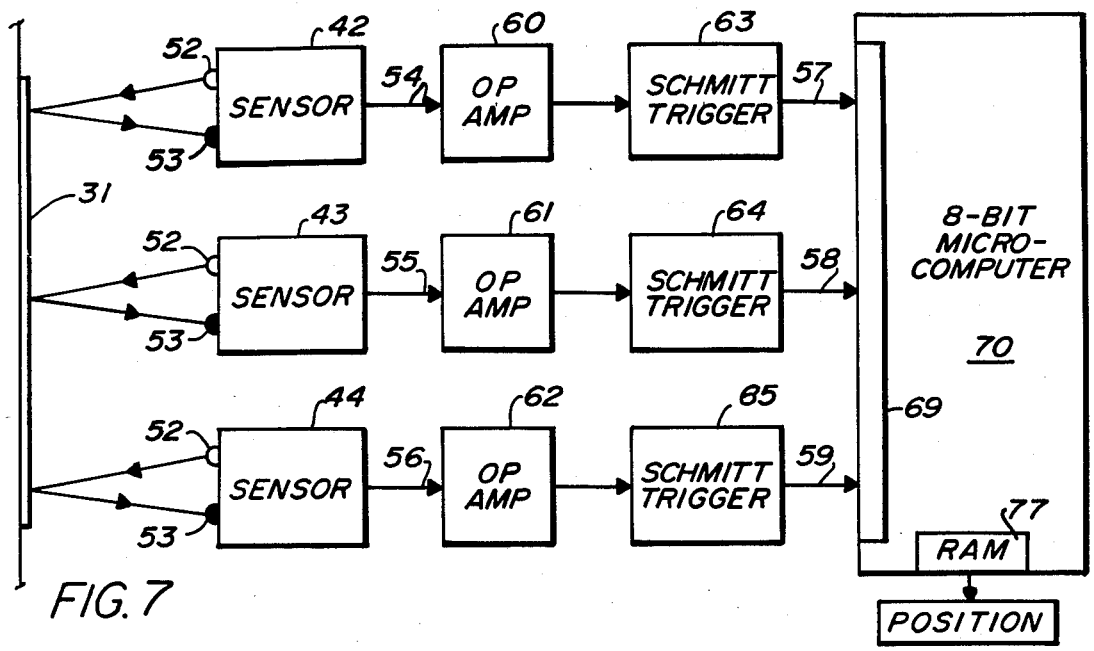
FIG. 7 is a block diagram of the encoder system.
Figure 8:
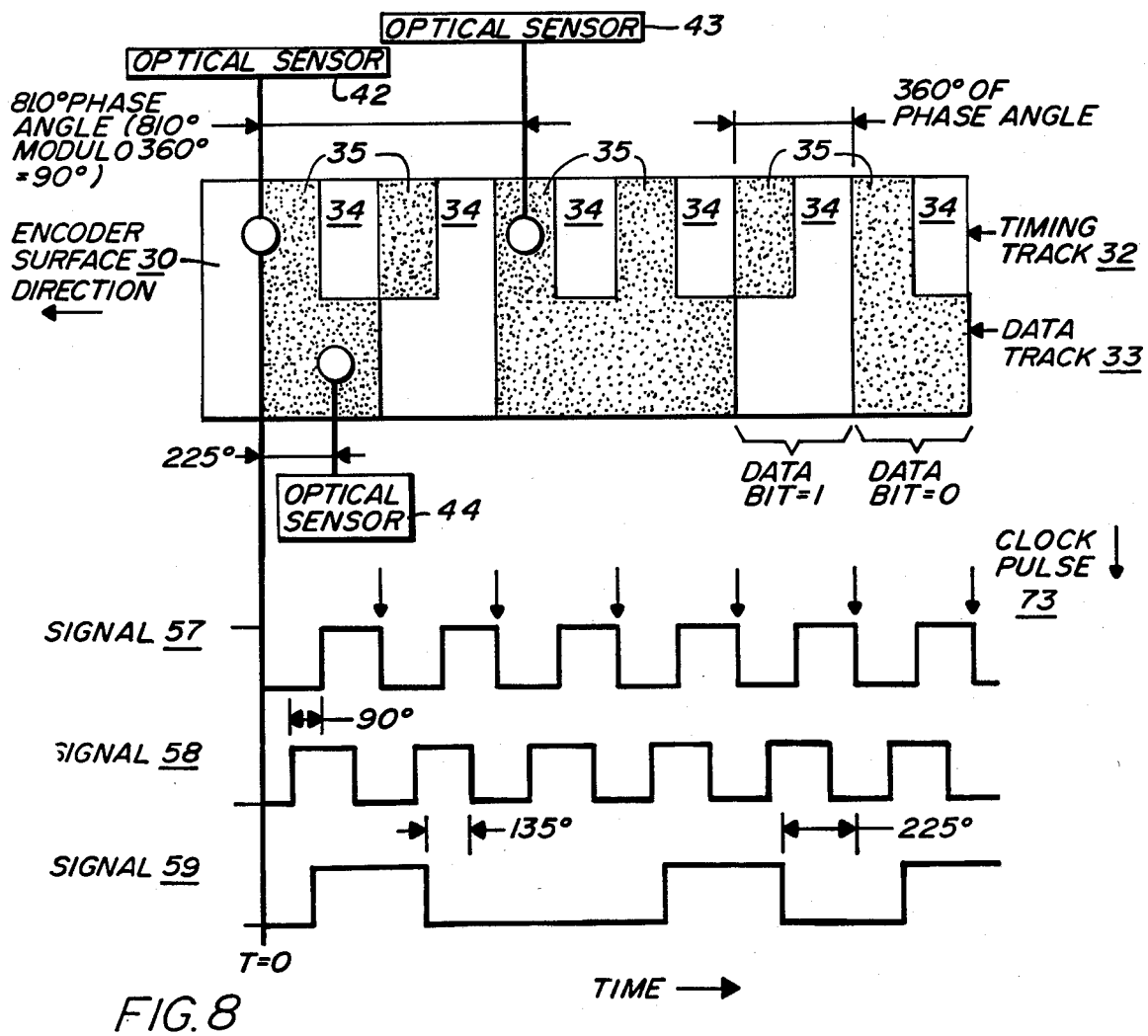
FIG. 8 is a diagrammatic view of a portion of the timing and data tracks showing how quadrature of the timing track may be achieved by the sensors and its relation to the data track and its sensor.

The Optical Sensors 42, 43, and 44 and Their Generated Analog Voltages (FIGS. 7 and 8)

The three optical sensors 42, 43, and 44 of the encoder read head 40 are used to scan the timing and data tracks 32 and 33. The sensors 42 and 43 are accurately spaced to develop their signals in quadrature although they respond to a single timing track 32. Each sensor 42, 43, and 44 pairs a light-emitting diode 52 (as a light source) with a phototransistor 53. The light-emitting diodes 52 for the sensors 42 and 43 may each emit a narrow, low-intensity infrared beam that is either reflected by a light reflecting stripe 34 or absorbed by a non-reflecting stripe 35 on the timing track 32 of the coded band 30, and reflection or nonreflection is sensed by its phototransistor 53. Similarly, the light-emitting diode 52 of the sensor 44 sends a beam to the data track 33 and its sensor 53 detects whether that beam is reflected or absorbed.

Two optical sensors 42 and 43 scan the timing track 32, and the signals they produce are in quadrature, as shown in FIG. 8. By comparing the phase relationship between the signals from these two sensors 42 and 43, the direction of dome motion is determined. The amount of motion is given by counting the number of signal transitions.

Each phototransistor 53 measures the reflected light and generates an analog voltage proportional to the intensity of the reflected beam. Thus, the sensor 42 generates an analog voltage 54; the sensor 43 generates an analog voltage 55, and the sensor 44 generates an analog voltage 56.

Conversion of the Analog Voltages (FIG. 7)

As shown by FIG. 7 the resulting three analog signals 54, 55 and 56 are converted to three digital TTL levels 57, 58 and 59, respectively, by a separate operational amplifier 60, 61 or 62 and a Schmitt trigger 63, 64, and 65 for each phototransistor output. These three TTL levels 57, 58, and 59 may be fed to separate input lines of an input/output port 69 of an 8-bit microcomputer 70, which then computes the dome position from these inputs. As shown in FIG. 8, the signals 57 and 58 are in quadrature.

Figure 9:
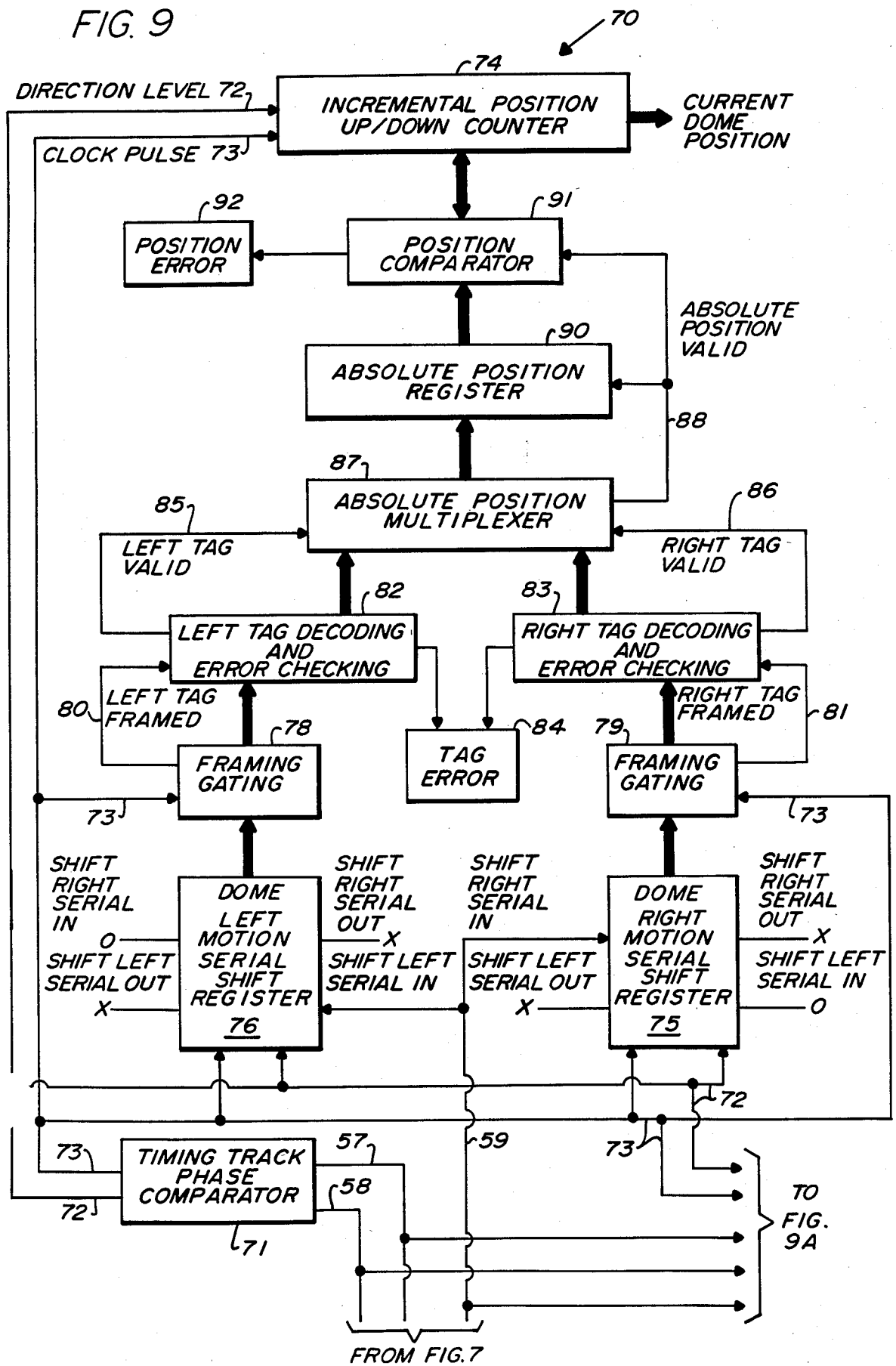
FIG. 9 is a block diagram of the functional operation of the microcomputer of FIG. 7.
Figure 10:
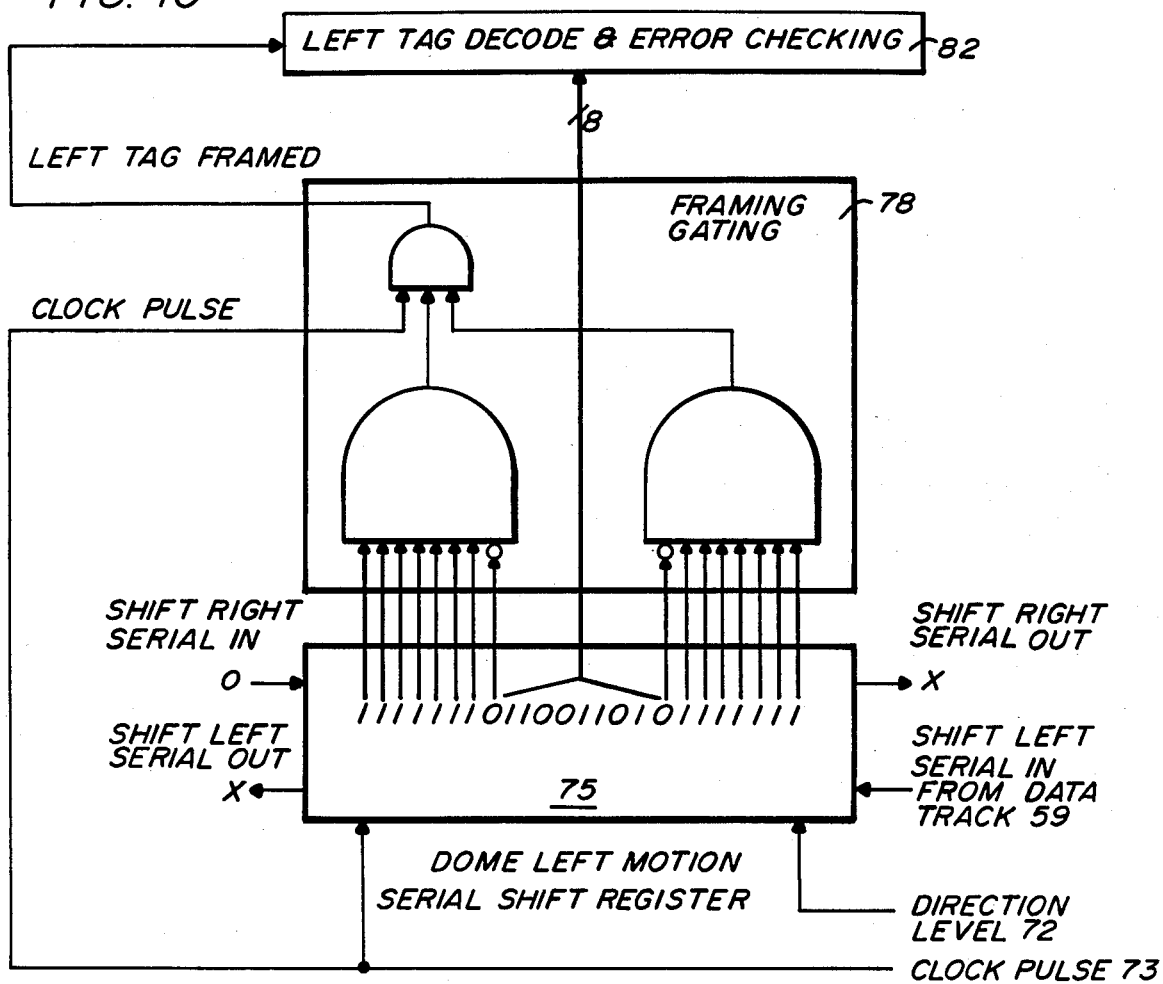
FIG. 10 is a detailed diagram of the framing gating logic in the microcomputer of FIG. 9.

The Microcomputer 70 (FIGS. 9 and 10)

The microcomputer 70 is programmed to give a series of functions and the following discussion treats these functions as though they were separate circuits. In fact, all the circuits now to be described are part of the microcomputer 70. A printout of a suitable program is given in the Appendix to this specification.

As shown in FIG. 9, the TTL levels 57 and 58 generated from the two sensors 42 and 43 are fed to a portion of the microcomputer 70 programmed to act as a phase comparator 71; the phase comparator 71 outputs a direction level signal 72 and a clock pulse 73 corresponding to each incremental tick of motion.

A 1× phase comparator 71 that produces the clock pulses shown in FIG. 8 operates as follows:

Any positive-going transitions of the signal 57 that occur when the signal 58 is in the low state cause the direction level signal 72 to be set to the high state and a clock pulse 73 to be generated. Any negative-going transitions of signal 57 that occur when the signal 58 is in the low state cause the direction level signal 72 to be set to the low state and a clock pulse 73 to be generated. Transitions of the signal 57 that occur when the signal 58 is in the high state are ignored.

2× and 4× phase comparators operate in a similar fashion, but are more complicated since they use a greater number of the possible combinations of transitions of the two signals 57 and 58.

The phase comparator 71 can be programmed to respond either to all possible combinations of transitions of the signals 57 and 58, or to only some subset of these combinations. If programmed to respond to all combinations, the phase comparator 71 outputs the direction level signal 72 and clock pulse 73 at four times (4×) the spatial frequency of the stripe-pairs (34 and 35) on the timing track 32. If programmed to respond only to some combinations, it can generate these outputs at either once (1×) or twice (2×) the spatial frequency of the stripe-pairs.

The spatial width of the incremental tick generated by the encoder is a function of the frequency at which the phase comparator 71 is operated. When the phase comparator is operated at four times (4×) the spatial frequency of the stripe-pairs, the spatial width of each incremental tick corresponds to one half the width of a single stripe (34 or 35) on the timing track 32. When operated at 2×, the spatial width of each tick equals the width of a single stripe (34 or 35). When operated at 1×, the tick width equals the width of a stripe-pair (34 and 35).

The choice of operating frequency (1×, 2×, or 4×) for the phase comparator 71 involves trade-offs between resolution and robustness, with 1× giving the greatest robustness (i.e., immunity to skewing or quadrature misadjustments) and 4× giving the greatest resolution. However, the choice of operating frequency does not change the logic of any of the other portions of the encoder. For the purposes of simplifying the remaining discussion and figures, the operating frequency of the phase comparator 71 will be taken as 1×, and thus the spatial width of an incremental tick will equal the width of a stripe-pair (light-blocking stripe 35 plus light-passing stripe 34) on the timing track 32.

The computer is programmed so that the direction level signal 72 and clock pulse 73, (which are generated by the phase comparator 71 for each incremental tick of motion), control an "up/down counter" function 74, which measures the incremental position. The computer is also programmed so that the direction level signal 72 and clock pulse 73 control two "shift register"-'functions 75 and 76 that process the signal 59 from the data track 33. The up/down counter 74, shift registers 75 and 76, and some other registers are located in the RAM of the microcomputer 70. The logic for the phase comparator 71 and for the clocking and gating of the various registers is implemented in appropriate software.

When the direction level signal 72 is in the high state, the clock pulse signal 73 causes the counter function 74 to be incremented, and the "shift register" functions 75 and 76 to be shifted right. When the direction level signal 72 is in the low state, the clock pulse signal 73 causes the counter function 74 to be decremented, and the "shift register" functions 75 and 76 to be shifted left.

When the dome 22 rotates, the direction level signal 72 and the clock pulse 73 that the phase comparator 71 derives from the timing track 32 are used to shift the bits obtained from the data track 33 into one of the two multi-bit bi-directional serial shift registers 75 and 76. (See FIGS. 9 and 10.) For example, the shift registers 75 and 76 may be 24 bits wide. The number of bits is not absolute, and may be larger or smaller depending on how many bits are being used to encode the absolute position tags 36. This in turn depends on the number of tags 36 and the spacing between them, and this in turn depends on the size and resolution of the encoder. Conceptually, these two registers 75 and 76 can be imagined as existing side-by-side and, when using 24-bit shift registers they form a 48-bit-wide window through which the microcomputer 70 "views" the data track 33. (For N-bit shift registers, the window is 2N bits wide.) After proper initialization, a minimum of N consecutive bits (e.g., 24) in this window always corresponds to an identical sequence of N bits (e.g. 24) on the section of the encoder data track 33 that is currently positioned in front of and immediately adjacent to the read head 40. The bits in the window are always aligned such that the bit nearest the "center" of the window corresponds to the data bit that has just passed under the optical sensor 44 for the data track 33.

The direction of dome rotation determines in which direction the registers 75 and 76 are shifted, and the distance moved determines the number of shifts that occur. For each incremental tick of motion, the registers 75 and 76 are shifted by one bit. The two registers 75 and 76 can be shifted in either direction, but both registers 75 and 76 perform the identical shift sequence. The registers 75 and 76 are not connected in cascade; so the contents of one register 75 will never shift into the other register 76 and vice versa. In fact, none of the four serial shift outputs is connected to anything; so the bits which shift out of the registers 75 and 76 are shifted into oblivion. The two registers 75 and 76 share a common serial input, namely, the signal 59 from the optical sensor 44 that scans the data track 33.

The actual operation of these shift registers 75 and 76 proceeds as follows. On power up, the registers 75 and 76 are set to zero. The dome 22 must be moved a small amount (at least N incremental ticks, e.g., 24 incremental ticks) in either direction to initialize either the register 75 or the register 76. When the dome 22 rotates to the right by one incremental tick, both registers 75 and 76 shifted right one bit (see FIG. 9). The bit from the data track 33 is shifted into the "dome right motion shift register 75", while a zero is shifted into the "dome lift motion shift register 76." When the dome 22 moves to the left, the converse is true.

When an absolute position tag 36 shifts into either register 75 or 76 and becomes properly framed (i.e., the tag 36 is centered in either register 75 or 76 and surrounded on both sides by the appropriate framing pattern made up of a start bit 38 or 39 and the spacer bit sequence 37), then a framing gating 78 or 79 generates a "tag-framed" strobe 80 or 81. This signals a tag decoder 82 or 83 (which may be implemented as a look-up table) to check the tag 36 for parity and adjacency, i.e., is this tag located physically adjacent to the last tag decoded. If the tag 36 fails either test, an error signal 84 is generated, and the tag 36 is ignored. If the tag 36 is valid, it is decoded by the tag decoder 82 or 83 into an absolute position. The tag decoder 82 or 83 also generates a "tag valid" strobe 85 or 86, which causes the decoded absolute position to be passed through an absolute position multiplexer 87 to an absolute position register 90. The multiplexer 87 generates an "absolute position valid" strobe 88, which causes the decoded absolute position that it is passing to be latched into the absolute position register 90 (FIG. 9) and which also signals a position comparator 91 to compare the absolute position in the register 90 to the incremental position in the incremental position up/down counter 74. If they do not match, an error signal 92 is generated, and the incremental position is reset to the absolute position.

A given tag 36 will decode to one of two different absolute positions, depending on whether it is framed in the "dome right motion" shift register 75 or the "dome left motion" shift register 76. The positions correspond, respectively, to the tag 36 being positioned either just to the right or just to the left of the read head 40.

Some Alternative Dome and Track Structures

Figure 11:
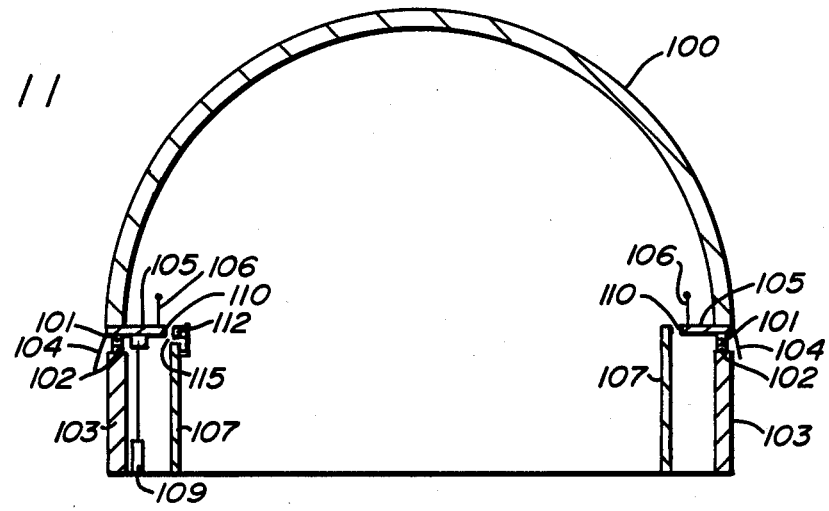
FIG. 11 is a simplified view in elevation and in section of an observatory dome having an alternative form of encoding system embodying the principles of the present invention.

First alternative structure (FIGS. 11 and 12):

FIG. 11 shows a dome 100 mounted by wheels 101 on a rail 102 supported by a stationary cylindrical concrete wall 103. There is an exterior shroud 104 to shield the interior of the domed structure from the weather. The dome 100 has a walkway 105 with a railing 106, and below the inner edge of the walkway 105 there may be a sheetrock wall 107. Slip rings 108 transfer electricity onto the moving dome 100 from an electrical panel 109.

A reflective encoder-band 110 is attached, preferably with glue, to a vertical edge 111 of the rotating walkway 105. A read head 112, like the read head 40, is rigidly mounted by a fixed portion 113 to the sheetrock wall 107, with a parallelogram linkage portion 114 joining the movable part of the read head 112 to the fixed portion 113. There is an opening 115 cut at the top of the sheetrock wall 107 to make the encoding band visible to the read head 112. The wheels and pivoting block of the read head 112 have been omitted from FIGS. 11 and 12, for the sake of clarity.

This system functions almost exactly like that described previously.

Figure 12:
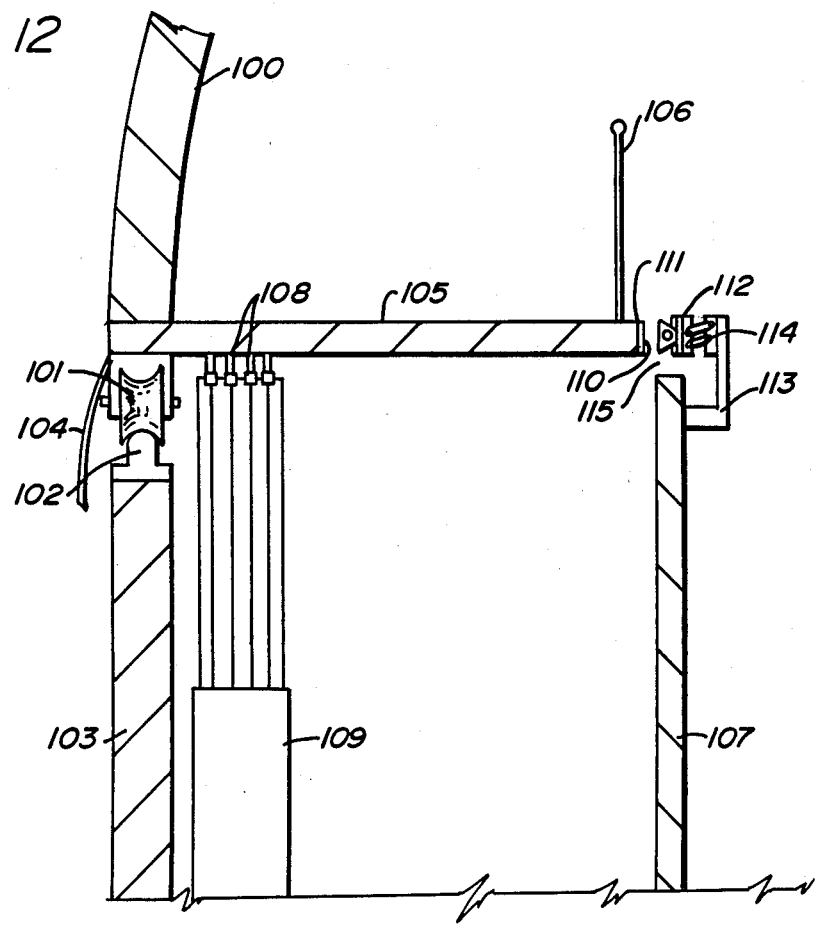
FIG. 12 is an enlargement of a portion of the dome of FIG. 11 and pertinent encoding system.
Figure 13:
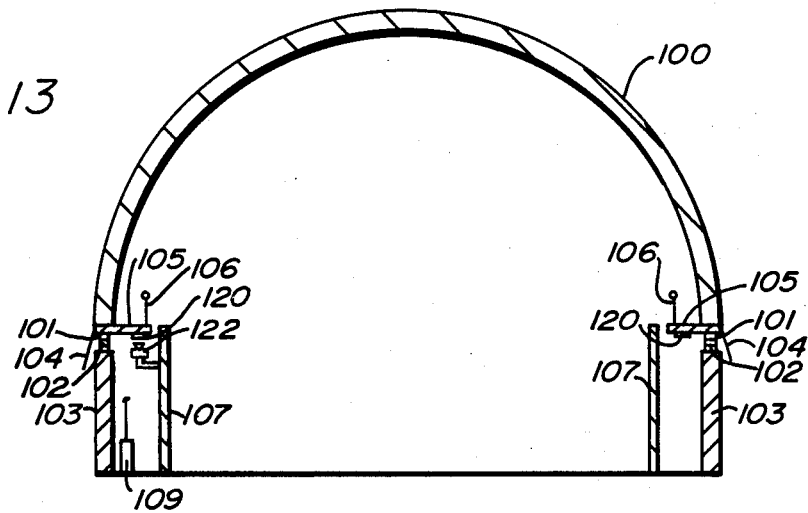
FIG. 13 is a view similar to FIG. 11 of a dome with a modified form of encoding system according to this invention.
Figure 14:
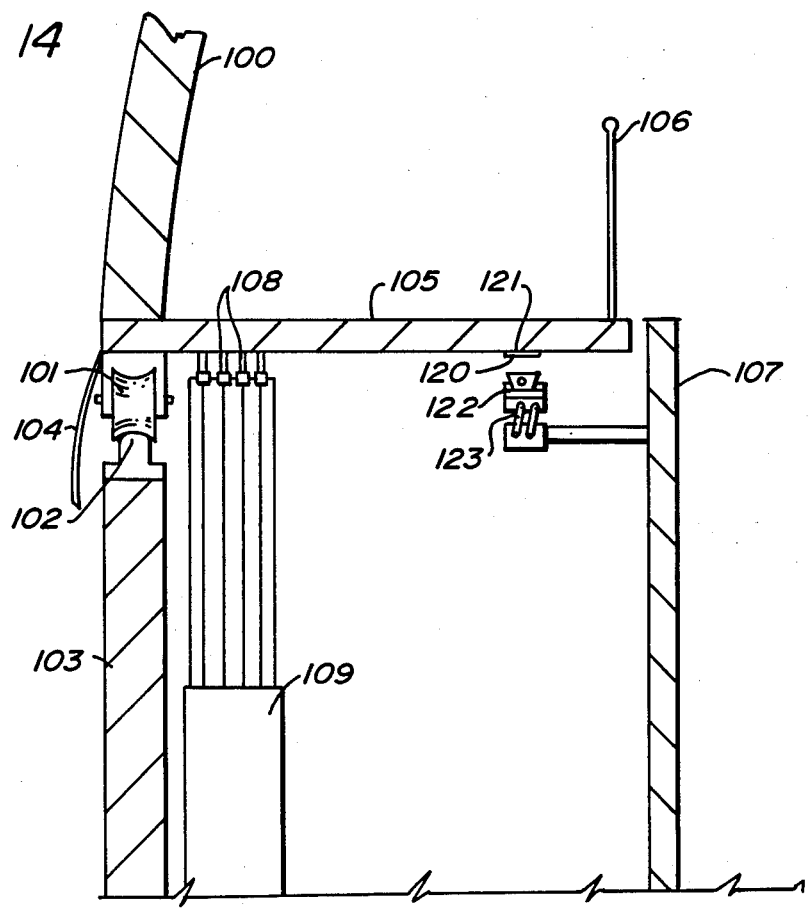
FIG. 14 is an enlargement of a portion of FIG. 13.

Second alternative structure (FIGS. 13 and 14):

In the structure shown in FIGS. 13 and 14, an annular flat encoder band 120 is placed on an horizontal surface 121 (see FIG. 14) on the bottom of the walkway 105 (or other rotating part of the dome 100, provided that such a surface is available and accessible), rather than on the inside vertical surface as in FIGS. 11 and 12. In this configuration, a read head 122 is mounted underneath the walkway 105, and its optical sensors look up at the encoder band 120 above. As a result, radial run-out in the dome 100 does not change the spacing between the up-looking read head 122 and the encoder band 120, and thus does not cause the optical sensors 42, 43, and 44 to go in and out of focus. Rather, radial run-out of the dome 100 causes a motion of the encoder band 120 in the plane of dome rotation and perpendicular to the direction of rotation. This motion can be accommodated by making each of the two (timing and data) tracks wider in the direction corresponding to this motion (i.e., the direction perpendicular to the direction of rotation.) Thus, in this configuration, the read head 122 can be rigidly mounted if the dome 100 in question exhibits *only* radial run-out and is not subject to other mechanical anomalies in its rotation.

Another advantage of this location is that it may provide an easier way for coping with domes which exhibit both axial and radial run-out. For such domes, if the encoder band 110 is mounted vertically, as shown in FIG. 12, the side-looking read head assembly 112 requires two separate parallelogram linkages 45 (one to compensate for the radial run-out and the other to compensate for the axial run-out) operating at right angles. (On the read head used for the encoder on the dome of the Lick 1-meter telescope, only a single parallelogram linkage 45 is needed since this dome has negligible axial motion but does have significant radial run-out.) If, instead, the encoder band 120 is mounted horizontally, as shown in FIG. 14, the up-looking read head assembly 122 requires only a single parallelogram linkage 123 to compensate for axial run-out. The radial run-out is handled as described in the previous paragraph. Note that in FIGS. 13 and 14, the wheels and pivoting block of the read head 122 have been omitted from the drawings, in the interest of clarity.

Locating the encoder band under the rotating part of a dome 100 does have some disadvantages. A major disadvantage of this configuration is that the encoder band 120 and read head 122 are located in a dirtier environment where they may be exposed to oil and lubricants from the dome "trucks" and dome drive motors. Another disadvantage is that the segments of the encoder band 120 become sectors of an annular ring, rather than segments of a cylinder. Thus, apparatus such as mylar strips used to form the band 120 may need to be printed as slightly curved pieces, the degree of curvature depending on the radius of the encoder band. This is easily accomplished, since the patterns for the mylar strips may be computer generated. However, it might be more difficult to apply the layer of aluminized mylar tape to the curved segments of mylar since curved segments of aluminized tape are not presently readily available. This can be compensated for by using extra tape to cover the rectangular area which bounds the curved segment.

Fortunately, the curvature problem becomes less pronounced as the radius of the encoder band 120 increases, and for large domes the curvature of each segment may be sufficiently small so that the band can be assembled from straight segments. In this case, instead of forming a perfect circle, the encoder band 120 forms an "N" sided polygon. For a dome comparable in size to the one on the Lick 3-meter telescope, "N" would be about 350 if a 10-inch segment size is used. A 350-sided polygon looks very much like a circle.

Figure 17:
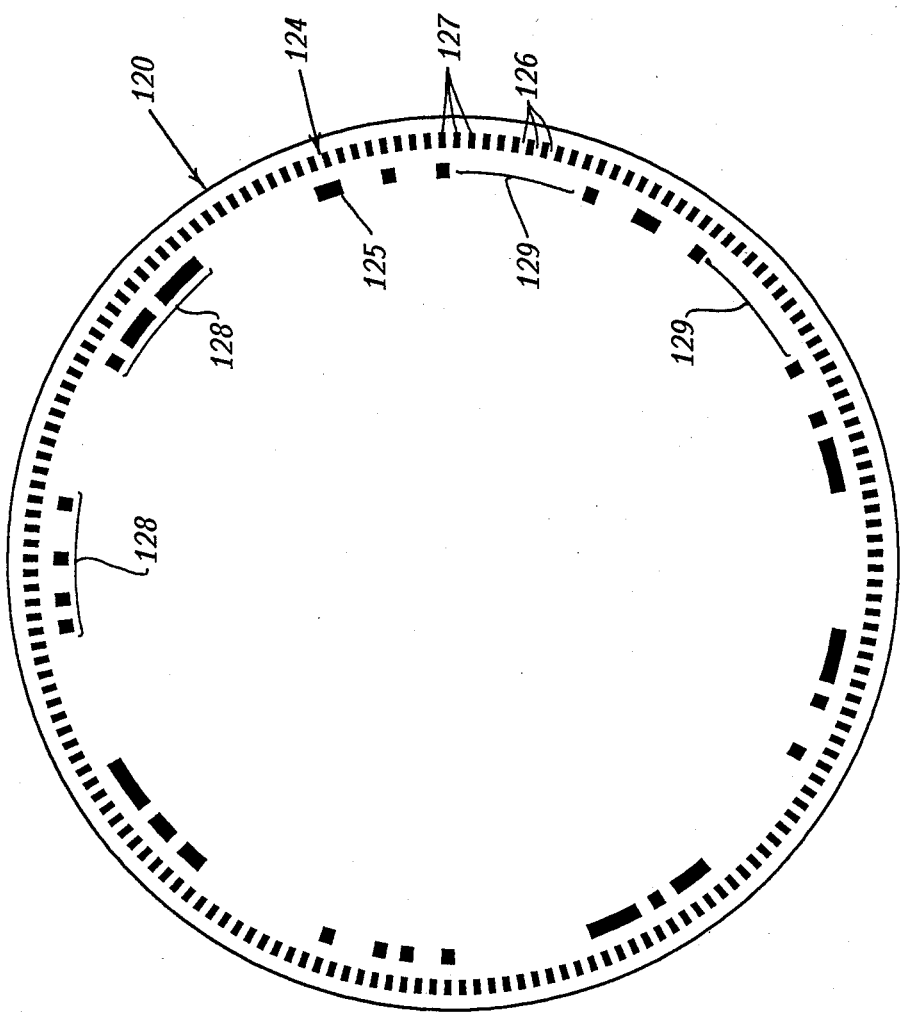
FIG. 17 is a plan view of a glass disk having a pattern for an incremental-absolute optical rotary encoder embodying the principles of the invention.

A flat band type of encoding track (FIG. 17):

For use in a structure like that of FIGS. 13 and 14, a band pattern 120 like that shown in FIG. 17 may be used. There is an outer circle providing a timing track 124 and an inner circle providing a data track 125. The timing track 124 alternates reflective stripes 126 with non-reflective stripes 127, and the data track alternates tags 128 with spacer 129.

This pattern 120 may comprise an annulus. Also, for somewhat smaller encoders, it may be placed on a glass disk.

Figure 15:
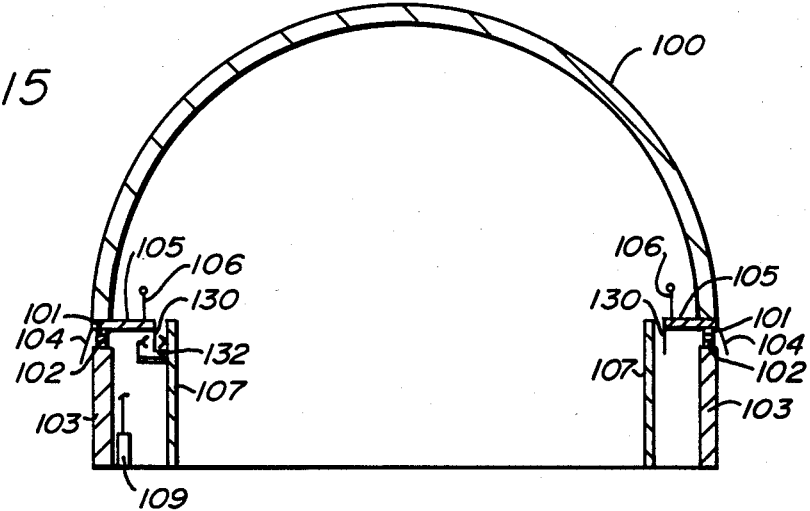
FIG. 15 is a view similar to FIGS. 11 and 13 of a dome with yet another form of encoding system embodying the invention.
Figure 16:
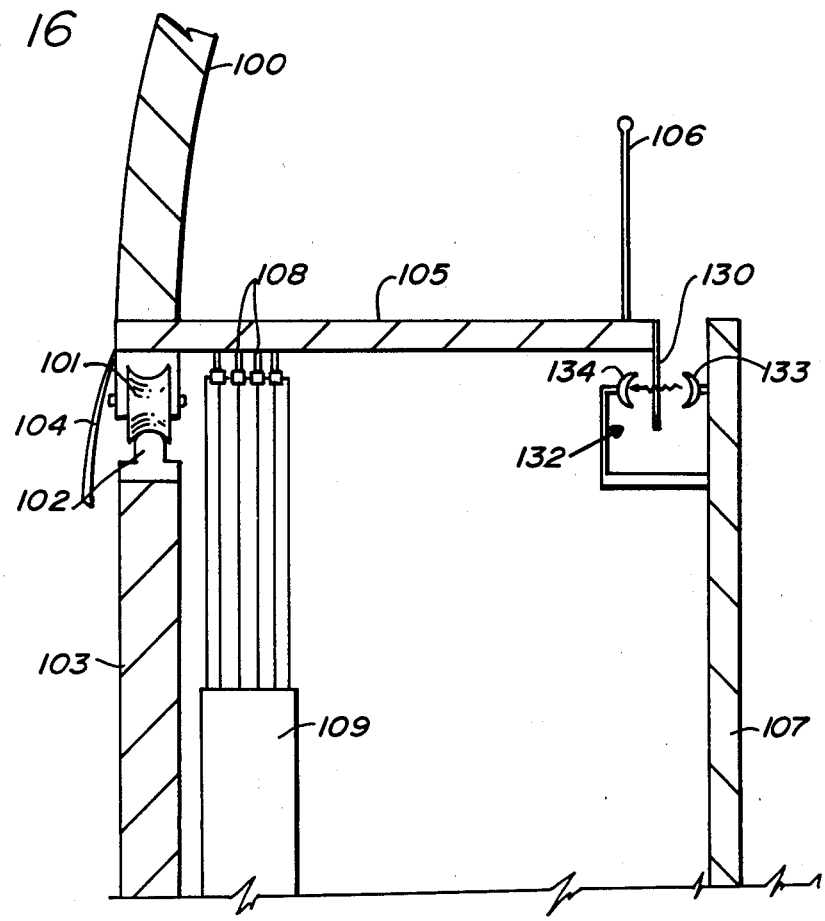
FIG. 16 is an enlargement of a portion of FIG. 15.

Third alternative structure—FIGS. 15 and 16:

In the third alternative implementation, illustrated in FIGS. 15 and 16, a transmissive band 130 is used in place of a reflective one. The transmissive band 130 may be hung like a skirt from the bottom of the walkway 105 or other rotating part of the dome 100. This may be accomplished on a dome such as that of the Shane 3-meter telescope by gluing the ½-inch upper margin of 3-inch high by 10-inch long mylar strips, which are used to form the band 130, onto the bottom ½-inch of the inner vertical surface of the walkway on the rotating part of the dome. Each of the three optical sensors 134 (only one of which is shown in FIGS. 15 and 16) in the read head assembly 132 is composed of two physically separate parts. Each sensor's light source 133 may be on the radially inner side of the band 130 and aimed outwardly, while the optical detector 134 may then be on the other, radially outer, side of the band 130 and aimed inwardly. By using a reasonably fast, well-focused beam, the depth of focus can be made very large. Thus, the image of the band 130 on the optical sensor 134 remains in focus, regardless of radial or axial run-out, or vertical warping. Accordingly, both parts of the optical sensor 133, 134 can be rigidly mounted, so that the only moving part of the encoder is the dome 100. Further, there is *no* physical contact between the fixed read head 132 and the rotating dome 100 and its encoder band 130. The only "contact" is the optical sensor's light beam passing through the transmissive band 130. Finally, using a transmissive band 130 rather than a reflective one eliminates the need for the layer of aluminized mylar tape, thus removing the cost of this material and the labor to apply it to the mylar strips.

The main disadvantage of this scheme is that the mylar strips, which are far from rigid, are literally dangling in the air, and are thus vulnerable to damage. This may be solved by gluing the mylar strips onto a clear but rigid material, such as Plexiglas, which is in turn rigidly mounted to the dome 100 itself. Alternatively, if computer-controlled milling equipment is available, the encoder band 130 may be made from strips of inexpensive aluminum stock, which may then be rigidly mounted to the dome 100. The patterns, instead of being printed on mylar would instead be cut as holes in the aluminum, and the logical sense of the signals complemented.

Another disadvantage is that the optical sensors 134 for the read head 132 which scans the transmissive band 130 may not be as readily available nor as inexpensive as those used in a read head 40 or 112 for scanning a reflective band 110 or 120.

Because the "dangling transmissive band" scheme eliminates any physical contact between the read head 130 and the surface being encoded, it may also be useful in encoder applications where one must tolerate radial and/or axial run out of the encoder band surface but cannot tolerate the mechanical/frictional drag created by an encoder pick-off or read head assembly which does make contact. While this is not a concern for massive objects like telescope domes, it may be a concern when measuring the position of low-mass, low-inertia rotating devices that spin on high-quality bearings.

Some Advantages of the Invention

This system of the present invention has several advantages over the more traditional solution of mechanically coupling a rotary encoder to the dome. To start with, mechanical complexity is reduced by eliminating most moving parts, such as pinch rollers, chains, sprockets, and reducing gears. If the dome 22 does not suffer from warping or run-out (either radial or axial) that causes the motion of the encoder track surface 31, 111, or 121 to exceed the depth of focus of the optical sensors 42, 43, and 44, then the read head 40 or 112 or 122 can be completely stationary. In this case, the parallelogram linkage 45 or 114 or 123 can be eliminated, and the block 47 need not pivot. The dome 22 itself will be the only moving part in the system, and all mechanical connections between the read head 40 or 112 or 122 and the dome 22 will be eliminated.

Otherwise, out-of-round domes are readily taken care of by the parallelogram linkage 45, in conjunction with the wheels 48 and 49, together with their tires 50 and 51. Similarly, warped tracks are taken care of by mounting the block 47, which holds the sensors 42, 43, and 44, so that it pivots vertically to compensate for the vertical warping.

Another advantage of the encoder of this invention is that a gear reduction is not required, as is the case of an absolute rotary encoder coupled to the dome. A gear reduction is expensive and is also a significant source of error. If the gearing does not produce the exact reduction required, a rotary encoder will incur a small incremental error on each rotation. Then, as said above, if the dome is rotated repeatedly in the same direction, this incremental error accumulates and may grow unacceptably large. Additional errors result from mechanical backlash in the gears. These errors are eliminated by the present invention.

Automatic detection of errors:

The encoder of this invention provides redundancy, and this enables the hybrid encoder to provide automatic detection of errors, because, unlike most encoders, there is redundant information which is cross-checked. Without some type of redundancy, it is very difficult to detect, diagnose, or correct errors.

In conventional optical incremental encoders, there has been no way to detect whether spurious counts have occurred as a result of dust or scratches on the glass disk of the encoder, dimming of the encoder's light source, or electrical noise. Incorrect position information has thus tended to go undetected. These problems have occurred many times during use of such encoders.

Similar problems can occur with absolute encoders as well, although these could be reduced by the addition of some redundancy in the form of a parity track. However, the addition of such a track would cut the available resolution of the encoder in half.

Gray-code absolute encoders provide some error detecting capability, because on any incremental step only a single bit should make a transition. Thus, if more than one bit changes at once (as might happen if there were dust, scratches, or electrical noise), then a Gray-code encoder can signal an error. On the other hand, if a given bit or group of bits get stuck in one state (as would happen if a light source dimmed or burned out, or a light sensor failed), those bits will make no transitions. Thus for some motions of the encoder, no motion will be reported and no error will be detected.

In the hybrid (absolute and incremental) encoder of this invention, the comparison of redundant sources of information greatly increases the likelihood that most typical malfunctions which will cause an error will be reported. Scratches, dust, or electrical noise affecting the signal from the data track 33 will result in the corruption of an absolute position tag 36. This will cause either a tag parity error or adjacency error to be reported, and the tag 36 to be rejected. The addition of the parity bit to the tag 36 of the hybrid encoder does not cut the encoder's resolution in half, (unlike the case of the absolute encoder) it does not require the addition of a separate track. Rather, it requires only the addition of one bit to a tag 36 that is already at least seven bits long and which has a typical effective width of twenty bits. Accordingly, the addition of the parity bit only reduces the absolute position resolution by 5%, and does not reduce the incremental position resolution at all.

Similarly, scratches, dust, or electrical noise affecting the signals from the timing track 32 will result in corruption of the incremental position and sometimes in the corruption of a nearby absolute position tag 36, since errors on the timing track may cause incorrect shifting of the tag 36 into the shift registers 75 and 76. In either case, this will cause an error to be reported. If a tag 36 has been corrupted, either a tag parity error, adjacency error, or missed-tag error will be reported. (A missed-tag error occurs when a tag is missed, i.e., not detected after a reasonable amount of incremental motion has been measured.) Ultimately, when the next valid tag 36 becomes "properly framed", a mismatch will be detected between the corrupted incremental position and the absolute position corresponding to the "properly framed" tag 36. This will cause a position mismatch error to be reported. The corrupted incremental position will then be corrected by resetting it to match the absolute position corresponding to the "properly framed" valid tag 36.

Diagnosis of errors (FIG. 9A):

So far, it has been demonstrated how the hybrid encoder will detect most typical errors, but it has not indicated how it can diagnose or isolate the cause of an error. For the types of errors discussed thus far (noise, scratches, dust), a precise diagnosis is not possible, although the different classes of error (tag parity error, adjacency error, missed tag error, position mismatch error) help to isolate the probable causes.

For example, if some tags 36 repeatably read correctly while others repeatably cause errors, the problem is probably (although not necessarily) with the encoder track surface 31 and not with the read head sensors, electronics, or signal processing logic. Knowing which tags cause errors identifies where on the encoder track surface 31 scratches or dust might be. For non-repeatable errors, more likely causes are electrical noise or an incorrect mechanical adjustment of the read head assembly 40, which causes the optical sensors to drift in and out of focus.

Figure 9A:
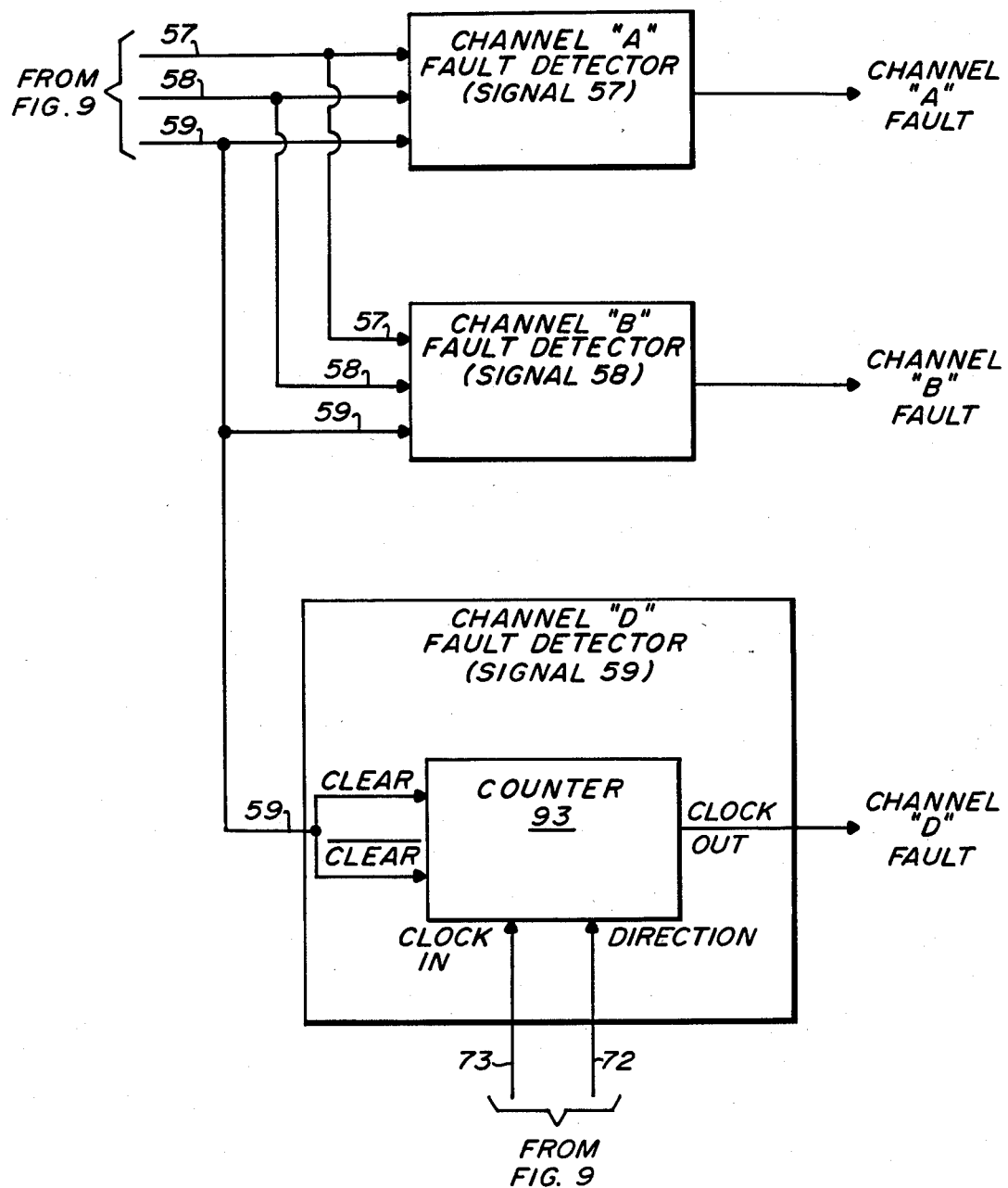
FIG. 9A is a continuation of FIG. 9, showing the fault detection system therefor.

There are, however, certain failure modes in which a more definite diagonsis can be made. In particular, failures of either the light source, light sensor, or associated electronics for one of the three signal channels (two channels "A" and "B" corresponding to the signals 57 and 58 from the timing track 32 and one channel "D" for signal 59 from the data track 33 as shown in FIG. 9A) produce a recognizable signature which will point to the failed channel. The failed channel is located by comparing in pairs the signals from each of the three channels. If analysis of the signals from a given pair of channels indicates that the encoder is making significant motion (i.e., the incremental position is changing by more than a minimum amount, usually one count), and the signal from the third channel shows no transitions, then the signal from the third channel has failed.

In the case of the conventional incremental encoder, where there are only the two channels from the timing track, there is only a single channel available to use to cross-check the opposing channel. (Note that many conventional incremental encoders have a third track which provides a single index pulse per revolution. However, since this pulse is generated so infrequently, it cannot be relied on for making a rapid diagnosis of the failure of the other channels.) A single channel cannot provide sufficient information to determine unambiguously whether or not the encoder is making a significant motion.

It is tempting to suggest that a fault could be detected simply by counting the signal transitions from each of the two channels, channel signal 57 and channel signal 58. If no transitions are seen on the channel signal 58 after some given number of transitions are seen on the channel signal 57, the conclusion could (erroneously) be made that the signal 58 has failed. Unfortunately, although this scheme will detect real failures, it will also erroneously detect failures where none has occurred. If the encoder is making a fine (i.e., the incremental position change is only one count or less) rocking motion back and forth across a single stripe on the timing track 32, then the signal 57 could produce many transitions without any transitions being generated from the signal 58, even though the signal 58 had not failed. Such rocking motions are indeed possible, particularly for domes and telescopes subjected to gentle wind buffeting.

In the case of the encoder of this invention, there is always sufficient information from any pair of channels to diagnose unambiguously a single-channel failure, (i.e., loss of the signal) from the third channel. Such failures are detected as soon as some minimal amount of motion actually occurs.

If the signal 59 from the single channel of the data track 33 fails, this can be detected quickly by using a second, smaller up/down counter 93. This counter 93 is clocked by the same direction level 72 and clock pulse 73 used by the incremental position up/down counter 74. This second up/down counter 93 is zeroed (cleared) whenever any transition is detected on the signal 59. There should always be some transition detected from the signal 59 whenever the encoder moves an amount equal to the width of a tag 36 or a spacer 37, whichever is greater. If this second up/down counter 93 counts (in either direction) a motion exceeding this amount and does not reset to zero, then the signal 59 from the data track (channel D) has failed.

The signals 57 and 58 from the two channels (A and B) of the timing track 32 are equivalent with one exception. The transitions on the signal 59 are 225 degrees out-of-phase with those of the signal 57 and 135 degrees out-of-phase with those of the signal 58, as shown in FIG. 8. Clearly, the signal 57 is 90 degrees out-of-phase with the signal 58. Thus, phase information can be obtained by comparing any combination of two channels, and failures of the signals 57 and 58 (A or B) can be treated much the same.

If there is a failure of the signal 58, phase information can be recovered instead from the signal 59, although not as often, since the signal 59 makes transitions less often than the signal 58. Because of this phase relationship, any transitions from either of the signals 58 or 59 will occur between opposing transitions of the signal 57. If during the interval between two opposing transitions of the signal 57, a transition is detected on the signal 59 but is not detected on the signal 56, then the signal 58 has failed.

Failures of the signal 57 can be dealt with in much the same way, since there is sufficient phase information from the other two channels to determine if significant motion has occurred. Any transitions of the signals 57 or 59 will occur between opposing transitions of the signal 58. If during the interval between two opposing transitions of the signal 58, a transition is detected on the signal 59 but is not detected on the signal 57, then the signal 57 has failed.

In summary, the hybrid encoder provides robust error detection and diagnosis through the use of redundant information, and does so, without significantly compromising positional resolution, and without requiring additional optical or analog electronic components inside a standard rotary encoder package.

Most encoders currently available (either incremental or absolute) do not provide this type of needed redundancy, and cannot detect whether they are malfunctioning.

The novel combination of incremental and absolute encoding:

A distinctly novel feature of this invention is that the encoder combines the features of incremental and absolute encoders into a single system, using only three optical sensors 42, 43, and 44. This number is far fewer than the number of sensors normally used in absolute encoders alone. It is also the same number of sensors found in encoders which provide only incremental position plus a single index pulse. In fact existing incremental encoders can be redesigned to use this technique with only minimal changes to the encoder optics and geometry.

General use rotary encoder (FIGS. 18-20):

The encoder of this invention may also be fabricated in a conventional rotary encoder package for general use, not just in telescope domes. This may be accomplished by converting the optical track which is normally used to provide a single index position into data for providing absolute position.

Conventional optical incremental encoders normally use two separate optical tracks as timing tracks, plus a third track if an index pulse is provided. Each of these tracks is scanned by its own optical sensor. The azimuthal alignment of the two timing tracks is arranged so that they are in spatial quadrature, i.e., the resulting signals are 90-degrees out-of-phase. The reason for using two separate tracks is that it allows the two optical sensors scanning these tracks to be mechanically locked together, thus eliminating the need for extremely precise mechanical adjustment of the spacing between the sensors and insuring that the phase relationship remains stable despite thermal variation or mechanical vibration.

In the specific implementation of the hybrid encoder heretofore described, only one optical track is used for the timing track 32. However, this single track is scanned by two optical sensors 42 and 43, and quadrature is achieved by adjusting the spacing between these two sensors 42 and 42. This can be done because the physical scale of the dome is so large, and consequently the spacing between stripes on the timing track is so coarse that the adjustments in the spacing of these two sensors required to achieve proper quadrature are correspondingly coarse. The pattern of FIG. 17 may be used on glass disks in appropriate cases.

In implementations in which finer incremental line spacings are required, as would be the case where a hybrid encoder is fabricated in a standard rotary encoder package, the adjustment of the spacing between these two optical sensors requires greater precision and stability than is usually possible. Therefore, if one were to make a hybrid encoder for a standard rotary encoder package, there should be two separate timing tracks with the azimuthal alignment of these two tracks providing the quadrature, as in a conventional incremental encoder and as shown in FIGS. 18 and 20.

Figure 19:
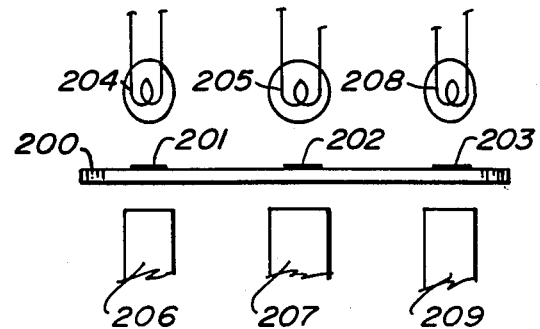
FIG. 19 is a diagrammatic view in elevation of the glass disk of FIG. 18 in combination with a light source and a sensor.
Figure 18:
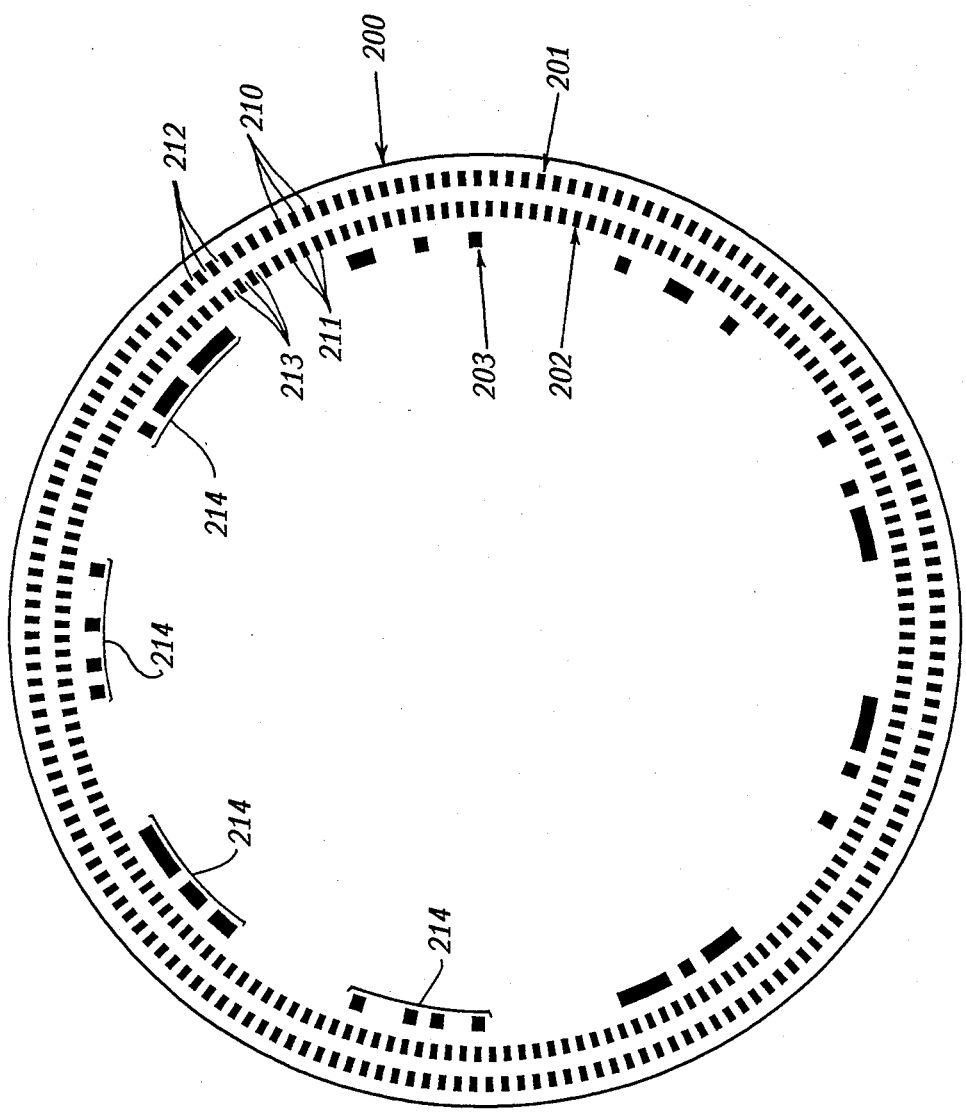
FIG. 18 is a plan view like FIG. 17 of a glass disk with a modified pattern for the rotary encoder.

FIG. 18 shows a transparent glass disk 200 having two timing tracks 201 and 202 and a data track 203. The timing tracks 201 and 202 are offset to provide quadrature. As FIG. 19 shows, light sources 204 and 205, respectively, are aligned radially with the tracks 201 and 202 and, as shown in FIG. 19, are on opposite sides of the disk 200 from their similarly aligned phototransistors 206 and 207. A light source 208 is used for the data track 203 and addresses a transistor 209. All of the light sources may be LED's or something else. FIG. 18 shows 180 incremental lines per revolution, giving an incremental resolution of two degrees. The respective dark stripes 210 and 211 of the tracks 201 and 202 are opaque and the respective clear strips 212 and 213 are transparent. The data track 203 has nine absolute tags 214, giving an absolute resolution of forty degrees.

Figure 20:
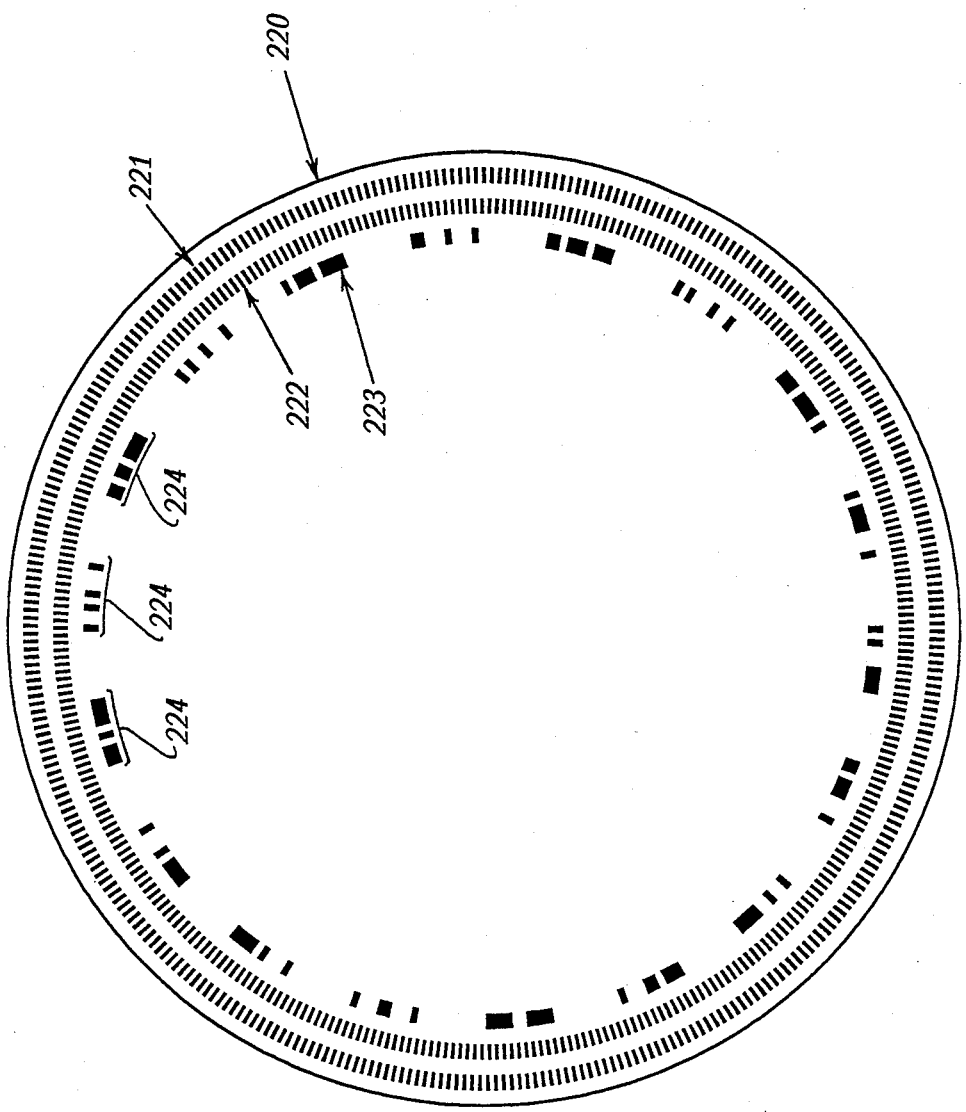
FIG. 20 is a view like FIG. 18, showing another modified pattern.

FIG. 20 shows a similar glass disk 220 with two timing tracks 221 and 222 and a data track 223. Here there are 360 incremental lines per revolution, for an incremental resolution of one degree. There are eighteen absolute tags 224, for an absolute resolution of twenty degrees. Typically, such glass disks may have thousands of incremental lines per revolution.

Figure 21:
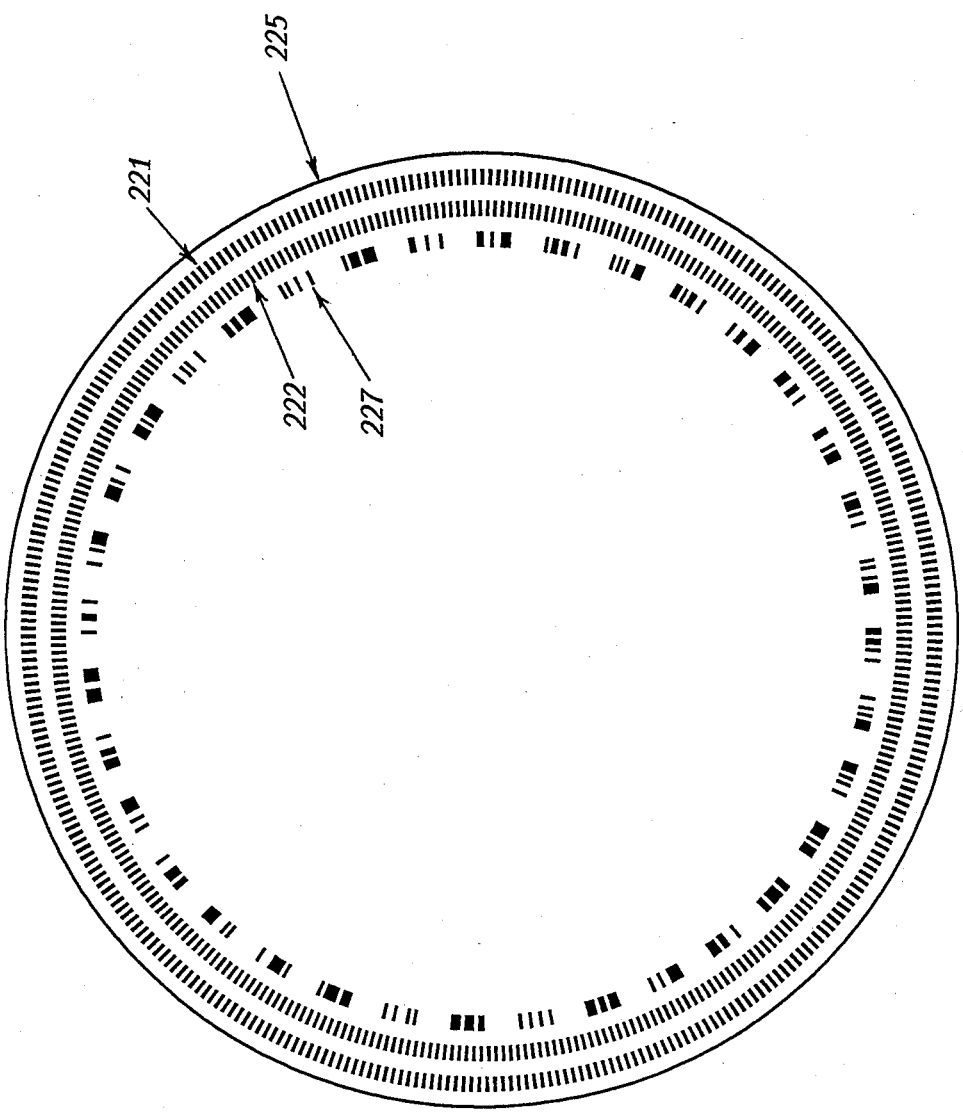
FIG. 21 is a view like FIG. 20 of a disk like that of FIG. 20 except that the data track is different in order to accommodate operation of its phase comparator at 2× the frequency used for the disk of FIG. 20.
Figure 17:
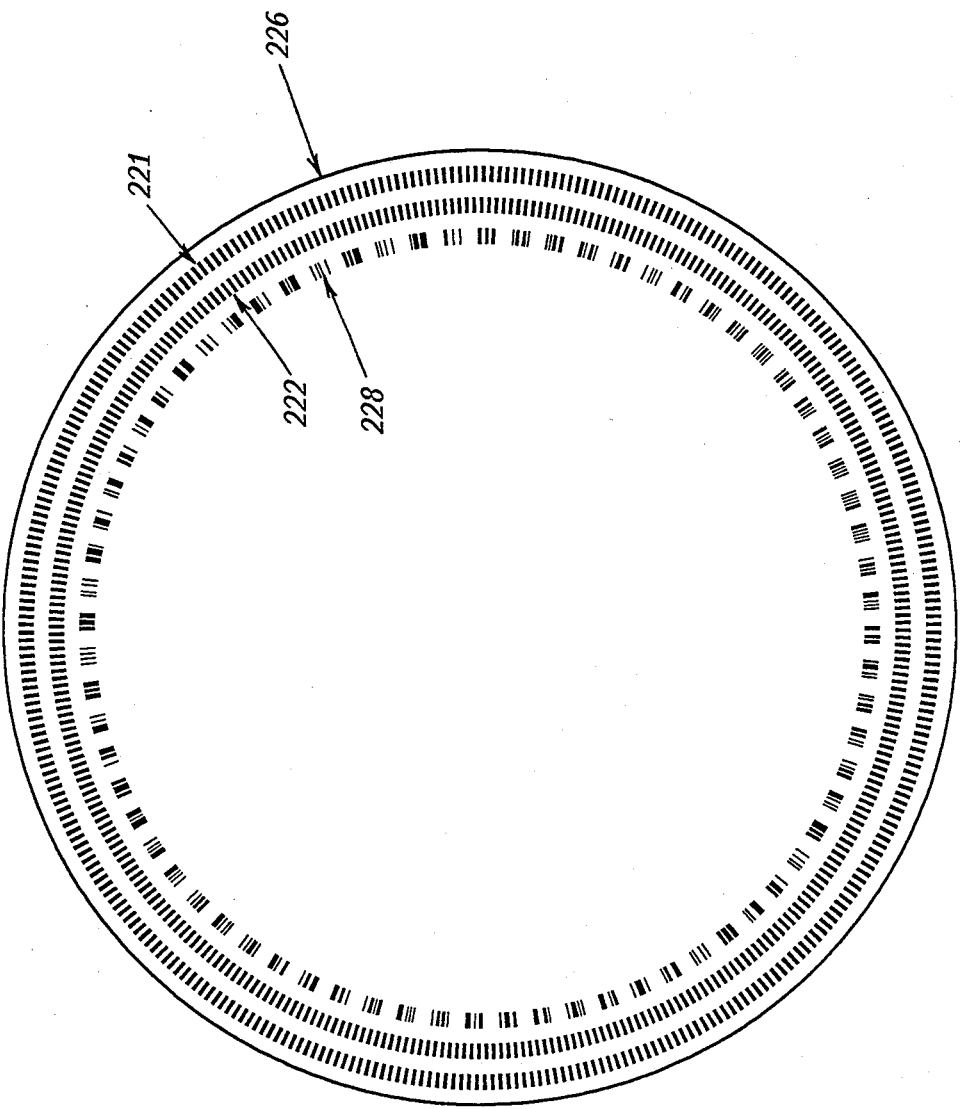

As described earlier, incremental resolution can also be increased by operating the phase comparator 71 at either twice (2×) or four times (4×) the spatial frequency of the incremental lines on the timing track. These higher operating frequencies also yield a tighter packing of the tags 36 and spacers 37 on the data track 33. Thus, both incremental and absolute resolution can be increased together. This is illustrated in FIGS. 21 and 22, which are identical to FIG. 20, except that they show, respectively, glass disks 225 and 226 designed for use with a phase comparator 71 operated at twice (2×) or four times (4×) the spatial frequency of the lines. Thus, while the timing tracks 221 and 222 are identical in FIGS. 20, 21, and 22, the data tracks 223 (FIG. 20), 227 (FIG. 21), and 228 (FIG. 22) are different, in accordance with the different frequencies involved.

If the optical sensor for the data track were to be locked in the same mounting with the sensors for the timing track, an azimuthal offset between the data and timing tracks would be needed to provide the phase difference required for detection of single channel failures.

In either case, whether one or two timing tracks are used, two sensors (two light sources 204 and 205 and two phototransistors 206 and 207) are always required for the incremental portion of the hybrid encoder, while a third sensor (light source 208 and phototransistor 209) is required for scanning the data track. Thus, while the complete hybrid encoder always requires exactly three optical sensors, the number of separate optical tracks may be either two or three depending on the specific implementation and the fineness of the incremental line spacing. Note that the number of optical sensors is the same number required for a conventional incremental encoder that provides only incremental position and a separate index pulse. Also note that unlike conventional absolute encoders, the number of optical sensors (three) and optical tracks (two or three) never increases beyond three, regardless of changes in the size or resolution of the encoder.

The only part that would need to be changed inside the rotary encoder package itself would be to install the glass disk 200 or 220 in place of the conventional disk; the sensors and electronics for what was the index track should be usable for what would become the data track. All of the signal processing logic described above (the shift registers, up/down counters, etc.) could and probably should be located outside this package in a separate box.

Further Advantages of the Invention (1) All forms of the invention provide both incremental and absolute position.

(2) The phase information from the timing track provides the clocking of the incremental position.

(3) the phase information from the timing track also controls the clocking of the data track and hence the absolute position.

(4) The incremental and absolute positions can be clocked by a phase comparator operating, e.g., at either once (1×), twice (2×), or four times (4×) the spatial frequency of the stripes on the timing track.

(5) Only three optical sensors are ever needed, regardless of encoder size or resolution.

(6) At most, three optical tracks are needed, and in some implementations, two tracks will suffice.

(7) Single channel failures can be readily detected and isolated.

(8) The encoding of absolute positions into absolute position tags that are surrounded by start bits and separated by spacers enables the data track to be self-synchronizing.

These eight features distinguish the encoder of this invention from all other existing encoders that we are aware of.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

```
_DRB1:[KIBRICK.DOME.SHANE]APPENDIX.LIS;8                6-NOV-1986 12:16                                    Page 1

APPENDIX:           SOFTWARE LISTING FOR MICROCOMPUTER 70.

1. INTRODUCTION

THIS LISTING COMPRISES THE SOFTWARE NECESSARY TO PROGRAM A ROCKWELL R65/11EB MICROCOMPUTER TO
         PERFORM THOSE FUNCTIONS DESCRIBED IN THE SPECIFICATION AS BEING IMPLEMENTED IN THE MICROCOMPUTER
         70. THESE FUNCTIONS INCLUDE:

1. THE TIMING TRACK PHASE COMPARATOR FUNCTION 71.
             2. THE INCREMENTAL POSITION UP/DOWN COUNTER FUNCTION 74.
             3. THE DOME RIGHT AND LEFT MOTION SERIAL SHIFT REGISTER FUNCTIONS 75 AND 76.
             4. THE FRAMING GATING FUNCTIONS 78 AND 79
             5. THE TAG DECODING AND ERROR CHECKING FUNCTIONS 82 AND 83
             6. THE TAG ERROR FUNCTION 84.
             7. THE ABSOLUTE POSITION MULTIPLEXER FUNCTION 87.
             8. THE ABSOLUTE POSITION REGISTER FUNCTION 90.
             9. THE POSITION COMPARATOR FUNCTION 91.
            10. THE POSITION ERROR FUNCTION 92
            11. THE FAULT DETECTOR FUNCTIONS FOR CHANNELS "A", "B", AND "D" (SIGNALS 57, 58, 59).

NOTE THAT AS A RESULT OF VARIOUS SOFTWARE RESTRICTIONS AND/OR OPTIMIZATIONS, THE FUNCTIONS LISTED
         ABOVE MAY NOT BE ORGANIZED EXACTLY THE SAME AS ILLUSTRATED IN FIGURES 9 AND 9A IN THE SPECIFICA-
         TION. FOR EXAMPLE, A GIVEN FUNCTION, SUCH AS THE TIMING TRACK PHASE COMPARATOR FUNCTION 71, MAY
         BE DISTRIBUTED AMONG A NUMBER OF DIFFERENT PROGRAM ELEMENTS, RATHER THAN BEING ENCAPSULATED INTO
         A SINGLE DISCRETE PROGRAM SEGMENT. THUS, FOR SOME OF THE FUNCTIONS LISTED ABOVE, IT MAY NOT BE
         POSSIBLE TO IDENTIFY A SPECIFIC, CONTIGUOUS BLOCK OF PROGRAM CODE WHICH PERFORMS THE GIVEN
         FUNCTION.

IN OTHER CASES, TWO DIFFERENT FUNCTIONS HAVE BEEN CONSOLIDATED INTO A SINGLE BLOCK OF CODE. FOR
         EXAMPLE, THE LEFT AND RIGHT FRAMING GATING FUNCTIONS 78 AND 79 ARE REALIZED AS A SINGLE FRAMING
         GATING ROUTINE, WHICH ACCEPTS A PARAMETER INDICATING WHETHER THE ROUTINE IS USING DATA FROM THE
         LEFT MOTION SERIAL SHIFT REGISTER 76 OR THE RIGHT MOTION SERIAL SHIFT REGISTER 75.

FINALLY, SOME FUNCTIONS HAVE BEEN RE-ARRANGED TO OCCUR AT AN EARLIER STAGE OF THE PROCESSING.
         FOR EXAMPLE, AS ILLUSTRATED IN FIGURE 9 OF THE SPECIFICATION, THE ABSOLUTE POSITION MULTIPLEXER
         FUNCTION 87, IS USED TO SELECT BETWEEN ABSOLUTE POSITION DATA THAT ORIGINATES FROM EITHER THE LEFT
         MOTION SERIAL SHIFT REGISTER 76 OR THE RIGHT MOTION SERIAL SHIFT REGISTER 75. IT PERFORMS THIS
         MULTIPLEXING FUNCTION (I.E., SELECTING BETWEEN THE LEFT AND RIGHT SIDES) AFTER THE DATA FROM
         THESE REGISTERS HAS ALREADY PASSED THROUGH SEPARATE FRAMING GATING FUNCTIONS AND TAG DECODING/
         ERROR CHECKING FUNCTIONS FOR EACH SIDE. IN THIS SOFTWARE IMPLEMENTATION, THE MULTIPLEXING
         FUNCTION (I.E., SELECTING BETWEEN THE LEFT AND RIGHT SIDES) IS PERFORMED PRIOR TO THE FRAMING
         GATING AND PRIOR TO TAG DECODING/ERROR CHECKING FUNCTIONS, SO THAT THESE PREVIOUSLY SEPARATE
         (I.E., SEPARATE FOR EACH SIDE) FUNCTIONS CAN BE CONSOLIDATED INTO A SINGLE ROUTINE. THUS, WHAT
         WAS AN ABSOLUTE POSITION MULTIPLEXER 87 IN THE SPECIFICATION HAS EFFECTIVELY BECOME A SHIFT
         REGISTER OUTPUT MULTIPLEXER IN THIS SOFTWARE IMPLEMENTATION.

HOWEVER, DESPITE THESE VARIATIONS, THE NET EFFECT OF THIS SOFTWARE IMPLEMENTATION IS TO PROVIDE
         THE SAME OVERALL FUNCTIONALITY AS IS ILLUSTRATED IN FIGURES 9 AND 9A AND AS IS DESCRIBED IN THE
         TEXT OF THE SPECIFICATION. THERE ARE MANY OTHER POSSIBLE SOFTWARE IMPLEMENTATIONS USING EITHER
         THIS MICROCOMPUTER OR SOME OTHER MICROCOMPUTER) THAT WILL ACHIEVE THE SAME OVERALL NET RESULT,
         AND THESE INVOLVE VARIOUS TRADEOFFS OF MEMORY UTILIZATION VERSUS PROCESSOR UTILIZATION. THE
         LOGIC IMPLEMENTED BY THIS SOFTWARE COULD ALSO BE IMPLEMENTED USING DIGITAL LOGIC CIRCUITS, AND
         SUCH IMPLEMENTATIONS WOULD ALSO INVOLVE VARIOUS RE-ARRANGEMENTS OF HOW THE SPECIFIC FUNCTIONS
         ARE REALIZED.

TABLE OF CONTENTS
         -----------------

THIS LISTING IS ORGANIZED INTO THE FOLLOWING SECTIONS:

1.   INTRODUCTION

2.   BRIEF DESCRIPTION OF THE R65/11EB MICROCOMPUTER

3.   DETAILED DESCRIPTION OF HOW THE R65/11EB MICROCOMPUTER INTERFACES TO THE OTHER
                  COMPONENTS OF THE HYBRID ENCODER SYSTEM

4.   SUMMARY OF THE OVERALL SOFTWARE FLOW
```

5. SIMPLIFIED FLOW DIAGRAM OF THE INTERRUPT PROCESSING

6. NOTES ON THE SYNTAX OF THE ASSEMBLER PROGRAM USED TO ASSEMBLE THIS LISTING

7. DESCRIPTION OF THE PHASE COMPARATOR IMPLEMENTATION

8. DEFINITION OF SYMBOLS FOR REFERENCING THE INTERNAL REGISTERS AND I/O PORTS OF THE R65/11EB PROCESSOR

9. DEFINITION OF IMPLEMENTATION SPECIFIC PARAMETERS THAT ARE DETERMINED BY THE ENCODER BAND 30

10. DEFINITION OF IMPLEMENTATION SPECIFIC 10-BIT TAG CODES FOR USE ON THE ENCODER BAND 30.

11. DEFINITION OF IMPLEMENTATION SPECIFIC DATA TABLES THAT ARE DETERMINED BY THE ENCODER BAND 30

12. DEFINITION OF APPLICATION SPECIFIC SYMBOLS FOR THE R65/11EB'S INTERAL REGISTERS AND I/O PORTS

13. DEFINITION OF APPLICATION SPECIFIC SYMBOLS FOR ORGANIZING THE R65/11EB'S RANDOM ACCESS MEMORY (RAM).

14. PROGRAM LISTINGS FOR THE INTERRUPT SERVICE ROUTINES

15. PROGRAM LISTING FOR POWER-UP INITIALIZATION ROUTINE

16. PROGRAM LISTING FOR THE MAIN "IDLE" LOOP THAT EXECUTES DURING THE INTERVAL BETWEEN INTERRUPT REQUESTS.

17. PROGRAM LISTING FOR OPTIONAL SOFTWARE THAT PRINTS DIAGNOSTIC DATA ON THE ASCII SERIAL OUTPUT

18. PROGRAM LISTING OF 6502-STYLE HARDWARE VECTORS

2. BRIEF DESCRIPTION OF THE R65/11EB MICROCOMPUTER

THE ROCKWELL R65/11EB MICROCOMPUTER IS PIN COMPATIBLE WITH ROCKWELL'S R6500/11 FAMILY OF MICROCOMPUTERS, AND IS DESCRIBED IN THE ROCKWELL SEMICONDUCTOR PRODUCTS DIVISION DATA BOOK, 1984 EDITION AND SUBSEQUENT EDITIONS. IT IS ALSO DESCRIBED ON ROCKWELL DATA SHEET ORDER NO. D113.
CONTACT: ROCKWELL SEMICONDUCTOR PRODUCTS DIVISION, ROCKWELL INTERNATIONAL, 4311 JAMBOREE RD., P.O. BOX C, MS 501-300, NEWPORT BEACH, CA 92658-8902
PHONE: (714)-833-4700

THE ROCKWELL R65/11EB MICROCOMPUTER SUPPORTS THE STANDARD 6502 MICROPROCESSOR INSTRUCTION SET, AS WELL AS A FEW ADDITIONAL INSTRUCTIONS (SMB, RMB, BBS, BBR) WHICH ALLOW SETTING, CLEARING, AND TESTING OF INDIVIDUAL BITS WITHIN AN 8-BIT BYTE IN MEMORY. THE R65/11EB ALSO CONTAINS A NUMBER OF MEMORY MAPPED INTERNAL REGISTERS WHICH ALLOW ACCESS TO AN INTERRUPT ENABLE REGISTER, INTERRUPT FLAG REGISTER, I/O PORTS, COUNTER/TIMERS, AND A SERIAL UART, ALL OF WHICH ARE CONTAINED WITHIN THE CHIP.

THE R65/11EB MICROCOMPUTER ACCEPTS, VIA A PIGGY-BACKED 24-PIN SOCKET, STANDARD 2732-SERIES 5 VOLT, 24-PIN 4-KILOBYTE EPROM MEMORIES, AND IT IS WITHIN ONE SUCH EPROM THAT THE SOFTWARE SHOWN IN THIS LISTING WOULD BE STORED. THE R65/11EB LOCATES THIS EPROM IN THE UPPERMOST 4 KILOBYTES (HEXADECIMAL LOCATIONS 0F000 TO 0FFFF) OF THE 64 KILOBYTE ADDRESS SPACE OF THE PROCESSOR. HENCE, THE SOFTWARE SHOWN IN THIS LISTING BEGINS AT HEXADECIMAL ADDRESS 0F000 AND ENDS AT HEXADECIMAL ADDRESS 0FFFF.

THE R65/11EB CONTAINS 192 BYTES OF STATIC RAM, LOCATED IN THE LOWEST 256 BYTE PAGE ("PAGE ZERO") AT HEXADECIMAL LOCATIONS 00040 TO 0000FF. THE REMAINING BYTES OF "PAGE ZERO" (I.E., HEXADECIMAL LOCATIONS 00000 TO 0003F) ARE RESERVED FOR INTERNAL CPU REGISTERS AND I/O PORTS. NOTE THAT "PAGE ONE" OF MEMORY (I.E., HEXADECIMAL LOCATIONS 00100 TO 001FF), WHICH IS NORMALLY USED FOR THE PROCESSOR'S STACK, IS MAPPED ONTO "PAGE ZERO". THUS, ENOUGH SPACE MUST LEFT UNUSED FOR THE TOP OF "PAGE ZERO" IN ORDER TO ALLOW ROOM FOR THE PROCESSOR STACK.

THE R65/11EB REQUIRES A SINGLE +5 VOLT POWER SUPPLY, PLUS AN EXTERNAL CRYSTAL OR CLOCK OPERATING
AT EITHER 1 OR 2 MHZ. WITH THE EXCEPTION OF THE ADDRESS AND DATA LINES THAT CONNECT TO THE
PIGGY-BACKED 24-PIN EPROM SOCKET, THE ADDRESS AND DATA BUSES OF THE R65/11EB REMAIN WITHIN THE
CHIP AND DO NOT NORMALLY INTERFACE TO THE OUTSIDE. BESIDES THE POWER, GROUND, AND EXTERNAL CLOCK
CONNECTIONS, THE REMAINDER OF THE INTERFACE PINS ON THE R65/11EB CHIP CONSIST OF 32 BITS OF
BIDIRECTIONAL I/O PORTS (ORGANIZED AS 4 SEPARATE 8-BIT I/O PORTS, PORTS "A", "B", "C", AND "D"),
AS WELL AS THE "NMI" (NON-MASKABLE INTERRUPT) AND "RESET" (POWER-UP RESET) LINES FOUND ON ALL
6502-TYPE PROCESSORS. THE PIN CONFIGURATION OF THE 40-PIN R65/11EB CHIP IS AS FOLLOWS:

PINS 1,2,3:    CONNECTIONS FOR EXTERNAL CRYSTAL OR FOR EXTERNALLY
               GENERATED CLOCK FREQUENCY. SEE DATA SHEET FOR DETAILS.
PINS 4-11:     I/O PORT BITS FOR PORT "C".
PINS 12-19:    I/O PORT BITS FOR PORT "D".
PIN 20:        6502-STYLE RESET LINE (MUST BE PULSED LOW ON POWER UP)
PIN 21:        +5 VOLT CONNECTION
PIN 22:        6502-STYLE NON-MASKABLE INTERRUPT (PULSED LOW FOR "NMI")
PINS 23-30:    I/O PORT BITS FOR PORT "A"
PINS 31-38:    I/O PORT BITS FOR PORT "B"
PIN 39:        CONNECTION FOR BATTERY BACKUP OF RAM LOCATIONS HEX 40-5F
PIN 40:        SIGNAL AND POWER GROUND (ZERO VOLTS)

SOME OF THE R65/11EB'S I/O PORT BITS PROVIDE SPECIAL FUNCTIONALITY, IN PARTICULAR:

PORT "A" BIT 0 (R65/11EB CHIP PIN 30):
    THIS I/O PORT BIT IS EDGE SENSITIVE, AND ANY POSITIVE-GOING TRANSITIONS ON THIS PIN WILL
    CAUSE A CORRESPONDING BIT TO BE LATCHED HIGH IN THE INTERRUPT FLAG REGISTER, AND IF
    ENABLED, CAUSE AN INTERRUPT REQUEST (IRQ) TO THE PROCESSOR.

PORT "A" BIT 1 (R65/11EB CHIP PIN 29):
    THIS I/O PORT BIT IS EDGE SENSITIVE, AND ANY POSITIVE-GOING TRANSITIONS ON THIS PIN WILL
    CAUSE A CORRESPONDING BIT TO BE LATCHED HIGH IN THE INTERRUPT FLAG REGISTER, AND IF
    ENABLED, CAUSE AN INTERRUPT REQUEST (IRQ) TO THE PROCESSOR.

PORT "A" BIT 2 (R65/11EB CHIP PIN 28):
    THIS I/O PORT BIT IS EDGE SENSITIVE, AND ANY NEGATIVE-GOING TRANSITIONS ON THIS PIN WILL
    CAUSE A CORRESPONDING BIT TO BE LATCHED HIGH IN THE INTERRUPT FLAG REGISTER, AND IF
    ENABLED, CAUSE AN INTERRUPT REQUEST (IRQ) TO THE PROCESSOR.

PORT "A" BIT 3 (R65/11EB CHIP PIN 27):
    THIS I/O PORT BIT IS EDGE SENSITIVE, AND ANY NEGATIVE-GOING TRANSITIONS ON THIS PIN WILL
    CAUSE A CORRESPONDING BIT TO BE LATCHED HIGH IN THE INTERRUPT FLAG REGISTER, AND IF
    ENABLED, CAUSE AN INTERRUPT REQUEST (IRQ) TO THE PROCESSOR.

PORT "A" BIT 6 (R65/11EB CHIP PIN 24):
    THIS I/O PORT BIT CAN BE CONFIGURED AS THE OUTPUT OF A SERIAL UART (UNIVERSAL ASYNCHRO-
    NOUS RECEIVER/TRANSMITTER) WHICH CAN BE OPERATED AT SPEEDS FROM 300 TO 9600 BAUD. IT
    PROVIDES SERIAL ASCII OUTPUTS AT TTL LEVELS APPROPRIATE FOR DRIVING EXTERNAL LEVEL
    CONVERSION CHIPS FOR GENERATING EITHER RS-232 OR RS-422 SERIAL OUTPUTS.

PORT "A" BIT 7 (R65/11EB CHIP PIN 23):
    THIS I/O PORT BIT CAN BE CONFIGURED AS THE INPUT OF A SERIAL UART WHICH CAN BE OPERATED
    AT SPEEDS FROM 300 TO 9600 BAUD. IT ACCEPTS SERIAL ASCII INPUT AT TTL LEVELS THAT COULD
    BE PROVIDED BY EXTERNAL LEVEL CONVERSION CHIPS FOR EITHER RS-232 OR RS-422 INTERFACES.

3. DETAILED DESCRIPTION OF HOW THE R65/11EB MICROCOMPUTER INTERFACES TO THE OTHER COMPONENTS

THE R6511/EB'S I/O PORT BITS PROVIDE THE MEANS FOR SUPPLYING THE SIGNALS (57, 58, AND 59) DERIVED
FROM THE OPTICAL SENSORS 42, 43, AND 44 TO THE MICROCOMPUTER 70. THE POSITION RESULT, CLOCK
PULSE SIGNAL 73, DIRECTION LEVEL SIGNAL 72, INDEX PULSE SIGNAL, AND ERROR STATUS SIGNALS ARE
ALL OUTPUT USING OTHER I/O PORT BITS.

THE I/O PORT BITS OF THE R65/11EB ARE CONNECTED TO THE OTHER COMPONENTS OF THE SYSTEM AS FOLLOWS:

PORT "A" BIT 0 (R65/11EB CHIP PIN 30):
    THIS PIN RECEIVES THE SIGNAL 58 (CHANNEL "B") DERIVED FROM THE OPTICAL SENSOR 43 WHICH
    SCANS THE TIMING TRACK 32. IT IS USED TO DETERMINE THE CURRENT STATE (HIGH OR LOW) OF
    AND TO DETECT POSITIVE TRANSITIONS OF, SIGNAL 58 (CHANNEL "B").

```
PORT "A" BIT 1 (R65/11EB CHIP PIN 29):
     THIS PIN RECEIVES THE SIGNAL 32 (CHANNEL "A") DERIVED FROM THE OPTICAL SENSOR 42 WHICH
     SCANS THE TIMING TRACK 32. IT IS USED TO DETERMINE THE CURRENT STATE (HIGH OR LOW) OF,
     AND TO DETECT POSITIVE TRANSITIONS OF, SIGNAL 57 (CHANNEL "A").

PORT "A" BIT 2 (R65/11EB CHIP PIN 28):
     THIS PIN RECEIVES THE SIGNAL 32 (CHANNEL "A") DERIVED FROM THE OPTICAL SENSOR 42 WHICH
     SCANS THE TIMING TRACK 32. IT IS USED TO DETECT NEGATIVE TRANSITIONS OF SIGNAL 57
     (CHANNEL "A").

PORT "A" BIT 3 (R65/11EB CHIP PIN 27):
     THIS PIN RECEIVES THE SIGNAL 32 (CHANNEL "B") DERIVED FROM THE OPTICAL SENSOR 43 WHICH
     SCANS THE TIMING TRACK 32. IT IS USED TO DETECT NEGATIVE TRANSITIONS OF SIGNAL 58
     (CHANNEL "B").

PORT "A" BIT 4 (R65/11EB CHIP PIN 26):
     THIS PIN RECEIVES THE SIGNAL 59 (CHANNEL "D") DERIVED FROM THE OPTICAL SENSOR 44 WHICH
     SCANS THE DATA TRACK 33. IT IS USED TO DETERMINE THE CURRENT STATE (HIGH OR LOW) OF
     SIGNAL 59 (CHANNEL "D").

PORT "A" BIT 5 (R65/11EB CHIP PIN 25):
     THIS PIN CAN BE USED FOR CONTROLLING THE TRANSMIT ENABLE LINE OF AN EXTERNAL RS-422 LEVEL
     CONVERTER CHIP SHOULD THIS TYPE OF CONVERTER BE USED IN CONJUNCTION WITH THE ASCII SERIAL
     OUTPUT AVAILABLE ON PORT "A" BIT 6 (PIN 24). THIS WOULD ALLOW THIS PORT TO
     BE USED ON A MULTI-DROPPED RS-422 SERIAL BUS. IN THE IMPLEMENTATION ILLUSTRATED IN THIS
     APPENDIX, THIS PIN IS NOT USED.

PORT "A" BIT 6 (R65/11EB CHIP PIN 24):
     THIS PIN IS USED FOR SERIAL ASCII OUTPUT IN THIS IMPLEMENTATION. SUCH OUTPUT IS
     PROVIDED PRIMARILY FOR DIAGNOSTIC AND DEBUGGING PURPOSES. DETAILS OF THE SERIAL OUTPUT
     GENERATED ARE GIVEN LATER IN SECTION 17 OF THIS APPENDIX.

PORT "A" BIT 7 (R65/11EB CHIP PIN 23):
     THIS PIN CAN BE USED FOR SERIAL ASCII INPUT. IN THE IMPLEMENTATION DESCRIBED IN THIS
     LISTING, THIS PIN IS NOT USED.

THE REMAINING I/O PORT BITS ARE ALL CONFIGURED AS OUTPUTS, AND ARE CONNECTED AS FOLLOWS:

PORT "B" BIT 0 (R65/11EB CHIP PIN 38):
     THIS PIN PROVIDES A NEGATIVE-GOING POSITION-INDEX PULSE THAT IS GENERATED ONCE PER
     REVOLUTION OF THE ENCODER BAND 30. IT IS SIMILAR TO THE INDEX PULSE OFTEN PROVIDED ON
     CONVENTIONAL INCREMENTAL ENCODERS, AND OCCURS COINCIDENT WITH THE NEGATIVE-GOING CLOCK
     PULSE SIGNAL 73 (SEE BELOW).

THIS SIGNAL ALSO SERVES AS AN "ABSOLUTE POSITION UNKNOWN" LEVEL, AND OPERATES AS FOLLOWS:

ON POWER-UP, THIS SIGNAL IS HELD LOW UNTIL THE ENCODER BAND 30 HAS MOVED ENOUGH SO THAT
     SUFFICIENT ABSOLUTE POSITION TAGS 36 ARE ENCOUNTERED TO INITIALIZE THE ABSOLUTE POSITION.
     SINCE THIS INDEX PULSE SIGNAL NORMALLY CAN GO LOW ONLY WHEN THE CLOCK PULSE SIGNAL 73
     GOES LOW, IF THE INDEX PULSE SIGNAL IS SEEN IN THE LOW STATE WHILE THE CLOCK PULSE SIGNAL
     73 IS IN THE HIGH STATE, THEN THIS INDICATES THAT THE ABSOLUTE POSITION IS NOT YET KNOWN.

PORT "B" BIT 1 (R65/11EB CHIP PIN 37):
     THIS PIN PROVIDES A NEGATIVE-GOING CLOCK PULSE SIGNAL 73 FOR EACH INCREMENTAL TICK OF
     MOTION, AND CAN BE USED EXTERNALLY FOR DETERMINING THE SPEED OF THE ENCODER BAND 30 BY
     MEASURING THE RATE AT WHICH THESE PULSES ARE GENERATED.

THIS SIGNAL ALSO SERVES AS A DATA VALID LEVEL. WHEN IN THE LOW STATE, IT INDICATES THAT
     THE PARALLEL DATA ON OUTPUT PORTS "C" AND "D" ARE INVALID. THE RISING EDGE OF THIS CLOCK
     PULSE SIGNAL 73 CAN BE USED AS A DATA STROBE TO LATCH THE CURRENT POSITION DATA FROM THE
     OUTPUT PORTS "C" AND "D" INTO SOME EXTERNAL REGISTER CONNECTED TO THESE TWO PORTS.

PORT "B" BIT 2 (R65/11EB CHIP PIN 36):
     THIS PIN PROVIDES A DIRECTION LEVEL SIGNAL 72 THAT INDICATES THE DIRECTION (RIGHT OR
     LEFT, UP OR DOWN, CLOCKWISE OR COUNTER-CLOCKWISE, POSITIVE OR NEGATIVE) IN WHICH THE
     ENCODER BAND 30 IS EITHER CURRENTLY MOVING OR IN WHICH IT LAST MOVED. IN CONJUNCTION
     WITH THE CLOCK PULSE SIGNAL 73, IT CAN BE USED EXTERNALLY TO GENERATE UP-COUNT AND
     DOWN-COUNT PULSES, SHOULD THESE BE NEEDED.
```

PORT "B" BIT 3 (R65/11EB CHIP PIN 35):
THIS PIN PROVIDES A PULSE AT A MINIMUM OF ONCE EVERY 200 MILLI-SECONDS AS LONG AS THE
PROGRAM DESCRIBED IN THIS SOURCE LISTING IS BEING EXECUTED PROPERLY, AND THE ENCODER
BAND 30 IS NOT MOVING AT EXCESSIVELY HIGH SPEED. THIS PULSE CAN BE USED TO RETRIGGER A
HARDWARE "WATCHDOG" TIMER, WHICH WILL TIME-OUT AND SIGNAL A FAULT CONDITION IF THE
PROGRAM CEASES TO RUN. EXPIRATION OF THE "WATCHDOG" TIMER COULD ALSO BE USED TO PULSE
THE MICROPROCESSOR'S RESET LINE (R65/11EB CHIP PIN 20) IN AN EFFORT TO RESTART THE
PROGRAM, SHOULD THE FAULT HAVE RESULTED FROM A TRANSIENT EVENT SUCH AS STATIC DISCHARGE.
SUCH A RESTART VIA THE "RESET" ROUTINE WILL FORCE THE ENCODER BACK TO THE "UNINITIALIZED"
STATE (SEE DESCRIPTION OF INDEX PULSE ABOVE).

PORT "B" BITS 4 TO 6 (R65/11EB CHIP PINS 34-32):
THESE THREE PINS OUTPUT A 3-BIT BINARY NUMBER (PIN 32 IS THE MOST SIGNIFICANT BIT, PIN 34
THE LEAST SIGNIFICANT) WHICH IS AN ERROR CODE INDICATING WHAT TYPE OF ENCODER ERROR (IF
ANY) HAS BEEN DETECTED. THESE BITS ARE ONLY MEANINGFUL IF THE ERROR FLAG BIT (SEE BELOW)
IS IN THE LOW STATE. THESE 3-BITS PROVIDE 8 DIFFERENT ERROR CODES, DEFINED AS FOLLOWS:

ERROR CODE 0:   FAULTY RAM MEMORY DETECTED ON POWER-UP, OR EDGE DETECT FAILURE SENSED
                (I.E., A SIGNAL WAS SENSED MAKING TWO OR MORE CONSECUTIVE POSITIVE-GOING
                TRANSITIONS WITHOUT AN INTERVENING NEGATIVE-GOING TRANSITION, OR VICE
                VERSA). EITHER THE ENCODER BAND 30 IS MOVING EXCESSIVELY FAST (I.E.,
                FASTER THAN THE INTERRUPT SERVICE RATE OF THE MICROPROCESSOR), OR THERE
                IS HIGH FREQUENCY NOISE ON EITHER OF THE SIGNALS 57 OR 58, OR THE PROCES-
                SOR IS FAULTY. THIS ERROR CONDITION IS ONLY CLEARED BY A PROCESSOR RESET.

ERROR CODE 1:   THE SIGNAL 57 (CHANNEL "A") DERIVED FROM SENSOR 42 OF THE TIMING TRACK 32
                HAS GONE DEAD. THIS ERROR CONDITION IS CLEARED AS SOON AS SIGNAL 57
                (CHANNEL "A") RESUMES NORMAL ACTIVITY.

ERROR CODE 2:   THE SIGNAL 58 (CHANNEL "B") DERIVED FROM SENSOR 43 OF THE TIMING TRACK 32
                HAS GONE DEAD. THIS ERROR CONDITION IS CLEARED AS SOON AS SIGNAL 58
                (CHANNEL "B") RESUMES NORMAL ACTIVITY.

ERROR CODE 3:   THE SIGNAL 59 (CHANNEL "D") DERIVED FROM SENSOR 44 OF THE TIMING TRACK 33
                HAS GONE DEAD. THIS ERROR CONDITION IS CLEARED AS SOON AS SIGNAL 59
                (CHANNEL "D") RESUMES NORMAL ACTIVITY.

ERROR CODE 4:   POSITION ERROR MISMATCH, I.E., AN ABSOLUTE POSITION TAG 36 WAS JUST
                DECODED, AND THE ABSOLUTE POSITION IT PROVIDED DISAGREED WITH THE CURRENT
                INCREMENTAL POSITION. THE INCREMENTAL POSITION WAS THEN RESET TO MATCH
                THE ABSOLUTE POSITION. THIS ERROR CONDITION IS CLEARED AS SOON AS THE
                NEXT ABSOLUTE POSITION TAG 36 IS DECODED WHICH DOES NOT DISAGREE WITH
                THE CURRENT INCREMENTAL POSITION.

ERROR CODE 5:   TAG PARITY ERROR, I.E., AN ABSOLUTE POSITION TAG 36 WITH INCORRECT PARITY
                WAS ENCOUNTERED. THIS ERROR CONDITION IS CLEARED AS SOON AS THE NEXT
                ABSOLUTE POSITION TAG 36 WITH CORRECT PARITY IS ENCOUNTERED.

ERROR CODE 6:   TAG ADJACENCY ERROR, I.E., AN ABSOLUTE POSITION TAG 36 WITH PROPER PARITY
                WAS ENCOUNTERED IN THE WRONG SEQUENCE. SPECIFICALLY, THIS TAG 36 IS NOT
                LOCATED PHYSICALLY ADJACENT ON THE ENCODER BAND 30 TO TAG 36 ENCOUNTERED JUST
                BEFORE. THIS ERROR CONDITION IS CLEARED AS SOON AS TWO PHYSICALLY ADJA-
                CENT ABSOLUTE POSITION TAGS 36 ARE ENCOUNTERED IN THE PROPER SEQUENCE.

ERROR CODE 7:   TAG MISSING ERROR, I.E., THE ENCODER HAS SENSED SUFFICIENT INCREMENTAL
                MOTION (SINCE THE LAST ABSOLUTE POSITION TAG 36 WAS DETECTED) SO THAT
                A NEW ABSOLUTE POSITION TAG 36 SHOULD HAVE BEEN DETECTED BY NOW, BUT NONE
                HAS BEEN. THIS ERROR CONDITION IS CLEARED AS SOON AS AN ABSOLUTE
                POSITION TAG 36 IS ENCOUNTERED.

PORT "B" BIT 7 (R65/11EB CHIP PIN 31):
THIS PIN PRODUCES AN "ERROR FLAG" LEVEL WHICH REMAINS LOW AS LONG AS ANY OF THE EIGHT
ERROR CONDITIONS (INDICATED BY THE EIGHT ERROR CODES DEFINED ABOVE) REMAIN TRUE. WHEN
THERE ARE NO ACTIVE ERROR CONDITIONS, THIS SIGNAL LEVEL WILL GO HIGH.

```
PORT "C"  BITS 0-7  (R65/11EB CHIP PINS 4-11) AND
PORT "D"  BITS 0-7  (R65/11EB CHIP PINS 19-12):

THESE 16 PINS ARE USED TO OUTPUT THE POSITION OF THE ENCODER BAND 30 IN PARALLEL FORM AS
      A 16-BIT BINARY INTEGER.  (WITH MINOR REPROGRAMMING, THESE 16 I/O PORT BITS COULD INSTEAD
      BE USED TO OUTPUT FOUR 4-BIT BINARY CODED DECIMAL DIGITS.)  THE LEAST SIGNIFICANT 8 BITS
      OF THE 16-BIT BINARY POSITION ARE OUTPUT BY PORT "C" (WITH PORT "C" BIT 0, OR PIN 4,
      BEING THE LEAST SIGNIFICANT BIT), AND THE MOST SIGNIFICANT 8 BITS OF THE 16 ARE OUTPUT
      BY PORT "D" (WITH PORT "D" BIT 7, OR PIN 12, BEING THE MOST SIGNIFICANT BIT).

THIS CONCLUDES THE DEFINITION OF THE EXTERNAL CONNECTIONS TO THE R65/11EB'S I/O PORT BITS,
AS CAN BE SEEN FROM THE ABOVE DESCRIPTIONS, USING ONLY THE THREE SIGNALS 57, 58, AND 59 AS INPUTS
(ALONG WITH THE +5 VOLT POWER AND CRYSTAL CLOCK SIGNAL), THIS CHIP IS ABLE TO PRODUCE ALL OF THE
SIGNALS TYPICALLY PRODUCED BY CONVENTIONAL INCREMENTAL POSITION ENCODERS (I.E., INDEX PULSE
SIGNAL, CLOCK PULSE SIGNAL 73, AND DIRECTION LEVEL SIGNAL 72), AS WELL AS A 16-BIT PARALLEL
BINARY POSITION OUTPUT, AS IS TYPICALLY PRODUCED BY CONVENTIONAL ABSOLUTE POSITION ENCODERS.

4.   SUMMARY OF THE OVERALL SOFTWARE FLOW

AS IS THE CASE IN MOST PROCESSORS WHICH SUPPORT THE 6502 INSTRUCTION SET, POWER-UP AND INTERRUPT
CONTROL ARE HANDLED VIA THREE VECTORS THAT ARE LOCATED IN FIXED POSITIONS AT THE VERY TOP OF THE
ADDRESS SPACE.  THESE THREE VECTORS ARE THE NMI VECTOR (SYMBOLICALLY REFERRED TO IN THIS LISTING
AS "NMIVEC"), THE RESET VECTOR ("RESVEC"), AND THE INTERRUPT REQUEST VECTOR ("IRQVEC").  THESE
VECTORS APPEAR AT THE VERY END OF THIS APPENDIX.

"NMIVEC" CONTAINS THE ADDRESS OF A ROUTINE WHICH RECEIVES CONTROL WHENEVER THE "NMI" (NON-MASK-
ABLE INTERRUPT) LINE (PIN 22) IS PULLED LOW.  IN THIS IMPLEMENTATION, THE "NMI" LINE IS NOT USED,
SO "NMIVEC" POINTS TO A NULL SERVICE ROUTINE.

"RESVEC" CONTAINS THE ADDRESS OF A ROUTINE ("RESSRV") WHICH "RESET" SERVICE ROUTINE WHENEVER THE "RESET"
LINE (PIN 20) IS PULLED LOW, TYPICALLY ON POWER-UP.  THIS "RESET" SERVICE ROUTINE ("RESSRV")
PERFORMS ALL OF THE INITIALIZATION TASKS REQUIRED AT PROGRAM START-UP ON COMPLETION OF THE
THESE TASKS, THE "RESET" ROUTINE ("RESSRV") TRANSFERS CONTROL TO THE MAIN IDLE LOOP ("IDLE"),
WHICH IS WHERE THE PROGRAM SPENDS MOST OF ITS TIME WHEN IT IS NOT SERVICING INTERRUPT REQUESTS.
THE "IDLE" LOOP UPDATES THE "ERROR FLAG" AND "ERROR CODE" BITS ON I/O PORT "B", AND ALSO OPTION-
ALLY GENERATES DIAGNOSTIC DATA ON THE ASCII SERIAL OUTPUT.

"IRQVEC" CONTAINS THE ADDRESS OF A ROUTINE ("IRQSRV") WHICH RECEIVES CONTROL WHENEVER AN INTER-
RUPT REQUEST OCCURS.  IN THIS IMPLEMENTATION, THERE ARE FOUR SOURCES OF INTERRUPT REQUESTS,
NAMELY, POSITIVE-GOING OR NEGATIVE-GOING TRANSITIONS ON EITHER OF THE TWO SIGNALS 57 OR 58.
BY CONNECTING THESE TWO SIGNALS TO THE SPECIAL EDGE-SENSITIVE I/O PORT BITS (BITS 0 TO 3 OF PORT
"A"), SUCH TRANSITIONS ARE DETECTED AND LATCHED IN THE PROCESSOR'S INTERRUPT FLAG REGISTER
("IFR").  BY SETTING THE CORRESPONDING BITS IN THE PROCESSOR'S INTERRUPT ENABLE REGISTER ("IER"),
THESE TRANSITIONS GENERATE INTERRUPT REQUESTS AS WELL.  THE TOP LEVEL ROUTINE ("IRQSRV") POINTED
TO BY "IRQVEC" IS AN INTERRUPT DISPATCHER ROUTINE, WHICH SEQUENTIALLY TESTS THE BITS OF THE
INTERRUPT FLAG REGISTER ("IFR") TO DETERMINE WHICH TYPE OF TRANSITION ON WHICH SIGNAL CAUSED THE
CURRENT INTERRUPT REQUEST ("IRQSRV") THEN TRANSFERS CONTROL TO THE
APPROPRIATE INTERRUPT SERVICE ROUTINE, AS INDICATED IN THE DIAGRAM BELOW.

IT IS WITHIN THESE INTERRUPT SERVICE ROUTINES THAT ALL OF THE PROCESSING OF THE INPUT SIGNALS 57,
58, AND 59 TAKES PLACE.  IT IS ALSO WHERE THE OUTPUT SIGNALS (INDEX PULSE SIGNAL, CLOCK PULSE
SIGNAL 73, AND DIRECTION LEVEL SIGNAL 72 ON I/O PORT "B", PLUS THE 16-BIT PARALLEL BINARY INTEGER
POSITION OUTPUT ON I/O PORTS "C" AND "D") ARE GENERATED.  AS A RESULT, THE MAXIMUM ALLOWABLE
SPEED OF THE ENCODER BAND 30 IS SET BY THE TOP SPEED AT WHICH THE R65/11EB MICROPROCESSOR CAN
SERVICE THESE INTERRUPTS, AND SHOULD NOT EXCEED 100 INCREMENTAL TICKS PER SECOND.  NOTE THAT
NON-INTERRUPT BASED IMPLEMENTATIONS ARE POSSIBLE, AND THESE MAY PROVIDE SOME SLIGHT SPEED
ADVANTAGES.

FOR APPLICATIONS IN WHICH HIGHER SPEED MOTIONS MUST BE MEASURED, EITHER A FASTER MICROPROCESSOR
SHOULD BE USED, OR THE LOGIC CONTAINED IN THIS SOFTWARE CAN BE REALIZED (USING APPROXIMATELY 80
READILY AVAILABLE INTEGRATED CIRCUIT CHIPS) IN DISCRETE DIGITAL LOGIC CIRCUITS.  USING DISCRETE
DIGITAL LOGIC CIRCUITS, HIGH SPEED MOTIONS UP TO ABOUT 400,000 INCREMENTAL TICKS PER SECOND CAN
BE ACCOMODATED.
```

5. SIMPLIFIED FLOW DIAGRAM OF THE INTERRUPT PROCESSING

```
+--------+   +---------+       +--------------------+
|"IRQVEC"|:->|"IRQSRV" |  -->  |INTERRUPT DISPATCHER "IRQSRV"|
+--------+   +---------+       +--------------------+
                                  |        |        |        |
SERVICE ROUTINES  -->         +-------+ +-------+ +-------+ +-------+
                              |"IRAPOS"| |"IRANEG"| |"IRBPOS"| |"IRBNEG"|
                              +-------+ +-------+ +-------+ +-------+
                                  |        |        |        |
                              +-------+              +-------+
                              |"IRACOM"|             |"IRBCOM"|
                              +-------+              +-------+
                                       \             /
                                      +----------+
                                      | "COMOTN" |
                                      +----------+
                                           |
                                      +----------+
                                      | "CHKDMT" |
                                      +----------+
                                           |
                                      +----------+
                                      | "UPDATE" |
                                      +----------+
                                           |
                                  +--------------------+
                                  |INTERRUPT EXIT "INTXIT"|
                                  +--------------------+
```

"IRACOM" AND "IRBCOM" CHECK FOR EDGE DETECT FAULTS, SIGNAL FAILURES, AND COMPARE THE PHASE OF SIGNALS 57 (A) AND 58 (B).

NOTES:

1. POSITIVE TRANSITIONS OF SIGNAL 57 INVOKE "IRAPOS", WHILE NEGATIVE TRANSITIONS INVOKE "IRANEG", AND BOTH CALL "IRACOM".

2. POSITIVE TRANSITIONS OF SIGNAL 58 INVOKE "IRBPOS", WHILE NEGATIVE TRANSITIONS INVOKE "IRBNEG", AND BOTH CALL "IRBCOM".

3. "COMOTN" HANDLES OPERATIONS COMMON TO ALL MOTIONS, SUCH AS UPDATING THE INCRE- MENTAL POSITION UP/DOWN COUNTER 74, AND SHIFTING THE SHIFT REGISTERS 75 AND 76. IT CHECKS FOR TAG 36 FRAMING, AND DOES TAG ERROR CHECKING AND DECODING.

4. "CHKDMT" CHECKS FOR FAILURE OF SIGNAL 59 AND FOR MISSED TAGS.

5. "UPDATE" OUTPUTS THE CLOCK PULSE SIGNAL 73, DIRECTION LEVEL SIGNAL 72, INDEX PULSE SIGNAL, AND THE POSITION OUTPUT.

--------

6. NOTES ON THE SYNTAX OF THE ASSEMBLER PROGRAM USED TO ASSEMBLE THIS LISTING

THE SOURCE CODE IN THIS LISTING CONSISTS OF STANDARD 6502 ASSEMBLER COMMANDS, PLUS THOSE COMMANDS WHICH IMPLEMENT THE BIT SET, BIT CLEAR, AND BIT TEST INSTRUCTIONS OF THE R6500/11 MICROCOMPUTERS. THE ASSEMBLER ALSO SUPPORTS THE FOLLOWING ASSEMBLER PSEUDO-OPERATORS:

THE ^L OPERATOR OBTAINS THE LEAST SIGNIFICANT BYTE OF A 2-BYTE QUANTITY
THE ^M OPERATOR OBTAINS THE MOST SIGNIFICANT BYTE OF A 2-BYTE QUANTITY

THE ^H OPERATOR INDICATES THE CONSTANT WHICH FOLLOWS IT IS IN HEXADECIMAL
THE ^D OPERATOR INDICATES THE CONSTANT WHICH FOLLOWS IT IS IN DECIMAL
THE ^B OPERATOR INDICATES THE CONSTANT WHICH FOLLOWS IT IS IN BINARY

THE ANGLE BRACKETS < AND > OBTAIN THE LOG BASE TWO OF THE ENCLOSED QUANTITY. IF THE RESULT IS NOT AN INTEGER, AN ERROR IS DIAGNOSED. THE ANGLE BRACKETS ARE USED FOR CONVERTING BIT VALUES INTO THE BIT NUMBERS REQUIRED BY THE 6500/11 EXTENDED INSTRUCTION SET. THE VARIOUS CONVERSIONS ARE AS FOLLOWS:

```
<1>    YIELDS  0   ;VALUE OF   1 MAPS TO BIT NUMBER 0
<2>    YIELDS  1   ;VALUE OF   2 MAPS TO BIT NUMBER 1
<4>    YIELDS  2   ;VALUE OF   4 MAPS TO BIT NUMBER 2
<8>    YIELDS  3   ;VALUE OF   8 MAPS TO BIT NUMBER 3
<16>   YIELDS  4   ;VALUE OF  16 MAPS TO BIT NUMBER 4
<32>   YIELDS  5   ;VALUE OF  32 MAPS TO BIT NUMBER 5
<64>   YIELDS  6   ;VALUE OF  64 MAPS TO BIT NUMBER 6
<128>  YIELDS  7   ;VALUE OF 128 MAPS TO BIT NUMBER 7
```

```
476  ;  THE .EQU OPERATOR IS USED TO DEFINE A SYMBOL EQUAL TO THE GIVEN VALUE
477  ;
478  ;  THE .ORG OPERATOR RESETS THE CURRENT LOCATION COUNTER TO THE GIVEN VALUE
479  ;
480  ;  THE .BYTE OPERATOR RESERVES 1 BYTE OF MEMORY STARTING AT THE CURRENT LOCATION
481  ;
482  ;  THE .DBYTE OPERATOR RESERVES 2 BYTES OF MEMORY STARTING AT THE CURRENT LOCATION
483  ;
484  ;  THE .QBYTE OPERATOR RESERVES 4 BYTES OF MEMORY STARTING AT THE CURRENT LOCATION
485  ;
486  ;  THE .ZERO OPERATOR RESERVES THE GIVEN NUMBER OF BYTES STARTING AT THE CURRENT LOCATION AND SETS THEM
487  ;         TO ZERO.
488  ;
489  ;  THE . OPERATOR RETURNS THE VALUE OF THE CURRENT LOCATION COUNTER
490  ;
491  ;  THE # OPERATOR INDICATES AN IMMEDIATE MODE VALUE
492  ;
493  ;  ALSO NOTE THAT STATEMENT LABELS BEGINNING WITH THE DOLLAR SIGN CHARACTER ("$") AND FOLLOWED BY A NUMBER
494  ;  BETWEEN 0 AND 255 (FOR EXAMPLE, $10 ) ARE USED AS LOCAL SYMBOLS. THE SCOPE OF THESE LOCAL SYMBOLS IS
495  ;  LIMITED TO THE RANGE BETWEEN THE CLOSEST TWO NEIGHBORING STATEMENTS THAT ARE LABELLED WITH NON-LOCAL
496  ;  SYMBOLS.
497  ;
498  ;       7.   DESCRIPTION OF THE PHASE COMPARATOR IMPLEMENTATION
499  ;
500  ;  THE PHASE COMPARATOR 71 AS IMPLEMENTED IN THIS SOFTWARE IS CAPABLE OF OPERATING AT EITHER
501  ;  1X, 2X, OR 4X THE SPATIAL FREQUENCY OF THE LINE PAIRS ON THE TIMING TRACK 32 OF THE ENCODER
502  ;  BAND 30. THE LOGICAL RULES USED TO IMPLEMENT THESE THREE DIFFERENT OPERATING FREQUENCIES ARE
503  ;  ARE LISTED BELOW. NOTE THAT THE RULES FOR THE "1X" AND "2X" OPERATING FREQUENCIES ARE A SUBSET
504  ;  OF THE RULES FOR THE "4X" FREQUENCY. ALSO NOTE THAT THE PRIME SYMBOL (') IS USED TO INDICATE
505  ;  RULES THAT ARE COMPLEMENTARY WITH RESPECT TO THE SIGNAL IN TRANSITION.
506  ;
507  ;  THE RULES LISTED BELOW ASSUME THAT THE SPACING BETWEEN THE OPTICAL SENSORS 42 AND 44 HAS BEEN
508  ;  ADJUSTED SO THAT SIGNAL 58 LAGS SIGNAL 57 BY 90 DEGREES WHEN THE ENCODER BAND 30 IS MOVING
509  ;  TO THE LEFT. (THIS IS DIFFERENT THAN THE SENSOR SPACING SHOWN IN FIGURE 8 OF THE SPECIFICATION.)
510  ;  MOTION (OF THE ENCODER BAND 30) TO THE LEFT GENERATES A "DOWN" COUNT, WHILE MOTION TO THE RIGHT
511  ;  GENERATES AN "UP" COUNT. NOTE THAT THESE RULES CAN BE RE-ARRANGED IF THE SPATIAL RELATIONSHIP
512  ;  BETWEEN CHANNEL "A" AND "B" IS ALTERED, BUT IN ANY CASE, THESE LOGIC RULES WILL ALWAYS DISPLAY
513  ;  THE INDICATED SYMMETRY.
514  ;
515  ;  1X FREQUENCY PHASE COMPARATOR     (ONLY USES TRANSITIONS OF CHANNEL "A" WITH CHANNEL "B" LOW)
516  ;
517  ;  1.   IF POSITIVE TRANSITION ON CHANNEL "A", AND CHANNEL "B" IS IN THE LOW STATE, THEN COUNT DOWN
518  ;  1.'  IF NEGATIVE TRANSITION ON CHANNEL "A", AND CHANNEL "B" IS IN THE LOW STATE, THEN COUNT UP
519  ;
520  ;  2X FREQUENCY PHASE COMPARATOR     (USES ALL CHANNEL "A" TRANSITIONS, BUT NONE FROM CHANNEL "B")
521  ;
522  ;  1.   IF POSITIVE TRANSITION ON CHANNEL "A", AND CHANNEL "B" IS IN THE LOW STATE, THEN COUNT DOWN
523  ;  3.   IF NEGATIVE TRANSITION ON CHANNEL "A", AND CHANNEL "B" IS IN THE HIGH STATE, THEN COUNT DOWN
524  ;  1.'  IF NEGATIVE TRANSITION ON CHANNEL "A", AND CHANNEL "B" IS IN THE LOW STATE, THEN COUNT UP
525  ;  3.'  IF POSITIVE TRANSITION ON CHANNEL "A", AND CHANNEL "B" IS IN THE HIGH STATE, THEN COUNT UP
526  ;
527  ;  4X FREQUENCY PHASE COMPARATOR     (USES ALL TRANSITIONS FROM BOTH CHANNELS "A" AND "B")
528  ;
529  ;  1.   IF POSITIVE TRANSITION ON CHANNEL "A", AND CHANNEL "B" IS IN THE LOW STATE, THEN COUNT DOWN
530  ;  1.   IF NEGATIVE TRANSITION ON CHANNEL "B", AND CHANNEL "A" IS IN THE LOW STATE, THEN COUNT DOWN
531  ;  2.   IF NEGATIVE TRANSITION ON CHANNEL "A", AND CHANNEL "B" IS IN THE HIGH STATE, THEN COUNT DOWN
532  ;  3.   IF POSITIVE TRANSITION ON CHANNEL "B", AND CHANNEL "A" IS IN THE HIGH STATE, THEN COUNT DOWN
533  ;  1.'  IF NEGATIVE TRANSITION ON CHANNEL "A", AND CHANNEL "B" IS IN THE LOW STATE, THEN COUNT UP
534  ;  2.'  IF POSITIVE TRANSITION ON CHANNEL "B", AND CHANNEL "A" IS IN THE LOW STATE, THEN COUNT UP
```

```
546
547    3.'  IF POSITIVE TRANSITION ON CHANNEL "A", AND CHANNEL "B" IS IN THE HIGH STATE, THEN COUNT UP
548
549    4.'  IF NEGATIVE TRANSITION ON CHANNEL "B", AND CHANNEL "A" IS IN THE HIGH STATE, THEN COUNT UP
550
551        IN ADDITION, IT IS POSSIBLE TO OPERATE THE INCREMENTAL PORTION OF THE ENCODER
552        (I.E., THE INCREMENTAL POSITION UP/DOWN COUNTER 74) AT A DIFFERENT FREQUENCY THAN THE ABSOLUTE
553        PORTION (I.E. THE SHIFT REGISTERS 75 AND 76, FRAMING GATINGS 78 AND 79, TAG DECODERS 82 AND 83,
554        POSITION MULTIPLEXER 87, ABSOLUTE POSITION REGISTER 90, AND POSITION COMPARATOR 91). FOR
555        EXAMPLE, THE INCREMENTAL PORTION COULD BE CLOCKED AT A 4X FREQUENCY, AND THE ABSOLUTE PORTION AT
556        A 1X FREQUENCY. THIS CAN BE ACCOMPLISHED BY THE APPROPRIATE SELECTION OF THE PARAMETERS "INFREQ"
557        AND "ABFREQ" BELOW. IF THE TWO PORTIONS ARE OPERATED AT DIFFERENT FREQUENCIES, THE INCREMENTAL
558        PORTION IS OPERATED AT THE HIGHER OF THE TWO FREQUENCIES.
559
560        NORMALLY, BOTH PORTIONS OF THE ENCODER ARE CLOCKED AT THE SAME FREQUENCY, AND SUCH IS THE CASE
561        IN THE SPECIFIC IMPLEMENTATION ILLUSTRATED IN THIS LISTING. TO CONFORM TO THE DESCRIPTION IN THE
562        SPECIFICATION, THE PARAMETERS FOR THIS LISTING ARE SET SO THAT BOTH THE INCREMENTAL AND ABSOLUTE
563        PORTIONS ARE CLOCKED USING A PHASE COMPARATOR OPERATING FREQUENCY OF 1X THE SPATIAL FREQUENCY
564        OF THE LINE PAIRS ON THE TIMING TRACK 32 OF THE ENCODER BAND 30.
565
566        FINALLY, IT SHOULD BE NOTED THAT THE SOFTWARE TO IMPLEMENT THE PHASE COMPARATOR 71 IS NOT
567        LOCALIZED WITHIN A SINGLE ROUTINE, BUT IS DISTRIBUTED BETWEEN THE INTERRUPT SERVICE ROUTINES
568        ("IRACOM", "IRBCOM", AND "COMOTN") WHICH SERVICE THE INTERRUPTS RESULTING FROM THE TRANSITIONS
569        OF THE SIGNALS 57 AND 58.
570
571        THE FOLLOWING CODES ARE USED TO REPRESENT THE PHASE COMPARATOR FREQUENCIES. THESE CODES WERE
572        CHOSEN IN ORDER TO SIMPLIFY DIRECT TESTING WITH BRANCH INSTRUCTIONS WITHOUT REQUIRING A COMPARE
573        OPERATION BEFORE THE BRANCH.
574
575        DEFINE SYMBOLS FOR SELECTING THE PHASE COMPARATOR OPERATING FREQUENCY FOR EACH PORTION.
576 0000  FREG1X  .EQU  0             ;CODE FOR 1X FREQUENCY PHASE COMPARISON
577 0001  FREG2X  .EQU  1             ;CODE FOR 2X FREQUENCY PHASE COMPARISON
578 ffffffff FREG4X .EQU -1            ;CODE FOR 4X FREQUENCY PHASE COMPARISON
579
580        SELECT THE FREQUENCIES AT WHICH TO CLOCK THE INCREMENTAL AND ABSOLUTE PORTION OF THE ENCODER
581 0000  INFREQ  .EQU  FREG1X        ;SELECT 1X FREQUENCY FOR INCREMENTAL POSITION
582
583 0000  ABFREQ  .EQU  FREG1X        ;SELECT 1X FREQUENCY FOR ABSOLUTE POSITION
584
585        SINCE THERE ARE THREE DIFFERENT FREQUENCIES (1X, 2X, OR 4X) POSSIBLE FOR EACH OF TWO CLOCKS
586        (THE INCREMENTAL CLOCK AND THE ABSOLUTE CLOCK), THERE ARE 9 POSSIBLE COMBINATIONS. THE FOLLOWING
587        SYMBOL 'COMBIN' TAKES ON A VALUE FROM 1 TO 9, DEPENDING ON WHICH COMBINATION IS CURRENTLY SELECTED.
588
589 0005  COMBIN  .EQU  [[3*[INFREQ+1]]+ABFREQ+2]  ;WHICH COMBINATION
590
591        THE VALUES OF 1 TO 9 FOR 'COMBIN' TRANSLATE TO THE FOLLOWING COMBINATIONS:
592
593                1       INFREQ=4X       ABFREQ=4X
594                2       INFREQ=4X       ABFREQ=1X
595                3       INFREQ=4X       ABFREQ=2X
596                4       INFREQ=1X       ABFREQ=4X       UNSUPPORTED COMBINATION
597                5       INFREQ=1X       ABFREQ=1X
598                6       INFREQ=1X       ABFREQ=2X
599                7       INFREQ=2X       ABFREQ=4X       UNSUPPORTED COMBINATION
600                8       INFREQ=2X       ABFREQ=1X       UNSUPPORTED COMBINATION
601                9       INFREQ=2X       ABFREQ=2X
602
603        THE FOLLOWING OFFSET VALUE IS A FUNCTION OF THE PHASE COMPARATOR OPERATING FREQUENCIES USED TO CLOCK
604        THE INCREMENTAL AND ABSOLUTE PORTIONS OF THE ENCODER. IT IS USED BY THE LEFT TAG DECODER <82> TO ADJUST
605        THE COMPUTED ABSOLUTE POSITION WHEN THE ABSOLUTE POSITION TAG <36> IS PROPERLY FRAMED IN THE "LEFT
606        MOTION SERIAL SHIFT REGISTER" <76>. THIS OFFSET GIVES THE DIFFERENCE IN ABSOLUTE POSITION BETWEEN A
607        GIVEN TAG BEING FRAMED IN THE "LEFT MOTION SERIAL SHIFT REGISTER" <76> AS OPPOSED TO BEING FRAMED IN
608        THE "RIGHT MOTION SERIAL SHIFT REGISTER" <75>.
609
610        THE VALUE OF THIS OFFSET IS THE PRODUCT OF THE NUMBER OF BITS IN THE SERIAL SHIFT REGISTERS
611        (<75> OR <76>) AND THE RATIO OF THE PHASE COMPARATOR OPERATING FREQUENCY USED TO CLOCK THE
612
```

```
                ; INCREMENTAL AND ABSOLUTE PORTIONS OF THE ENCODER. FOR EXAMPLE, IF THE NUMBER OF BITS IN THE
                ; SHIFT REGISTERS IS 24, AND THE INCREMENTAL PORTION IS CLOCKED AT 4X AND THE ABSOLUTE PORTION
                ; IS CLOCKED AT 1X, THEN THE VALUE OF THIS OFFSET WILL BE = (24) * (4X / 1X) = 96.
                ;
                ; IN ORDER TO CONFORM TO THE SPECIFICATION, THE IMPLEMENTATION IN THIS LISTING USES A PHASE COMPARATOR
                ; OPERATING FREQUENCY OF 1X TO CLOCK BOTH THE INCREMENTAL AND ABSOLUTE PORTIONS OF THE ENCODER.
                ; SINCE THE NUMBER OF BITS IN THE SHIFT REGISTERS IN THIS IMPLEMENTATION IS 24, THE VALUE OF THE
                ; OFFSET IS COMPUTED AS (24) * (1X / 1X) = 24.
0018   LDELTA   .EQU    ^D24         ; POSITION OFFSET WHEN TAG FRAMED IN LEFT SHIFT REGISTER 76.
                                     ; THIS OFFSET IS 0 WHEN THE TAG IS FRAMED IN THE RIGHT SHIFT REGISTER 75.

; 8.    DEFINITION OF SYMBOLS FOR REFERENCING THE INTERNAL REGISTERS AND I/O :

; THE FOLLOWING SYMBOLS ARE DEFINED TO ALLOW SYMBOLIC ACCESS TO VARIOUS IN..:
        ; (AND BITS WITHIN THESE REGISTERS) OF THE R65/11EB MICROCOMPUTER FOR ADD:
        ; THE USE OF THESE REGISTERS, SEE THE PRODUCT DESCRIPTION LISTED ABOVE.

; PORT A

0000   PAPORT   .EQU    ^H0000       ; MEMORY MAPPED ADDRESS OF I/O PORT A

0001   PA0POS   .EQU    ^B00000001   ; NORMAL I/O BIT AND POSITIVE EDGE DETECT
0002   PA1POS   .EQU    ^B00000010   ; NORMAL I/O BIT AND POSITIVE EDGE DETECT
0004   PA2NEG   .EQU    ^B00000100   ; NORMAL I/O BIT AND NEGATIVE EDGE DETECT
0008   PA3NEG   .EQU    ^B00001000   ; NORMAL I/O BIT AND NEGATIVE EDGE DETECT
0010   PA4IO    .EQU    ^B00010000   ; NORMAL I/O BIT
0020   PA5IO    .EQU    ^B00100000   ; NORMAL I/O BIT
0040   PA6STO   .EQU    ^B01000000   ; SERIAL COMMUNICATIONS TRANSMITTER OUTPUT
0080   PA7SRI   .EQU    ^B10000000   ; SERIAL COMMUNICATIONS RECEIVER INPUT

; PORT B

0001   PBPORT   .EQU    ^H0001       ; MEMORY MAPPED ADDRESS OF I/O PORT B

0001   PB0IC    .EQU    ^B00000001   ; NORMAL I/O BIT
0002   PB1IO    .EQU    ^B00000010   ; NORMAL I/O BITS
0004   PB2IO    .EQU    ^B00000100   ;       "      "
0008   PB3IO    .EQU    ^B00001000   ;       "      "
0010   PB4IO    .EQU    ^B00010000   ;       "      "
0020   PB5IO    .EQU    ^B00100000   ;       "      "
0040   PB6IO    .EQU    ^B01000000   ;       "      "
0080   PB7IO    .EQU    ^B10000000   ;       "      "

; PORT C

0002   PCPORT   .EQU    ^H0002       ; MEMORY MAPPED ADDRESS OF I/O PORT C    (MCR, MCBSMC

0003   PDPORT   .EQU    ^H0003       ; MEMORY MAPPED ADDRESS OF I/O PORT D

; INTERRUPT FLAG REGISTER AND INTERRUPT ENABLE REGISTER

0010   IFRCLR   .EQU    ^H0010       ; 'RMB #X, IFRCLR' TO CLEAR EDGE DETECT FLAG "X"
0011   IFR      .EQU    ^H0011       ; 'LDA IFR,       TO READ INTERRUPT FLAG REGISTER
0012   IER      .EQU    ^H0012       ; 'LDA IER,       TO READ INTERRUPT ENABLE REGISTE:
                                     ; 'STA IER,       TO WRITE INTERRUPT ENABLE REGISTE:

; BIT ASSIGNMENTS WITHIN INTERRUPT FLAG AND INTERRUPT ENABLE REGISTERS

0080   IFXMTR   .EQU    ^B10000000   ; SERIAL I/O XMIT DATA REGISTER EMPTY FLAG
0040   IFRCVR   .EQU    ^B01000000   ; SERIAL I/O RECEIVE DATA REGISTER FULL FLAG
0020   IFCTRB   .EQU    ^B00100000   ; COUNTER 'B' UNDERFLOW FLAG
0010   IFCTRA   .EQU    ^B00010000   ; COUNTER 'A' UNDERFLOW FLAG
```

```
678  0008          IFPA3N   .EQU    ^B00001000         ;PA3 NEGATIVE EDGE DETECT FLAG
679  0004          IFPA2N   .EQU    ^B00000100         ;PA2 NEGATIVE EDGE DETECT FLAG
680  0002          IFPA1P   .EQU    ^B00000010         ;PA1 POSITIVE EDGE DETECT FLAG
681  0001          IFPA0P   .EQU    ^B00000001         ;PA0 POSITIVE EDGE DETECT FLAG
682
683              ; MODE CONTROL
684
685  0014          MCR      .EQU    ^H0014             ;'LDA MCR'  TO READ MODE CONTROL REGISTER
686                                                   ;'STA MCR'  TO WRITE MODE CONTROL REGISTER
687
688              ; BIT MASKS FOR MODE CONTROL REGISTER
689  00c0          MCBSMO   .EQU    ^B11000000         ;BUS MODE MASK
690  0000          MCFBUS   .EQU    ^B00000000         ;FULL BUS MODE
691  0040          MCNORM   .EQU    ^B01000000         ;NORMAL BUS MODE
692  0080          MCABUS   .EQU    ^B10000000         ;ABBREVIATED BUS MODE
693  00c0          MCMUXB   .EQU    ^B11000000         ;MULTIPLEXED BUS MODE
694
695  0020          MCPDMO   .EQU    ^B00100000         ;PORT D MODE MASK
696  0000          MCPDHI   .EQU    ^B00000000         ;PORT D TRI-STATE BUFFER= HI IMPEDANCE (INPUT)
697  0020          MCPDAC   .EQU    ^B00100000         ;PORT D TRI-STATE BUFFER= ACTIVE      (OUTPUT)
698
699  0010          MCPBLA   .EQU    ^B00010000         ;PORT B LATCH ENABLED  (INPUT PORT ONLY)
700
701  000c          MCCBMO   .EQU    ^B00001100         ;COUNTER B MODE MASK
702  0000          MCCBIT   .EQU    ^B00000000         ;COUNTER B INTERVAL TIMER MODE
703  0004          MCCBAP   .EQU    ^B00000100         ;COUNTER B ASYMMETRIC PULSE GENERATION MODE
704  0008          MCCBEC   .EQU    ^B00001000         ;COUNTER B EVENT COUNTER MODE
705  000c          MCCBRI   .EQU    ^B00001100         ;COUNTER B RETRIGGERABLE INTERVAL TIMER MODE
706
707  0003          MCCAMO   .EQU    ^B00000011         ;COUNTER A MODE MASK
708  0000          MCCAIT   .EQU    ^B00000000         ;COUNTER A INTERVAL TIMER MODE
709  0001          MCCAPG   .EQU    ^B00000001         ;COUNTER A PULSE GENERATION MODE
710  0002          MCCAEC   .EQU    ^B00000010         ;COUNTER A EVENT COUNTER MODE
711  0003          MCCAPW   .EQU    ^B00000011         ;COUNTER A PULSE WIDTH MEASUREMENT MODE
712
713              ; SERIAL COMMUNICATION
714
715  0015          SCCR     .EQU    ^H0015             ;'LDA SCCR'  READS SERIAL COMM. CONTROL REGISTER
716                                                   ;'STA SCCR'  WRITES SERIAL COMM. CONTROL REGISTER
717
718              ; BIT MASKS FOR SERIAL COMMUNICATION CONTROL REGISTER
719  0080          SCTENA   .EQU    ^B10000000         ;TRANSMITTER ENABLE
720  0040          SCRENA   .EQU    ^B01000000         ;RECEIVER ENABLE
721
722  0030          SCTRMO   .EQU    ^B00110000         ;TRANSMIT/RECEIVE MODE MASK
723  0000          SCTARA   .EQU    ^B00000000         ;TRANSMITTER ASYNCH., RECEIVER ASYNCH.
724  0010          SCTARS   .EQU    ^B00010000         ;TRANSMITTER ASYNCH., RECEIVER SHIFT/REG.
725  0020          SCTSRA   .EQU    ^B00100000         ;TRANSMITTER SHIFT/REG., RECEIVER ASYNCH.
726
727  000c          SCBITM   .EQU    ^B00001100         ;BITS/CHARACTER MASK
728  0004          SC8BIT   .EQU    ^B00000100         ;8 BITS/CHAR.
729  0000          SC7BIT   .EQU    ^B00000000         ;7 BITS/CHAR.
730  0008          SC6BIT   .EQU    ^B00001000         ;6 BITS/CHAR.
731  000c          SC5BIT   .EQU    ^B00001100         ;5 BITS/CHAR.
732
733  0002          SCPAEN   .EQU    ^B00000010         ;PARITY ENABLE
734  0001          SCEVEN   .EQU    ^B00000001         ;EVEN PARITY
735
736  0016          SCSR     .EQU    ^H0016             ;'LDA SCSR'   READS SERIAL COMM. STATUS REGISTER
737                                                   ;'SMB #SSWAKE, SCSR'   TO SET WAKEUP BIT
738                                                   ;'SMB #SSEOTR, SCSR'   TO SET END OF TRANSMISSION BIT
739
740              ; BIT MASKS FOR SERIAL COMMUNICATION STATUS REGISTER
741  0080          SSTRUR   .EQU    ^B10000000         ;TRANSMITTER UNDER-RUN
742  0040          SSTRDE   .EQU    ^B01000000         ;TRANSMITTER DATA REGISTER EMPTY
743  0020          SSEOTR   .EQU    ^B00100000         ;END OF TRANSMISSION
744  0010          SSWAKE   .EQU    ^B00010000         ;WAKE UP
745  0008          SSFRER   .EQU    ^B00001000         ;FRAMING ERROR
```

```
746  0004         SSPERR  .EQU    ^B00000100              ;PARITY ERROR
747  0002         SSRCOR  .EQU    ^B00000010              ;RECEIVER OVERRUN
748  0001         SSRDRF  .EQU    ^B00000001              ;RECEIVER DATA REGISTER FULL
749
750  0017         SCRDR   .EQU    ^H0017                  ;'LDA SCRDR' READS SERIAL COMM. RECEIVER DATA REG.
751  0017         SCTDR   .EQU    ^H0017                  ;'STA SCTDR' WRITES SERIAL COMM. TRANSMIT DATA REG.
752  ;
753  ;               TIMER CONTROL
754  ;
755  ;               COUNTER 'A'  ('CA')
756  ;
757  0018         CALOCL  .EQU    ^H0018                  ;'LDA CALOCL'   READ 'CA' LOWER COUNTER & CLEAR FLAG
758  0019         CAUPCT  .EQU    ^H0019                  ;'LDA CAUPCT'   READ 'CA' UPPER COUNTER
759  001a         CALOCT  .EQU    ^H001A                  ;'LDA CALOCT'   READ 'CA' LOWER COUNTER
760
761  0018         CALOLA  .EQU    ^H0018                  ;'STA CALOLA'   WRITE 'CA' LOWER LATCH
762  0019         CAUPLS  .EQU    ^H0019                  ;'STA CAUPLS'   WRITE 'CA' UPPER LATCH, CLEAR FLAG,
763  001a         CAUPLS  .EQU    ^H001A                  ;'STA CAUPLS'   WRITE 'CA' UPPER LATCH, CLEAR FLAG, START COUNT
764  ;                                                                          COUNTER <- LATCH, & START COUNT
765  ;
766  ;               COUNTER 'B'  ('CB')
767  ;
768  001c         CBLOCL  .EQU    ^H001C                  ;'LDA CBLOCL'   READ 'CB' LOWER COUNTER & CLEAR FLAG
769  001d         CBUPCT  .EQU    ^H001D                  ;'LDA CBUPCT'   READ 'CB' UPPER COUNTER
770  001e         CBLOCT  .EQU    ^H001E                  ;'LDA CBLOCT'   READ 'CB' LOWER COUNTER
771
772  001c         CBLOLA  .EQU    ^H001C                  ;'STA CBLOLA'   WRITE 'CB' LOWER LATCH
773  001d         CBUPLA  .EQU    ^H001D                  ;'STA CBUPLA'   WRITE 'CB' UPPER LATCH, CLEAR FLAG,
774  001e         CBUPLS  .EQU    ^H001E                  ;'STA CBUPLS'   WRITE 'CB' UPPER LATCH, CLEAR FLAG, START COUNT
775  ;                                                                          COUNTER <- LATCH, & START COUNT
776  ;
777  ;       ASSEMBLER EQUATES FOR THE R65/11EB MICROCOMPUTER ENVIRONMENT
778  ;
779  0040         RAMBAS  .EQU    ^H0040                  ;STARTING ADDRESS OF RAM IN MICROCOMPUTER CHIP
780  00ff         STKTOP  .EQU    ^H00FF                  ;TOP OF PROCESSOR STACK
781  f000         ROMBAS  .EQU    ^HF000                  ;STARTING ADDRESS OF EPROM
782  ;
783  ;       6502-STYLE HARDWARE VECTORS
784  fffa         NMIVEC  .EQU    ROMBAS+^H0FFA           ;NMI VECTOR
785  fffc         RESVEC  .EQU    ROMBAS+^H0FFC           ;RESET VECTOR
786  fffe         IRQVEC  .EQU    ROMBAS+^H0FFE           ;IRQ VECTOR
787
```

9. DEFINITION OF IMPLEMENTATION SPECIFIC PARAMETERS THAT ARE DETERMINED BY THE ENCODER BAND 30

IN ORDER TO SIMPLIFY THE TASK OF ADJUSTING THIS SOFTWARE TO RUN WITH ENCODER BANDS 30 OF VARIOUS SIZES AND RESOLUTIONS, ALL OF THE DATA THAT IS SPECIFIC TO A PARTICULAR ENCODER BAND HAS BEEN COLLECTED INTO THE FOLLOWING PARAMETERS AND TABLES. PROVIDED THAT CERTAIN FUNDAMENTAL PARAMETERS OF THE BAND (SUCH AS THE NUMBER OF BITS PER ABSOLUTE POSITION TAG 36) REMAIN UNCHANGED, THEN ONLY THESE TABLES AND OTHER NON-FUNDAMENTAL PARAMETERS NEED BE CHANGED; THE REMAINDER OF THE PROGRAM CAN REMAIN THE SAME.

THE FUNDAMENTAL PARAMETERS ARE DEFINED AS:

"I"::  THE NUMBER OF CONSECUTIVE "ONE" BITS IN THE SPACER 37 BIT PATTERN.
"K"::  THE NUMBER OF BITS IN THE INCREMENTAL POSITION UP/DOWN COUNTER 74.
"L"::  THE NUMBER OF BITS IN THE TAG DECODER (82 OR 83) OUTPUT
"M"::  THE NUMBER OF BITS (INCLUDING PARITY BIT) IN EACH ABSOLUTE POSITION TAG 36.
"N"::  THE NUMBER OF BITS IN EACH SERIAL SHIFT REGISTER (75 OR 76).

IF THESE PARAMETERS REMAIN UNCHANGED, THEN ONLY THE FOLLOWING NON-FUNDAMENTAL PARAMETERS AND ASSOCIATED TABLES NEED BE CHANGED IF A DIFFERENT ENCODER BAND 30 IS TO BE USED:

THE NON-FUNDAMENTAL PARAMETERS ARE DEFINED AS:

"B"::  THE NUMBER OF EXTRA CONSECUTIVE "ONE" BITS THAT CAN APPEAR BETWEEN THE SPACER 37 BIT PATTERN AND THE START BIT (38 OR 39) ON EITHER SIDE OF A TAG 36.

```
         "J"       THE ENCODER SIZE, I.E., THE NUMBER OF INCREMENTAL TICKS PER REVOLUTION OF THE ENCODER
                   BAND 30.

THE FOLLOWING DERIVED PARAMETERS RESULT DIRECTLY FROM THE ABOVE DEFINITION OF THE
         FUNDAMENTAL AND NON-FUNDAMENTAL PARAMETERS.

"W"       EFFECTIVE WIDTH (NUMBER OF BITS), PER ABSOLUTE POSITION TAG 36, WHICH INCLUDES
                   THE NUMBER OF BITS PER TAG 36 "M", THE NUMBER OF CONSECUTIVE "ONE" BITS IN THE
                   SPACER BIT PATTERN 37 "I", THE START BITS 38 OR 39, AND THE NUMBER OF EXTRA BITS "B".

"F"       THE NUMBER OF TAGS 36 OF EFFECTIVE WIDTH "W" THAT WILL FIT ON AN ENCODER BAND 30 OF
                   SIZE "J".

THE PARAMETERS AND TABLES IN THIS LISTING CORRESPOND TO A VERY SMALL ENCODER BAND 30 THAT IS ONLY 5
         FEET IN CIRCUMFERENCE AND WHICH IS USED FOR BENCH-TESTING OF THE ENCODER COMPONENTS.  AN ENCODER BAND
         30 OF SUFFICIENT SIZE FOR A TYPICAL TELESCOPE DOME 22 (I.E., SEVERAL HUNDRED FEET IN CIRCUMFERENCE)
         WOULD BE MANY TIMES LARGER THAN THE BAND DEFINED HERE.  SUFFICIENT TABLE SPACE HAS BEEN RESERVED IN THE
         EPROM TO ACCOMODATE AN ENCODER BAND 30 THAT IS LARGE ENOUGH TO ENCODE (TO AN INCREMENTAL RESOLUTION OF
         0.5 INCH AND AN ABSOLUTE RESOLUTION OF 10 INCHES) THE POSITION OF AN 85-FOOT DIAMETER TELESCOPE DOME.

THE 5-FOOT CIRCUMFERENCE ENCODER BAND 30 THAT IS USED FOR TESTING AND TO WHICH THE SOFTWARE IN THIS
         LISTING CORRESPONDS MAKES USE OF THE FOLLOWING PARAMETER SETTINGS:

FUNDAMENTAL PARAMETERS:

"I" =  6     NUMBER OF CONSECUTIVE "ONE" BITS IN SPACER BIT SEQUENCE <37>
                             "K" = 16     NUMBER OF BITS IN INCREMENTAL POSITION UP/DOWN COUNTER <74>
                             "L" = 16     NUMBER OF BITS IN THE OUTPUT OF THE TAG DECODERS <82> AND <83>
                             "M" = 10     NUMBER OF BITS IN EACH ABSOLUTE POSITION TAG <36> (INCLUDING PARITY BIT)
                             "N" = 24     NUMBER OF BITS IN EACH SERIAL SHIFT REGISTER <75> AND <76>

NON-FUNDAMENTAL PARAMETERS:

"B" =   2    NUMBER OF BITS OF EXCESS BLANK SPACE BETWEEN SPACERS 37 AND TAGS 36
                             "J" = 120    ENCODER SIZE = 120 INCREMENTAL COUNTS/REVOLUTION AT 1X PHASE COMPARATOR FREQUENCY

DERIVED PARAMETERS:

"W" = 20     EFFECTIVE WIDTH OF EACH TAG <36>
                             "F" =  6     NUMBER OF TAGS <36> THAT WILL FIT ON BAND <30> AT 1X PHASE COMPARATOR FREQUENCY

; THE FOLLOWING PROGRAM SYMBOLS ARE SET TO CORRESPOND TO SOME OF THE ABOVE DEFINED PARAMETERS:

ENUMTG   .EQU      ^D6                    ;"F" NUMBER OF ABSOLUTE POSITION TAGS <36> THAT FIT ON BAND <30> AT 1X
ENUTAG   .EQU      ENUMTG-1               ;EFFECTIVE NUMBER OF TAGS (ACTUAL NUMBER - 1)

ENCSIZ   .EQU      ^D120                  ;"J" ENCODER SIZE = INCREMENTAL COUNTS/REVOLUTION AT 1X PHASE COMPARATOR
         ; THE FOLLOWING PARAMETERS ARE A FUNCTION OF THE ABOVE DEFINED PARAMETERS OF THE ENCODER BAND <30>.

DUDTHR   .EQU      ^D12                   ;CHANNEL 'D' UP/DOWN COUNT THRESHOLD.
                                          ;THIS IS THE MAXIMUM NUMBER OF INCREMENTAL TICKS OF MOTION IN A GIVEN
                                          ;DIRECTION THAT THE BAND <30> CAN MOVE WITHOUT THERE BEING A TRANSITION
                                          ;ON CHANNEL 'D' (I.E, SIGNAL 59).  THIS THRESHOLD IS USED BY THE
                                          ;THE CHANNEL 'D' (SIGNAL 59) FAULT DETECTOR FUNCTION OF FIGURE 9A.

MTGTHR   .EQU      ^D48                   ;MISSING TAG THRESHOLD.
                                          ;THIS IS THE MAXIMUM NUMBER OF INCREMENTAL TICKS OF MOTION IN A GIVEN
                                          ;DIRECTION THAT THE BAND <30> CAN MOVE WITHOUT ENCOUNTERING A COMPLETE
                                          ;ABSOLUTE POSITION TAG <36>, AND IS USED IN IMPLEMENTING THE "MISSED TAG
                                          ;ERROR" COMPONENT OF THE TAG ERROR FUNCTION 84 OF FIGURE 9.
                                          ;NOTE: 48 IS WORST CASE THAT CAN OCCUR DURING ON POWER-UP INITIALIZATION.
                                          ;      THIS NUMBER COULD BE REDUCED TO 26 ONCE INITIALIZED.

NVAPTR   .EQU      ^D3                    ;NUMBER OF VALID ABSOLUTE POSITION TAGS <36> THAT MUST BE ENCOUNTERED
                                          ;IN PROPER SEQUENCE IN ORDER FOR THE ABSOLUTE POSITION TO BE CONSIDERED
                                          ;INITIALIZED (I.E., FOR THE INDEX PULSE SIGNAL TO BE ALLOWED TO GO HIGH).
                                          ;THIS VALUE MUST BE AT LEAST 1, AND IS TO 3 FOR CONFIDENCE.
```

```
                ; THE FOLLOWING TWO FRAMING GATING PATTERNS CONSIST OF "1" = 6 CONSECUTIVE "ONE" BITS (I.E., THE SPACER
                ; BIT SEQUENCE <37>) FOLLOWED BY A START BIT <39> OR PRECEDED BY A START BIT <38> OF ZERO.

884  003f     HIFRAM    .EQU   ^B00111111              ;FRAMING GATING PATTERN FOR RIGHT START FRAME
885  00fc     LOFRAM    .EQU   ^B11111100              ;FRAMING GATING PATTERN FOR LEFT START FRAME
886
887              ; THE FOLLOWING MASKS ARE USED FOR EXTRACTING VARIOUS DATA BIT FIELDS FROM WITHIN THE SERIAL SHIFT
888              ; REGISTER <75> AND <76>.
889
890  00fe     LOMASK    .EQU   ^B11111110              ;MASK FOR SELECTING LEFT START FRAMING BITS
891  007f     HIMASK    .EQU   ^B01111111              ;MASK FOR SELECTING RIGHT START FRAMING BITS
892  0001     HITAG     .EQU   ^B00000001              ;MASK FOR SELECTING HI PART OF TAG DATA BITS
893
894            ;      10.   DEFINITION OF IMPLEMENTATION SPECIFIC 10-BIT TAG CODES FOR USE ON THE ENCODER BAND 30.
895
896              ; THE FOLLOWING SET OF SYMBOL EQUATES DEFINE ENOUGH ABSOLUTE POSITION TAG <36> CODES TO FORM AN ENCODER
897              ; BAND <30> THAT IS SUFFICIENT TO ENCODE THE POSITION OF AN 87-FOOT DIAMETER TELESCOPE DOME <22> TO AN
898              ; INCREMENTAL RESOLUTION OF 0.5 INCH AND AN ABSOLUTE RESOLUTION OF 10 INCHES USING A PHASE COMPARATOR
899              ; OPERATING FREQUENCY OF 1X THE SPATIAL FREQUENCY OF THE LINES ON THE TIMING TRACK <32> OF THE BAND <30>
900
901              ; FOR THE 5-FOOT CIRCUMFERENCE (TEST STRIP) ENCODER BAND <30> TO WHICH THE REMAINDER OF THIS SOFTWARE
902              ; IN THIS LISTING CORRESPONDS, ONLY THE FIRST 6 OF THESE TAG CODES ARE USED. TO MODIFY THE SOFTWARE
903              ; TO SERVICE A LARGER CIRCUMFERENCE ENCODER BAND <30>, AS MANY OF THE ADDITIONAL CODES LISTED HERE AS REQUIRED
904              ; WOULD BE ADDED TO THE TAG DECODING TABLE ("TAGNUM") LISTED ON SUBSEQUENT PAGES.
905
906              ; THE BIT PATTERNS OF THE CODES HAVE BEEN ASSIGNED SO AS TO MAXIMIZE THE HAMMING DISTANCE BETWEEN
907              ; THE CODES FOR TAGS <36> THAT ARE LOCATED PHYSICALLY ADJACENT ON THE ENCODER BAND <30>. THE MINIMUM
908              ; HAMMING DISTANCE BETWEEN THE CODES OF ANY TWO ADJACENT TAGS <36> IS 8 BITS. THIS ASSIGNMENT OF CODES
909              ; MAXIMIZES THE LIKELIHOOD THAT TAG CODES WHICH SUFFER MULTI-BIT ERRORS AND WHICH PASS THE TAG PARITY
910              ; CHECK TEST WILL STILL FAIL THE TAG ADJACENCY CHECK. ALSO NOTE THAT THE LEAST SIGNIFICANT BIT OF
911              ; EACH TAG CODE IS TAKEN TO BE THE PARITY BIT.
912
917  0077     TAG001    .EQU   ^B0001110111            ;CODE FOR ABSOLUTE POSITION TAG <36> NUMBER 1
918  038d     TAG002    .EQU   ^B1110001101            ;CODE FOR ABSOLUTE POSITION TAG <36> NUMBER 2
919  0072     TAG003    .EQU   ^B0001110010            ;CODE FOR ABSOLUTE POSITION TAG <36> NUMBER 3, ETC.
920  03bd     TAG004    .EQU   ^B1110111101
921  004b     TAG005    .EQU   ^B0001001011
922  03b4     TAG006    .EQU   ^B1110110100
923  004e     TAG007    .EQU   ^B0001001110
924  03b1     TAG008    .EQU   ^B1110110001
925  0056     TAG009    .EQU   ^B0001010110
926  03a9     TAG010    .EQU   ^B1110101001
927  005a     TAG011    .EQU   ^B0001011010
928  03a5     TAG012    .EQU   ^B1110100101
929  0055     TAG013    .EQU   ^B0001010101
930  03a3     TAG014    .EQU   ^B1110100011
931  006c     TAG015    .EQU   ^B0001101100
932  0393     TAG016    .EQU   ^B1110010011
933  0069     TAG017    .EQU   ^B0001101001
934  0396     TAG018    .EQU   ^B1110010110
935  003a     TAG019    .EQU   ^B0000111010
936  0065     TAG020    .EQU   ^B0001100101
937  0071     TAG021    .EQU   ^B0001110001
938  0074     TAG022    .EQU   ^B0001110100
939  038e     TAG023    .EQU   ^B1110001110
940  0078     TAG024    .EQU   ^B0001111000
941  0387     TAG025    .EQU   ^B1110000111
942  00b7     TAG026    .EQU   ^B0010110111
943  0347     TAG027    .EQU   ^B1101000111
944  00b8     TAG028    .EQU   ^B0010111000
945  0088     TAG029    .EQU   ^B0010001000
946  008d     TAG030    .EQU   ^B0010001101
947  0377     TAG031    .EQU   ^B1101110111
948  0372     TAG032    .EQU   ^B1101110010
949  0095     TAG033    .EQU   ^B0010010101
950  036a     TAG034    .EQU   ^B1101101010
951  0096     TAG035    .EQU   ^B0010010110
```

| | | | |
|---|---|---|---|
| 952 | 0369 | TAG036 | .EQU <<B1101101010101 |
| 953 | 0365 | TAG037 | .EQU <<B1101100110101 |
| 954 | 0365 | TAG038 | .EQU <<B1101010101010 |
| 955 | 00aa | TAG039 | .EQU <<B1101010101010 |
| 956 | 0355 | TAG040 | .EQU <<B1101010101001 |
| 957 | 00a6 | TAG041 | .EQU <<B1101010100110 |
| 958 | 0359 | TAG042 | .EQU <<B1101010011001 |
| 959 | 00a3 | TAG043 | .EQU <<B1101010001111 |
| 960 | 0035 | TAG044 | .EQU <<B0010101010101 |
| 961 | 00af | TAG045 | .EQU <<B1101010101111 |
| 962 | 035c | TAG046 | .EQU <<B1101011100110 |
| 963 | 0151 | TAG047 | .EQU <<B0010101010001 |
| 964 | 02aa | TAG048 | .EQU <<B0101010101010 |
| 965 | 00d1 | TAG049 | .EQU <<B0001101000011 |
| 966 | 032e | TAG050 | .EQU <<B1100101110110 |
| 967 | 00c3 | TAG051 | .EQU <<B1100001111100 |
| 968 | 033a | TAG052 | .EQU <<B1100111010010 |
| 969 | 00c5 | TAG053 | .EQU <<B1100010101010 |
| 970 | 0339 | TAG054 | .EQU <<B1100111001101 |
| 971 | 00c6 | TAG055 | .EQU <<B1100011000101 |
| 972 | 0335 | TAG056 | .EQU <<B1100110101010 |
| 973 | 00ca | TAG057 | .EQU <<B1100101011010 |
| 974 | 0333 | TAG058 | .EQU <<B1100110011010 |
| 975 | 00cc | TAG059 | .EQU <<B1100110001011 |
| 976 | 00d4 | TAG060 | .EQU <<B0011010100110 |
| 977 | 032b | TAG061 | .EQU <<B1100101010011 |
| 978 | 00b4 | TAG062 | .EQU <<B1101100011011 |
| 979 | 034b | TAG063 | .EQU <<B1101001010110 |
| 980 | 00e4 | TAG064 | .EQU <<B1100111001011 |
| 981 | 031b | TAG065 | .EQU <<B1100110110111 |
| 982 | 00ca | TAG066 | .EQU <<B1100101101011 |
| 983 | 00e1 | TAG067 | .EQU <<B1100111000011 |
| 984 | 031e | TAG068 | .EQU <<B1100011100110 |
| 985 | 00e2 | TAG069 | .EQU <<B1100111000110 |
| 986 | 031d | TAG070 | .EQU <<B1100011101011 |
| 987 | 00e7 | TAG071 | .EQU <<B1100111001111 |
| 988 | 0318 | TAG072 | .EQU <<B1100110001010 |
| 989 | 00eb | TAG073 | .EQU <<B1101110101001 |
| 990 | 0314 | TAG074 | .EQU <<B1100010100110 |
| 991 | 00ed | TAG075 | .EQU <<B1101110110101 |
| 992 | 0312 | TAG076 | .EQU <<B1100010010101 |
| 993 | 0045 | TAG077 | .EQU <<B0011110001010 |
| 994 | 030a | TAG078 | .EQU <<B1100001010011 |
| 995 | 0046 | TAG079 | .EQU <<B0001000100101 |
| 996 | 0309 | TAG080 | .EQU <<B1100000101010 |
| 997 | 0176 | TAG081 | .EQU <<B1010001010001 |
| 998 | 0289 | TAG082 | .EQU <<B1010001001010 |
| 999 | 0116 | TAG083 | .EQU <<B1011101001011 |
| 1000 | 02e9 | TAG084 | .EQU <<B1011110001010 |
| 1001 | 0115 | TAG085 | .EQU <<B1011010100101 |
| 1002 | 02ea | TAG086 | .EQU <<B1010101010110 |
| 1003 | 0119 | TAG087 | .EQU <<B1011110010010 |
| 1004 | 02e6 | TAG088 | .EQU <<B1011110011001 |
| 1005 | 011c | TAG089 | .EQU <<B1011011100011 |
| 1006 | 02e3 | TAG090 | .EQU <<B1011001011100 |
| 1007 | 012c | TAG091 | .EQU <<B1011001010011 |
| 1008 | 02d3 | TAG092 | .EQU <<B1011010010001 |
| 1009 | 0129 | TAG093 | .EQU <<B1011010100110 |
| 1010 | 02d6 | TAG094 | .EQU <<B1011010101010 |
| 1011 | 02d5 | TAG095 | .EQU <<B1011010100101 |
| 1012 | 0125 | TAG096 | .EQU <<B1010101001010 |
| 1013 | 02da | TAG097 | .EQU <<B1010110010110 |
| 1014 | 0131 | TAG098 | .EQU <<B1011100110001 |
| 1015 | 02ce | TAG099 | .EQU <<B1011011001010 |
| 1016 | 0134 | TAG100 | .EQU <<B1011011001011 |
| 1017 | 02cb | TAG101 | .EQU <<B1010110001000 |
| 1018 | 0138 | | .EQU <<B1011000110000 |
| 1019 | 02c7 | | .EQU <<B1011000111111 |

| | | | |
|---|---|---|---|
| 1020 013d | TAG102 | EGU | <B010011110> |
| 1021 02c2 | TAG103 | EGU | <B101100101> |
| 1022 015d | TAG104 | EGU | <B010111010> |
| 1023 02a2 | TAG105 | EGU | <B101010010> |
| 1024 0149 | TAG106 | EGU | <B010100100> |
| 1025 02b6 | TAG107 | EGU | <B101011011> |
| 1026 014c | TAG108 | EGU | <B010100110> |
| 1027 02b3 | TAG109 | EGU | <B101011001> |
| 1028 0154 | TAG110 | EGU | <B010101010> |
| 1029 02ab | TAG111 | EGU | <B101010101> |
| 1030 0157 | TAG112 | EGU | <B010101011> |
| 1031 02a8 | TAG113 | EGU | <B101010100> |
| 1032 015b | TAG114 | EGU | <B010101101> |
| 1033 02a4 | TAG115 | EGU | <B101010010> |
| 1034 015e | TAG116 | EGU | <B010101111> |
| 1035 02a1 | TAG117 | EGU | <B101010000> |
| 1036 016e | TAG118 | EGU | <B010110111> |
| 1037 0291 | TAG119 | EGU | <B101001000> |
| 1038 0164 | TAG120 | EGU | <B010110010> |
| 1039 029b | TAG121 | EGU | <B101001101> |
| 1040 0168 | TAG122 | EGU | <B010110100> |
| 1041 0297 | TAG123 | EGU | <B101001011> |
| 1042 016d | TAG124 | EGU | <B010110110> |
| 1043 0292 | TAG125 | EGU | <B101001001> |
| 1044 0175 | TAG126 | EGU | <B010111010> |
| 1045 028a | TAG127 | EGU | <B101000101> |
| 1046 017b | TAG128 | EGU | <B010111101> |
| 1047 0286 | TAG129 | EGU | <B101000011> |
| 1048 017a | TAG130 | EGU | <B010111100> |
| 1049 0285 | TAG131 | EGU | <B101000010> |
| 1050 02a5 | TAG132 | EGU | <B101010010> |
| 1051 01ba | TAG133 | EGU | <B011011101> |
| 1052 0275 | TAG134 | EGU | <B100111010> |
| 1053 018f | TAG135 | EGU | <B011000111> |
| 1054 02b1 | TAG136 | EGU | <B101011000> |
| 1055 0231 | TAG137 | EGU | <B100011000> |
| 1056 01ce | TAG138 | EGU | <B011100111> |
| 1057 0213 | TAG139 | EGU | <B100001001> |
| 1058 01ec | TAG140 | EGU | <B011110110> |
| 1059 0215 | TAG141 | EGU | <B100001010> |
| 1060 01ea | TAG142 | EGU | <B011110101> |
| 1061 0216 | TAG143 | EGU | <B100001011> |
| 1062 01e9 | TAG144 | EGU | <B011110100> |
| 1063 021a | TAG145 | EGU | <B100001101> |
| 1064 01e5 | TAG146 | EGU | <B011110010> |
| 1065 0217 | TAG147 | EGU | <B100001011> |
| 1066 01e6 | TAG148 | EGU | <B011110011> |
| 1067 021c | TAG149 | EGU | <B100001110> |
| 1068 01e3 | TAG150 | EGU | <B011110001> |
| 1069 022c | TAG151 | EGU | <B100010110> |
| 1070 01d3 | TAG152 | EGU | <B011101001> |
| 1071 01d5 | TAG153 | EGU | <B011101010> |
| 1072 0225 | TAG154 | EGU | <B100010010> |
| 1073 01da | TAG155 | EGU | <B011101101> |
| 1074 0223 | TAG156 | EGU | <B100010001> |
| 1075 01dc | TAG157 | EGU | <B011101110> |
| 1076 0226 | TAG158 | EGU | <B100010011> |
| 1077 01d9 | TAG159 | EGU | <B011101100> |
| 1078 022a | TAG160 | EGU | <B100010101> |
| 1079 01d5 | TAG161 | EGU | <B011101010> |
| 1080 0229 | TAG162 | EGU | <B100010100> |
| 1081 01d6 | TAG163 | EGU | <B011101011> |
| 1082 022f | TAG164 | EGU | <B100010111> |
| 1083 0192 | TAG165 | EGU | <B011001001> |
| 1084 026d | TAG166 | EGU | <B100110110> |
| 1085 01a2 | TAG167 | EGU | <B011010001> |
| 1086 025d | TAG168 | EGU | <B100101110> |
| 1087 01ab | TAG169 | EGU | <B011010101> |
| 1088 0254 | | | <B100101010> |

| | | | | | | |
|---|---|---|---|---|---|---|
| 1089 | 01b9 | TAG170 | .EQU | <B01101111001 | | |
| 1090 | 0246 | TAG171 | .EQU | <B10100110010 | | |
| 1091 | 019b | TAG172 | .EQU | <B01100110101 | | |
| 1092 | 0264 | TAG173 | .EQU | <B10011001011 | | |
| 1093 | 019e | TAG174 | .EQU | <B01100111110 | | |
| 1094 | 0261 | TAG175 | .EQU | <B10011000001 | | |
| 1095 | 0197 | TAG176 | .EQU | <B01100010111 | | |
| 1096 | 0268 | TAG177 | .EQU | <B10011010000 | | |
| 1097 | 0194 | TAG178 | .EQU | <B01100010100 | | |
| 1098 | 026b | TAG179 | .EQU | <B10011010111 | | |
| 1099 | 0198 | TAG180 | .EQU | <B01100011000 | | |
| 1100 | 0267 | TAG181 | .EQU | <B10011001111 | | |
| 1101 | 01a8 | TAG182 | .EQU | <B01101010000 | | |
| 1102 | 0257 | TAG183 | .EQU | <B10010101011 | | |
| 1103 | 01a4 | TAG184 | .EQU | <B01101010100 | | |
| 1104 | 0186 | TAG185 | .EQU | <B01100001101 | | |
| 1105 | 0279 | TAG186 | .EQU | <B10011110010 | | |
| 1106 | 01c7 | TAG187 | .EQU | <B01110001111 | | |
| 1107 | 0238 | TAG188 | .EQU | <B10001110001 | | |
| 1108 | 01cb | TAG189 | .EQU | <B01110010110 | | |
| 1109 | 0234 | TAG190 | .EQU | <B10001101010 | | |
| 1110 | 01c2 | TAG191 | .EQU | <B01110000101 | | |
| 1111 | 023d | TAG192 | .EQU | <B10001111000 | | |
| 1112 | 01c4 | TAG193 | .EQU | <B01110001000 | | |
| 1113 | 023b | TAG194 | .EQU | <B10001110110 | | |
| 1114 | 01c8 | TAG195 | .EQU | <B01110010001 | | |
| 1115 | 0237 | TAG196 | .EQU | <B10001101110 | | |
| 1116 | 0189 | TAG197 | .EQU | <B01100010011 | | |
| 1117 | 0276 | TAG198 | .EQU | <B10011101101 | | |
| 1118 | 01a1 | TAG199 | .EQU | <B01101010001 | | |
| 1119 | 01a1 | TAG200 | .EQU | <B01101010001 | | |
| 1120 | 025e | TAG201 | .EQU | <B10010111110 | | |
| 1121 | 01ad | TAG202 | .EQU | <B01101011010 | | |
| 1122 | 0252 | TAG203 | .EQU | <B10010101100 | | |
| 1123 | 01bc | TAG204 | .EQU | <B01101111010 | | |
| 1124 | 0243 | TAG205 | .EQU | <B10010000110 | | |
| 1125 | 01b6 | TAG206 | .EQU | <B01101101101 | | |
| 1126 | 0249 | TAG207 | .EQU | <B10010010101 | | |
| 1127 | 01b5 | TAG208 | .EQU | <B01101101011 | | |
| 1128 | 024a | TAG209 | .EQU | <B10010010101 | | |
| 1129 | 01a7 | TAG210 | .EQU | <B01101001110 | | |
| 1130 | 0258 | TAG211 | .EQU | <B10010110001 | | |
| 1131 | 01ae | TAG212 | .EQU | <B01101011100 | | |
| 1132 | 0251 | TAG213 | .EQU | <B10010101101 | | |
| 1133 | 01ef | TAG214 | .EQU | <B01111101111 | | |
| 1134 | 0232 | TAG215 | .EQU | <B10001101010 | | |
| 1135 | 01cd | TAG216 | .EQU | <B01110010101 | | |
| 1136 | 0262 | TAG217 | .EQU | <B10011000010 | | |
| 1137 | 019d | TAG218 | .EQU | <B01100111100 | | |
| 1138 | 026e | TAG219 | .EQU | <B10011011100 | | |
| 1139 | 0191 | TAG220 | .EQU | <B01100100010 | | |
| 1140 | 024c | TAG221 | .EQU | <B10010011010 | | |
| 1141 | 01b3 | TAG222 | .EQU | <B01101100110 | | |
| 1142 | 024c | TAG223 | .EQU | <B10010011000 | | |
| 1143 | 01ae | TAG224 | .EQU | <B01101011101 | | |
| 1144 | 0244 | TAG225 | .EQU | <B10010001001 | | |
| 1145 | 00b1 | TAG226 | .EQU | <B00010110001 | | |
| 1146 | 034e | TAG227 | .EQU | <B11010011101 | | |
| 1147 | 00b2 | TAG228 | .EQU | <B00010110100 | | |
| 1148 | 02ba | TAG229 | .EQU | <B10110101001 | | |
| 1149 | 0145 | TAG230 | .EQU | <B01010001001 | | |
| 1150 | 0298 | TAG232 | .EQU | <B10100110001 | | |
| 1151 | 0167 | TAG233 | .EQU | <B01011001111 | | |
| 1152 | 0294 | TAG234 | .EQU | <B10100101001 | | |
| 1153 | 016b | TAG235 | .EQU | <B01011001100 | | |
| 1154 | 028c | TAG236 | .EQU | <B10100011100 | | |
| 1155 | 0173 | | .EQU | <B01011001011 | | |
| 1156 | 028f | | .EQU | <B10100011111 | | |

| | | | | | | |
|---|---|---|---|---|---|---|
|1157|0162|TAG237|.EGU|^B0101100010|1176|02c4|TAG256|.EGU|^B1011000100|
|1158|029d|TAG238|.EGU|<B1010011101|1177|013b|TAG257|.EGU|<B1010111011|
|1159|0161|TAG239|.EGU|<B1010110001|1178|02cd|TAG258|.EGU|<B1010110101|
|1160|029a|TAG240|.EGU|<B1010011110|1179|0132|TAG259|.EGU|<B1010110010|
|1161|0143|TAG241|.EGU|<B1010111100|1180|02d5|TAG260|.EGU|<B1010101010|
|1162|02bc|TAG242|.EGU|<B1010100010|1181|012a|TAG261|.EGU|<B1010101100|
|1163|0152|TAG243|.EGU|<B1010101010|1182|02dc|TAG262|.EGU|<B1010100011|
|1164|02ad|TAG244|.EGU|<B1010100101|1183|0123|TAG263|.EGU|<B1011010100|
|1165|0158|TAG245|.EGU|<B1010101000|1184|02ec|TAG264|.EGU|<B1011100011|
|1166|02a7|TAG246|.EGU|<B1010100111|1185|0113|TAG265|.EGU|<B1011101100|
|1167|014a|TAG247|.EGU|<B1010100010|1186|02e5|TAG266|.EGU|<B1011100101|
|1168|02b5|TAG248|.EGU|<B1010101101|1187|011a|TAG267|.EGU|<B1011101010|
|1169|0144|TAG249|.EGU|<B1010110001|1188|02ef|TAG268|.EGU|<B1011110111|
|1170|02b9|TAG250|.EGU|<B1010111001|1189|0108|TAG269|.EGU|<B1011111000|
|1171|0146|TAG251|.EGU|<B1010110100|1190|02f1|TAG270|.EGU|<B1011110001|
|1172|02d9|TAG252|.EGU|<B1010100110|1191|010e|TAG271|.EGU|<B1011110111|
|1173|0126|TAG253|.EGU|<B1010010110|1192|02f7|TAG272|.EGU|<B1011111110|
|1174|02c8|TAG254|.EGU|<B1010100110|1193|010d|TAG273|.EGU|<B1011110001|
|1175|0137|TAG255|.EGU|^B1010110111|1194|02f2|TAG274|.EGU|<B1011100100|
| | | | | |1195|018c|TAG275|.EGU|<B1100010100|
| | | | | |1196|0273|TAG276|.EGU|<B1100110011|
| | | | | |1197|030c|TAG277|.EGU|<B1011110101|
| | | | | |1198|00f3|TAG278|.EGU|<B1100110001|
| | | | | |1199|0304|TAG279|.EGU|<B1011111011|
| | | | | |1200|0244|TAG280|.EGU|<B1101001010|
| | | | | |1201|010b|TAG281|.EGU|<B1100110010|
| | | | | |1202|0374|TAG282|.EGU|<B1101001011|
| | | | | |1203|008b|TAG283|.EGU|<B1101001100|
| | | | | |1204|0324|TAG284|.EGU|<B1101001110|
| | | | | |1205|00db|TAG285|.EGU|<B1100100011|
| | | | | |1206|0321|TAG286|.EGU|<B1100110110|
| | | | | |1207|00de|TAG287|.EGU|<B1100110100|
| | | | | |1208|0322|TAG288|.EGU|<B1101001100|
| | | | | |1209|00dd|TAG289|.EGU|<B1101001110|
| | | | | |1210|0327|TAG290|.EGU|<B1101001010|
| | | | | |1211|00d8|TAG291|.EGU|<B1101001111|
| | | | | |1212|0317|TAG292|.EGU|<B1100100111|
| | | | | |1213|00e8|TAG293|.EGU|<B1100110110|
| | | | | |1214|0336|TAG294|.EGU|<B1101010010|
| | | | | |1215|00c9|TAG295|.EGU|<B1110010101|
| | | | | |1216|0356|TAG296|.EGU|<B1001010100|
| | | | | |1217|00a9|TAG297|.EGU|<B1110010001|
| | | | | |1218|0342|TAG298|.EGU|<B1101010101|
| | | | | |1219|00bd|TAG299|.EGU|<B1110011101|
| | | | | |1220|0344|TAG300|.EGU|<B1101010100|
| | | | | |1221|00bb|TAG301|.EGU|<B1110010011|
| | | | | |1222|0348|TAG302|.EGU|<B1101010000|
| | | | | |1223|00b7|TAG303|.EGU|^B0010110111|

```
1223  0328          TAG304    EGU    ^B1100101000
1224  00d7          TAG305    EGU    ^B0011010111
1225  032d          TAG306    EGU    ^B1100101101
1227  032d          TAG307    EGU    ^B1100101101
1228  00d2          TAG307    EGU    ^B0011010010
1229  036c          TAG308    EGU    ^B1101101100
1230  0073          TAG309    EGU    ^B0010010011
1231  0366          TAG310    EGU    ^B1101100110

1232  0099          TAG311    EGU    ^B0010011001
1233  0363          TAG312    EGU    ^B1101100011
1234  009c          TAG313    EGU    ^B0010011100
1235  0353          TAG314    EGU    ^B1101010011
1236  00ac          TAG315    EGU    ^B0010101100
1237  035a          TAG316    EGU    ^B1101011010
1238  00a5          TAG317    EGU    ^B0010100101
1239  035a          TAG318    EGU    ^B1101011010
1240  027a          TAG319    EGU    ^B1001111010
1241  0185          TAG320    EGU    ^B0110000101
1242  0378          TAG321    EGU    ^B1101111000
1243  0087          TAG322    EGU    ^B0010000111
1244  0371          TAG323    EGU    ^B1101110001
1245  008e          TAG324    EGU    ^B0010001110
1246  0311          TAG325    EGU    ^B1100010001
1247  00ee          TAG326    EGU    ^B0011101110
1248  0395          TAG327    EGU    ^B1101010101
1249  006a          TAG327    EGU    ^B0001101010
1250  0384          TAG328    EGU    ^B1110000100
1251
1252  0148          NDFTAG    EGU    ^D328          ;NUMBER OF DEFINED TAG CODES
1253
1254  ;   11.  DEFINITION OF IMPLEMENTATION SPECIFIC DATA TABLES THAT ARE DETERMINED BY THE ENCODER BAND 30.
1255  ;
1256  ;  THERE ARE TWO DATA TABLES, "TAGNUM" AND "RTNPOS", WHOSE SIZE AND CONTENTS ARE DETERMINED BY THE
1257  ;  CHARACTERISTICS OF THE ENCODER BAND 30.
1258  ;
1259  ;  THE 'TAGNUM' LOOK-UP TABLE IS USED TO DECODE RAW ABSOLUTE POSITION TAGS <36> INTO ABSOLUTE POSITION TAG
1260  ;  (SEQUENCE) NUMBERS.  THIS LOOK-UP TABLE HAS 512 (OR TWO TO THE ("M"-1=) 9 POWER) ENTRIES, SO THAT
1261  ;  THERE WILL BE ONE ENTRY FOR EVERY ABSOLUTE POSITION TAG <36> THAT HAS CORRECT PARITY.  MANY OF THE
1262  ;  ENTRIES WILL REMAIN UNINITIALIZED, SINCE THEY CORRESPOND TO INVALID (I.E. UNASSIGNED) TAGS.  HOWEVER,
1263  ;  SINCE ALL LOCATIONS IN THE EPROM CHIP ARE SET TO "ALL ONES" STATE WHEN THE CHIP IS ERASED, THESE
1264  ;  UNINITIALIZED ENTRIES WILL REMAIN SET TO "ALL ONES".  THE TAG SEQUENCE NUMBER CONSISTING OF ALL ONES
1265  ;  (AND WHICH HAS A DECIMAL VALUE OF 65,535) HAS BEEN RESERVED TO INDICATE AN INVALID (I.E. UNASSIGNED)
1266  ;  TAG.  THE ASEMBLER SYMBOL "INVTAG" HAS BEEN DEFINED EQUAL TO ALL ONES FOR THIS PURPOSE.  ALSO NOTE THAT
1267  ;  ONLY ONE 'TAGNUM' TABLE IS NEEDED TO DECODE ABSOLUTE POSITION TAGS <36> INTO ABSOLUTE POSITION TAG
1268  ;  (SEQUENCE) NUMBERS, REGARDLESS OF WHICH SERIAL SHIFT REGISTER (75 OR 76) THE TAG BECAME FRAMED IN.
1269  ;
1270  ;  THE 5-FOOT CIRCUMFERENCE TEST STRIP ENCODER BAND 30 HAS ONLY 6 VALID TAGS, BUT A MORE TYPICAL ENCODER
1271  ;  BAND <30> WITH 9-BIT (EXCLUDING THE PARITY BIT)
1272  ;  TAGS COULD HAVE UP TO 488 VALID ENTRIES.  488, RATHER THAN 512, IS THE MAXIMUM NUMBER OF VALID 9-BIT
1273  ;  TAGS SINCE THERE ARE 24 POSSIBLE TAG VALUES WHICH MUST BE DISCARDED BECAUSE THEY CONTAIN THE SPACER
1274  ;  BIT SEQUENCE 37 (I.E., SIX CONSECUTIVE "ONE" BITS) EMBEDDED WITHIN THEM, AND THUS CANNOT BE USED AS
1275  ;  TAGS <36>.
1276  ;
1277  ;  NOTE:  THE CONSTRUCTION                 TAGNUM+(TAGNNN/2)*2
1278  ;
1279  ;  IS USED BELOW TO COMPUTE THE CORRECT OFFSET INTO THE 'TAGNUM' TABLE FOR TAG SEQUENCE NUMBER 'nnn',
1280  ;  THE TAG CODES DEFINED ON THE PREVIOUS PAGES ARE 10-BIT CODES AND INCLUDE THE PARITY BIT AS THE LEAST
1281  ;  SIGNIFICANT BIT.  THE 'TAGNUM' TABLE IS DESIGNED TO BE INDEXED BY A 9-BIT CODE (I.E. THE 9-BITS THAT
1282  ;  REMAIN AFTER THE PARITY BIT IS STRIPPED OFF).  INTEGER DIVISION BY 2 (I.E. (TAGNUM/2)) EFFECTIVELY
1283  ;  STRIPS OFF THE PARITY BIT AND LEAVES A 9-BIT RESULT.  THIS RESULT IS THEN MULTIPLIED BY 2 SINCE EACH
1284  ;  ENTRY IN THE 'TAGNUM' TABLE IS 2 BYTES LONG.  FINALLY, NOTE THE IN ORDER TO SIMPLIFY ADDRESSING, EACH
1285  ;  THIS TABLE SHOULD BE ORIGINED TO BEGIN AT THE START OF A "PAGE" OF MEMORY.
1286
1287  f000          TAGNUM    .ORG   ROMBAS         ;SET ASSEMBLER'S ORIGIN TO STARTING ADDRESS OF ROM CHIP
1289  f000                    EGU    ^LITAGNUM]     ;USE RAW ABSOLUTE POSITION TAG AS TABLE INDEX
1290  0000          ZERO      EGU    ^LITAGNUM]     ;FORCE ASSEMBLY ERROR IF "TAGNUM" DOES NOT BEGIN AT START OF PAGE
1291
```

```
1292  f076             .ORG    TAGNUM+[TAG001/2]*2
1293  f076  00 01      .DBYTE  ^D1                   ;OFFSET TO ENTRY FOR THIS TAG <36>
1294                                                 ;DECODE IT TO TAG (SEQUENCE) NUMBER 1
1295  f38c             .ORG    TAGNUM+[TAG002/2]*2
1296  f38c  00 02      .DBYTE  ^D2                   ;OFFSET TO ENTRY FOR THIS TAG <36>
1297                                                 ;DECODE IT TO TAG (SEQUENCE) NUMBER 2
1298  f072             .ORG    TAGNUM+[TAG003/2]*2
1299  f072  00 03      .DBYTE  ^D3                   ;OFFSET TO ENTRY FOR THIS TAG <36>
1300                                                 ;DECODE IT TO TAG (SEQUENCE) NUMBER 3
1301  f3bc             .ORG    TAGNUM+[TAG004/2]*2
1302  f3bc  00 04      .DBYTE  ^D4
1303
1304  f04a             .ORG    TAGNUM+[TAG005/2]*2
1305  f04a  00 05      .DBYTE  ^D5
1306
1307  f3b4             .ORG    TAGNUM+[TAG006/2]*2
1308  f3b4  00 06      .DBYTE  ^D6
1309
1310
1311
1312  f400             .ORG    TAGNUM+[2*^D512]       ;POINT PAST END OF TAG DECODE TABLE
1313
1314      ; THIS ALLOCATES ENOUGH SPACE FOR ALL 512 POSSIBLE TAGS <36>.
1315      ; TO SERVICE A LARGER ENCODER BAND, ONE WOULD SIMPLY STORE MORE OF THE PREVIOUSLY DEFINED TAG CODES
1316      ; INTO THE APPROPRIATE (PREALLOCATED) LOCATIONS IN THIS DECODER TABLE.
1317
1318      ; THE 'RTNPOS' LOOK-UP TABLE DECODES A TAG SEQUENCE NUMBER INTO AN ABSOLUTE POSITION.  THE ABSOLUTE
1319      ; POSITION CORRESPONDS TO AN ABSOLUTE POSITION TAG <36> (FROM WHICH THE ABSOLUTE TAG NUMBER WAS OBTAINED
1320      ; VIA THE 'TAGNUM' TABLE) BEING PROPERLY FRAMED IN THE "RIGHT MOTION SERIAL SHIFT REGISTER" <75>.
1321
1322      ; NOTE THAT THESE TABLES NEED ONLY "F" (NUMBER OF TAGS THAT FIT ON STRIP) ENTRIES, RATHER THAN THE 512
1323      ; (TWO TO THE "M"-1 = 9 POWER) ENTRIES NEEDED FOR THE 'TAGNUM' LOOK-UP TABLE.  ALSO NOTE THAT IF THE
1324      ; TAGS 36 ARE SPACED AT REGULAR INTERVALS AROUND THE BAND 30 (AS IS USUALLY THE CASE AND IS THE CASE IN
1325      ; THIS SPECIFIC IMPLEMENTATION) THEN THE CONVERSION OF THE TAG SEQUENCE NUMBER INTO ABSOLUTE POSITION
1326      ; CAN BE ACCOMPLISHED BY SIMPLE MULTIPLICATION OF THE TAG SEQUENCE NUMBER TIMES THE EFFECTIVE WIDTH "W"
1327      ; (IN THIS IMPLEMENTATION "W" = 20) OF THE TAGS 36.  THIS WOULD ELIMINATE THE NEED FOR THE 'RTNPOS'
1328      ; LOOK-UP TABLE, AT A CONSIDERABLE SAVINGS IN EPROM SPACE.  THIS SAVINGS IN EPROM SPACE WOULD BE ACHIEVED
1329      ; AT A COST OF ONLY A NEGLIBLE INCREASE IN THE PROCESSOR TIME REQUIRED TO SERVICE THE SIGNAL INTERRUPTS.
1330      ; HOWEVER, SINCE WE HAVE PLENTY OF EPROM SPACE LEFT IN THIS IMPLEMENTATION, THE "RTNPOS" TABLE IS USED.
1331      ; THE USE OF TABLE LOOK-UP RATHER THAN MULTIPLICATION ALSO ALLOWS FOR IMPLEMENTATIONS IN WHICH THE TAGS
1332      ; 36 ARE NOT REGULARLY SPACED AROUND THE ENCODER BAND 30.
1333
1334      ; FINALLY, NOTE THAT IN ORDER TO SIMPLIFY ADDRESSING, THIS TABLE SHOULD BE ORIGINED TO BEGIN AT THE START
1335      ; OF A "PAGE" OF MEMORY.
1336
1337  f400             RTNPOS   .EQU    $                ;DECODES RIGHT SIDE TAG SEQUENCE NUMBER TO ABSOLUTE POSITION
1338  0000             ZERO     .EQU    0                ;LCRTNPOS ;FORCE ASSEMBLY ERROR IF 'RTNPOS' IS NOT ORIGINED TO BEGIN PAGE START.
1339  f400  00 00      .DBYTE   0                        ;O PLACE HOLDER FOR NON-EXISTENT TAG NUMBER 0
1340  f402             RTN1ST   .EQU    $                ;ADDRESS OF ENTRY FOR TAG NUMBER 1
1341                   INFREQ=1X ABFREQ=1X
1342                   ; FOR REGULARLY SPACED TAGS 36, THESE VALUES ARE SIMPLY COMPUTED AS THE TAG SEQUENCE NUMBER TIMES THE
1343                   ; EFFECTIVE WIDTH "W" OF THE TAGS 36, TAKEN MODULO THE SIZE "J" OF THE ENCODER BAND 30.  IN THIS CASE,
1344                   ; "W" = 20 AND "J" = 120.
1345  f402  00 14      .DBYTE   ^D20                     ;1   ABSOLUTE POSITION WHEN TAG 36 WITH SEQUENCE NUMBER 1 FRAMED IN RIGHT SIDE
1346  f404  00 28      .DBYTE   ^D40                     ;2
1347  f406  00 3c      .DBYTE   ^D60                     ;3
1348  f408  00 50      .DBYTE   ^D80                     ;4
1349  f40a  00 64      .DBYTE   ^D100                    ;5
1350  f40c  00 00      .DBYTE   ^D000                    ;6
1351  0006             ENUMTG   .EQU    $.-RTN1ST]/2     ;CONSISTENCY CHECK
1352
1353
1354  f692             .ORG    RTN1ST+[2*NDFTAG]          ;POINT PAST END OF LARGEST 'RTNPOS' TABLE
1355      ; THIS ALLOCATES ENOUGH SPACE FOR ALL OF THE TAG CODES PREVIOUSLY DEFINED.
1356      ; TO SERVICE A LARGER ENCODER BAND, ONE WOULD SIMPLY ADD AS MANY ADDITIONAL ENTRIES TO THESE PREALLOCATED
1357      ; SLOTS IN THE 'RTNPOS' TABLE AS REQUIRED.
1358
1359  f692             TABEND   .EQU    $                 ;SAVE HIGHWATER MARK IN ROM FOR RE-ORIGINING
```

```
1360  ;
1361  ;       12. DEFINITION OF APPLICATION SPECIFIC SYMBOLS FOR THE R65/11EB'S INTERAL REGISTERS AND I/O PORTS
1362  ;       ================================================================================================
1363  ;
1364  ;  THE PORT BIT EQUATE SYMBOLS CONTAIN THE ADDRESS OF THE PORT IN THE MOST SIGNIFICANT BYTE AND THE BIT
1365  ;  MASK VALUE IN THE LEAST SIGNIFICANT BYTE.  THIS ALLOWS A SINGLE ASSEMBLER SYMBOL TO CARRY ALL OF THE
1366  ;  INFORMATION ABOUT THE LOCATION OF A BIT, AND ALLOWS BIT FUNCTIONS TO BE REASSIGNED SIMPLY BY CHANGING
1367  ;  THE EQUATE.
1368  ;
1369  ;  NOTE: RIGHTMOST COLUMN INDICATES THE R65/11EB CHIP PIN ON WHICH SIGNAL IS AVAIALBLE.
1370  ;
1371  0100          Q       .EQU    ^D256                   ;MULTIPLIER FOR PORT BIT EQUATES
1372  ;
1373  ;               EQUATES FOR PAPORT
1374  0040          PASHAD  .EQU    PAPORT+RAMBAS
1375  0001          CHBPOS  .EQU    Q*PAPORT+PA0POS         ;FORCE ASSEMBLY ERROR IF 'PASHAD' MOVED
1376  0002          CHAPOS  .EQU    Q*PAPORT+PA1POS         ;CHANNEL 'B', POSITIVE EDGE DETECT (SIGNAL 58)   INPUT   UP-30
1377  0004          CHANEG  .EQU    Q*PAPORT+PA2NEG         ;CHANNEL 'A', POSITIVE EDGE DETECT (SIGNAL 57)   INPUT   UP-29
1378  0008          CHBNEG  .EQU    Q*PAPORT+PA3NEG         ;CHANNEL 'A', NEGATIVE EDGE DETECT (SIGNAL 57)   INPUT   UP-28
1379  0010          CHDATA  .EQU    Q*PAPORT+PA4IO          ;CHANNEL 'B', NEGATIVE EDGE DETECT (SIGNAL 58)   INPUT   UP-27
1380  0020          XMTENA  .EQU    Q*PAPORT+PA5IO          ;DATA CHANNEL 'D',                 (SIGNAL 59)   INPUT   UP-26
1381  0040          SEND    .EQU    Q*PAPORT+PA6TO          ;TRANSMIT ENABLE RS-422 (CURRENTLY UNUSED)      OUTPUT  UP-25
1382  0080          RECEIV  .EQU    Q*PAPORT+PA7SRI         ;SERIAL TRANSMITTER                             OUTPUT  UP-24
1383                                                        ;SERIAL RECEIVER        (CURRENTLY UNUSED)      INPUT   UP-23
1384  ; BIT MASK EQUATES FOR ENCODER CHANNELS
1385  0002          CHANLA  .EQU    ^LCCHAPOS]              ;MASK FOR CHANNEL 'A'  (SIGNAL 57 FROM OPTICAL SENSOR <42>)
1386  0001          CHANLB  .EQU    ^LCCHBPOS]              ;MASK FOR CHANNEL 'B'  (SIGNAL 58 FROM OPTICAL SENSOR <43>)
1387  0010          CHANLD  .EQU    ^LCCHDATA]              ;MASK FOR CHANNEL 'D'  (SIGNAL 59 FROM OPTICAL SENSOR <44>)
1388  ;
1389  ;               EQUATES FOR PBPORT
1390  0041          PBSHAD  .EQU    PBPORT+RAMBAS
1391  0101          INDEX   .EQU    Q*PBPORT+PB0IO          ;FORCE ASSEMBLY ERROR IF 'PBSHAD' MOVED
1392  0102          CLOCKP  .EQU    Q*PBPORT+PB1IO          ;NEGATIVE-GOING INDEX PULSE (AND INITIALIZE LEVEL)  OUTPUT  UP-38
1393  0104          DIRLEV  .EQU    Q*PBPORT+PB2IO          ;NEGATIVE-GOING CLOCK PULSE <72> (AND DATA STROBE) OUTPUT  UP-37
1394  0108          PULRES  .EQU    Q*PBPORT+PB3IO          ;DIRECTION LEVEL                                    OUTPUT  UP-36
1395  0110          ERCOD1  .EQU    Q*PBPORT+PB4IO          ;WATCHDOG TIME RETRIGGER PULSE                      OUTPUT  UP-35
1396  0120          ERCOD2  .EQU    Q*PBPORT+PB5IO          ;ERROR CODE LSB                                     OUTPUT  UP-34
1397  0140          ERCOD4  .EQU    Q*PBPORT+PB6IO          ;ERROR CODE MIDDLE BIT                              OUTPUT  UP-33
1398  0180          ERRFLG  .EQU    Q*PBPORT+PB7IO          ;ERROR CODE MSB                                     OUTPUT  UP-32
1399                                                        ;NEGATIVE-TRUE ERROR FLAG                          OUTPUT  UP-31
1400  ;
1401  0042          PCSHAD  .EQU    PCPORT+RAMBAS           ;FORCE ASSEMBLY ERROR IF 'PCSHAD' MOVED
1402  ;  PORT 'C' IS USED TO OUTPUT THE LEAST SIGNIFICANT BYTE OF THE POSITION
1403  ;
1404  ;               EQUATES FOR PDPORT
1405  0043          PDSHAD  .EQU    PDPORT+RAMBAS           ;FORCE ASSEMBLY ERROR IF 'PCSHAD' MOVED
1406  ;  PORT 'D' IS USED TO OUTPUT THE MOST SIGNIFICANT BYTE OF THE POSITION
1407  ;
1408  ;  INTERRUPT FLAG EQUATES FOR THE INTERRUPT FLAG REGISTER ("IFR") AND INTERRUPT ENABLE REGISTER ("IER")
1409  0001          IFBPOS  .EQU    IFPA0P                  ;'B' CHANNEL (SIGNAL 58) POSITIVE TRANSITION
1410  0002          IFAPOS  .EQU    IFPA1P                  ;'A' CHANNEL (SIGNAL 57) POSITIVE TRANSITION
1411  0004          IFANEG  .EQU    IFPA2N                  ;'A' CHANNEL (SIGNAL 57) NEGATIVE TRANSITION
1412  0008          IFBNEG  .EQU    IFPA3N                  ;'B' CHANNEL (SIGNAL 58) NEGATIVE TRANSITION
1413  000f          ALLIFR  .EQU    [IFBPOS!IFAPOS!IFANEG!IFBNEG]  ;ALL INTERRUPTS
1414  ;
1415  ; MISCELLANEOUS SYMBOL DEFINITIONS
1416  ;
1417  0043          TSTPIN  .EQU    ^B01000011              ;TEST PATTERN INCREMENT FOR RAM TEST
1418  0000          ZERO    .EQU    0000                    ;FOR PAGE 0 MAPPING AND START OF PAGE TESTING
1419  ;
1420  000c          BAUDRT  .EQU    ^H0C                    ;4807.69 BAUD WHEN USING A 1 MHZ. CLOCK; SEE R65/11 PRODUCT DESCRIPTION
1421  ;
1422  00ff          INVTAG  .EQU    ^H0FF                   ;TAG NUMBER OF ALL ONES RESERVED FOR INVALID TAG
1423  ;
1424  ;  ERROR CODES -
1425  ;
1426  ;  THESE 3 BIT CODES ARE STORED INTO THE ERROR CODE BITS IN PORT 'A'
1427  ;  THE 'ERRFLG' BIT IS ALSO PULLED LOW WHEN THERE IS AN ERROR CONDITION
1428  ;
```

```
                        CODE NUMBER          MEANING
                        -----------          -------
1429
1430
1431    EDTERR    .EQU  ^H00                 ;EDGE DETECT OR RAM ERROR (MICROPROCESSOR FAULT LIKELY)
1432    CHABAD    .EQU  ^H10                 ;SIGNAL FROM CHANNEL 'A' OF TIMING TRACK HAS GONE DEAD
1433    CHBBAD    .EQU  ^H20                 ;SIGNAL FROM CHANNEL 'B' OF TIMING TRACK HAS GONE DEAD
1434    CHDBAD    .EQU  ^H30                 ;SIGNAL FROM CHANNEL 'D' DATA TRACK HAS GONE DEAD
1435    POSERR    .EQU  ^H40                 ;POSITION ERROR MISMATCH (INCREMENTAL NOT = ABSOLUTE)
1436    TAGPAR    .EQU  ^H50                 ;TAG PARITY ERROR
1437    TAGADJ    .EQU  ^H60                 ;TAG ADJACENCY ERROR
1438    TAGMIS    .EQU  ^H70                 ;TAG MISSING ERROR
1439
1440    ;
1441    ; 13. DEFINITION OF APPLICATION SPECIFIC SYMBOLS FOR ORGANIZING THE R65/11EB'S RANDOM ACCESS MEMORY
1442    ;
1443
1444 0040           .ORG    RAMBAS            ;RESET ASSEMBLER'S ORIGIN TO STARTING ADDRESS OF MICROPROCESSOR RAM
1445
1446    ; THE FOLLOWING 4 RAM LOCATIONS ARE USED AS RAM SHADOWS OF THE CORRESPONDING I/O PORTS PAPORT, PBPORT,
1447    ; PCPORT, AND PDPORT. WHENEVER AN OUTPUT VALUE IS STORED INTO AN I/O PORT, THE SAME VALUE IS ALSO STORED
1448    ; INTO THE CORRESPONDING RAM SHADOW LOCATION. THE ADDRESS OF EACH RAM SHADOW IS EXACTLY 'RAMBAS' BYTES
1449    ; ABOVE THE ADDRESS OF THE CORRESPONDING I/O PORT WHICH IS BEING SHADOWED. THUS, THESE LOCATIONS CAN BE
1450    ; REFERENCED EITHER BY THE SHADOW SYMBOL NAME (I.E., PASHAD, ETC.) OR BY ADDING THE OFFSET 'RAMBAS' TO
1451    ; THE CORRESPONDING PORT ADDRESS (I.E., PAPORT+RAMBAS). THE RAM SHADOW BYTES ALLOW A MEANS OF CHECKING
1452    ; THE CONTENTS OF THE OUTPUT PORTS, SINCE THE CONTENTS OF THE OUTPUT PORTS THEMSELVES CAN'T BE READ BACK.
1453
1454
1455 0040 00  PASHAD   .BYTE  0                ;PAPORT OUTPUT BITS SHADOW
1456
1457    ; BIT EQUATES FOR 'PASHAD':
1458             .EQU  ^B00000001
1459             .EQU  ^B00000010
1460             .EQU  ^B00000100
1461             .EQU  ^B00001000
1462    SXMTENA  .EQU  ^B00010000             ;SHADOW BIT FOR TRANSMIT ENABLE RS-422
1463             .EQU  ^B01000000             ;SERIAL TRANSMITTER OUTPUT
1464             .EQU  ^B10000000             ;SERIAL RECEIVER INPUT
1465
1466
1467
1468 0041 00  PBSHAD   .BYTE  0                ;PBPORT OUTPUT BITS SHADOW
1469
1470    ; BIT EQUATES FOR 'PBSHAD':
1471 0001    SINDEX   .EQU  ^B00000001         ;INDEX PULSE                      OUTPUT    UP-38
1472 0002    SCLCKP   .EQU  ^B00000010         ;CLOCK PULSE                      OUTPUT    UP-37
1473 0004    SDIRLV   .EQU  ^B00000100         ;DIRECTION LEVEL                  OUTPUT    UP-36
1474 0008    SPULRS   .EQU  ^B00001000         ;PULSE RESET RETRIGGER            OUTPUT    UP-35
1475 0010    SERCD1   .EQU  ^B00010000         ;ERROR CODE LSB                   OUTPUT    UP-34
1476 0020    SERCD2   .EQU  ^B00100000         ;ERROR CODE MIDDLE BIT            OUTPUT    UP-33
1477 0040    SERCD4   .EQU  ^B01000000         ;ERROR CODE MSB                   OUTPUT    UP-32
1478 0080    SERFLG   .EQU  ^B10000000         ;ERROR FLAG                       OUTPUT    UP-31
1479
1480
1481 0042 00  PCSHAD   .BYTE  0                ;PCPORT OUTPUT RAM SHADOW - COPY OF LSB OF POSITION
1482
1483 0043 00  PDSHAD   .BYTE  0                ;PDPORT OUTPUT RAM SHADOW - COPY OF MSB OF POSITION
1484
1485    ; NOTE: ALL BINARY INTEGER MULTI-BYTE QUANTITIES ARE MSB FIRST, LSB LAST
1486
1487    ; INCREMENTAL POSITION UP/DOWN COUNTER <74>
1488 0044 00 00  INCPOS  .DBYTE  0             ;COUNTS FROM 0 TO 'ENCSIZ-1 OR ("J"-1)
1489
1490    ; ABSOLUTE POSITION REGISTER <90>
1491 0046 00 00  ABSPOS  .DBYTE  0             ;ABSOLUTE POSITION AT MOST RECENTLY DECODED TAG <36>
1492
1493    ; USED BY POSITION COMPARATOR FUNCTION <91> AND POSITION ERROR FUNCTION <92>
1494 0048 00 00  POSDIF  .DBYTE  0             ;POSITION DIFFERENCE BETWEEN INCREMENTAL AND ABSOLUTE
1495
```

```
                    ; DIRECTION OF MOTION OF ENCODER BAND 30 (SIMILAR TO OUTPUT DIRECTION LEVEL SIGNAL <72> ON PIN 36):
1496                ; ENCODER MOTION DIRECTION
1497                ;                           ^H01 = POSITIVE, UP, RIGHT, OR CLOCKWISE
1498                ;                           ^HOFF = NEGATIVE, DOWN, LEFT, OR COUNTER-CLOCKWISE
1499 004a 00        ENCDIR  .BYTE  0            ^H00 = NO MOTION DETECTED SINCE POWER APPLIED
1500                ;
1501                ;
1502                ;        RIGHT  (UP, POSITIVE, CLOCKWISE) MOTION SERIAL SHIFT REGISTER <75>
1503 004b 00        RMSSR1  .BYTE  0            ;LEFT START FRAME AND UPPER DATA
1504 004c 00        RMSSR2  .BYTE  0            ;LOWER DATA
1505 004d 00        RMSSR3  .BYTE  0            ;RIGHT START FRAME AND PARITY BIT
1506                ;
1507                ;
1508                ;        LEFT  (DOWN, NEGATIVE, COUNTER-CLOCKWISE) MOTION SERIAL SHIFT REGISTER <76>
1509 004e 00        LMSSR1  .BYTE  0            ;LEFT START FRAME AND UPPER DATA
1510 004f 00        LMSSR2  .BYTE  0            ;LOWER DATA
1511 0050 00        LMSSR3  .BYTE  0            ;RIGHT START FRAME AND PARITY BIT
1512                ;
1513 0051 00        WHICH   .BYTE  0            ;WHICH CHANNEL (^H01 IF 'A', ^HOFF IF 'B') CAUSED CURRENT INTERRUPT REQUEST
1514                ;
1515                ; THE FOLLOWING LOCATIONS MONITOR THE RECENT HISTORY OF TRANSITIONS OF SIGNALS 57 AND 58.
1516 0052 00        CHATRN  .BYTE  0            ;MOST RECENT CHANNEL 'A' (SIGNAL 57) TRANSITION
1517                ;                           ^H01 = MOST RECENT CHANNEL 'A' TRANSITION WAS NEGATIVE
1518                ;                           ^HOFF = MOST RECENT CHANNEL 'A' TRANSITION WAS POSITIVE
1519                ;                           ^H00 = NO TRANSITIONS ON CHANNEL 'A' SINCE POWER APPLIED
1520                ;
1521 0053 00        CHBTRN  .BYTE  0            ;MOST RECENT CHANNEL 'B' (SIGNAL 58) TRANSITION
1522                ;                           ^H01 = MOST RECENT CHANNEL 'B' TRANSITION WAS NEGATIVE
1523                ;                           ^HOFF = MOST RECENT CHANNEL 'B' TRANSITION WAS POSITIVE
1524                ;                           ^H00 = NO TRANSITIONS ON CHANNEL 'B' SINCE POWER APPLIED
1525                ;
1526                ; THE FOLLOWING BYTES ARE FOR DETECTING VARIOUS COMBINATIONS OF SENSOR FAILURES
1527 0054 00        BDSNAT  .BYTE  0            ;SNAPSHOT OF STATES OF CHANNELS 'B' AND 'D' ON LAST TRANSITION OF CHANNEL 'A'
1528 0055 00        ADSNBT  .BYTE  0            ;SNAPSHOT OF STATES OF CHANNELS 'A' AND 'D' ON LAST TRANSITION OF CHANNEL 'B'
1529 0056 00        DUDCTR  .BYTE  0            ;CHANNEL 'D' UP/DOWN COUNTER 93 -> MOTION SINCE LAST TRANSITION OF CHANNEL 'D'
1530                ;
1531                ; THE FOLLOWING BYTE IS USED IN IMPLEMENTING THE "MISSED TAG ERROR" PORTION OF THE TAG ERROR FUNCTION 84.
1532 0057 00        MTGCTR  .BYTE  0            ;MISSING TAG COUNTER -> MOTION SINCE LAST FRAMED TAG
1533                ;
1534                ; THE FOLLOWING BYTES ARE FOR REPORTING SINGLE CHANNEL SENSOR FAILURES AND ARE USED IN IMPLEMENTING
1535                ; THE CHANNEL "A", "B", AND "D" FAULT DETECTOR FUNCTIONS SHOWN ON FIGURE 9A OF THE SPECIFICATION.
1536 0058 00        BADCHA  .BYTE  0            ;NON-ZERO IF SIGNAL FROM CHANNEL 'A' (SIGNAL 57) HAS FAILED
1537 0059 00        BADCHB  .BYTE  0            ;NON-ZERO IF SIGNAL FROM CHANNEL 'B' (SIGNAL 58) HAS FAILED
1538 005a 00        BADCHD  .BYTE  0            ;NON-ZERO IF SIGNAL FROM CHANNEL 'D' (SIGNAL 59) HAS FAILED
1539                ;
1540                ; THE FOLLOWING BYTES ARE FOR DETECTING FAULTY HYSTERESIS IN THE ANALOG LEVEL-CONVERSION CIRCUITRY.
1541                ; (I.E., THE OP AMPS <60>, <61>, AND <62>, AND THE SCHMIDT TRIGGERS <63>, <64>, AND <65>)
1542 005b 00        NAPTAN  .BYTE  0            ;# OF CHANNEL 'A' POSITIVE TRANSITION PULSE ANNIHILATIONS
1543 005c 00        NANTAN  .BYTE  0            ;# OF CHANNEL 'A' NEGATIVE TRANSITION PULSE ANNIHILATIONS
1544 005d 00        NBPTAN  .BYTE  0            ;# OF CHANNEL 'B' POSITIVE TRANSITION PULSE ANNIHILATIONS
1545 005e 00        NBNTAN  .BYTE  0            ;# OF CHANNEL 'B' NEGATIVE TRANSITION PULSE ANNIHILATIONS
1546                ;
1547                ; THE FOLLOWING BYTES ARE FOR DETECTING INTERRUPT TIMING PROBLEMS OR PROBLEMS WITH THE MICROPROCESSORS
1548                ; EDGE DETECT CIRCUITRY
1549 005f 00        CAPTFC  .BYTE  0            ;CHANNEL 'A' POSITIVE TRANSITION FAULT COUNTER
1550 0060 00        CANTFC  .BYTE  0            ;CHANNEL 'A' NEGATIVE TRANSITION FAULT COUNTER
1551 0061 00        CBPTFC  .BYTE  0            ;CHANNEL 'B' POSITIVE TRANSITION FAULT COUNTER
1552 0062 00        CBNTFC  .BYTE  0            ;CHANNEL 'B' NEGATIVE TRANSITION FAULT COUNTER
1553                ;
1554                ; THE FOLLOWING TWO LOCATIONS ARE USEFUL FOR MONITORING SMALL ROCKING MOTIONS
1555 0063 00        ENADRV  .BYTE  0            ;NUMBER OF CONSECUTIVE DIRECTION REVERSALS SEEN ON CHANNEL 'A'
1556 0064 00        ENBDRV  .BYTE  0            ;NUMBER OF CONSECUTIVE DIRECTION REVERSALS SEEN ON CHANNEL 'B'
1557                ;
1558                ; VIRTUAL MOTION SERIAL SHIFT REGISTER
1559                ; ON EACH ABSOLUTE TICK OF MOTION, THE CONTENTS OF WHICHEVER SERIAL SHIFT REGISTER (RIGHT 75 OR LEFT 76)
1560                ; CORRESPONDS TO THE CURRENT DIRECTION OF ENCODER MOTION (RIGHT OR LEFT) IS COPIED INTO THE VIRTUAL
1561                ; MOTION SHIFT REGISTER.  THIS SIMPLIFIES THE FRAMING GATING AND TAG DECODING FUNCTIONS, AND ALLOWS A
1562                ; COMMON CODE SEGMENT TO BE USED FOR EITHER DIRECTION OF MOTION. THIS COPY OPERATION EFFECTIVELY
1563                ; PERFORMS THE LEFT SIDE/RIGHT SIDE MULTIPLEXING FUNCTION THAT WAS PERFORMED (IN THE SPECIFICATION)
                    ; AT LATER STAGE OF PROCESSING BY THE ABSOLUTE POSITION MULTIPLEXER 87.
```

```
1564 0065 00          VMSSR1   .BYTE   0       ;LEFT START FRAME AND UPPER DATA
1565 0066 00          VMSSR2   .BYTE   0       ;LOWER DATA
1566 0067 00          VMSSR3   .BYTE   0       ;RIGHT START FRAME AND PARITY BIT
1567
1568                  ;AMOUNT TO SUBTRACT FROM ABSOLUTE POSITION TABLE ('RTNPOS') VALUE FOR A GIVEN SIDE FRAMING.
1569 0068 00          DELTA    .BYTE   0       ;ZERO IF TAG 36 FRAMED IN RIGHT SHIFT REGISTER 75, 'LDELTA' IF IN LEFT 76.
1570
1571                  ;ABSOLUTE POSITION TAG SEQUENCE NUMBER REGISTER
1572 0069 00 00       ENCABT   .DBYTE  0       ;MOST RECENTLY DECODED ABSOLUTE POSITION TAG SEQUENCE NUMBER
1573
1574                  ;NOTE:  THE ABSOLUTE POSITION TAG SEQUENCE NUMBER IS NOT THE SAME AS AN ABSOLUTE POSITION TAG <36>.
1575                  ;       THE TAG SEQUENCE NUMBER REPRESENTS AN INTERMEDIATE LEVEL OF TAG DECODING.  THE RAW ABSOLUTE
1576                  ;       POSITION TAG <36> IS FIRST DECODED INTO AN INTERMEDIATE POSITION TAG SEQUENCE NUMBER (USING THE
1577                  ;       TAG DECODING TABLE 'TAGNUM'), WHICH IS IN TURN DECODED INTO AN ABSOLUTE POSITION.  THIS
1578                  ;       INTERMEDIATE LEVEL OF DECODING SIMPLIFIES TAG ADJACENCY CHECKING, AND ALSO REDUCES THE TOTAL
1579                  ;       SIZE OF THE TAG DECODING TABLES.
1580
1581                  ;THE FOLLOWING LOCATION IS USED IN IMPLEMENTING TAG ADJACENCY CHECKING
1582 006b 00 00       ENLABT   .DBYTE  0       ;PREVIOUSLY DECODED ABSOLUTE POSITION TAG SEQUENCE NUMBER
1583
1584                  ;INITIALIZATION STATE - CLEARED TO ZERO ON POWER-UP
1585 006d 00          POSUNK   .BYTE   0       ;POSITION UNKNOWN FLAG
1586                                                   00 = POSITION COMPLETELY UNKNOWN
1587                                                   C1 = 1 VALID ABSOLUTE POSITION TAG DECODED
1588                                                   02 = 2 VALID & DISTINCT ABS. POS'N TAGS DECODED
1589                                                   On = n VALID & DISTINCT ABS. POS'N TAGS DECODED
1590                                                   80 = REQUIRED # OF VALID & DISTINCT TAGS FOUND; POSITION INITIALIZED
1591
1592 006e 00 00       TAGDIF   .DBYTE  0       ;ABSOLUTE VALUE OF DIFFERENCE BETWEEN CURRENT AND LAST TAG SEQUENCE NUMBERS
1593
1594                  ;TAG ERROR FLAGS -.THESE ARE USED IN IMPLEMENTING THE VARIOUS COMPONENTS OF THE TAG ERROR FUNCTION 84.
1595 0070 00 00       ENADJC   .DBYTE  0       ;NON-ZERO IF ADJACENCY ERROR
1596
1597 0072 00          BADTER   .BYTE   0       ;NON-ZERO IF INVALID (INCORRECT PARITY OR UNASSIGNED) TAG <36> IS PROPERLY FRAMED
1598
1599 0073 00 00       BADTAG   .DBYTE  0       ;ACTUAL INVALID TAG VALUE OF MOST RECENT INVALID (INCORRECT PARITY) TAG <36>
1600
1601 0075 00          MTGERR   .BYTE   0       ;NON-ZERO IF MISSING TAG ERROR
1602                                           ;IF NON-ZERO, INDICATES THAT ENCODER MOVED FAR ENOUGH THAT IT SHOULD HAVE
1603                                           ;  ENCOUNTERED A TAG <36>, BUT NONE WAS FOUND.
1604
1605 0076 00          ERRNUM   .BYTE   0       ;ERROR CODE POSTED TO OUTPUT PORT
1606
1607 0077 00 00       CODPTR   .ADDR   0       ;ADDRESS POINTER FOR INDEXING INTO 'TAGNUM' TABLE
1608 0079 00 00       TAGPTR   .ADDR   0       ;ADDRESS POINTER FOR INDEXING INTO 'RTNPOS' TABLE
1609
1610                  ;THE FOLLOWING VARIABLES AND SYMBOL EQUATES ARE USED BY THE BINARY TO DECIMAL CONVERT ROUTINES,
1611                  ;WHICH ARE IN TURN USED TO GENERATE THE OPTIONAL DIAGNOSTIC OUTPUTS ON THE ASCII SERIAL INTERFACE.
1612                  ;THESE CAN BE ELIMINATED IF THE OPTIONAL DIAGNOSTIC OUTPUT SOFTWARE IS DELETED.
1613
1614 0002            LBNFLD   EQU     2       ;EFFECTIVE LENGTH OF 'BINFLD'
1615 007b 00         BINFLD   .ZERO   3       ;GEN. PURPOSE BINARY INTEGER FIELD
1616 007e 00         BYTCTR   .BYTE   0       ;GENERAL PURPOSE BYTE COUNTER
1617
1618 007f 00         CVTEMP   .ZERO   3       ;3 BYTE TEMPORARY BINARY AREA
1619 0082 00         CVTDIG   .BYTE   0       ;VALUE OF CURRENT OUTPUT DIGIT
1620 0083 00         CVTWHD   .BYTE   0       ;WHICH DIGIT IS ACTIVE
1621
1622 0084            CVTOUT   EQU     .       ;OUTPUT CONVERSION AREA
1623 0084 00         CVTSGN   .BYTE   0       ;DIGIT #0 - SIGN ('HO' IF POSITIVE, 'HOFF IF NEGATIVE)
1624 0085 00         CVONES   .BYTE   0       ;DIGIT #1 - UNITS DIGIT
1625 0086 00         CV10     .BYTE   0       ;DIGIT #2 - TENS DIGIT
1626 0087 00         CV100    .BYTE   0       ;DIGIT #3 - HUNDREDS DIGIT
1627 0088 00         CV1K     .BYTE   0       ;DIGIT #4 - THOUSANDS DIGIT
1628 0089 00         CV10K    .BYTE   0       ;DIGIT #5 - 10 THOUSANDS DIGIT
1629 008a 00         CV100K   .BYTE   0       ;DIGIT #6 - 100 THOUSANDS DIGIT
```

```
1630  008b 00                     CV1M       .BYTE   0         ;DIGIT #7 - MILLIONS DIGIT
1631  0007                        CVTLEN     .EQU    CV1M-CVTOUT
1632  008c                        RAMEND     .EQU    .         ;MARKS NEXT AVAILABLE FREE RAM LOCATION
1633
1634                              ; DIGIT NUMBER EQUATES FOR UNPACKED BCD FIELD IN 'CVTOUT'
1635
1636  0001                        DGONE      .EQU    1         ;DIGIT #1 -- ONE
1637  0002                        DGTEN      .EQU    2         ;DIGIT #2 -- TEN
1638  0003                        DG1HUN     .EQU    3         ;DIGIT #3 -- 1 HUNDRED
1639  0004                        DGONEK     .EQU    4         ;DIGIT #4 -- 1 THOUSAND
1640  0005                        DGTENK     .EQU    5         ;DIGIT #5 -- 10 THOUSAND
1641  0006                        DG100K     .EQU    6         ;DIGIT #6 -- 100 THOUSAND
1642  0007                        DG1MEG     .EQU    7         ;DIGIT #7 -- 1 MILLION
1643
1644                              ; ASCII SYMBOL EQUATES USED BY OPTIONAL DIAGNOSTIC OUTPUT ROUTINES
1645
1646  000d                        CARRET     .EQU    ^OD       ;HEX OD IS ASCII CODE FOR CARRIAGE RETURN
1647  000a                        LINEFD     .EQU    ^OA       ;HEX OA IS ASCII CODE FOR LINE FEED
1648
1649                              ; 14. PROGRAM LISTINGS FOR THE INTERRUPT SERVICE ROUTINES
1650                              ;
1651
1652  f692                                   .ORG    TABEND    ;RE-SET ASSEMBLER'S ORIGIN INTO EPROM JUST PAST TAG DECODE TABLES
1653
1654                              ;******************************************************************
1655                              ;***                                                            ***
1656                              ;***       R E G I S T E R    C O N V E N T I O N S            ***
1657                              ;***                                                            ***
1658                              ;***       'A' REGISTER IS SAVED AND RESTORED OVER ALL INTERRUPTS ***
1659                              ;***       'Y' REGISTER IS SAVED AND RESTORED OVER INTERRUPTS WHICH USE IT ***
1660                              ;***       'X' REGISTER IS SAVED AND RESTORED OVER ALL INTERRUPTS ***
1661                              ;***                                                            ***
1662                              ;******************************************************************
1663
1664                              ; NOTE THAT INTERRUPTS ARE NOT HANDLED RECURSIVELY. SERVICING OF A GIVEN INTERRUPT REQUEST
1665                              ; COMPLETES BEFORE SERVICING OF ANY SUBSEQUENT INTERRUPT REQUESTS IS INITIATED.
1666
1667
1668                              ; INTERRUPT SERVICE DISPATCHING ROUTINE
1669  f692 d8                     IRQSRV     CLD               ;INSURE INTERRUPT SERVICE IN BINARY
1670  f693 48                                PHA               ;SAVE ACCUMULATOR (I.E., THE 'A' REGISTER)
1671  f694 8a                                TXA
1672  f695 48                                PHA               ;SAVE 'X' REGISTER
1673
1674  f696 a6 00                             LDX     PAPORT    ;TAKE SNAPSHOT OF ALL THREE CHANNELS (SIGNALS 57, 58, 59)
1675                                                           ;AND DISPATCH TO THE SERVICE ROUTINE APPROPRIATE FOR
1676                              ; TEST BITS IN INTERRUPT FLAG REGISTER "IFR" AND DISPATCH TO THE SERVICE ROUTINE APPROPRIATE FOR
1677                              ; THE TRANSITION WHICH CAUSED THE CURRENT INTERRUPT REQUEST
1678
1679  f698 9f 11 0d                          BBS     #<IFAPOS>,IFR,IRAPOS  ;CHANNEL 'A' (SIGNAL 57) POSITIVE TRANSITION
1680  f69b af 11 1c                          BBS     #<IFANEG>,IFR,IRANEG  ;CHANNEL 'A' (SIGNAL 57) NEGATIVE TRANSITION
1681  f69e bf 11 3d                          BBS     #<IFBNEG>,IFR,IRBNEG  ;CHANNEL 'B' (SIGNAL 58) NEGATIVE TRANSITION
1682  f6a1 8f 11 28                          BBS     #<IFBPOS>,IFR,IRBPOS  ;CHANNEL 'B' (SIGNAL 58) POSITIVE TRANSITION
1683
1684                              ; INTERRUPT GOT LOST, SO IGNORE IT.
1685
1686                              ; COMMON INTERRUPT EXIT
1687  f6a4 68                     INTXIT     PLA
1688  f6a5 aa                                TAX
1689  f6a6 68                                PLA               ;RESTORE 'X' REGISTER
1690  f6a7 40                                RTI               ;RESTORE 'A' REGISTER
```

```
                        ; INTERRUPT SERVICE ROUTINES FOR CHANNEL 'A' (SIGNAL 57) TRANSITIONS:

; INTERRUPT SERVICE ROUTINE CHANNEL 'A' (SIGNAL 57) POSITIVE TRANSITION
                        IRAPOS   RMB     #<IFAPOS>,IFRCLR      ;ACKNOWLEDGE INTERRUPT, CLEAR FLAG IN "IFR"
f6a8  17 10
f6a8 2f 11 08           ; CHECK OPPOSITE TRANSITION FLAG FOR PULSE ANNIHILATION
                                 BBR     #<IFANEG>,IFR,$10     ;FLAG NOT SET, NO ANNIHILATION
                        ;
                        ; THE CHANNEL 'A' NEGATIVE TRANSITION FLAG IS ALSO SET.   THESE TWO, OPPOSITE
                        ; TRANSITIONS ON THE SAME CHANNEL ANNIHILATE EACH OTHER.  PROBABLY NOISE SPIKE,
                        ; OR OP AMPS SET INCORRECTLY WITH INSUFFICIENT HYSTERESIS.
f6ad 27 10                       RMB     #<IFANEG>,IFRCLR      ;CLEAR NEGATIVE TRANSITION FLAG
f6af e6 5b              $5       INC     NAPTAN                ;COUNT A POSITIVE TRANSITION ANNIHILATION
f6b1 f0 fc                       BEQ     $5                    ;DON'T LET COUNTER WRAP TO ZERO
f6b3 d0 ef                       BNE     INTXIT                ;IGNORE THIS INTERRUPT
                        ;
                        ; VALID POSITIVE TRANSITION ON CHANNEL 'A'
f6b5 a9 ff              $10      LDA     #^HOFF                ;INDICATE THAT THIS WAS A POSITIVE TRANSITION
f6b7 4c f0 f6                    JMP     IRACOM                ;COMMON PROCESSING FOR CHANNEL 'A' TRANSITIONS

; INTERRUPT SERVICE ROUTINES FOR CHANNEL 'A' (SIGNAL 57) NEGATIVE TRANSITION
                        IRANEG   RMB     #<IFANEG>,IFRCLR      ;ACKNOWLEDGE INTERRUPT, CLEAR FLAG IN "IFR"
f6ba 27 10
f6bc 1f 11 08           ; CHECK OPPOSITE TRANSITION FLAG FOR PULSE ANNIHILATION
                                 BBR     #<IFAPOS>,IFR,$10     ;FLAG NOT SET, NO ANNIHILATION
                        ;
                        ; THE CHANNEL 'A' POSITIVE TRANSITION FLAG IS ALSO SET.   THESE TWO, OPPOSITE
                        ; TRANSITIONS ON THE SAME CHANNEL ANNIHILATE EACH OTHER.  PROBABLY NOISE SPIKE,
                        ; OR OP AMPS SET INCORRECTLY WITH INSUFFICIENT HYSTERESIS.
f6bf 17 10                       RMB     #<IFAPOS>,IFRCLR      ;CLEAR POSITIVE TRANSITION FLAG
f6c1 e6 5c              $5       INC     NANTAN                ;COUNT A NEGATIVE TRANSITION ANNIHILATION
f6c3 f0 fc                       BEQ     $5                    ;DON'T LET COUNTER WRAP TO ZERO
f6c5 d0 dd                       BNE     INTXIT                ;IGNORE THIS INTERRUPT
                        ;
                        ; VALID NEGATIVE TRANSITION ON CHANNEL 'A'
f6c7 a9 01              $10      LDA     #$01                  ;INDICATE THAT THIS WAS A NEGATIVE TRANSITION
f6c9 4c f0 f6                    JMP     IRACOM                ;COMMON PROCESSING FOR CHANNEL 'A' TRANSITIONS

; INTERRUPT SERVICE ROUTINE FOR CHANNEL 'B' (SIGNAL 58) TRANSITIONS:

; INTERRUPT SERVICE ROUTINE FOR CHANNEL 'B' (SIGNAL 58) POSITIVE TRANSITION
                        IRBPOS   RMB     #<IFBPOS>,IFRCLR      ;ACKNOWLEDGE INTERRUPT, CLEAR FLAG
f6cc 07 10
f6ce 3f 11 08           ; CHECK OPPOSITE TRANSITION FLAG FOR PULSE ANNIHILATION
                                 BBR     #<IFBNEG>,IFR,$10     ;FLAG NOT SET, NO ANNIHILATION
                        ;
                        ; THE CHANNEL 'B' NEGATIVE TRANSITION FLAG IS ALSO SET.   THESE TWO, OPPOSITE
                        ; TRANSITIONS ON THE SAME CHANNEL ANNIHILATE EACH OTHER.  PROBABLY NOISE SPIKE,
                        ; OR OP AMPS SET INCORRECTLY WITH INSUFFICIENT HYSTERESIS.
f6d1 37 10                       RMB     #<IFBNEG>,IFRCLR      ;CLEAR NEGATIVE TRANSITION FLAG
f6d3 e6 5d              $5       INC     NBPTAN                ;COUNT A POSITIVE TRANSITION ANNIHILATION
f6d5 f0 fc                       BEQ     $5                    ;DON'T LET COUNTER WRAP TO ZERO
f6d7 d0 cb                       BNE     INTXIT                ;IGNORE THIS INTERRUPT
                        ;
                        ; VALID POSITIVE TRANSITION ON CHANNEL 'B'
f6d9 a9 01              $10      LDA     #$01                  ;INDICATE THAT THIS WAS A POSITIVE TRANSITION
f6db 4c 58 f7                    JMP     IRBCOM                ;COMMON PROCESSING FOR CHANNEL 'B' TRANSITIONS

; INTERRUPT SERVICE ROUTINE FOR CHANNEL 'B' (SIGNAL 58) NEGATIVE TRANSITION
```

```
1764  f6de                  IRBNEG   RMB    #<IFBNEG>,IFRCLR      ;ACKNOWLEDGE INTERRUPT, CLEAR FLAG
1765  f6de  37 10
1766
1767           ; CHECK OPPOSITE TRANSITION FLAG FOR PULSE ANNIHILATION
1768  f6e0  0f 11 08                 BBR    #<IFBPOS>,IFR,$10     ;FLAG NOT SET, NO ANNIHILATION
1769
1770           ; THE CHANNEL 'B' POSITIVE TRANSITION FLAG IS ALSO SET.  THESE TWO, OPPOSITE
1771           ; TRANSITIONS ON THE SAME CHANNEL ANNIHILATE EACH OTHER.  PROBABLY NOISE SPIKE,
1772           ; OR OP AMPS SET INCORRECTLY WITH INSUFFICIENT HYSTERESIS.
1773  f6e3  07 10                    RMB    #<IFBPOS>,IFRCLR      ;CLEAR POSITIVE TRANSITION FLAG
1774  f6e5  e6 5e                    INC    NBNTAN                ;COUNT A NEGATIVE TRANSITION ANNIHILATION
1775  f6e7  f0 fc            $5      BEQ    $5                    ;DON'T LET COUNTER WRAP TO ZERO
1776  f6e9  d0 b9                    BNE    INTXIT                ;IGNORE THIS INTERRUPT
1777
1778
1779           ; VALID NEGATIVE TRANSITION ON CHANNEL 'B'
1780  f6eb  a9 ff            $10     LDA    #^HOFF                ;INDICATE THAT THIS WAS A NEGATIVE TRANSITION
1781  f6ed  4c 58 f7                 JMP    IRBCOM                ;COMMON PROCESSING FOR 'B' TRANSITIONS
1782
1783           ; COMMON INTERRUPT SERVICING FOR CHANNEL 'A' (SIGNAL 57) TRANSITIONS:
1784
1785           ; THIS CODE SEGMENT IS EXECUTED ON EVERY NON-ANNIHILATED TRANSITION OF THE SIGNAL FROM CHANNEL 'A', (I.E.,
1786           ; SIGNAL 57). THIS SEGMENT IS ENTERED WITH A SNAPSHOT OF THE STATES OF ALL THREE CHANNELS ('A', 'B', AND
1787           ; 'D') STORED IN THE 'X' REGISTER, AND A VALUE CORRESPONDING TO THE SENSE OF THE CHANNEL 'A' TRANSITION
1788           ; STORED IN THE 'A' REGISTER (HEX 'FF' IF TRANSITION WAS POSITIVE-GOING, HEX '01' IF TRANSITION WAS
1789           ; NEGATIVE-GOING).
1790  f6f0            IRACOM
1791
1792           ; COMPARE THE SENSE OF THE CURRENT CHANNEL 'A' TRANSITION (IN REGISTER 'A') TO THE SENSE
1793           ; OF THE PREVIOUS CHANNEL 'A' TRANSITION STORED IN 'CHATRN'. IF POWER JUST CAME ON,
1794           ; 'CHATRN' WILL BE ZERO, SO THE FOLLOWING 'BIT' TEST WILL SET THE ZERO STATUS BIT IN
1795           ; THE PROCESSOR STATUS REGISTER.
1796
1797  f6f0  24 52                    BIT    CHATRN                 ;FIRST 'A' TRANSITION SINCE POWER UP?
1798  f6f2  d0 05                    BNE    $0                    ;NO
1799
1800           ; THIS IS THE FIRST 'A' TRANSITION FOLLOWING POWER UP, NEED TO INITIALIZE.
1801           ;                                                   ;SAVE AS PREVIOUS TRANSITION FOR THIS TRANSITION
1802  f6f4  85 52                    STA    CHATRN                ;AND TAKE SNAPSHOT FOR THIS TRANSITION
1803  f6f6  4c 36 f7                 JMP    $9
1804
1805           ; THE FOLLOWING SEGMENT FROM $0 TO JUST BEFORE $3 IS PRIMARILY FOR HARDWARE
1806           ; TESTING OF THE SCHMIDT TRIGGERS IN THE ANALOG CONVERSION CIRCUITRY AND THE
1807           ; EDGE DETECT CIRCUITRY OF THE MICROPROCESSOR.  IT IS NOT A REQUIRED PART OF
1808           ; THE SIGNAL PROCESSING PERFORMED TO DECODE THE ENCODER SIGNALS.
1809
1810           ; NOT THE FIRST 'A' TRANSITION AFTER POWER-UP.
1811  f6f9  c5 52            $0      CMP    CHATRN                ;IS SENSE OF 'A' TRANSITION SAME AS LAST ONE?
1812  f6fb  d0 10                    BNE    $3                    ;NO, 'A' TRANSITIONS ALTERNATING AS THEY SHOULD
1813
1814           ; THE SAME SENSE OF 'A' TRANSITION HAS BEEN DETECTED TWICE IN A ROW, I.E.,
1815           ; WE HAVE SEEN 2 POSITIVE GOING TRANSITIONS WITHOUT AN INTERVENING NEGATIVE
1816           ; TRANSITION, OR VICE VERSA. IF SO, EITHER THERE IS AN INTERRUPT SERVICE
1817           ; TIMING PROBLEM, OR THE RISE TIME OF ONE OF THE EDGES IS TOO SLOW TO BE
1818           ; DETECTED BY THE R65/11EB CHIP.  IN EITHER CASE, COUNT AN OCCURENCE IN THE
1819           ; APPROPRIATE FAULT DETECTION COUNTER.
1820
1821  f6fd  29 ff                    AND    #^HOFF                 ;RESET CONDITION CODE FROM ACCUMULATOR
1822  f6ff  30 06                    BMI    $2                    ;TWO POSITIVE TRANSITIONS (HEX 'FF' IF POSITIVE)
1823
1824           ; 2 NEGATIVE TRANSITIONS SENSED WITHOUT INTERVENING POSITIVE TRANSITION
1825  f701  e6 60                    INC    CANTFC                ;CHANNEL 'A' NEGATIVE TRANSITION FAULT COUNTER
1826  f703  f0 fc                    BEQ    $1                    ;DON'T ALLOW COUNTER TO WRAP TO ZERO
1827  f705  d0 2f                    BNE    $9                    ;UNCONDITIONAL BRANCH
1828
1829           ; 2 POSITIVE TRANSITIONS SENSED WITHOUT INTERVENING NEGATIVE TRANSITION
1830  f707  e6 5f            $2      INC    CAPTFC                ;CHANNEL 'A' POSITIVE TRANSITION FAULT COUNTER
1831  f709  f0 fc                    BEQ    $2                    ;DON'T ALLOW COUNTER TO WRAP TO ZERO
1832  f70b  d0 29                    BNE    $9                    ;UNCONDITIONAL BRANCH
1833           ; END OF HARDWARE DIAGNOSTIC SEGMENT
```

```
1834                   ; SENSE OF 'A' CHANNEL TRANSITION HAS ALTERNATED, AS IT SHOULD.
1835                   ; SAVE CURRENT TRANSITION SENSE FOR USE AS NEXT PREVIOUS SENSE.
1836 f70d 85 52        $3      STA     CHATRN          ;'FF' FOR POSITIVE TRANSITION, '01' FOR NEGATIVE
1837
1838
1839                   ; SINCE THERE HAS BEEN A TRANSITION ON CHANNEL 'A', IT IS CLEARLY NOT DEAD
1840 f70f a9 00                LDA     #00             ;SO ZERO OUT THE CHANNEL 'A' DEAD FLAG
1841 f711 85 58                STA     BADCHA          ;THIS WOULD BE SET NON-ZERO IF CHANNEL 'A' APPEARS DEAD
1842
1843                   ; THE FOLLOWING CODE SEGMENT UP TO JUST BEFORE $7 CHECKS FOR A FAILURE OF THE CHANNEL 'B' SIGNAL BY
1844                   ; COMPARING THE CURRENT STATES OF THE 'B' AND 'D' SIGNALS TO THE STATES THEY HAD ON THE PREVIOUS
1845                   ; TRANSITION OF CHANNEL 'A'. THIS BLOCK OF CODE IMPLEMENTS THE CHANNEL 'B' (I.E., SIGNAL 58) FAULT
1846                   ; DETECTOR SHOWN ON FIGURE 9A OF THE SPECIFICATION.
1847
1848                   ; NOW CHECK IF STATES OF CHANNELS 'B' OR 'D' HAVE CHANGED SINCE LAST TRANSITION
1849                   ; OF CHANNEL 'A'. THERE ARE ONLY 4 POSSIBLE CASES:
1850
1851                   ;       CASE 1: NEITHER CHANNEL 'B' NOR 'D' CHANGED
1852                   ;       CASE 2: ONLY CHANNEL 'B' CHANGED
1853                   ;       CASE 3: ONLY CHANNEL 'D' CHANGED
1854                   ;       CASE 4: BOTH CHANNELS 'B' AND 'D' CHANGED
1855
1856 f713 8a                   TXA                     ;REFRESH FROM SNAPSHOT OF THE CURRENT STATE OF ALL THREE CHANNELS
1857 f714 29 11                AND     #[CHANLB!CHANLD] ;COMPARE TO STATES ON LAST TRANSITION OF CHANNEL 'A'
1858 f716 45 54                EOR     BDSNAT
1859 f718 d0 06                BNE     $5              ;EITHER CHANNEL 'B', 'D', OR BOTH HAVE CHANGED
1860
1861                   ; CASE 1: NEITHER CHANNEL 'B' NOR 'D' CHANGED STATE, I.E., THEY ARE BOTH IN THE
1862                   ; SAME STATE THEY WERE IN WHEN THE LAST TRANSITION ON CHANNEL 'A' OCCURRED.
1863                   ; THIS MEANS THE ENCODER HAS REVERSED DIRECTION ACROSS A CHANNEL 'A' EDGE.
1864
1865 f71a e6 63        $4      INC     ENADRV          ;COUNT A DIRECTION REVERSAL SEEN ON CHANNEL 'A'
1866 f71c f0 fc                BEQ     $4              ;DON'T LET COUNTER WRAP TO ZERO
1867 f71e d0 16                BNE     $9              ;UNCONDITIONAL BRANCH
1868
1869                   ; AT LEAST ONE OF THE CHANNELS 'B' OR 'D' IS IN A DIFFERENT STATE THAN IT WAS
1870                   ; IN WHEN THE LAST NON-ANNIHILATED TRANSITION ON CHANNEL 'A' OCCURRED.
1871
1872 f720 c9 01        $5      CMP     #CHANLB         ;DID CHANNEL 'B' CHANGE WITHOUT CHANNEL 'D'?
1873 f722 f0 0e                BEQ     $8              ;YES, CASE 2: ONLY CHANNEL 'B' CHANGED
1874 f724 c9 11                CMP     #[CHANLB!CHANLD] ;DID BOTH CHANNELS 'B' AND 'D' CHANGE?
1875 f726 f0 04                BEQ     $7              ;YES, CASE 4: BOTH CHANNELS 'B' AND 'D' CHANGED
1876
1877                   ; OF THE 4 CASES, CASES 1, 2, AND 4 HAVE ALREADY BEEN EXPLICITLY TESTED.
1878                   ; IF WE REACH THIS POINT, ONLY CASE 3 IS LEFT.
1879
1880                   ; CASE 3: ONLY CHANNEL 'D' CHANGED. SINCE 'D' HAS CHANGED STATE BETWEEN OPPOSING
1881                   ; TRANSITIONS OF 'A', WE KNOW THAT THE ENCODER IS NOT SIMPLY ROCKING BACK AND
1882                   ; FORTH ACROSS AN EDGE ON THE 'A' CHANNEL, AND WE SHOULD HAVE SEEN A CHANGE IN
1883                   ; THE STATE OF CHANNEL 'B' AS WELL. SINCE WE DID NOT, CHANNEL 'B' MUST BE DEAD.
1884
1885 f728 e6 59                INC     BADCHB          ;COUNT A FAILURE OF THE CHANNEL 'B' SIGNAL
1886 f72a f0 fc        $6      BEQ     $6              ;DON'T LET COUNTER WRAP TO ZERO
1887
1888                   ; NEXT, UPDATE THE VARIOUS RAM LOCATIONS WHICH KEEP TRACK OF TRANSITIONS DETECTED ON THE SIGNALS FROM
1889                   ; CHANNELS 'B' AND 'D', AND WHICH ARE USED BY THE CHANNEL "D" (SIGNAL 59) FAULT DETECTOR OF FIGURE 9A.
1890
1891                   ; THERE HAS BEEN A TRANSITION ON CHANNEL 'D' (WITH OR WITHOUT A CORRESPONDING
1892                   ; TRANSITION ON CHANNEL 'B'), NEED TO RESET THE CHANNEL 'D' UP/DOWN COUNTER TO
1893                   ; INDICATE THAT CHANNEL 'D' IS STILL ALIVE, AND ALSO ZERO THE FAULT INDICATOR.
1894
1895 f72c a9 00        $7      LDA     #00
1896 f72e 85 56                STA     DUDCTR
1897 f730 85 5a                STA     BADCHD
1898
1899                   ; THERE HAS BEEN A TRANSITION ON EITHER CHANNEL 'B' OR CHANNEL 'D', SO ENCODER
1900                   ; HAS NOT JUST REVERSED DIRECTION ACROSS A CHANNEL 'A' EDGE.
1901
1902 f732 a9 00        $8      LDA     #00
```

```
1903                                          ;COUNTS CONSECUTIVE REVERSALS ACROSS AN 'A' EDGE
1904                   STA      ENADRV
1905       ; NOW SAVE THE STATE OF CHANNELS 'B' AND 'D' CORRESPONDING TO THE CURRENT
1906       ; TRANSITION OF CHANNEL 'A' FOR USE BY THE NEXT CHANNEL 'A' TRANSITION SERVICE
1907
1908 f734 85 63    $9   TXA
1909 f736 8a            AND      #CHANLB!CHANLD  ;REFRESH ACCUMULATOR FROM SNAPSHOT OF STATES
1910 f737 29 11         STA      BDSNAT         ;SELECT THE CHANNEL 'B' AND 'D' BITS
     f739 85 54                                  ;SAVE AS 'B' AND 'D' SNAPSHOT ON 'A' TRANSITION
1911
1912       ; THE FOLLOWING BLOCK OF CODE THROUGH LABEL $14 IMPLEMENTS A PORTION OF THE PHASE COMPARATOR 71.
1913       ; IT DETERMINES THE ENCODER DIRECTION "ENCDIR", AND HENCE THE DIRECTION LEVEL SIGNAL 72. IT ALSO
1914       ; DETERMINES IF THE APPROPRIATE PHASE COMPARATOR OPERATING FREQUENCY) OF
1915       ; SIGNAL TRANSITION HAS OCCURRED TO ALLOW GENERATION OF A CLOCK PULSE SIGNAL 73.
1916
1917       ; NOW SET ENCODER DIRECTION USING THE STATE OF CHANNEL 'B' AND THE SENSE OF THE
1918       ; MOST RECENT CHANNEL 'A' TRANSITION. SNAPSHOT OF CURRENT SIGNAL STATES IS IN 'A' REGISTER.
1919
1920 f73b 29 01         AND      #CHANLB        ;SELECT THE CHANNEL 'B' BIT
1921 f73d f0 02         BEQ      $10            ;CHANNEL 'B' IS IN THE LOW STATE. LEAVES 'XOR' MASK OF ZERO IN 'A' REG.
1922
1923       ; CHANNEL 'B' IS IN THE HIGH STATE. LOAD REGISTER 'A' WITH A MASK WHICH WILL
1924       ; REVERSE THE SENSE OF THE MOST RECENT CHANNEL 'A' TRANSITION.
1925 f73f a9 fe         LDA      #^HOFE         ;WILL 'EXCLUSIVE OR' HEX FF TO 01, AND 01 TO FF
1926
1927 f741 45 52  $10    EOR      CHATRN         ;SENSE OF MOST RECENT CHANNEL 'A' TRANSITION
1928 f743 85 4a         STA      ENCDIR         ;SAVE AS ENCODER DIRECTION (HEX FF = LEFT, HEX 01 = RIGHT)
1929
1930       ; NOW CHECK IF THIS TRANSITION IS AT THE PROPER FREQUENCY FOR THE INCREMENTAL POSITION PHASE COMPARATOR
1931 f745 a9 00         LDA      #INFREQ        ;INCREMENTAL POSITION FREQUENCY: 1X, 2X, OR 4X
1932 f747 30 0a         BMI      $14            ;4X FREQUENCY: ALL TRANSITIONS RECOGNIZED
1933 f749 d0 08         BNE      $12            ;2X FREQUENCY: ALL TRANSITIONS OF 'A' RECOGNIZED
1934
1935       ; 1X FREQUENCY SELECTED FOR INCREMENTAL POSITION. ONLY RECOGNIZE TRANSITIONS ON
1936       ; CHANNEL 'A' THAT OCCUR WHEN CHANNEL 'B' IS IN THE DESIRED (IN THIS CASE LOW)
1937       ; STATE.
1938 f74b 8a            TXA                     ;REFRESH ACCUMULATOR FROM SNAPSHOT OF STATES
1939 f74c 29 01         AND      #CHANLB        ;SELECT THE CHANNEL 'B' BIT
1940 f74e f0 03         BEQ      $11            ;CHANNEL 'B' IS IN DESIRED STATE
1941 f750 4c a4 f6      JMP      INTXIT         ;NOT IN DESIRED STATE. DO NOT RECOGNIZE IT.
1942
1943 f753         $11                           ;SATISFIED CONDITIONS FOR 1X FREQUENCY PHASE COMPARATOR
1944 f753         $12                           ;SATISFIED CONDITIONS FOR 2X FREQUENCY PHASE COMPARATOR
1945 f753         $14                           ;SATISFIED CONDITIONS FOR 4X FREQUENCY PHASE COMPARATOR
1946
1947 f753 a9 01         LDA      #01            ;INDICATE THAT THE TRANSITION WAS FROM CHANNEL 'A'
1948 f755 4c b9 f7      JMP      COMOTN         ;JOIN COMMON CODE SEGMENT FOR HANDLING ALL INCREMENTAL MOTIONS
1949
1950       ; COMMON INTERRUPT SERVICING FOR CHANNEL 'B' (SIGNAL 58) TRANSITIONS
1951
1952       ; THIS CODE SEGMENT IS EXECUTED ON EVERY NON-ANNIHILATED TRANSITION OF THE SIGNAL FROM CHANNEL 'B', (I.E.,
1953       ; SIGNAL 58). THIS SEGMENT IS ENTERED WITH A SNAPSHOT OF THE STATES OF ALL THREE CHANNELS ('A', 'B', AND
1954       ; 'D') STORED IN THE 'X' REGISTER, AND A VALUE CORRESPONDING TO THE SENSE OF THE CHANNEL 'B' TRANSITION
1955       ; STORED IN THE 'A' REGISTER (HEX '01' IF TRANSITION WAS POSITIVE-GOING, HEX 'FF' IF TRANSITION WAS
1956       ; NEGATIVE-GOING).
1957
1958 f758  IRBCOM
1959
1960       ; COMPARE THE SENSE OF THE CURRENT CHANNEL 'B' TRANSITION (IN REGISTER 'A') TO THE SENSE
1961       ; OF THE PREVIOUS CHANNEL 'B' TRANSITION STORED IN 'CHBTRN'. IF POWER JUST CAME ON,
1962       ; 'CHBTRN' WILL BE ZERO, SO THE FOLLOWING 'BIT' TEST WILL SET THE ZERO STATUS BIT IN
1963       ; THE PROCESSOR STATUS REGISTER.
1964
1965 f758 24 53         BIT      CHBTRN         ;FIRST 'B' TRANSITION SINCE POWER UP?
1966 f75a d0 05         BNE      $0             ;NO
1967
1968       ; THIS IS THE FIRST 'B' TRANSITION FOLLOWING POWER UP. NEED TO INITIALIZE.
```

```
1970                                STA     CHBTRN          ;SAVE AS PREVIOUS TRANSITION
1971  f75c 85 53                    JMP     $9              ;AND TAKE SNAPSHOT FOR THIS TRANSITION
1972  f75e 4c 9e f7
1973
1974  ; THE FOLLOWING SEGMENT FROM $0 TO JUST BEFORE $3 IS PRIMARILY FOR HARDWARE
1975  ; TESTING OF THE SCHMIDT TRIGGERS IN THE ANALOG CONVERSION CIRCUITRY AND THE
1976  ; EDGE DETECT CIRCUITRY OF THE MICROPROCESSOR.  IT IS NOT A REQUIRED PART OF
1977  ; THE SIGNAL PROCESSING PERFORMED TO DECODE THE ENCODER SIGNALS.
1978
1979  ; NOT THE FIRST 'B' TRANSITION AFTER POWER-UP.
1980  f761 c5 53          $0        CMP     CHBTRN          ;IS SENSE OF 'B' TRANSITION SAME AS LAST ONE?
1981  f763 d0 10                    BNE     $3              ;NO, 'B' TRANSITIONS ALTERNATING AS THEY SHOULD
1982
1983  ; THE SAME SENSE OF 'B' TRANSITION HAS BEEN DETECTED TWICE IN A ROW, I.E.
1984  ; WE HAVE SEEN 2 POSITIVE GOING TRANSITIONS WITHOUT AN INTERVENING NEGATIVE
1985  ; TRANSITION, OR VICE VERSA.  IF SO, EITHER THERE IS AN INTERRUPT SERVICE
1986  ; TIMING PROBLEM OR THE RISE TIME OF ONE OF THE EDGES IS TOO SLOW TO BE
1987  ; DETECTED BY THE R65/11EB CHIP.  IN EITHER CASE, COUNT AN OCCURENCE IN THE
1988  ; APPROPRIATE FAULT DETECTION COUNTER.
1989
1990  f765 29 ff                    AND     #^HOFF          ;RESET CONDITION CODE FROM ACCUMULATOR
1991  f767 10 06                    BPL     $2              ;TWO POSITIVE TRANSITIONS
1992
1993  ; 2 NEGATIVE TRANSITIONS SENSED WITHOUT INTERVENING POSITIVE TRANSITION
1994  f769 e6 62          $1        INC     CBNTFC          ;CHANNEL 'B' NEGATIVE TRANSITION FAULT COUNTER
1995  f76b f0 fc                    BEQ     $1              ;DON'T ALLOW COUNTER TO WRAP TO ZERO
1996  f76d d0 2f                    BNE     $9              ;UNCONDITIONAL BRANCH
1997
1998  ; 2 POSITIVE TRANSITIONS SENSED WITHOUT INTERVENING NEGATIVE TRANSITION
1999  f76f e6 61          $2        INC     CBPTFC          ;CHANNEL 'B' POSITIVE TRANSITION FAULT COUNTER
2000  f771 f0 fc                    BEQ     $2              ;DON'T ALLOW COUNTER TO WRAP TO ZERO
2001  f773 d0 29                    BNE     $9              ;UNCONDITIONAL BRANCH
2002
2003  ; END OF HARDWARE DIAGNOSTIC SEGMENT
2004
2005  ; SENSE OF 'B' CHANNEL TRANSITION HAS ALTERNATED, AS IT SHOULD.
2006  ; MAKE CURRENT INTO PREVIOUS.        '01' FOR POSITIVE TRANSITION, 'FF' FOR NEGATIVE
2007  f775 85 53          $3        STA     CHBTRN
2008
2009  ; SINCE THERE HAS BEEN A TRANSITION ON CHANNEL 'B', IT IS CLEARLY NOT DEAD
2010  f777 a9 00                    LDA     #$00            ;SO ZERO OUT THE CHANNEL 'B' DEAD FLAG
2011  f779 85 59                    STA     BADCHB          ;THIS WOULD BE SET NON-ZERO IF CHANNEL 'B' APPEARS DEAD
2012
2013  ; THE FOLLOWING CODE SEGMENT UP TO JUST BEFORE $7 CHECKS FOR A FAILURE OF THE CHANNEL 'A' SIGNAL BY
2014  ; COMPARING THE CURRENT STATES OF THE 'A' AND 'D' SIGNALS TO THE STATES THEY HAD ON THE PREVIOUS
2015  ; TRANSITION OF CHANNEL 'B'.  THIS IMPLEMENTS THE CHANNEL 'A' (I.E., SIGNAL 57) FAULT DETECTOR FUNCTION
2016  ; SHOWN ON FIGURE 9A OF THE SPECIFICATION.
2017
2018  ; NOW CHECK IF STATES OF CHANNELS 'A' OR 'D' HAVE CHANGED SINCE LAST TRANSITION
2019  ; OF CHANNEL 'B'.  THERE ARE ONLY 4 POSSIBLE CASES:
2020
2021  ;     CASE 1:  NEITHER CHANNEL 'A' NOR 'D' CHANGED
2022  ;     CASE 2:  ONLY CHANNEL 'A'       CHANGED
2023  ;     CASE 3:  ONLY CHANNEL 'D'       CHANGED
2024  ;     CASE 4:  BOTH CHANNELS 'A' AND 'D' CHANGED
2025
2026  f77b 8a                       TXA                     ;REFRESH FROM SNAPSHOT OF THE CURRENT STATE OF ALL 3 CHANNELS
2027  f77c 29 12                    AND     #CCHANLA!CHANLD ;SELECT BITS FOR CHANNELS 'A' AND 'D'
2028  f77e 45 55                    EOR     ADSNBT          ;COMPARE TO STATES ON LAST TRANSITION CHANNEL 'B'
2029  f780 d0 06                    BNE     $5              ;EITHER CHANNEL 'A', 'D', OR BOTH HAVE CHANGED
2030
2031  ; CASE 1: NEITHER CHANNEL 'A' NOR 'D' CHANGED STATE, I.E., THEY ARE BOTH IN THE
2032  ; SAME STATE THEY WERE IN WHEN THE LAST TRANSITION ON CHANNEL 'B' OCCURRED.
2033  ; THIS MEANS THE ENCODER HAS REVERSED DIRECTION ACROSS A CHANNEL 'B' EDGE.
2034
2035  f782 e6 64                    INC     ENBDRV          ;COUNT A DIRECTION REVERSAL SEEN ON CHANNEL 'B'
2036  f784 f0 fc                    BEQ     $4              ;DON'T LET COUNTER WRAP TO ZERO
2037  f786 d0 16                    BNE     $9              ;UNCONDITIONAL BRANCH
2038
```

```
                       ; AT LEAST ONE OF THE CHANNELS 'A' OR 'D' IS IN A DIFFERENT STATE THAN IT WAS
                       ; IN WHEN THE LAST NON-ANNIHILATED TRANSITION ON CHANNEL 'B' OCCURRED.
       $5              CMP   #CHANLA         ;DID CHANNEL 'A' CHANGE WITHOUT CHANNEL 'D'?
f788 c9 02             BEQ   $8              ;YES, CASE 2: ONLY CHANNEL 'A' CHANGED
f78a f0 0e             CMP   #[CHANLA!CHANLD] ;DID BOTH CHANNELS 'A' AND 'D' CHANGED?
f78c c9 12             BEQ   $7              ;YES, CASE 4: BOTH CHANNELS 'A' AND 'D' CHANGED
f78e f0 04
                       ; OF THE 4 CASES, CASES 1, 2, AND 4 HAVE ALREADY BEEN EXPLICITLY TESTED.
                       ; IF WE REACH THIS POINT, ONLY CASE 3 IS LEFT.

; CASE 3: ONLY CHANNEL 'D' CHANGED. SINCE 'D' HAS CHANGED STATE BETWEEN OPPOSING
                       ; TRANSITIONS OF 'B', WE KNOW THAT THE ENCODER IS NOT SIMPLY ROCKING BACK AND
                       ; FORTH ACROSS AN EDGE ON THE 'B' CHANNEL, AND WE SHOULD HAVE SEEN A CHANGE IN
                       ; THE STATE OF CHANNEL 'A' AS WELL. SINCE WE DID NOT, CHANNEL 'A' MUST BE DEAD.

$6              INC   BADCHA          ;COUNT A FAILURE OF THE CHANNEL 'A' SIGNAL
f790 e6 58             BEQ   $6              ;DON'T LET COUNTER WRAP TO ZERO
f792 f0 fc

; NEXT, UPDATE THE VARIOUS RAM LOCATIONS WHICH KEEP TRACK OF TRANSITIONS DETECTED ON THE SIGNALS FROM
                       ; CHANNELS 'A' AND 'D', AND WHICH ARE USED BY THE CHANNEL 'D' (SIGNAL 59) FAULT DETECTOR OF FIGURE 9A.

; THERE HAS BEEN A TRANSITION ON CHANNEL 'D' (WITH OR WITHOUT A CORRESPONDING
                       ; TRANSITION ON CHANNEL 'A'). NEED TO RESET THE CHANNEL 'D' UP/DOWN COUNTER TO
                       ; INDICATE THAT CHANNEL 'D' IS STILL ALIVE, AND ZERO THE FAULT INDICATOR.

$7              LDA   #00
f794 a9 00             STA   DUDCTR          ;MEASURES MOTION SINCE LAST 'D' TRANSITION
f796 85 56             STA   BADCHD          ;SIGNAL CHANNEL 'D' NO LONGER BAD
f798 85 5a

; THERE HAS BEEN A TRANSITION ON EITHER CHANNEL 'A' OR CHANNEL 'D', SO ENCODER
                       ; HAS NOT JUST REVERSED DIRECTION ACROSS A CHANNEL 'B' EDGE.

$8              LDA   #00
f79a a9 00             STA   ENBDRV          ;COUNTS CONSECUTIVE REVERSALS ACROSS A 'B' EDGE
f79c 85 64

; NOW SAVE THE STATE OF CHANNELS 'A' AND 'D' CORRESPONDING TO THE CURRENT
                       ; TRANSITION OF CHANNEL 'B' FOR USE BY THE NEXT CHANNEL 'B' TRANSITION $9              TXA                   ;REFRESH ACCUMULATOR FROM SNAPSHOT OF STATES
f79e 8a                AND   #[CHANLA!CHANLD] ;SELECT THE CHANNEL 'A' AND 'D' BITS
f79f 29 12             STA   ADSNBT          ;SAVE AS 'A' AND 'D' SNAPSHOT ON 'B' TRANSITION
f7a1 85 55

; THE FOLLOWING BLOCK OF CODE THROUGH LABEL $14 IMPLEMENTS A PORTION OF THE PHASE COMPARATOR 71
                       ; IT DETERMINES THE ENCODER DIRECTION "ENCDIR", AND HENCE THE DIRECTION LEVEL SIGNAL 72. IT ALSO
                       ; DETERMINES IF THE APPROPRIATE TYPE (FOR THE SELECTED PHASE COMPARATOR OPERATING FREQUENCY) OF
                       ; SIGNAL TRANSITION HAS OCCURRED TO ALLOW GENERATION OF A CLOCK PULSE SIGNAL 73.

; NOW SET ENCODER DIRECTION USING THE STATE OF CHANNEL 'A' AND THE SENSE OF THE
                       ; MOST RECENT CHANNEL 'B' TRANSITION.

AND   #CHANLA         ;SELECT THE CHANNEL 'A' BIT
f7a3 29 02             BEQ   $10             ;CHANNEL 'A' IS IN THE LOW STATE. LEAVES 'XOR' MASK OF ZERO IN 'A' REG.
f7a5 f0 02

; CHANNEL 'A' IS IN THE HIGH STATE. LOAD REGISTER 'A' WITH A MASK WHICH WILL
                       ; REVERSE THE SENSE OF THE MOST RECENT CHANNEL 'B' TRANSITION.
                       LDA   #^HOFE          ;WILL 'EXCLUSIVE OR' HEX FF TO 01, AND 01 TO FF
f7a7 a9 fe $10             EOR   CHBTRN          ;SENSE OF MOST RECENT CHANNEL 'B' TRANSITION
f7a9 45 53             STA   ENCDIR          ;SAVE AS ENCODER DIRECTION (HEX FF = LEFT, HEX 01 = RIGHT)
f7ab 85 4a

; NOW CHECK IF THE TRANSITION WHICH CAUSED THIS INTERRUPT IS AT THE PROPER
                       ; FREQUENCY TO BE RECOGNIZED BY THE INCREMENTAL POSITION PHASE COMPARATOR.

LDA   #INFREQ         ;INCREMENTAL POSITION FREQUENCY: 1X, 2X, OR 4X
f7ad a9 00             BMI   $14             ;4X FREQUENCY: ALL TRANSITIONS RECOGNIZED
f7af 30 03

; EITHER 1X OR 2X FREQUENCY SELECTED FOR INCREMENTAL POSITION PHASE COMPARATOR.
```

```
2107   ; A FREQUENCY OF 2X ONLY RECOGNIZES TRANSITIONS FROM CHANNEL 'A' THAT OCCUR WHEN
2108   ; A FREQUENCY OF 1X ONLY RECOGNIZES TRANSITIONS FROM CHANNEL 'A'.
2109   ; CHANNEL 'B' IS IN THE DESIRED STATE.
2110   ; IN EITHER CASE, TRANSITIONS FROM CHANNEL 'B' ARE NOT RECOGNIZED FOR 1X OR 2X.
2111   ; SINCE THE TRANSITION WHICH CAUSED THIS INTERRUPT IS FROM CHANNEL 'B', IT MUST
2112   ; BE IGNORED.
2113
2114                          $11    ;1X FREQUENCY POSITION COMPARATOR
2115                          $12    ;2X FREQUENCY POSITION COMPARATOR
2116
2117   f7b1                   JMP    INTXIT    ;IGNORE CHANNEL 'B' TRANSITIONS FOR 1X AND 2X
2118   f7b1  4c a4 f6
2119
2120   ; 4X FREQUENCY SELECTED FOR INCREMENTAL POSITION PHASE COMPARATOR.
2121   ; ALL TRANSITIONS OF CHANNELS 'A' AND 'B' ARE RECOGNIZED.
2122   f7b4  a9 ff       $14  LDA    #^HOFF    ;INDICATE THAT TRANSITION WAS FROM CHANNEL 'B'
2123   f7b6  4c b9 f7         JMP    COMOTN    ;NOW DO COMMON PROCESSING FOR ALL MOTIONS
2124
2125   ; COMMON CODE SEGMENT FOR HANDLING ALL MOTIONS.  THE INTERRUPT SERVICE ROUTINES
2126   ; FOR HANDLING TRANSITIONS OF CHANNEL 'A' ('IRACOM') AND CHANNEL 'B' ('IRBCOM')
2127   ; BOTH CONVERGE AT THIS POINT.  ON ENTRY, THE ACCUMULATOR CONTAINS ^H01 IF
2128   ; ENTERED FROM 'IRACOM', AND ^HOFF IF ENTERED FROM 'IRBCOM'.
2129
2130   f7b9            COMOTN                  ;COMMON MOTION INTERRUPT SERVICE
2131
2132   f7b9  85 51            STA    WHICH     ;SAVE WHICH CHANNEL CAUSED THIS INTERRUPT
2133   f7bb  98               TYA              ;SAVE 'Y' REGISTER FOR INDEXING
2134   f7bc  48               PHA              ;RESTORE AT END OF UPDATE ROUTINE
2135
2136   ; DIVERGE ON DIRECTION OF MOTION
2137   f7bd  a5 4a            LDA    ENCDIR    ;ENCODER DIRECTION SET BY 'IRACOM' OR 'IRBCOM'
2138   f7bf  30 1d            BMI    $8        ;ENCODER MOVING NEGATIVE, DOWN, LEFT, OR CCW
2139
2140   ; ENCODER BAND 30 MOVING POSITIVE, UP, RIGHT, OR CLOCKWISE
2141   ; INCREMENT THE INCREMENTAL POSITION UP/DOWN COUNTER <74>
2142   f7c1  e6 45            INC    INCPOS+1  ;LSB
2143   f7c3  d0 02            BNE    $2
2144   f7c5  e6 44            INC    INCPOS    ;MSB
2145
2146   ; THE NEXT TEST CORRESPONDS TO THE INCREMENTAL POSITION = "J" 'POSITION-COMPARATOR'.
2147
2148   f7c7  a5 45       $2   LDA    INCPOS+1         ;LSB OF INCREMENTAL POSITION
2149   f7c9  c9 78            CMP    #^L[ENCSIZ]      ;LSB OF ENCODER SIZE
2150   f7cb  d0 0e            BNE    $4               ;NOT SAME
2151   f7cd  a5 44            LDA    INCPOS           ;MSB OF INCREMENTAL POSITION
2152   f7cf  c9 00            CMP    #^M[ENCSIZ]      ;MSB OF ENCODER SIZE
2153   f7d1  d0 08            BNE    $4               ;NOT SAME
2154
2155   ; THE INCREMENTAL POSITION HAS BEEN INCREMENTED EQUAL TO THE ENCODER SIZE.
2156   ; TO KEEP THE INCREMENTAL POSITION MODULO THE ENCODER SIZE, RESET POSITION TO ZERO.
2157
2158   f7d3  a9 00            LDA    #00              ;ASSERT ZERO
2159   f7d5  85 45            STA    INCPOS+1         ;LSB OF <74>
2160   f7d7  85 44            STA    INCPOS           ;MSB OF <74>
2161
2162   ; SINCE POSITION HAS JUST CROSSED THROUGH THE ZERO POINT, REQUEST THAT AN
2163   ; 'INDEX' PULSE BE GENERATED WITH THE NEXT CLOCK PULSE
2164
2165   f7d9  07 41            RMB    #<[INDEX]>,^M[INDEXJ+RAMBAS    ;PULL PULSE LOW IN RAM SHADOW
2166
2167   ; INCREMENTAL POSITION UP/DOWN COUNTER <74> IS NOW UP TO DATE.
2168   f7db  4c f7 f7   $4    JMP    $10              ;CHECK ABSOLUTE POSITION FREQUENCY
2169
2170   ; ENCODER BAND 30 MOVING NEGATIVE, DOWN, LEFT, OR COUNTER-CLOCKWISE
2171   ; DECREMENT THE INCREMENTAL POSITION UP/DOWN COUNTER <74>
2172
2173
2174   f7de  18          $8   CLC
```

```
2175  f7d4 a5 45        LDA   INCPOS+1        ;LSB OF INCREMENTAL POSITION
2176  f7e1 69 ff        ADC   #-1             ;DECREMENT BY ADDING -1
2177  f7e3 85 45        STA   INCPOS+1
2178  f7e5 a5 44        LDA   INCPOS          ;MSB OF INCREMENTAL POSITION
2179  f7e7 69 ff        ADC   #-1             ;DECREMENT BY ADDING -1
2180  f7e9 85 44        STA   INCPOS
2181
2182   ; THE NEXT TEST CORRESPONDS TO THE INCREMENTAL POSITION = -1 'POSITION-COMPARATOR'.
2183
2184  f7eb 10 0a        BPL   $10             ;POSITIVE RESULT MEANS STILL IN VALID RANGE
2185
2186  ; THE INCREMENTAL POSITION HAS JUST BEEN DECREMENTED TO A VALUE OF -1
2187  ; TO KEEP THE POSITION MODULO THE ENCODER SIZE, POSITION NEEDS TO BE RESET
2188  ; TO ENCODER SIZE MINUS 1 ('ENCSIZ'-1 OR "J"-1)
2189
2190  f7ed a9 77        LDA   #^LENCSIZ-1     ;ASSERT LSB OF ENCODER SIZE MINUS 1
2191  f7ef 85 45        STA   INCPOS+1        ;LSB OF INCREMENTAL POSITION
2192  f7f1 a9 00        LDA   #^MENCSIZ-1     ;ASSERT MSB OF ENCODER SIZE MINUS 1
2193  f7f3 85 44        STA   INCPOS          ;MSB OF INCREMENTAL POSITION
2194
2195  ; SINCE POSITION HAS JUST CROSSED THROUGH THE ZERO POINT, REQUEST THAT AN
2196  ; 'INDEX' PULSE BE GENERATED WITH THE NEXT CLOCK PULSE
2197
2198  f7f5 07 41        RMB   #<LLINDEX1>,^MINDEX1+RAMBAS  ;PULL PULSE LOW IN RAM SHADOW
2199                                                       ;UP/DOWN COUNTER <74> COMPLETED.
2200  ; PROCESSING OF INCREMENTAL POSITION
2201
2202  ; NOW CHECK IF THE TRANSITION WHICH CAUSED THIS INTERRUPT IS AT THE PROPER
2203  ; FREQUENCY FOR THE ABSOLUTE POSITION PHASE COMPARATOR. THIS IMPLEMENTS ANOTHER
2204  ; PORTION OF THE PHASE COMPARATOR 71.
2205
2206  $10
2207  f7f7 a9 00        LDA   #ABFREQ         ;ABSOLUTE POSITION FREQUENCY: 1X, 2X, OR 4X
2208  f7f9 30 0e        BMI   $14             ;4X FREQUENCY: ALL TRANSITIONS RECOGNIZED
2209  f7fb d0 05        BNE   $12             ;2X FREQUENCY: ONLY CHANNEL 'A' RECOGNIZED
2210
2211  ; ABSOLUTE POSITION PORTION OF ENCODER IS BEING CLOCKED AT 1X FREQUENCY.
2212  ; ONLY RECOGNIZE CHANNEL 'A' TRANSITIONS THAT OCCURRED WITH CHANNEL 'B' IN
2213  ; THE DESIRED (IN THIS CASE LOW) STATE. FIRST CHECK THE CHANNEL 'B' STATE.
2214  $11
2215  f7fd 8a           TXA                   ;REFRESH ACCUMULATOR FROM SNAPSHOT
2216  f7fe 29 01        AND   #CHANLB         ;SELECT CHANNEL 'B' BIT
2217  f800 d0 04        BNE   $13             ;CHANNEL 'B' NOT IN DESIRED STATE
2218
2219  ; CHANNEL 'B' IS IN DESIRED STATE. FALL THROUGH INTO THE 2X FREQUENCY TEST
2220  ; WHICH CHECKS IF THE TRANSITION WHICH CAUSED THIS INTERRUPT CAME FROM CHANNEL A
2221
2222  ; 2X PHASE COMPARATOR SELECTED. ONLY RECOGNIZE TRANSITIONS FROM CHANNEL 'A'
2223  $12
2224  f802 a5 51        LDA   WHICH           ;WHICH CHANNEL ('A' OR 'B') CAUSED INTERRUPT?
2225  f804 10 03        BPL   $16             ;CHANNEL 'A' DID, SO RECOGNIZE IT
2226
2227  ; THE TRANSITION WHICH CAUSED THIS INTERRUPT DOES NOT SATISFY THE CONDITIONS
2228  ; REQUIRED BY THE FREQUENCY SELECTED FOR CLOCKING THE ABSOLUTE POSITION PORTION OF
2229  ; THE ENCODER. DO NOT RECOGNIZE THIS TRANSITION FOR PURPOSES OF CLOCKING THE
2230  ; SHIFT REGISTERS, FRAMING GATING, TAG DECODING, POSITION COMPARATOR, ETC.
2231  $13
2232  f806 4c 8f f9     JMP   UPDATE          ;UPDATE I/O PORT OUTPUT WITH NEW INCREMENTAL POS
2233
2234  ; 4X PHASE COMPARATOR SELECTED. RECOGNIZE ALL TRANSITIONS FROM CHANNELS 'A' & 'B'
2235  $14
      f809              ;AND FALL THROUGH INTO SHIFT REGISTER UPDATE ROUTINE
2236
2237  ; THE FOLLOWING CODE SEGMENT TO JUST BEFORE $121 IMPLEMENTS THE RIGHT MOTION AND LEFT MOTION SERIAL
2238  ; SHIFT REGISTER FUNCTIONS 75 AND 76.
2239
2240  ; SET THE 'CARRY' BIT IN PROCESSOR STATUS REGISTER USING THE DATA BIT (BIT 4)
2241  ; FROM CHANNEL 'D' (DATA CHANNEL, I.E., SIGNAL 59).
```

```
2242                         ;REFRESH 'A' REGISTER FROM SNAPSHOT OF CURRENT STATE OF ALL 3 CHANNELS.
2243  f809 8a       TXA      ;NOTE: THIS IS THE LAST USE OF THIS SNAPSHOT, SO 'X' REGISTER NOW FREE.
2244  ;
2245  ; ROTATE DATA BIT 4 INTO 'CARRY' BIT, 1 BIT A TIME
2246  f80a 0a       ASL  A   ;(BIT 4 TO 5)
2247  f80b 0a       ASL  A   ;(TO BIT 6)
2248  f80c 0a       ASL  A   ;(TO BIT 7)
2249  f80d 0a       ASL  A   ;(TO 'CARRY' BIT)
2250  ; STATE OF DATA CHANNEL 'D' (I.E. SIGNAL 59) NOW IN 'CARRY' BIT IN PROCESSOR STATUS REGISTER.
2251  ;
2252  ; DIVERGE ON DIRECTION OF ENCODER BAND 30 MOTION WITH DATA FROM CHANNEL 'D' IN 'CARRY'
2253  f80e a5 30    LDA  ENCDIR  ;ENCODER DIRECTION SET BY 'IRACOM' OR 'IRBCOM'
2254  f810 30 1e    BMI  $100    ;ENCODER MOVING NEGATIVE, DOWN, LEFT, OR CCW
2255  ;
2256  ; ENCODER BAND 30 MOVING POSITIVE, UP, RIGHT, OR CLOCKWISE.
2257  ; ROTATE BOTH SERIAL SHIFT REGISTERS <75> AND <76> TO THE RIGHT
2258  ;
2259  ; FIRST, ROTATE DATA BIT FROM 'CARRY' INTO THE SHIFT RIGHT SERIAL INPUT OF THE
2260  ; RIGHT MOTION SERIAL SHIFT REGISTER (RMSSR) <75>
2261  f812 66 4b    ROR  RMSSR1  ;LEFT START FRAME
2262  f814 66 4c    ROR  RMSSR2  ;DATA BYTE
2263  f816 66 4d    ROR  RMSSR3  ;RIGHT START FRAME
2264  ;
2265  ; NEXT, ROTATE A ZERO (CLEARED 'CARRY' BIT) INTO THE SHIFT RIGHT SERIAL INPUT
2266  ; THE LEFT MOTION SERIAL SHIFT REGISTER (LMSSR) <76>
2267  f818 18       CLC          ;CLEARS 'CARRY' BIT TO ZERO
2268  f819 66 4e    ROR  LMSSR1  ;LEFT START FRAME
2269  f81b 66 4f    ROR  LMSSR2  ;DATA BYTE
2270  f81d 66 50    ROR  LMSSR3  ;RIGHT START FRAME
2271  ;
2272  ; SERIAL SHIFT REGISTERS <75> AND <76> ARE NOW UP TO DATE.
2273  ; NOW INCREMENT THE CHANNEL 'D' UP/DOWN COUNTER 93 TO INDICATE THAT POSITIVE MOTION HAS OCCURRED SINCE
2274  ; THE LAST CHANNEL 'D' TRANSITION. THIS COUNTER IS USED IN IMPLEMENTING THE CHANNEL 'D' (SIGNAL 59)
2275  ; FAULT DETECTOR SHOWN IN FIGURE 9A OF THE SPECIFICATION.
2276  f81f e6 56    INC  DUDCTR  ;MEASURES NET MOTION SINCE LAST 'D' TRANSITION
2277  ;
2278  ; ALSO INCREMENT THE MISSING TAG UP/DOWN COUNTER TO INDICATE THAT POSITIVE MOTION HAS OCCURRED SINCE THE
2279  ; LAST TAG WAS FRAMED. THIS COUNTER IS USED IN IMPLEMENTING THE "MISSED TAG ERROR" COMPONENT OF THE TAG
2280  ; ERROR FUNCTION 84 SHOWN IN FIGURE 9 OF THE SPECIFICATION.
2281  f821 e6 57    INC  MTGCTR  ;MEASURES NET MOTION SINCE LAST TAG FRAMED.
2282  ;
2283  ; PREPARE TO COPY THE CONTENTS OF RIGHT MOTION SERIAL SHIFT REGISTER <75> INTO THE VIRTUAL SERIAL SHIFT
2284  ; REGISTER FOR USE BY THE FRAMING GATING AND TAG DECODING ROUTINES.
2285  f823 a9 00    LDA  #$00    ;INDICATE THAT WE ARE CHECKING RIGHT SIDE
2286  f825 85 68    STA  DELTA   ;DIFFERENCE FROM POSITION SUPPLIED BY RIGHT SIDE LOOK UP TABLE "RTNPOS"
2287  f827 a5 4b    LDA  RMSSR1  ;LEFT START FRAME
2288  f829 a6 4c    LDX  RMSSR2  ;MIDDLE BY OF SSR
2289  f82b a4 4d    LDY  RMSSR3  ;RIGHT START FRAME
2290  f82d 4c 21 f8 JMP  $121    ;LEFT START FRAME
2291                             ;DO VIRTUAL MOTION SERIAL SHIFT REGISTER TASKS
2292  ;
2293  ; ENCODER BAND 30 MOVING LEFT, DOWN, NEGATIVE, OR COUNTER-CLOCKWISE DIRECTION.
2294  ; ROTATE BOTH SERIAL SHIFT REGISTERS <75> AND <76> TO THE LEFT
2295  ;
2296  ; FIRST, ROTATE THE DATA BIT FROM 'CARRY' INTO THE SHIFT LEFT SERIAL INPUT OF
2297  ; THE LEFT MOTION SERIAL SHIFT REGISTER (LMSSR) <76>
2298  f830 26 50    ROL  LMSSR3  ;RIGHT START FRAME
2299  f832 26 4f    ROL  LMSSR2  ;DATA BYTE
2300  f834 26 4e    ROL  LMSSR1  ;LEFT START FRAME
2301  ;
2302  ; NEXT, ROTATE A ZERO (CLEARED 'CARRY' BIT) INTO THE SHIFT LEFT SERIAL INPUT OF
2303  ; THE RIGHT MOTION SERIAL SHIFT REGISTER (RMSSR) <75>
```

```
2311                              CLC                    ;CLEARS 'CARRY' BIT TO ZERO
2312  f836  18 4d                 ROL     RMSSR3         ;RIGHT START FRAME
2313  f837  26 4d                 ROL     RMSSR2         ;DATA BYTE
2314  f839  26 4c                 ROL     RMSSR1         ;LEFT START FRAME
2315  f83b  26 4b
2316
2317  ; SHIFT REGISTERS <75> AND <76> ARE NOW UP TO DATE.
2318
2319  ; NOW DECREMENT THE CHANNEL 'D' UP/DOWN COUNTER 93 TO INDICATE THAT POSITIVE MOTION HAS OCCURRED SINCE
2320  ; THE LAST CHANNEL 'D' TRANSITION.  THIS COUNTER IS USED IN IMPLEMENTING THE CHANNEL 'D' (SIGNAL 59)
2321  ; FAULT DETECTOR SHOWN IN FIGURE 9A OF THE SPECIFICATION.
2322
2323  f83d  c6 56                 DEC     DUDCTR         ;MEASURES NET MOTION SINCE LAST 'D' TRANSITION
2324
2325  ; ALSO DECREMENT THE MISSING TAG UP/DOWN COUNTER TO INDICATE THAT POSITIVE MOTION HAS OCCURRED SINCE THE
2326  ; LAST TAG WAS FRAMED.  THIS COUNTER IS USED IN IMPLEMENTING THE "MISSED TAG ERROR" COMPONENT OF THE TAG
2327  ; ERROR FUNCTION 84 SHOWN IN FIGURE 9 OF THE SPECIFICATION.
2328
2329  f83f  c6 57                 DEC     MTGCTR         ;MEASURES NET MOTION SINCE LAST TAG FRAMED
2330
2331  ; PREPARE TO COPY THE CONTENTS OF LEFT MOTION SERIAL SHIFT REGISTER <76> INTO THE VIRTUAL SERIAL SHIFT
2332  ; REGISTER FOR USE BY THE FRAMING GATING AND TAG DECODING ROUTINES.
2333
2334  f841  a9 18         $120    LDA     #^LILDELTA]    ;INDICATE THAT WE ARE CHECKING LEFT SIDE
2335  f843  85 68                 STA     DELTA          ;DIFFERENCE FROM POSITION SUPPLIED BY RIGHT SIDE LOOK UP TABLE "RTNPOS"
2336  f845  a5 4e                 LDA     LMSSR1         ;LEFT START FRAME
2337  f847  a6 4f                 LDX     LMSSR2         ;MIDDLE BY OF SSR
2338  f849  a4 50                 LDY     LMSSR3         ;RIGHT START FRAME
2339
2340  ; SAVE APPROPRIATE SHIFT REGISTER CONTENTS INTO VIRTUAL SHIFT REGISTER, AND THEN PERFORM REMAINING SHIFT
2341  ; REGISTER OPERATIONS ON IT.  THIS EFFECTIVELY PERFORMS THE LEFT SIDE/RIGHT SIDE MULTIPLEXING FUNCTION
2342  ; THAT, IN THE TEXT AND FIGURE 9 OF THE SPECIFICATION, IS PERFORMED AT A LATER STAGE OF PROCESSING BY
2343  ; A MULTIPLEXING THE ABSOLUTE POSITION MULTIPLEXER 87.  THE MULTIPLEXING FUNCTION PERFORMED BY THIS SOFTWARE IS REALLY
2344  ; LEFT/RIGHT FRAMING GATING FUNCTIONS (78 AND 79) TO BE CONSOLIDATED, AND THE LEFT/RIGHT TAG DECODING-
2345  ; ERROR CHECKING FUNCTIONS (82 AND 83) TO BE CONSOLIDATED AS WELL.
2346
2347
2348  f84b  84 67         $121    STY     VMSSR3         ;VIRTUAL SHIFT REGISTER RIGHTMOST BYTE
2349  f84d  86 66                 STX     VMSSR2         ;VIRTUAL SHIFT REGISTER MIDDLE BYTE
2350  f84f  85 65                 STA     VMSSR1         ;VIRTUAL SHIFT REGISTER LEFTMOST BYTE
2351
2352  f851  29 fe                 AND     #LOMASK        ;MASK THE FRAMING BITS
2353  f853  c9 fc                 CMP     #LOFRAM        ;COMPARE TO FRAMING PATTERN
2354  f855  d0 08                 BNE     $122           ;NOT FRAMED
2355
2356  f857  a5 67                 LDA     VMSSR3         ;MASK THE FRAMING BITS
2357  f859  29 7f                 AND     #HIMASK        ;COMPARE TO FRAMING PATTERN
2358  f85b  c9 3f                 CMP     #HIFRAM        ;TAG IS FRAMED IN VIRTUAL SHIFT REGISTER
2359  f85d  f0 03                 BEQ     $123
2360  f85f  4c 6d f9      $122    JMP     $250           ;NOT FRAMED
2361
2362  ; THERE IS AN ABSOLUTE POSITION TAG <36> PROPERLY FRAMED IN THE VIRTUAL SHIFT REGISTER.  THE VALUE IN
2363  ; 'DELTA' INDICATES WHETHER THIS TAG 36 ORIGINATED IN THE RIGHT OR LEFT MOTION SERIAL SHIFT REGISTERS
2364  ; (75 OR 76).
2365
2366  ; CLEAR THE COUNTER WHICH MEASURES THE NET MOTION SINCE THE LAST TAG 36 WAS FRAMED, AND CLEAR THE "MISSED
2367  ; TAG ERROR" FLAG AS WELL.  THESE ARE USED IN IMPLEMENTING THE MISSED TAG ERROR COMPONENT OF THE TAG ERROR
2368  ; FUNCTION 84.
2369  f862  a9 00         $123    LDA     #00
2370  f864  85 57                 STA     MTGCTR         ;MEASURES NET MOTION SINCE LAST TAG FRAMED
2371  f866  85 75                 STA     MTGERR         ;NON-ZERO IF THERE WAS A MISSED TAG ERROR
2372
2373  ; CHECK THE PARITY OF THE RAW ABSOLUTE POSITION TAG <36>.
2374  ; FIRST, COUNT UP THE NUMBER OF "ONE" BITS THAT ARE IN THIS TAG.
2375
2376  f868  a2 00                 LDX     #00            ;USE 'X' REGISTER TO COUNT NUMBER OF BITS
2377
2378  f86a  a5 65                 LDA     VMSSR1         ;GET HIGH PART OF TAG
```

```
2379  f86c 29 01           AND  #HITAG           ;MASK THE TAG BITS
2380  f86e 4a              LSR  A                ;SHIFT LOWEST BIT INTO CARRY FOR TESTING
2381  f86f 90 01           BCC  $125             ;NOT A "ONE" BIT
2382        e8             INX                   ;COUNT A "ONE" BIT
2383  f872 4a        $124  LSR  A                ;SHIFT NEXT BIT INTO CARRY
2384  f873 b0 fc           BCS  $124             ;COUNT IT IF IT IS A "ONE"
2385  f875 d0 fb           BNE  $125             ;KEEP SHIFTING TILL NO MORE "ONE" BITS
2386
2387  f877 a5 66           LDA  VMSSR2           ;GET REMAINDER OF TAG
2388  f879 4a              LSR  A                ;SHIFT LOWEST BIT INTO CARRY FOR TESTING
2389  f87a 90 01           BCC  $127             ;NOT A "ONE" BIT
2390        e8             INX                   ;COUNT A "ONE" BIT
2391  f87d 4a        $126  LSR  A                ;SHIFT NEXT BIT INTO CARRY
2392  f87e b0 fc           BCS  $126             ;COUNT IT IF IT IS A "ONE"
2393  f880 d0 fb           BNE  $127             ;KEEP SHIFTING TILL NO MORE "ONE" BITS
2394
2395 ; AT THIS POINT, THE 'X' REGISTER CONTAINS A COUNT OF THE NUMBER OF "ONE"
2396 ; BITS IN THE TAG. COMPARE THIS COUNT MODULO 2 WITH THE PARITY BIT IN TAG.
2397
2398  f882 8a              TXA                   ;COUNT OF NUMBER OF "ONE" BITS IN TAG (W/OUT PARITY)
2399  f883 6a              ROR  A                ;ROTATE UNITS BIT OF COUNT INTO 'C' (W/ PARITY)
2400  f884 6a              ROR  A                ;ROTATE IT TO BIT 7 OF 'A' REG.
2401  f885 45 67           EOR  VMSSR3           ;"EXCLUSIVE-OR" IT WITH THE PARITY BIT IN TAG
2402  f887 30 17           BMI  $128             ;COMPUTED PARITY DOESN'T MATCH EMBEDDED PARITY
2403
2404 ; THE PARITY OF THE THIS RAW TAG <36> IS VALID. THE NON-PARITY BITS OF THIS RAW
2405 ; TAG <36> ARE USED AS AN INDEX INTO A LOOK-UP TABLE WHICH CONVERTS THE TAG <36>
2406 ; INTO AN ABSOLUTE TAG NUMBER. THE TAG NUMBER IS THEN USED AS AN INDEX INTO A
2407 ; SECOND LOOK-UP TABLE WHICH CONVERTS THE TAG NUMBER INTO AN ABSOLUTE POSITION.
2408 ; THUS, TAG DECODING IS A TWO STEP PROCESS USING TWO STAGES OF TABLE LOOK-UP.
2409 ; ALSO NOTE THAT THE TAG NUMBER IS NEEDED FOR ADJACENCY CHECKING. FINALLY, NOTE
2410 ; THAT THE INTERMEDIATE STEP OF DECODING TAG CODES INTO TAG NUMBERS ALSO REDUCES
2411 ; THE SIZE OF THE LOOK-UP TABLE WHICH HOLDS THE ABSOLUTE POSITIONS.
2412
2413  f889 a5 66           LDA  VMSSR2           ;LOW PART OF TAG CODE
2414  f88b 0a              ASL  A                ;TIMES 2 TO INDEX DOUBLE BYTE TABLE ENTRIES
2415  f88c 85 77           STA  CODPTR           ;LSB OF ADDRESS POINTER
2416  f88e a5 65           LDA  VMSSR1           ;HI PART OF TAG CODE
2417  f890 29 01           AND  #HITAG           ;MASK THE TAG BITS
2418  f892 2a              ROL  A                ;TIMES 2 AND ROTATE IN TAG BIT 7 FROM CARRY
2419  f893 18              CLC                   ;CLEAR CARRY FOR ADD
2420  f894 69 f0           ADC  #^MCTAGNUM]      ;THIS TABLE SHOULD BE AT START OF PAGE
2421  f896 85 78           STA  CODPTR+1         ;MSB OF ADDRESS POINTER
2422
2423 ; 'CODPTR' NOW CONTAINS THE ADDRESS CORRESPONDING TO THE START OF THE DOUBLE
2424 ; BYTE TABLE ENTRY IN THE 'TAGNUM' TABLE FOR THIS TAG CODE <36>.
2425
2426  f898 a0 00           LDY  #00              ;INDEX MSB OF TABLE ENTRY FIRST
2427  f89a b1 77           LDA  (CODPTR),Y       ;MSB OF CORRESPONDING TAG NUMBER
2428  f89c c9 ff           CMP  #INVTAG          ;IS THIS AN INVALID TAG CODE?
2429  f89e d0 16           BNE  $130             ;NO, THIS TAG CODE IS VALID
2430
2431 ; INVALID TAG CODE. EITHER PARITY IS BAD OR THIS CODE DOES NOT CORRESPOND
2432 ; TO A VALID ENTRY IN THE 'TAGNUM' TRANSLATE TABLE.
2433
2434  f8a0 a5 67     $128   LDA  VMSSR3           ;EXTRACT PARITY BIT FOR THIS TAG CODE
2435  f8a2 2a              ROL  A                ;ROTATE INTO CARRY
2436  f8a3 a5 66           LDA  VMSSR2           ;MIDDLE PART OF TAG CODE
2437  f8a5 2a              ROL  A                ;SHIFT PARITY BIT TO BIT 0, BIT 7 OF TAG TO 'C'
2438  f8a6 85 74           STA  BADTAG+1         ;SAVE AS LOW BYTE OF BAD TAG CODE
2439  f8a8 a5 65           LDA  VMSSR1           ;GET TOP PART OF TAG CODE
2440  f8aa 29 01           AND  #HITAG           ;MASK THE TAG BITS
2441  f8ac 2a              ROL  A                ;ROTATE BIT 7 OF TAG INTO BIT 0 OF 'A'
2442  f8ad 85 73           STA  BADTAG           ;SAVE AS HI PART OF BAD TAG CODE
2443
2444 ; THE TAG PARITY BIT, & TAG DATA BITS 0-6 OF THE BAD TAG ARE KEPT IN 'BADTAG'+1
2445 ; TAG DATA BITS 7-> THE HIGHEST TAG DATA BIT OF THE BAD TAG ARE IN 'BADTAG'+0
2446
```

```
2447  f8af  a9 ff                LDA    #INVTAG          ;SIGNAL INVALID TAG ERROR
2448  f8b1  85 72                STA    BADTER
2449  f8b3  4c 67 f9             JMP    $248             ;CLEAR ADJACENCY ERROR (PARITY SUPERSEDES)
2450
2451       ; RAW CODE IS VALID.  COMPLETE PROCESS OF CONVERTING TAG CODE TO TAG SEQUENCE NUMBER.
2452
2453  f8b6  aa          $130     TAX                     ;TEMPORARY SAVE OF HI PART OF TAG SEQUENCE NUMBER
2454
2455       ; LAG THE PREVIOUS TAG NUMBER (I.E., SAVE PREVIOUS CURRENT TAG AS LAST TAG).
2456  f8b7  a5 69                LDA    ENCABT           ;HI PART OF CURRENT TAG NUMBER (PREVIOUSLY).
2457  f8b9  85 6b                STA    ENLABT           ;SAVE AS HI PART OF LAST TAG NUMBER (PREVIOUSLY)
2458  f8bb  a5 6a                LDA    ENCABT+1         ;LO PART OF CURRENT TAG NUMBER (PREVIOUSLY)
2459  f8bd  85 6c                STA    ENLABT+1         ;SAVE AS LO PART OF LAST TAG NUMBER
2460
2461       ; NOW RESET CURRENT TAG NUMBER TO CORRESPOND TO THAT OF THE PROPERLY FRAMED TAG <36>.
2462  f8bf  86 69                STX    ENCABT           ;HI PART OF TAG NUMBER JUST OBTAINED FROM TABLE
2463  f8c1  c8                   INY                     ;POINT TO LSB OF TABLE ENTRY
2464  f8c2  b1 77                LDA    (CODPTR),Y       ;GET LOW PART OF TAG NUMBER
2465  f8c4  85 6a                STA    ENCABT+1         ;SAVE AS LO PART OF TAG NUMBER JUST OBTAINED
2466
2467       ; NOW USE THE TAG NUMBER TO BUILD AN ADDRESS POINTER THAT WILL INDEX THE APPROPRIATE DOUBLE BYTE ENTRY
2468       ; IN THE TRANSLATE TABLE ('RTNPOS,') WHICH TRANSLATES TAG SEQUENCE NUMBER INTO ABSOLUTE POSITION.
2469
2470  f8c6  0a                   ASL    A                ;LO PART OF TAG NUMBER TIMES 2, BIT 7 TO CARRY
2471  f8c7  85 79                STA    TAGPTR           ;LSB OF ADDRESS OF TABLE ENTRY
2472  f8c9  a5 69                LDA    ENCA3T           ;HI PART OF TAG NUMBER
2473  f8cb  2a                   ROL    A                ;TIMES 2 AND ROTATE IN HI BIT OF LOW PART
2474  f8cc  18                   CLC                     ;CLEAR CARRY FOR ADD
2475  f8cd  69 f4                ADC    #^MRTNPOS        ;MSB OF BASE OF TAG NUMBER -> POSITION TABLE
2476  f8cf  85 7a                STA    TAGPTR+1         ;MSB OF ADDRESS OF TABLE ENTRY
2477
2478       ; 'TAGPTR' NOW CONTAINS THE ADDRESS CORRESPONDING TO THE START OF THE DOUBLE-BYTE TABLE ENTRY (IN THE
2479       ; 'RTNPOS,' TABLE) FOR THIS TAG SEQUENCE NUMBER.
2480
2481  f8d1  a0 01                LDY    #01              ;POINT AT LSB OF TABLE ENTRY FIRST
2482  f8d3  38                   SEC                     ;SET CARRY FOR SUBTRACTION FROM 'DELTA'
2483  f8d4  b1 79                LDA    (TAGPTR),Y       ;GET LSB OF TABLE ENTRY FROM 'RTNPOS'
2484  f8d6  e5 68                SBC    DELTA            ;COMPENSATE FOR WHICH REGISTER (75 OR 76) THE TAG IS FRAMED IN
2485  f8d8  85 47                STA    ABSPOS+1         ;LSB OF ADJUSTED ABSOLUTE POSITION
2486  f8da  88                   DEY                     ;POINT AT MSB OF TABLE ENTRY
2487  f8db  b1 79                LDA    (TAGPTR),Y       ;GET MSB OF TABLE ENTRY
2488  f8dd  e9 00                SBC    #00              ;DIFFERENCE BETWEEN SIDES ALWAYS < 256 FOR REASONABLE SIZED REGISTERS
2489  f8df  85 46                STA    ABSPOS           ;MSB OF ADJUSTED ABSOLUTE POSITION
2490  f8e1  10 0d                BPL    $200             ;AND SET MSB OF ABSOLUTE POSITION
2491
2492       ; DERIVED ABSOLUTE POSITION IS NEGATIVE, SO WE WRAPPED THROUGH ZERO ADJUSTING
2493       ; THE POSITION FOR BEING FRAMED IN THE LEFT SIDE.  CORRECT BY ADDING IN THE
2494       ; ENCODER SIZE.
2495
2496  f8e3  18                   CLC                     ;CLEAR CARRY FOR ADD
2497  f8e4  a5 47                LDA    ABSPOS+1         ;LSB OF ADJUSTED POSITION
2498  f8e6  69 78                ADC    #^LEENCSIZ       ;CORRECTED FOR WRAP THRU ZERO
2499  f8e8  85 47                STA    ABSPOS+1         ;CORRECTED ADJUSTED LSB OF ABSOLUTE POSITION
2500  f8ea  a5 46                LDA    ABSPOS           ;MSB OF ADJUSTED POSITION
2501  f8ec  69 00                ADC    #^MENCSIZ        ;CORRECTED FOR WRAP THRU ZERO
2502  f8ee  85 46                STA    ABSPOS           ;CORRECTED ADJUSTED MSB OF ABSOLUTE POSITION
2503
2504       ; COMMON PROCESSING OF VALID ABSOLUTE POSITION TAG 36 FOR BOTH DIRECTIONS OF ENCODER MOTION.
2505       ; THE ABSOLUTE POSITION (CORRESPONDING TO THIS VALID TAG 36 BEING PROPERLY FRAMED) IS NOW STORED
2506       ; IN 'ABSPOS', WHICH CORRESPONDS TO THE ABSOLUTE POSITION REGISTER 90 IN FIGURE 9 OF THE SPECIFICATION.
2507
2508  f8f0  a9 00       $200     LDA    #00              ;CLEAR BAD TAG ERROR FLAG SINCE TAG IS VALID
2509  f8f2  85 72                STA    BADTER
2510
2511       ; THE FOLLOWING CODE SEGMENT HANDLES ADJACENCY CHECKING (AND ENCODER INITIALIZATION), AND THUS IMPLEMENTS
2512       ; THE "TAG ADJACENCY ERROR" COMPONENT OF THE TAG ERROR FUNCTION 84.
2513
2514
```

```
                        ; NOW CHECK IF THE CURRENT TAG NUMBER IS ADJACENT TO THE PREVIOUS TAG NUMBER
02515 f8f4 38                  SEC
02516 f8f5 a5 6a               LDA   ENCABT+1        ;LSB OF CURRENT TAG NUMBER
02517 f8f7 e5 6c               SBC   ENLABT+1        ;LSB OF LAST TAG NUMBER
02518 f8f9 85 6f               STA   TAGDIF+1        ;LSB OF DIFFERENCE
02519
02520 f8fb a5 69               LDA   ENCABT
02521 f8fd e5 6b               SBC   ENLABT
02522 f8ff 85 6e               STA   TAGDIF          ;MSB
02523 f901 10 0d               BPL   $210            ;POSITIVE TAG DIFFERENCE
02524
02525                   ; NEGATIVE DIFFERENCE.  NEGATE TO OBTAIN ABSOLUTE VALUE BY SUBTRACTING FROM ZERO.
02526 f903 38                  SEC
02527 f904 a9 00               LDA   #$00
02528 f906 e5 6f               SBC   TAGDIF+1        ;LSB
02529 f908 85 6f               STA   TAGDIF+1
02530 f90a a9 00               LDA   #$00
02531 f90c e5 6e               SBC   TAGDIF
02532 f90e 85 6e               STA   TAGDIF          ;MSB
02533
02534                   ; ABSOLUTE VALUE OF DIFFERENCE BETWEEN CURRENT TAG NUMBER AND PREVIOUS TAG
02535                   ; NUMBER NOW IN ,TAGDIF'
02536 $210
02537 f910 d0 06               BNE   $211            ;MSB NONZERO, SO DIFFERENCE > 255
02538 f912 a5 6f               LDA   TAGDIF+1        ;LSB OF ABSOLUTE VALUE OF DIFFERENCE
02539 f914 c9 02               CMP   #^D2            ;DIFFERENCE >= 2?
02540 f916 90 22               BCC   $220            ;NO, < 2, SO MUST BE ADJACENT
02541
02542                   ; DIFFERENCE EXCEEDS 1.  CHECK FOR ZERO CROSSING WRAP AROUND, (I.E., THE TWO
02543                   ; TAGS ARE ON OPPOSITE SIDES OF POSITION ZERO).
02544 $211
02545 f918 a5 6e               LDA   TAGDIF          ;MSB OF ABSOLUTE VALUE OF DIFFERENCE
02546 f91a c9 00               CMP   #^MIENUTAG]     ;MSB OF EFFECTIVE NUMBER OF TAGS
02547 f91c d0 06               BNE   $212            ;NO MATCH, SO NOT A WRAP AROUND
02548
02549 f91e a5 6f               LDA   TAGDIF+1        ;LSB OF ABSOLUTE VALUE OF DIFFERENCE
02550 f920 c9 05               CMP   #^LCENUTAG]     ;LSB OF EFFECTIVE NUMBER OF TAGS
02551 f922 f0 16               BEQ   $220            ;MATCH, SO JUST WRAPPED, AND THUS ADJACENT
02552
02553                   ; CURRENT TAG IS NOT ADJACENT TO PREVIOUS TAG.
02554                   ; SIGNAL AN ERROR UNLESS THIS IS THE VERY FIRST TAG SEEN AFTER POWER-UP.
02555 $212
02556 f924 a5 6d               LDA   POSUNK          ;CHECK IF FIRST TAG NOT YET SEEN
02557 f926 f0 0b               BEQ   $214            ;THIS IS THE FIRST TAG
02558
02559                   ; FIRST TAG ALREADY SEEN AND TAGS NOT ADJACENT. SIGNAL AN ADJACENCY ERROR.
02560 f928 a5 6e               LDA   TAGDIF          ;MSB OF ABSOLUTE DISTANCE BETWEEN TAGS
02561 f92a 85 70               STA   ENADJC
02562 f92c a5 6f               LDA   TAGDIF+1        ;LSB
02563 f92e 85 71               STA   ENADJC+1
02564 f930 4c 6d f9             JMP   $250            ;IGNORE THIS TAG; DON'T CHANGE INCREMENTAL POSN
02565
02566                   ; THIS IS THE FIRST TAG SEEN AFTER POWER-UP.  USE IT UNCONDITIONALLY.
02567 $214
02568 f933 a9 01               LDA   #$01            ;SIGNAL THAT WE HAVE SEEN IT
02569 f935 85 6d               STA   POSUNK
02570 f937 4c 5f f9             JMP   $245            ;SET INCREMENTAL POSITION FROM TABLE VALUE
02571
02572                   ; CURRENT TAG IS ADJACENT TO PREVIOUS TAG.
02573 $220
02574 f93a a5 6d               LDA   POSUNK          ;STATE OF POSITION KNOWLEDGE
02575 f93c 30 14               BMI   $230            ;POSITION FULLY INITIALIZED.  CHECK AGREEMENT
02576 f93e f0 03               BEQ   $214            ;THIS MUST BE THE FIRST VALID TAG SEEN.
02577
02578                   ; THIS TAG IS ADJACENT TO LAST TAG AND IS NOT THE FIRST ONE SEEN.
02579                   ; POSITION IS NOT YET FULLY INITIALIZED, SO MUST COUNT MINIMUM NUMBER OF
02580                   ; DISTINCT AND ADJACENT VALID TAGS BEFORE PRONOUNCING ENCODER HEALTHY.
02581                   ; IS IT THE SAME TAG AS THE LAST TAG SEEN?
02582 f940 a5 6e               LDA   TAGDIF          ;MSB OF ABSOLUTE DISTANCE BETWEEN TAGS
02583 f942 05 6f               ORA   TAGDIF+1        ;LSB.  RESULT = 0 IF SAME TAG AS LAST TIME
02584 f944 f0 0c               BEQ   $230            ;YES, NOT A NEW TAG, SO DON'T UPDATE VALID CT.
```

```
2585                ; THIS TAG IS ADJACENT AND DISTINCT FROM THE LAST TAG AND NOT 1ST ONE SEEN.
2586                ; COUNT IT TOWARDS A HEALTHY ENCODER.
2587
2588  f946 e6 6d         INC   POSUNK          ;COUNT A VALID TAG
2589  f948 a5 6d         LDA   POSUNK          ;CHECK IF MINIMUM NUMBER COUNTED
2590  f94a c9 03         CMP   #NVAPTR         ;NUMBER OF VALID ABSOLUTE POSITION TAGS REQUIRED
2591  f94c 90 04         BCC   $230            ;NOT ENOUGH
2592
2593                ; ENOUGH VALID, ADJACENT, AND DISTINCT ABSOLUTE TAGS SEEN TO PRONOUNCE THAT
2594                ; THE ENCODER IS HEALTHY.  TAG IT AS SUCH.
2595
2596  f94e a9 80         LDA   #80
2597  f950 85 6d         STA   POSUNK
2598
2599                ; TAGS ADJACENT AND NOT FIRST TAG. COMPUTE DIFFERENCE BETWEEN INCREMENTAL POSITION AND ABSOLUTE POSITION.
2600                ; THIS IMPLEMENTS THE POSITION COMPARATOR FUNCTION 91 FROM FIGURE 9 OF THE SPECIFICATION.
2601
2602  f952 38       $230 SEC
2603  f953 a5 47         LDA   ABSPOS+1        ;LSB POSITION DERIVED FROM ABSOLUTE TAG
2604  f955 e5 45         SBC   INCPOS+1        ;LSB OF INCREMENTAL POSITION
2605  f957 85 49         STA   POSDIF+1        ;LSB DIFFERENCE IN POSITIONS
2606  f959 a5 46         LDA   ABSPOS          ;MSB
2607  f95b e5 44         SBC   INCPOS          ;MSB
2608  f95d 85 48         STA   POSDIF          ;MSB
2609
2610                ; NOW SET THE CURRENT INCREMENTAL POSITION TO MATCH THE ABSOLUTE POSITION
2611  f95f a5 46   $245 LDA   ABSPOS          ;MSB OF ABSOLUTE POSITION
2612  f961 85 44         STA   INCPOS          ;MSB OF INCREMENTAL POSITION UP/DOWN COUNTER 74
2613  f963 a5 47         LDA   ABSPOS+1        ;LSB
2614  f965 85 45         STA   INCPOS+1        ;LSB
2615
2616                ; NOW CLEAR THE ABSOLUTE TAG ADJACENCY ERROR FLAG
2617  f967 a9 00   $248 LDA   #00
2618  f969 85 70         STA   ENADJC
2619  f96b 85 71         STA   ENADJC+1
2620
2621  f96d         $250
2622                ; FALL THRU INTO CHECK FOR CHANNEL 'D' SIGNAL FAILURES AND MISSED TAG ERRORS
2623
2624                ; NOW NEED TO CHECK FOR CHANNEL 'D' SIGNAL FAILURES AND MISSED TAG ERRORS.
2625
2626                ; CHECK IF MAGNITUDE OF MOTION SINCE LAST TRANSITION OF CHANNEL 'D' TOO BIG.
2627                ; THIS IMPLEMENTS A PORTION OF THE UP/DOWN COUNTER 93 (SHOWN IN FIGURE 9A OF THE SPECIFICATION) THAT
2628                ; IS USED FOR THE CHANNEL 'D' (I.E., SIGNAL 59) FAULT DETECTOR.
2629
2630  f96d a5 56   CHKDMT LDA  DUDCTR          ;MEASURES NET MOTION SINCE LAST 'D' TRANSITION
2631  f96f 10 05         BPL   $11             ;NET MOTION STILL POSITIVE
2632
2633                ; NET MOTION IS NEGATIVE.  NEED TO TAKE ABSOLUTE VALUE FOR THRESHOLD TEST
2634  f971 49 ff         EOR   #^HOFF          ;NEGATE BY COMPLEMENTING AND ...
2635  f973 38            SEC
2636  f974 69 00         ADC   #00             ;... INCREMENTING
2637
2638                ; ABSOLUTE VALUE OF MOTION SINCE LAST TRANSITION ON CHANNEL 'D' NOW IN 'A' REG.
2639  f976 c9 0c   $11  CMP   #DUDTHR         ;ERROR THRESHOLD
2640  f978 90 04         BCC   $13             ;HAVEN'T MOVED FAR ENOUGH YET
2641
2642                ; ENCODER HAS MOVED "DUDTHR" COUNTS WITHOUT DETECTING ANY TRANSITIONS ON THE
2643                ; SIGNAL FROM CHANNEL 'D'.  REPORT THAT CHANNEL 'D' HAS FAILED.
2644
2645  f97a e6 5a   $12  INC   BADCHD          ;COUNTS NUMBER OF FAILURE DETECTIONS
2646  f97c f0 fc         BEQ   $12             ;DON'T LET COUNTER WRAP TO ZERO
2647
2648                ; THIS IMPLEMENTS A PORTION OF THE "MISSED TAG ERROR" COMPONENT OF THE TAG ERROR FUNCTION 84.
2649                ; CHECK IF MAGNITUDE OF MOTION SINCE LAST FRAMED TAG IS TOO BIG
2650  f97e a5 57   $13  LDA   MTGCTR          ;MEASURES NET MOTION SINCE LAST TAG FRAMED
2651  f980 10 05         BPL   $14             ;NET MOTION STILL POSITIVE
```

```
2654                                    ; NET MOTION IS NEGATIVE.  NEED TO TAKE ABSOLUTE VALUE FOR THRESHOLD TEST
2655   f982  49 ff              EOR  #^HOFF                       ;NEGATE BY COMPLEMENTING AND ....
2656   f984  38                 SEC
2657   f985  69 00              ADC  #00                           ; .... INCREMENTING
2658
2659                                    ; ABSOLUTE VALUE OF MOTION SINCE LAST TAG FRAMED NOW IN 'A' REGISTER.
2660   f987  c9 30        $14   CMP  #MTGTHR                       ;ERROR THRESHOLD
2661   f989  90 04              BCC  $16                           ;HAVEN'T MOVED FAR ENOUGH YET
2662
2663                                    ; ENCODER HAS MOVED "MTGTHR" COUNTS WITHOUT DETECTING ANY FRAMED TAGS.
2664                                    ; SIGNAL THAT A "MISSED TAG" ERROR HAS OCCURRED.
2665
2666   f98b  e6 75        $15   INC  MTGERR                        ;COUNTS NUMBER OF MISSED TAGS
2667   f98d  f0 fc              BEQ  $15                           ;DON'T LET COUNTER WRAP TO ZERO
2668
2669   f98f               $16
2670                                    ; FALL THROUGH INTO ROUTINE TO UPDATE THE I/O PORT OUTPUTS
2671
2672                                    ; UPDATE THE I/O PORT OUTPUTS TO REFLECT NEW POSITION
2673
2674   f98f               UPDATE
2675                                    ; START CLOCK PULSE <63> TO INDICATE THAT SIGNALS WILL BE IN TRANSITION
2676   f98f  17 01              RMB  #<<LICLOCKP]>,^MCCLOCKP]      ;PULL CLOCK PULSE <63> LOW
2677   f991  17 41              RMB  #<<LICLOCKP]>,^MCCLOCKP]+RAMBAS  ;AND IN RAM SHADOW AS WELL
2678
2679                                    ; SET DIRECTION LEVEL <62> TO INDICATE CURRENT DIRECTION OF MOTION
2680   f993  a5 30              LDA  ENCDIR                        ;ENCODER DIRECTION
2681   f995  30 4a              BMI  $10                           ;MOVING NEGATIVE, DOWN, LEFT, OR CCW
2682
2683                                    ; MOTION IS POSITIVE, UP, RIGHT, OR CLOCKWISE
2684   f997  a7 01              SMB  #<<LIDIRLEV]>,^MCDIRLEV]      ;DIRECTION LEVEL HIGH -> RIGHT
2685   f999  a7 41              SMB  #<<LIDIRLEV]>,^MCDIRLEV]+RAMBAS ;AND IN RAM SHADOW AS WELL
2686   f99b  4c a2 f9           JMP  $20
2687
2688                                    ; MOTION IS NEGATIVE, DOWN, LEFT, OR COUNTER-CLOCKWISE
2689   f99e  27 01        $10   RMB  #<<LIDIRLEV]>,^MCDIRLEV]      ;DIRECTION LEVEL LOW -> LEFT
2690   f9a0  27 41              RMB  #<<LIDIRLEV]>,^MCDIRLEV]+RAMBAS ;AND IN RAM SHADOW AS WELL
2691
2692                                    ; CHECK IF INDEX PULSE REQUESTED
2693   f9a2  bf 41 02     $20   BBS  #<<LIINDEX]>,^MCINDEX]+RAMBAS,$30 ;BRANCH IF INDEX NOT REQUESTED
2694
2695                                    ; JUST CROSSED THROUGH ZERO AND INDEX PULSE NEEDED
2696   f9a5  07 01              RMB  #<<LIINDEX]>,^MCINDEX]        ;PULL BIT LOW IN PORT TO MATCH SHADOW
2697
2698                                    ; NOW UPDATE THE POSITION REGISTER OUTPUTS
2699   f9a7  a5 44        $30   LDA  INCPOS                        ;MSB OF CURRENT POSITION
2700   f9a9  85 03              STA  PDPORT                        ;STORE INTO OUTPUT PORT FOR MSB
2701   f9ab  85 43              STA  PDSHAD                        ;STORE INTO OUTPUT PORT RAM SHADOW
2702
2703   f9ad  a5 45              LDA  INCPOS+1
2704   f9af  85 02              STA  PCPORT                        ;LSB OF CURRENT POSITION
2705   f9b1  85 42              STA  PCSHAD                        ;STORE INTO OUTPUT PORT FOR LSB
2706                                                                ;STORE INTO OUTPUT PORT RAM SHADOW
2707                                    ; POSITION AND DIRECTION LEVEL STABLE
2708                                    ; CHECK IF POSITION IS ACTUALLY INITIALIZED.  IF SO, TERMINATE ANY INDEX PULSES.
2709                                    ; IF NOT, KEEP THE INDEX PULSE LEVEL HELD LOW.
2710
2711   f9b3  a5 6d              LDA  POSUNK                         ;POSITIVE IF INITIALIZATION NOT COMPLETE
2712   f9b5  10 04              BPL  $40                            ;NOT INITIALIZED, DON'T TERMINATE INDEX
2713
2714                                    ; POSITION IS INTIALIZED, SO PULL INDEX BIT HIGH TO END ANY INDEX PULSES.
2715   f9b7  87 01              SMB  #<<LIINDEX]>,^MCINDEX]         ;PULL INDEX BIT HIGH IN PORT
2716   f9b9  87 41              SMB  #<<LIINDEX]>,^MCINDEX]+RAMBAS  ;AND IN RAM SHADOW AS WELL
2717
2718                                    ; POSITION UPDATE COMPLETED.  PULL CLOCK PULSE HIGH TO INDICATE THE OUTPUT
2719                                    ; DATA IS VALID AND THAT IT CAN BE STROBED ON RISING EDGE.
2720
2721   f9bb  97 01        $40   SMB  #<<LICLOCKP]>,^MCCLOCKP]       ;CLOCK PULSE <63>
2722   f9bd  97 41              SMB  #<<LICLOCKP]>,^MCCLOCKP]+RAMBAS ;RAM SHADOW TOO
```

```
2723                                    ; RESTORE 'Y' REGISTER
2724    f9bf 68          PLA
2725    f9c0 a8          TAY
2726    f9c1 4c a4 f6    JMP     INTXIT          ;ALL DONE FOR THIS CLOCK CYCLE
2727
2728
2729                     ; 15. PROGRAM LISTING FOR POWER-UP INITIALIZATION ROUTINE
2730                     ;
2731    f9c4 78  RESSRV  SEI                     ;DIBABLE PROCESSOR INTERRUPTS
2732    f9c5 a2 ff       LDX    #STKTOP          ;RESET STACK POINTER TO TOP OF "PAGE ZERO"
2733    f9c7 9a          TXS
2734    f9c8 d8          CLD                     ;CLEAR DECIMAL MODE
2735    f9c9 18          CLC
2736
2737                     ; NOW INITIALIZE CONTROL REGISTERS
2738
2739                     ; CONFIGURATION OF 6100 PORTS/TIMERS FOR FEEDBACK CORRECTOR
2740                     ;
2741                             MCR.MCBSMO = MCNORM       ;BUS MODE      = NORMAL
2742                             MCR.MCPDMO = MCPDAC       ;PORT D MODE   = ACTIVE OUTPUT
2743                             MCR.MCPBLA = 0            ;PORT B LATCH  = DISABLED
2744                             MCR.MCBMO  = MCCBIT       ;COUNTER B MODE = INTERVAL TIMER
2745                             MCR.MCCAMO = MCCAIT       ;COUNTER A MODE = INTERVAL TIMER
2746
2747                             SCCR = SCTENA             ;SERIAL COMMUNICATION TRANSMIT ENABLED
2748                                    SCRENA             ;                      RECEIVE  ENABLED
2749                                    SCTARA             ;              TRANSMIT ASYNCH, RECEIVE ASYNCH
2750                                    SCBBIT             ;              8-BIT ASCII, NO PARITY
2751
2752    f9ca a9 60       LDA    #[MCNORM!MCPDAC!MCCBIT!MCCAIT]   ;SEE ABOVE
2753    f9cc 85 14       STA    MCR                              ;MODE CONTROL REGISTER
2754
2755    f9ce a9 c0       LDA    #[SCTENA!SCRENA!SCTARA!SCBBIT]   ;SEE ABOVE
2756    f9d0 85 15       STA    SCCR                             ;SERIAL COMMUNICATIONS CONTROL REGISTER
2757
2758                     ; INITIALIZE COUNTER 'A' TO DESIRED BAUD RATE
2759    f9d2 a9 0c       LDA    #^LCBAUDRT]
2760    f9d4 85 18       STA    CALOLA                           ;COUNTER A LOWER LATCH
2761    f9d6 a9 00       LDA    #^MCBAUDRT]
2762    f9d8 85 19       STA    CAUPLA                           ;UPPER LATCH
2763
2764                     ; DO SOFTWARE RESET BY FORCING ALL PORTS HIGH
2765    f9da a9 ff       LDA    #^HOFF
2766    f9dc 85 00       STA    PAPORT
2767    f9de 85 01       STA    PBPORT
2768    f9e0 85 02       STA    PCPORT
2769    f9e2 85 03       STA    PDPORT
2770
2771                     ; NOW CHECK PAGE 0 OF RAM, WITHOUT USING ANY OTHER RAM
2772                     ; TO DO THE CHECKING
2773    f9e4 a2 01       LDX    #01
2774    f9e6 8a  $5      TXA
2775    f9e7 a0 40       LDY    #RAMBAS
2776    f9e9 18  $10     CLC
2777    f9ea 69 43       ADC    #TSTPIN          ;NOT A SIMPLE BINARY
2778    f9ec 99 00 00    STA    0000,Y
2779    f9ef c8          INY
2780    f9f0 d0 f7       BNE    $10
2781
2782                     ; PAGE O (AND THUS ALSO PAGE 1) HAS BEEN LOADED WITH A TEST PATTERN.
2783                     ; LET IT SIT THERE A LITTLE BIT TO AVOID BUS CAPACITANCE FAKE OUT.
2784    f9f2 c8  $15     INY
2785    f9f3 d0 fd       BNE    $15
2786
2787                     ; NOW TRY TO READ IT BACK AND COMPARE
2788    f9f5 8a          TXA                     ;RELOAD BASE OF TEST PATTERN
2789    f9f6 a0 40       LDY    #RAMBAS          ;START AT BASE OF PAGE
```

```
2790                          CLC
2791  f94b 18 69 43            ADC   #TSTPIN             ;SHOULD MATCH
2792  f94d d9 00 00            CMP   0000,Y
2793  f950 d0 35               BNE   HANG                ;BAD PAGE 0 RAM
2794  f953 c8                  INY
2795  f954 d0 f5               BNE   $20
2796  fa00 8a                  TXA
2797  fa01 0a                  ASL   A                   ;SHIFT TEST BIT UP BY 1 BIT
2798  fa02 aa                  TAX
2799  fa03 d0 de               BNE   $5
2800
2801  ; PAGE 0 OF MEMORY CHECKS OUT OK.
2802  ; NOW LET'S CLEAR RAM TO ZERO.
2803  fa05 a0 40               LDY   #RAMBAS
2804  fa07 a9 00               LDA   #$00
2805  fa09 99 00 00   $30      STA   0000,Y
2806  fa0c c8                  INY
2807  fa0d c0 8c               CPY   #RAMEND
2808  fa0f 90 f8               BCC   $30
2809
2810  ; INITIALIZE STACK AREA TO DISTINCTIVE PATTERN
2811  fa11 a0 8c               LDY   #RAMEND
2812  fa13 a9 77               LDA   #$77
2813  fa15 99 00 00   $35      STA   0000,Y
2814  fa18 c8                  INY
2815  fa19 c0 ff               CPY   #^HOFF
2816  fa1b 90 f8               BCC   $35
2817
2818  ; INITIALIZE RAM SHADOWS TO REFLECT INITIALIZATION STATE OF PORTS
2819  fa1d a9 ff               LDA   #^HOFF              ;PORTS SET TO 'FF' ON POWER UP
2820  fa1f 85 40               STA   PASHAD
2821  fa21 85 41               STA   PBSHAD
2822  fa23 85 42               STA   PCSHAD
2823  fa25 85 43               STA   PDSHAD
2824
2825  ; HOLD INDEX LEVEL LOW UNTIL ENCODER IS PROPERLY INITIALIZED
2826  fa27 07 01               RMB   #<^L[INDEX]>,^MINDEX1 ;PULL INDEX LOW IN PORT
2827  fa29 07 41               RMB   #<^L[INDEX]>,^MINDEX1+RAMBAS ;AND IN RAM SHADOW AS WELL
2828
2829  ; INITIALIZE THE INTERRUPT ENABLE REGISTER  ;ENABLE ALL VALID DEVICES
2830  fa2b a9 0f               LDA   #ALLIFR
2831  fa2d 85 12               STA   IER
2832
2833  ; JUMP INTO MAIN IDLE LOOP
2834  fa2f 4c 3d fa            JMP   IDLE
2835
2836  ; HANG HERE FOREVER IF RAM TESTS OUT BAD
2837          HANG
2838  fa32 a9 00               LDA   #EDTERR             ;SIGNAL PROBLEM WITH MICROPROCESSOR
2839  fa34 85 01               STA   PBPORT
2840  fa36 4c 35 fa            JMP   HANG
2841
2842  ; THIS IS THE NMI SERVICE ROUTINE
2843          NMISRV
2844  fa39 40                  RTI                       ;NMI'S CURRENTLY IGNORED
2845
2846  ;    16.  PROGRAM LISTING FOR THE MAIN "IDLE" LOOP THAT EXECUTES DURING THE INTERVAL BETWEEN INTERRUPTS
2847  ;    -------------------------------------------------------------------------------------------------
2848
2849  ;  THIS IS THE MAIN IDLE LOOP WHERE WE GENERATE A PULSE TO RETRIGGER AN AUTO-RESET WATCHDOG TIME,
2850  ;  SET THE ERROR CODE AND ERROR FLAG BITS IN I/O PORT "B", AND OPTIONALLY PRINT OUT THE DIAGNOSTIC
2851  ;  AND DEBUGGING DATA ON THE ASCII SERIAL INTERFACE.
2852
2853  ;  NOTE THAT ALL OF THE ACTUAL PROCESSING OF SIGNALS 57, 58, AND 59 IS DONE IN THE INTERRUPT SERVICE
2854  ;  ROUTINES WHICH ARE INVOKED AS A RESULT OF TRANSITIONS OF THE SIGNALS 57 AND 58 (CHANNELS "A" AND "B")
2855  ;  DERIVED FROM THE OPTICAL SENSORS 42 AND 43 WHICH SCAN THE TIMING TRACK 32 OF THE ENCODER BAND 30.
2856
```

```
                IDLE    LDX     #STKTOP         ;CLEAN UP PROCESSOR STACK IN CASE OF ABORT
2857  fa3d                                      ;RESET TO STACK POINTER TO STACK TOP
2858  fa3d  a2 ff        TXS                    ;INSURE WE ARE IN BINARY MODE
2859  fa3e               CLD
2860  fa3f  9a                                  ;ENABLE ALL VALID SOURCES ENABLED TO REQUEST INTERRUPTS
2861  fa40  d8           STA    #ALLIFR
2862  fa41  a9 0f        CLI                    ;INSURE PROCESSOR INTERRUPTS ENABLED
2863  fa43  85 12        IER
2864  fa45  58
2865
2866                     ; RETRIGGER THE AUTO RESET WATCH DOG TIMER.  SHOULD THIS TIMER EXPIRE, IT CAN BE USED TO SIGNAL A
2867                     ; FAULT OR GENERATE A MICROPROCESSOR RESET SIGNAL
2868  fa46  37 01        RMB    #<^[LCPULRES]>,^MCPULRES]   ;PULSE WATCHDOG TIMER RESET LOW
2869  fa48  b7 01        SMB    #<^[LCPULRES]>,^MCPULRES]   ;PULL IT HIGH
2870
2871                     ; NOW UPDATE THE ERROR CODE BIT AND ERROR FLAG BITS IN I/O PORT "B"
2872  fa4a  a5 58        LDA    BADCHA          ;HAS CHANNEL 'A' SIGNAL FAILED ?
2873  fa4c  f0 04        BEQ    $110            ;NO
2874  fa4e  a9 10        LDA    #CHABAD         ;YES, SIGNAL "CHANNEL 'A' BAD" ERROR
2875  fa50  d0 4c        BNE    $200            ;UNCONDITIONAL BRANCH
2876  fa52  a5 59 $110   LDA    BADCHB          ;HAS CHANNEL 'B' SIGNAL FAILED ?
2877  fa54  f0 04        BEQ    $120            ;NO
2878  fa56  a9 20        LDA    #CHBBAD         ;YES, SIGNAL "CHANNEL 'B' BAD" ERROR
2879  fa58  d0 44        BNE    $200            ;UNCONDITIONAL BRANCH
2880
2881  fa5a  a5 5a $120   LDA    BADCHD          ;HAS CHANNEL 'D' SIGNAL FAILED ?
2882  fa5c  f0 04        BEQ    $130            ;NO
2883  fa5e  a9 30        LDA    #CHDBAD         ;YES, SIGNAL "CHANNEL 'D' BAD" ERROR
2884  fa60  d0 3c        BNE    $200            ;UNCONDITIONAL BRANCH
2885
2886  fa62  a5 48 $130   LDA    POSDIF          ;MSB OF POSITION DIFFERENCE (ABS - INC)
2887  fa64  05 49        ORA    POSDIF+1        ;"OR" IT WITH THE LSB OF POSITION DIFF.
2888  fa66  f0 04        BEQ    $140            ;ABSOLUTE POSITION = INCREMENTAL POS'N
2889  fa68  a9 40        LDA    #POSERR         ;SIGNAL "POSITION MISMATCH" ERROR
2890  fa6a  d0 32        BNE    $200            ;UNCONDITIONAL BRANCH
2891
2892  fa6c  a5 72 $140   LDA    BADTER          ;WAS THERE A BAD TAG ERROR?
2893  fa6e  f0 04        BEQ    $150            ;NO
2894  fa70  a9 50        LDA    #TAGPAR         ;YES, SIGNAL "TAG PARITY" ERROR
2895  fa72  d0 2a        BNE    $200            ;UNCONDITIONAL BRANCH
2896
2897  fa74  a5 70 $150   LDA    ENADJC          ;WAS THERE A TAG ADJACENCY ERROR ?
2898  fa76  05 71        ORA    ENADJC+1        ;NO
2899  fa78  f0 04        BEQ    $160            ;YES, SIGNAL A "TAG ADJACENCY" ERROR
2900  fa7a  a9 60        LDA    #TAGADJ         ;UNCONDITIONAL BRANCH
2901  fa7c  d0 20        BNE    $200

2902  fa7e  a5 75 $160   LDA    MTGERR          ;WAS THERE A MISSING TAG ERROR?
2903  fa80  f0 04        BEQ    $170            ;NO
2904  fa82  a9 70        LDA    #TAGMIS         ;YES, SIGNAL A "MISSED TAG" ERROR
2905  fa84  d0 18        BNE    $200            ;UNCONDITIONAL BRANCH 2906  fa86  a5 5f $170   LDA    CAPTFC          ;CHANNEL 'A' POSITIVE TRANSITION FAULT
2907  fa88  05 60        ORA    CANTFC          ;CHANNEL 'A' NEGATIVE TRANSITION FAULT
2908  fa8a  05 61        ORA    CBPTFC          ;CHANNEL 'B' POSITIVE TRANSITION FAULT
2909  fa8c  05 62        ORA    CBNTFC          ;CHANNEL 'B' NEGATIVE TRANSITION FAULT
2910  fa8e  f0 05        BEQ    $180            ;NO TRANSITION FAULTS ON EITHER CHANNEL
2911  fa90  a9 00        LDA    #EDTERR         ;YES, FAULTS. SIGNAL "EDGE DETECT" ERROR
2912  fa92  4c 9e fa     JMP    $200

2913                     ; NO ERRORS DETECTED (HOORAY!).  CLEAR ERROR FLAG BAR (PULL ERROR FLAG BIT HIGH)
2914  fa95  78    $180   SEI
2915  fa96  f7 01        SMB    #<^[LIERRFLG]>,^MIERRFLG]   ;DISABLE TO FLIP PORT BITS
2916  fa98  f7 41        SMB    #<^[LIERRFLG]>,^MIERRFLG]+RAMBAS  ;PULL BIT HIGH IN PORT
2917  fa9a  58           CLI                    ;AND IN RAM SHADOW
2918  fa9b  4c af fa     JMP    OUTPUT          ;NOW DO OPTIONAL DIAGNOSTIC OUTPUT
```

```
                                    ; AN ERROR WAS DETECTED.  STORE THE APPROPRIATE ERROR CODE AND PULL THE ERROR
                                    ; FLAG BIT LOW.
2925
2926
2927                      $200      STA     ERRNUM
2928  fa9e 85 76                    LDA     #^L^C!ERRFLG!ERCOD1!ERCOD2!ERCOD4JJ ;SAVE ERROR NUMBER SEPARATELY
2929  faa0 a9 0f                    SEI                        ;DISABLE TO FLIP BITS
2930  faa2 78                       AND     PBSHAD             ;MASK OFF THE ERROR BITS
2931  faa3 25 41                    ORA     ERRNUM             ;"OR" IN THE ERROR CODE
2932  faa5 05 76                    STA     PBPORT             ;STORE IT BACK INTO PORT
2933  faa7 85 01                    STA     PBSHAD             ;AND INTO SHADOW AS WELL
2934  faa9 85 41                    CLI
2935  faab 58                       JMP     OUTPUT
2936  faac 4c af fa
2937
2938  faaf
2939          ; 17.  PROGRAM LISTING FOR OPTIONAL SOFTWARE THAT PRINTS DIAGNOSTIC DATA ON THE ASCII SERIAL OUTPUT
2940
2941          OUTPUT
2942
2943          ;  ----> START OF OPTIONAL DIAGNOSTIC/DEBUGGING CODE - THIS CAN BE REMOVED TO SAVE SPACE IN EPROM.  <----
2944          ;  ----> TO ELIMINATE THIS CODE, SUBSTITUTE A "JMP IDLE" INSTRUCTION IN PLACE OF IT                 <----
2945
2946          ;  NOW OPTIONALLY PRINT OUT VARIOUS RAM LOCATIONS OF INTEREST.
2947          ;  THESE OUTPUTS ARE FOR DEBUGGING AND DIAGNOSTICS PURPOSES ONLY.  THE PRIMARY MECHANISM FOR INTERFACING
2948          ;  THE POSITION AND ERROR STATUS INFORMATION TO THE OUTSIDE WORLD IS VIA THE I/O PORTS.  SHOULD ONE WISH
2949          ;  TO USE THE ASCII SERIAL INTERFACE INSTEAD, THEN THE SOFTWARE IN THIS "IDLE" LOOP COULD EASILY BE
2950          ;  REVISED TO PERFORM THAT FUNCTION.  NOTE THAT SINCE MOST OF THE VALUES OF INTEREST ARE MANIPULATED BY
2951          ;  INTERRUPT SERVICE ROUTINES, ONE WOULD NEED TO TEMPORARILY DISABLE INTERRUPTS AND SNAPSHOT THESE VALUES
2952          ;  INTO TEMPORARY BUFFERS SO THAT THEY WOULD NOT BE IN TRANSITION DURING THE CONVERSION AND DISPLAY
2953          ;  PROCESS.  SUCH SNAPSHOTTING CURRENTLY IS NOT PERFORMED BY THE SOFTWARE IN THE "IDLE" LOOP.
2954
2955          ;  THE DIAGNOSTIC OUTPUT CONSISTS OF AN 80-COLUMN LINE WHICH IS OUTPUT REPEATEDLY FOREVER.
2956          ;  CURRENTLY, THE ASCII SERIAL INTERFACE IS CONFIGURED TO OPERATE AT 4800 BAUD, 8 BITS, NO PARITY.
2957          ;  THE 80-COLUMN OUTPUT LINE CONSISTS OF THE FOLLOWING FIELDS, DELIMITED BY SPACES:
2958
2959          ;  1.  A 2-COLUMN HEXADECIMAL FIELD WHICH DISPLAYS A COPY OF THE CURRENT 8-BIT BYTE BEING
2960          ;      OUTPUT BY I/O PORT "B", WHICH INCLUDES THE INDEX PULSE SIGNAL, CLOCK PULSE SIGNAL <73>,
2961          ;      DIRECTION LEVEL SIGNAL <72>, ERROR CODE BITS, AND ERROR FLAG BIT.
2962
2963          ;  2.  A 2-COLUMN HEXADECIMAL FIELD WHICH DISPLAYS A COPY OF THE CURRENT 8-BIT BYTE BEING
2964          ;      OUTPUT BY I/O PORT "C", WHICH CORRESPONDS TO THE LOW 8-BITS OF THE 16-BIT BINARY INTEGER
2965          ;      POSITION.
2966
2967          ;  3.  A 2-COLUMN HEXADECIMAL FIELD WHICH DISPLAYS A COPY OF THE CURRENT 8-BIT BYTE BEING
2968          ;      OUTPUT BY I/O PORT "D", WHICH CORRESPONDS TO THE HIGH 8-BITS OF THE 16-BIT BINARY INTEGER
2969          ;      POSITION.
2970
2971          ;  4.  A 2-COLUMN HEXADECIMAL FIELD WHICH DISPLAYS THE INITIALIZATION STATE OF THE ENCODER.
2972          ;      A HEXADECIMAL VALUE OF 80 INDICATES THE ENCODER IS INITIALIZED.
2973
2974          ;  5.  A 5-COLUMN UNSIGNED DECIMAL FIELD WHICH DISPLAYS THE CURRENT POSITION.
2975
2976          ;  6.  A 3-COLUMN UNSIGNED DECIMAL FIELD WHICH DISPLAYS THE TAG SEQUENCE NUMBER OF THE MOST
2977          ;      RECENTLY DECODED ABSOLUTE POSITION TAG <36>.
2978
2979          ;  7.  A 3-COLUMN UNSIGNED DECIMAL FIELD WHICH DISPLAYS THE TAG SEQUENCE NUMBER OF THE MOST RECENT
2980          ;      PREVIOUSLY DECODED ABSOLUTE POSITION TAG <36>.
2981
2982          ;  8.  A 3-COLUMN UNSIGNED DECIMAL FIELD WHICH DISPLAYS THE ABSOLUTE VALUE OF THE DIFFERENCE
2983          ;      (MODULO THE NUMBER OF ABSOLUTE POSITION TAGS <36>) IN THE ENCODER BAND <30>, BETWEEN THE
2984          ;      VALUES DISPLAYED IN THE PRECEDING TWO FIELDS.  IF THE VALUE DISPLAYED IS NON-ZERO, THIS
2985          ;      INDICATES A TAG ADJACENCY ERROR.
2986
2987          ;  9.  A 2-COLUMN HEXADECIMAL FIELD WHICH DISPLAYS A NON-ZERO VALUE IF THE MOST RECENTLY DETECTED
2988          ;      ABSOLUTE POSITION TAG <36> HAD A PARITY ERROR OR OTHERWISE INVALID CODE.
2989
2990          ; 10.  A 2-COLUMN HEXADECIMAL FIELD WHICH DISPLAYS THE MOST SIGNIFICANT 8 BITS OF THE MOST RECENTLY
2991          ;      DETECTED INVALID TAG CODE (I.E., A TAG CODE WHICH HAD INCORRECT PARITY OR WAS UNASSIGNED).
2992          ;      THIS FIELD, IN CONJUNCTION WITH FIELD 11 BELOW, CAN HELP ONE TO DETERMINE WHICH BIT OR BITS
```

IN THE TAG CODE MAY BE IN ERROR.

11. A 2-COLUMN HEXADECIMAL FIELD WHICH DISPLAYS THE LEAST SIGNIFICANT 8 BITS OF THE MOST RECENTLY DETECTED INVALID TAG CODE (I.E., A TAG CODE WHICH HAD INCORRECT PARITY OR WAS UNASSIGNED). THIS FIELD, IN CONJUNCTION WITH FIELD 10 ABOVE, CAN HELP ONE TO DETERMINE WHICH BIT OR BITS IN THE TAG CODE MAY BE IN ERROR.

12. A 6-COLUMN SIGNED DECIMAL FIELD WHICH DISPLAYS THE DIFFERENCE BETWEEN THE ABSOLUTE POSITION AND THE INCREMENTAL POSITION AT THE INSTANT THAT THE LAST VALID ABSOLUTE POSITION TAG <36> WAS SUCCESSFULLY DECODED. IF THIS VALUE IS NON-ZERO, IT INDICATES THAT A POSITION MISMATCH ERROR OCCURRED, AND THE VALUE INDICATES THE AMOUNT OF THE MISMATCH.

13. A 3-COLUMN UNSIGNED DECIMAL FIELD WHICH IS NON-ZERO IF THE SIGNAL FROM CHANNEL "A" (I.E., SIGNAL 57) HAS GONE DEAD.

14. A 3-COLUMN UNSIGNED DECIMAL FIELD WHICH IS NON-ZERO IF THE SIGNAL FROM CHANNEL "B" (I.E., SIGNAL 58) HAS GONE DEAD.

15. A 3-COLUMN UNSIGNED DECIMAL FIELD WHICH IS NON-ZERO IF THE SIGNAL FROM CHANNEL "D" (I.E., SIGNAL 59) HAS GONE DEAD.

16. A 4-COLUMN SIGNED DECIMAL FIELD WHICH INDICATES THE INCREMENTAL DISTANCE TRAVELED SINCE THE LAST TRANSITION WAS DETECTED ON CHANNEL "D" (I.E., SIGNAL 59).

17. A 3-COLUMN UNSIGNED DECIMAL FIELD WHICH DISPLAYS (MODULO 256) THE NUMBER OF CONSECUTIVE DIRECTION REVERSALS (ACROSS A GIVEN EDGE OF A GIVEN TIMING TRACK <32> STRIPE) DETECTED ON CHANNEL "A" (I.E., SIGNAL 57).

18. A 3-COLUMN UNSIGNED DECIMAL FIELD WHICH DISPLAYS (MODULO 256) THE NUMBER OF CONSECUTIVE DIRECTION REVERSALS (ACROSS A GIVEN EDGE OF A GIVEN TIMING TRACK <32> STRIPE) DETECTED ON CHANNEL "B" (I.E., SIGNAL 58).

19. A 3-COLUMN UNSIGNED DECIMAL FIELD WHICH IS NON-ZERO IF A MISSED TAG <36> ERROR HAS BEEN DETECTED. THIS MEANS THAT SUFFICIENT INCREMENTAL MOTION WAS MEASURED SINCE THE LAST TAG <36> WAS DETECTED SO THAT ANOTHER TAG <36> SHOULD HAVE BEEN DETECTED BY NOW, BUT NONE WAS.

20. A 4-COLUMN SIGNED DECIMAL FIELD WHICH INDICATES THE INCREMENTAL DISTANCE TRAVELED SINCE THE LAST VALID ABSOLUTE POSITION TAG <36> WAS DECODED.

```
2993
2994
2995
2996
2997
2998
2999
3000
3001
3002
3003
3004
3005
3006
3007
3008
3009
3010
3011
3012
3013
3014
3015
3016
3017
3018
3019
3020
3021
3022
3023
3024
3025
3026
3027
3028
3029
3030
3031  faaf a5 41       fb        LDA   PBSHAD            ;GET VALUE OF RAM SHADOW OF PBPORT
3032  fab1 20 4c       fb        JSR   HEXPRT            ;#1. HEXADECIMAL CONVERT AND PRINT
3033
3034
3035  fab4 a5 42       fb        LDA   PCSHAD            ;GET VALUE OF RAM SHADOW OF PCPORT
3036  fab6 20 4c       fb        JSR   HEXPRT            ;#2. HEXADECIMAL CONVERT AND PRINT
3037
3038  fab9 a5 43       fb        LDA   PDSHAD            ;GET VALUE OF RAM SHADOW OF PDPORT
3039  fabb 20 4c       fb        JSR   HEXPRT            ;#3. HEXADECIMAL CONVERT AND PRINT
3040
3041  fabe a5 6d       fb        LDA   POSUNK            ;GET VALUE OF "POSITION UNKNOWN" FLAG
3042  fac0 20 4c       fb        JSR   HEXPRT            ;#4. HEXADECIMAL CONVERT AND PRINT
3043
3044  fac3 a0 44                 LDY   #INCPOS           ;POINT AT INCREMENTAL POSITION
3045  fac5 a2 6f                 LDX   #U2BCD            ;2-BYTE UNSIGNED BINARY TO BCD CONVERT
3046  fac7 a2 05                 LDX   #DGTENK           ;START PRINTING WITH TEN THOUSANDS DIGIT
3047  fac9 20 12       fc        JSR   WRITUN            ;#5. PRINTS CURRENT INCREMENTAL POSITION
3048  facc 20 47       fb        JSR   SPACE             ;LEAVE A SPACE
3049
3050  fad0 a0 69                 LDY   #ENCABT           ;CURRENT ABSOLUTE POSITION TAG NUMBER
3051  fad2 20 39       fb        JSR   DUNSPT            ;#6. DOUBLE UNSIGNED DECIMAL CONVERT & PRINT
3052
3053  fad5 a0 6b                 LDY   #ENLABT           ;PREVIOUS ABSOLUTE POSITION TAG NUMBER
3054  fad7 20 39       fb        JSR   DUNSPT            ;#7. DOUBLE UNSIGNED DECIMAL CONVERT & PRINT
3055
3056  fada a0 70                 LDY   #ENADJC           ;POINT AT TAG ADJACENCY ERROR FLAG
3057  fadc 20 39       fb        JSR   DUNSPT            ;#8. DOUBLE UNSIGNED DECIMAL CONVERT & PRINT
```

```
3058  fadf  a5 72          BADTER  LDA              ;GET VALUE OF BAD TAG ERROR FLAG
3059  fae1  20 4c fb               JSR    HEXPRT    ;#9. HEXADECIMAL CONVERT AND PRINT
3060
3061  fae4  a5 73                  LDA    BADTAG    ;GET VALUE OF MSB OF BAD TAG CODE
3062  fae6  20 4c fb               JSR    HEXPRT    ;#10. HEXADECIMAL CONVERT AND PRINT
3063
3064  fae9  a5 74                  LDA    BADTAG+1  ;GET VALUE OF LSB OF BAD TAG CODE
3065  faeb  20 4c fb               JSR    HEXPRT    ;#11. HEXADECIMAL CONVERT AND PRINT
3066
3067  faee  a0 48          #POSDIF LDY              ;POSITION DIFFERENCE (ABSOLUTE - INCREM)
3068  faf0  20 61 fb               JSR    BS2BCD    ;2-BYTE SIGNED BINARY TO BCD CONVERT
3069  faf3  a5 84                  LDA    CVTSGN    ;GET SIGN CHARACTER
3070  faf5  20 29 fc               JSR    WRCHAR    ;PRINT IT
3071  faf8  a2 05                  LDX    #DGTENK   ;START PRINTING WITH TEN THOUSANDS DIGIT
3072  fafa  20 12 fb               JSR    WRITUN    ;#12. WILL BE ZERO IF NO ERROR
3073  fafd  20 47 fb               JSR    SPACE     ;LEAVE A SPACE
3074
3075  fb00  a0 58          #BADCHA LDY              ;POINT AT BAD CHANNEL 'A' COUNTER
3076  fb02  20 3f fb               JSR    UNSPRT    ;#13. UNSIGNED DECIMAL CONVERT AND PRINT
3077
3078  fb05  a0 59          #BADCHB LDY              ;POINT AT BAD CHANNEL 'B' COUNTER
3079  fb07  20 3f fb               JSR    UNSPRT    ;#14. UNSIGNED DECIMAL CONVERT AND PRINT
3080
3081  fb0a  a0 5a          #BADCHD LDY              ;POINT AT BAD CHANNEL 'D' COUNTER
3082  fb0c  20 3f fb               JSR    UNSPRT    ;#15. UNSIGNED DECIMAL CONVERT AND PRINT
3083
3084  fb0f  a0 56          #DUDCTR LDY              ;POINT AT MOTION SINCE LAST 'D' CHANGE
3085  fb11  20 2e fb               JSR    SGNWRT    ;#16. SIGNED DECIMAL CONVERT AND PRINT
3086
3087  fb14  a0 63          #ENADRV LDY              ;DIRECTION REVERSAL SEEN ON 'A' EDGE
3088  fb16  20 3f fb               JSR    UNSPRT    ;#17. UNSIGNED DECIMAL CONVERT AND PRINT
3089
3090  fb19  a0 64          #ENBDRV LDY              ;DIRECTION REVERSAL SEEN ON 'B' EDGE
3091  fb1b  20 3f fb               JSR    UNSPRT    ;#18. UNSIGNED DECIMAL CONVERT AND PRINT
3092
3093  fb1e  a0 75          #MTGERR LDY              ;MISSED TAG ERROR
3094  fb20  20 3f fb               JSR    UNSPRT    ;#19. UNSIGNED DECIMAL CONVERT AND PRINT
3095
3096  fb23  a0 57          #MTGCTR LDY              ;NET MOTION SINCE LAST TAG FRAMED
3097  fb25  20 2e fb               JSR    SGNWRT    ;#20. SIGNED CONVERT TO DECIMAL AND PRINT IT
3098  fb28  20 1b fc               JSR    WRNEWL    ;WRITE NEW LINE
3099  fb2b  4c 3d fa               JMP    IDLE      ;OPTIONAL OUTPUT COMPLETED - RESTART IDLE LOOP
3100
3101  ; MISCELLANEOUS SERIAL OUTPUT SUBROUTINES
3102
3103  ; CONVERT TO DECIMAL THE 1-BYTE SIGNED LOCATION POINTED TO BY 'Y' AND PRINT IT
3104  fb2e  20 5d fb       SGNWRT  JSR    BS1BCD    ;1-BYTE SIGNED BINARY TO BCD CONVERT
3105  fb31  a5 84                  LDA    CVTSGN    ;GET SIGN CHARACTER
3106  fb33  20 29 fc               JSR    WRCHAR    ;PRINT THE SIGN
3107  fb36  4c 42 fb               JMP    HUNWRT    ;PRINT THE MAGNITUDE
3108
3109  ; CONVERT TO DECIMAL THE 2-BYTE UNSIGNED LOCATION POINTED TO BY 'Y' AND PRINT IT
3110  fb39  20 6f fb       DUNSPT  JSR    BU2BCD    ;2-BYTE UNSIGNED BINARY TO BCD CONVERT
3111  fb3c  4c 42 fb               JMP    HUNWRT    ;PRINT THE MAGNITUDE
3112
3113  ; CONVERT TO DECIMAL THE 1-BYTE UNSIGNED LOCATION POINTED TO BY 'Y' AND PRINT IT
3114  fb3f  20 6b fb       UNSPRT  JSR    BU1BCD    ;1-BYTE UNSIGNED BINARY TO BCD CONVERT
3115                                               ;AND FALL THROUGH INTO MAGNITUDE PRINT
3116
3117  ; START PRINTING MAGNITUDE WITH 100'S DIGIT
3118  fb42  a2 03          HUNWRT  LDX    #DG1HUN   ;START PRINTING MAGNITUDE AT 100'S DIGIT
3119  fb44  20 12 fb               JSR    WRITUN    ;PRINT THE MAGNITUDE AND FALL THRU TO
3120                                               ; PRINT A SPACE
3121
3122  ; PRINT A SPACE BETWEEN FIELDS
3123  fb47  a9 20          SPACE   LDA    #" "      ;LOAD A SPACE FOR PRINTING
3124  fb49  4c 29 fc               JMP    WRCHAR    ;'RTS' VIA 'WRCHAR'
```

```
3126                    ;PRINT VALUE PASSED IN 'A' REGISTER AS A HEXADECIMAL NUMBER
3127                HEXPRT  PHA             ;SAVE OVER PRINT OF HI NIBBLE
3128  fb4c 48               LSR  A          ;SHIFT HI NIBBLE TO LO NIBBLE
3129  fb4d 4a               LSR  A
3130  fb4e 4a               LSR  A
3131  fb4f 4a               LSR  A
3132  fb50 4a               JSR  WRBCD      ;TRANSLATE HEX NIBBLE TO ASCII
3133  fb51 20 25 fc         PLA             ;NOW GET LOW NIBBLE
3134  fb54 68               AND  #^H00F     ;MASK OFF THE HIGH NIBBLE
3135  fb55 29 0f            JSR  WRBCD      ;TRANSLATE TO ASCII
3136  fb57 20 25 fc         JMP  SPACE      ;PRINT A SPACE AND RTS VIA 'WRCHAR'
3137  fb5a 4c 47 fb
3138
3139                    ; GENERAL PURPOSE BINARY TO DECIMAL CONVERT ROUTINES -
3140                    ; ANY EQUIVALENT CONVERSION ROUTINES COULD EASILY BE SUBSTITUTED IN PLACE OF THE ROUTINES LISTED HERE.
3141
3142                    ; SIGNED BINARY TO BCD CONVERT ROUTINES:
3143
3144                        LDY  #111111    ;SIGNED BIN->BCD CONVERT OF 1-BYTE FLD. 111111
3145                        JSR  BS1BCD
3146
3147                        LDY  #222222    ;SIGNED BIN->BCD CONVERT OF 2-BYTE FLD. 222222
3148                        JSR  BS2BCD
3149
3150                        LDY  #333333    ;SIGNED BIN->BCD CONVERT OF 3-BYTE FLD. 333333
3151                        JSR  BS3BCD
3152
3153                    ; UNSIGNED BINARY TO BCD CONVERT ROUTINES:
3154
3155                        LDY  #111111    ;UNSIGNED BIN->BCD CONVERT OF 1-BYTE FLD. 111111
3156                        JSR  BU1BCD
3157
3158                        LDY  #222222    ;UNSIGNED BIN->BCD CONVERT OF 2-BYTE FLD. 222222
3159                        JSR  BU2BCD
3160
3161                        LDY  #333333    ;UNSIGNED BIN->BCD CONVERT OF 3-BYTE FLD. 333333
3162                        JSR  BU3BCD
3163
3164                    ; ADDRESS OF PAGE 0 FIELD TO BE CONVERTED IS PASSED IN 'Y' REGISTER. OUTPUT IS TO A FIXED LOCATION
3165                    ; FIELD, CVTOUT, WHICH IS 'CVTLEN'+1 BYTES LONG. THE (1ST BYTE OF CVTOUT, (BYTE #0) CONTAINS THE ASCII
3166                    ; SIGN. (+/-) OF THE RESULT. THE NEXT 'CVTLEN' BYTES (BYTE #'S 1-'CVTLEN') CORRESPOND TO THE BCD DIGITS.
3167                    ; NOTE: INPUT FIELD MUST BE STORED MSB FIRST, LSB LAST. REGISTERS A, X, AND Y ARE ALL USED AS SCRATCH.
3168
3171  fb5d a9 00        BS1BCD  LDA  #00
3172  fb5f f0 06            BEQ  BSIBCD      ;1-BYTE SIGNED FLD.
3173                                         ;UNCOND. BR.
3174  fb61 a9 01        BS2BCD  LDA  #01
3175  fb63 d0 02            BNE  BSIBCD      ;2-BYTE SIGNED FLD.
3176                                         ;UNCOND. BR.
3177  fb65 a9 02        BS3BCD  LDA  #02
3178  fb67 a2 00            LDX  #00         ;3-BYTE SIGNED FLD.
3179  fb69 f0 0c            BEQ  BINCVT      ;SIGNAL SIGNED FLD.
3180                        BSIBCD                ;COMMON CONVERSION ENTRY POINT
3181  fb6b a9 00        BU1BCD  LDA  #00
3182  fb6d f0 06            BEQ  BUNBCD      ;1-BYTE UNSIGNED FLD.
3183                                         ;UNCOND. BR.
3184  fb6f a9 01        BU2BCD  LDA  #01
3185  fb71 d0 02            BNE  BUNBCD      ;2-BYTE UNSIGNED FLD.
3186                                         ;UNCOND. BR.
3187  fb73 a9 02        BU3BCD  LDA  #02     ;3-BYTE UNSIGNED FLD.
3188  fb75 a2 01        BUNBCD  LDX  #01     ;SIGNAL UNSIGNED CONVERSION
3189
3190  fb77 85 7e        BINCVT  STA  BYTCTR  ;LENGTH OF INPUT FLD., -1
3191
```

```
3192  fb79 a9 00            LDA  #00            ;INITIALIZE FULL FIELD IN CASE INPUT SHORTER
3193  fb7b 85 7b            STA  BINFLD+0       ;MSB IN THIS ROUTINE
3194  fb7d 85 7c            STA  BINFLD+1
3195  fb7f 85 7d            STA  BINFLD+2       ;LSB
3196
3197  fb81 8a               TXA                 ;SAVE TYPE OF CONVERSION REQUEST
3198  fb82 48               PHA
3199
3200  fb83 18               CLC                 ;NEED TO COMPUTE POINTER TO LSB OF INPUT
3201  fb84 98               TYA                 ;INDEX TO MSB OF INPUT FIELD
3202  fb85 65 7e            ADC  BYTCTR         ;ADD OFFSET TO LSB
3203  fb87 aa               TAX                 ;INDEX TO LSB OF INPUT FIELD
3204
3205  ; NOW CHECK IF SIGNED OR UNSIGNED CONVERSION
3206  fb88 68               PLA                 ;RESTORE TYPE OF CONVERSION REQUEST
3207  fb89 d0 1b            BNE  $20            ;UNSIGNED. TREAT INPUT AS POSITIVE NUMBER
3208
3209  ; SIGNED CONVERSION REQUESTED.  CHECK SIGN OF INPUT
3210  fb8b b9 00 00         LDA  ZERO,Y         ;CHECK SIGN OF MSB
3211  fb8e 10 16            BPL  $20            ;INPUT FIELD IS POSITIVE
3212
3213  ; INPUT FIELD IS NEGATIVE.  TAKE ABSOLUTE VALUE BY NEGATING IT.
3214  fb90 a9 2d            LDA  #'-'           ;SET UP SIGN BYTE
3215  fb92 85 84            STA  CVTSGN
3216  ; NEGATE AS WE COPY BY SUBTRACTING FROM 0
3217  fb94 a0 02            LDY  #LBNFLD        ;EFFECTIVE LENGTH OF OUTPUT FIELD
3218  fb96 38               SEC
3219
3220  fb97 a9 00            $10  LDA  #00       ;SUBTRACT OFF INPUT STARTING WITH LSB
3221  fb99 f5 00            SBC  ZERO,X
3222  fb9b 99 7b 00         STA  BINFLD,Y       ;INPUT FIELD IS MSB FIRST, LSB LAST
3223  fb9e 88               DEY                 ;BINFLD COPY IS MSB FIRST, LSB LAST
3224  fb9f ca               DEX
3225  fba0 c6 7e            DEC  BYTCTR         ;COUNT A BYTE FROM INPUT FIELD
3226  fba2 10 f3            BPL  $10
3227  fba4 30 11            BMI  $30            ;UNCONDITIONAL BRANCH
3228
3229  ; INPUT FIELD IS POSITIVE.  COPY DIRECTLY TO TRANSFER AREA.
3230  fba6 a9 2b            $20  LDA  #'+'      ;SET UP SIGN BYTE
3231  fba8 85 84            STA  CVTSGN
3232  fbaa a0 02            LDY  #LBNFLD        ;EFFECTIVE LENGTH OF OUTPUT FIELD
3233
3234  fbac b5 00            $25  LDA  ZERO,X
3235  fbae 99 7b 00         STA  BINFLD,Y       ;INPUT FIELD IS MSB FIRST, LSB LAST
3236  fbb1 ca               DEX                 ;BINFLD COPY IS MSB FIRST, LSB LAST
3237  fbb2 88               DEY
3238  fbb3 c6 7e            DEC  BYTCTR         ;COUNT A BYTE FROM INPUT FIELD
3239  fbb5 10 f5            BPL  $25
3240
3241  ; SIGN BYTE HAS BEEN SET AND ABSOLUTE VALUE OF BINARY INPUT
3242  ; IS NOW RIGHT JUSTIFIED IN THE TRANSFER AREA "BINFLD".
3243  fbb7 a9 07            $30  LDA  #CVTLEN   ;# OF DIGIT TO START WITH
3244  fbb9 85 83            STA  CVTWHD         ;START WITH MSD
3245
3246  ; START OF THE "PROCESS THE NEXT DIGIT" LOOP
3247  ; "A" CONTAINS THE # OF THE DIGIT BEING PROCESSED (1 TO 'CVTLEN',
3248  ; WITH 1=LSD, CVTLEN'=MSD.  DIGIT # 0 IS THE SIGN BYTE.)
3249  ; CALCULATE OFFSET INTO VALUE TABLE AND PUT IN "X" FOR INDEXING
3250
3251  fbbb 0a               $60  ASL  A         ;TABLE ENTRIES ARE 4 BYTES, SO
3252  fbbc 0a               ASL  A              ;MULTIPLY BY 4 FOR OFFSET
3253  fbbd aa               TAX                 ;"X" IS RUNNING INDEX INTO TBL.
3254  ; NOW INITIALIZE VALUE OF THIS DIGIT TO 0
3255  fbbe a9 00            LDA  #00
3256  fbc0 85 82            STA  CVTDIG
3257
3258  ; START OF "SUBTRACT OUT THE VALUE OF THIS DIGIT POSITION"
3259  ; LOOP.
```

```
3260  fbc2  a0 02           $70      LDY  #LBNFLD        ;USE ONLY THE LOW 3 BYTES OF EACH 4 BYTE ENTRY
3261  fbc4  38                       SEC
3262  fbc5  b9 7b 00                 LDA  BINFLD,Y
3263  fbc8  fd 45 fb                 SBC  CVTABL-1,X
3264  fbcb  99 74 00                 STA  CVTEMP,Y
3265  fbce  ca                       DEX
3266  fbcf  88                       DEY
3267  fbd0  10 f3                    BPL  $80
3268
3269                                 ; VALUE OF DIGIT POSITION HAS BEEN SUBTRACTED FROM REMAINDER
3270                                 ; OF FIELD. WAS IT TOO MUCH?
3271  fbd2  a5 7f           $80      LDA  CVTEMP         ;CHECK SIGN OF RESULT
3272  fbd4  30 10                    BMI  $100           ;GONE TOO FAR
3273
3274                                 ; WHAT REMAINS IN CVTFLD IS >= (CVTDIG+1)*(VALUE OF THIS DIGIT POSITION),
3275  fbd6  e6 82                    INC  CVTDIG         ; SO COUNT UP 'CVTDIG' BY 1.
3276
3277                                 ; NOW COUNT THE VALUE OF THIS DIGIT IN THIS DIGIT POSITION AGAINST THE
3278                                 ; REMAINING VALUE OF THE FIELD BY COPYING THE RESULT OF THE SUBTRACTION BACK
3279                                 ; INTO THE FIELD AS THE REMAINDER, AND CONTINUE SUBTRACTING OUT IN THIS DIGIT
3280                                 ; POSITION
3281  fbd8  a0 02           $90      LDY  #LBNFLD
3282  fbda  b9 74 00                 LDA  CVTEMP,Y
3283  fbdd  99 7b 00                 STA  BINFLD,Y
3284  fbe0  e8                       INX
3285  fbe1  88                       DEY
3286  fbe2  10 f6                    BPL  $90
3287  fbe4  30 dc                    BMI  $70            ;UNCONDITIONAL BRANCH
3288
3289                                 ; PROCESSING FOR THIS DIGIT POSITION COMPLETED. CVTDIG CONTAINS VALUE OF THIS
3290                                 ; DIGIT. CVTWHD CONTAINS # OF THIS DIGIT.
3291  fbe6  a4 83           $100     LDY  CVTWHD         ;INDEX INTO OUTPUT FLD.
3292  fbe8  a5 82                    LDA  CVTDIG
3293  fbea  99 84 00                 STA  CVTOUT,Y       ;STORE DIGIT AT APPROPRIATE POSITION
3294  fbed  88                       DEY                 ;POINT TO NEXT DIGIT
3295  fbee  f0 05                    BEQ  $110           ;YES, JUST TAKE REMAINDER
3296  fbf0  84 83                    STY  CVTWHD         ;NOPE, MORE TO DO
3297  fbf2  98                       TYA                 ;SET UP FOR OFFSET CALC.
3298  fbf3  10 c6                    BPL  $60            ;UNCONDITIONAL BR.
3299  fbf5  60                       RTS
3300
3301                                 ; ROM TABLES NEEDED BY CONVERT BIN->BCD AND BCD->BIN CONVERT ROUTINE
3302
3303                                 ; TABLE OF POWERS OF TEN
3304                          CVTABL EQU  *
3305  fbf6  00 00           PVONES   .QBYTE 1            ;DIGIT #1 - ONE
3306  fbf8  00 00
3307  fbfa  00 01
3308  fbfc  00 00           PV10     .QBYTE 10           ;DIGIT #2 - TEN
3309  fbfe  00 00
3310  fc00  00 0a
3311  fc02  00 00           PV100    .QBYTE 100          ;DIGIT #3 - 1 HUNDRED
3312  fc04  00 00
3313  fc06  00 64
3314  fc08  00 00           PV1K     .QBYTE 1000         ;DIGIT #4 - 1 THOUSAND
3315  fc0a  00 00
3316  fc0c  03 e8
3317  fc0e  00 00           PV10K    .QBYTE 10000        ;DIGIT #5 - 10 THOUSAND
3318  fc10  00 00
3319        27 10
3320  fc12  00 00           PV100K   .QBYTE 100000       ;DIGIT #6 - 100 THOUSAND
3321        01 86
3322        a0
3323  fc14  00 00           PV1M     .QBYTE 1000000      ;DIGIT #7 - 1 MILLION
3324        0f 42
3325        40

; TRANSLATE UNPACKED BCD CHARACTERS STARTING AT DIGIT 'X' IN 'CVTOUT'
                                    ; TO ASCII AND WRITE THEM OUT 3323  fc12  b5 84           WRITUN   LDA  CVTOUT,X       ;BCD DIGIT
3324  fc14  20 25 fc                 JSR  WRBCD          ;TRANSLATE AND RIGHT
3325  fc17  ca                       DEX                 ;POINT TO NEXT LESS SIGNIFICANT DIGIT
3326  fc18  d0 f8                    BNE  WRITUN         ;LOOP TILL UNITS DIGIT PRINTED
3327  fc1a  60                       RTS
```

```
3328
3329  fc1b a9 0d       WRNEWL  LDA  #CARRET      ;CARRIAGE RETURN
3330  fc1d 20 29 fc            JSR  WRCHAR       ;WRITE IT OUT
3331  fc20 a9 0a               LDA  #LINEFD      ;LINE FEED
3332  fc22 4c 29 fc            JMP  WRCHAR       ;RTS, VIA WRITE IT OUT
3333
3334       ; TRANSLATE BCD CHARACTER IN 'A' TO ASCII AND WRITE IT OUT
3335
3336  fc25 a8          WRBCD   TAY               ;USE DIGIT AS INDEX INTO TRANSLATE TABLE
3337  fc26 b9 2f fc            LDA  TRTABL,Y     ;CONVERTS DIGIT TO ASCII
3338                                             ;AND FALL THRU INTO 'WRCHAR' ROUTINE
3339
3340       ; WRCHAR
3341       ; INPUT:  CHARACTER IN "A" REGISTER
3342       ; OUTPUT: TO SERIAL OUTPUT DEVICE
3343       ;
3344  fc29                WRCHAR
3345  fc29 6f 16 fd  $1      BBR  #(SSTRDE),SCSR,$1  ;WAIT FOR TRANSMIT DATA REGISTER TO EMPTY
3346  fc2c 85 17              STA  SCTDR              ;STORE CHARACTER TO SEND INTO TRANSMIT REGISTER; STARTS TRANSMIT
3347  fc2e 60                 RTS
3348
3349
3350  fc2f 30 31 32  TRTABL  .BYTE "0123456789ABCDEF"
3351  fc32 33 34 35
3352  fc35 36 37 38
3353  fc38 39 41 42
3354  fc3b 43 44 45
3355  fc3e 46
3356
3357       ; --------> END OF OPTIONAL DIAGNOSTIC/DEBUGGING SERIAL OUTPUT SOFTWARE  <--------
3358
3359  fc3f          ROMEND  .EQU                 ;MARKS NEXT AVAILABLE SPACE IN ROM
3360
3361             ; 18. PROGRAM LISTING OF 6502-STYLE HARDWARE VECTORS
3362             ;
3363  fffa            .ORG  NMIVEC         ;NMI VECTOR
3364  fffa 3c fa      .ADDR NMISRV         ;ADDRESS OF NON-MASKABLE INTERRUPT SERVICE ROUTINE
3365
3366  fffc            .ORG  RESVEC         ;RESET VECTOR
3367  fffc c4 f9      .ADDR RESSRV         ;ADDRESS OF POWER-UP RESET SERVICE ROUTINE
3368
3369  fffe            .ORG  IRQVEC         ;INTERRUPT REQUEST VECTOR
3370  fffe 92 f6      .ADDR IRQSRV         ;ADDRESS OF INTERRUPT REQUEST SERVICE ROUTINE
```

What is claimed is:

1. An encoding system for determining the absolute and the incremental positions of a movable member relative to a stationary member, including in combination:

an encoding band supported by one said member and having
a timing and incremental encoding track comprising at least one series of alternating activating stripes and non-activating stripes, and
a single data track comprising a series of absolute position tags disposed at regular intervals along said data track and alternating with spacers that are identical to each other, each said tag being framed by start bits and being distinctly different from every other said tag and each comprising a serial bit stream for encoding the absolute position corresponding to the location of its tag along said data track,
reading means supported by the other said member and having three non-sweeping sensing means, two in quadrature with each other for said timing and incremental encoding track, and one for said data track, each said sensing means having a single energy-source-energy-sensor pair including means for generating an analog signal voltage,
said members being capable of both discrete and continuous motion in both directions, and
decoding means actuated by said analog signal voltages for determining the incremental and absolute positions of said movable member relative to said stationary member,
whereby said absolute and incremental positions can be determined solely from said system without dependence or any additional information external to said system.

2. The system of claim 1 wherein said band is cylindrical and is supported perpendicular to the plane of motion of said movable member.

3. The system of claim 1 wherein said band is flat and annular and is supported parallel to the plane of motion of said movable member.

4. An encoding system for determining the absolute and the incremental positions of a movable member relative to a stationary member, including in combination:

an encoding band supported by one said member and having
a timing and incremental encoding track comprising at least one series of alternating activating stripes and non-activating stripes, and
a data track comprising a series of absolute position tags alternating with spacers, each said tag being framed by start bits, and
reading means supported by the other said member and having three sensing means, two in quadrature with each other for said timing and incremental encoding track, and one for said data track, each said sensing means including means for generating an analog signal voltage, and
decoding means actuated by said analog signal voltages for determining the incremental and absolute positions of said movable member relative to said stationary member,
said decoding means comprising
(1) timing track phase comparator means connected to said two in-quadrature sensing means for comparing the phase relationship of their two signal voltages and producing a direction level signal and a clock pulse signal,
(2) up/down counter means connected to said direction level and clock pulse signals and having readout means for indicating the current position of said movable member,
(3) left-motion serial shift register means connected to said direction level and clock pulse signals and also to said third sensing means,
(4) right-motion serial shift register means connected to said direction level and clock pulse signal and also to said third sensing means,
(5) two framing gating means, each connected to said clock pulse signal and to one of said shift registers,
(6) absolute position register means connected to both said framing gating means, and
(7) position comparator means connected to said absolute position register means and to said up/down counter means.

5. The system of claim 4 wherein said sensing means send their voltage signals through operational amplifier means and Schmitt trigger means en route from said two in-quadrature sensing means, to said phase comparator means and, from said third sensing means en route to said shift register means.

6. The system of claim 4 whereby said signals from said framing gating means pass, through respective decoder and error checking means and from there to absolute position multiplexer means, while en route to said absolute position register means.

7. The system of claim 4 having three fault-detection means, to which said three sensing means and said timing track phase comparator means also send their respective signals, for outputting a fault signal when a signal derived from any of the respective sensing means has by itself failed.

8. A decoding apparatus actuated by three analog signal voltages from an encoder for determining the incremental and absolute positions of a movable member relative to a stationary member, said encoder having three sensing means for producing said three analog voltages from a timing track and a data track, comprising:
(1) timing track phase comparator means connected to two timing sensing means for comparing the phase relationship of their two analog signal voltages and producing a direction level signal and a clock pulse signal,
(2) up/down counter means connected to said direction level and clock pulse signals and having readout means for indicating the current position of said movable member, (3) left-motion serial shift register means connected to said direction level and clock pulse signals and also to said third analog signal voltage, (4) right-motion serial shift register means connected to said direction level and clock pulse signal and also to said third analog signal voltage, (5) two framing gating means, each connected to said clock pulse signal and to one of said shift register means, (6) absolute position register means connected to both said framing gating means, and (7) position comparator means connected to said absolute position register means and to said up/down counter means.

9. The decoding apparatus of claim 8 wherein said sensing means send their voltage signals through operational amplifier means and Schmitt trigger means en route from said two timing sensing means to said phase comparator means and, from said third sensing means en route to said shift register means.

10. The decoding apparatus of claim 8 whereby said signals from said framing gating means pass through respective decoder and error checking means and from there to absolute position multiplexer means, while en route to said absolute position register means.

11. The decoding apparatus of claim 8 having three fault detector means, connected to said three sensing means and said timing track phase comparator means so that they also send their respective signals to said three fault detector means, said fault detector means outputting a fault signal when the signal derived from the respective sensing means has by itself failed.

12. An optical encoding system for determining the absolute and the incremental positions of a movable member relative to a stationary member, including in combination:

three light sources supported by one said member for emitting three narrow light beams on respective paths, an encoding band supported by the other said member in the paths of said light beams, said band having at least one timing and incremental encoding track comprising at least one series of alternating light-blocking strips and light-passing stripes, and a single data track comprising a series of absolute position tags disposed at regular intervals along said data track and alternating with spacers that are identical to each other, each said tag being framed by start bits and distinctly different from every other said tag and each comprising a serial bit stream for encoding the absolute position corresponding to the location of its tag along said data track, a read head supported by said one said member and having three non-sweeping optical sensors, one for each said light beam, two in quadrature with each other for said timing and incremental encoding track, and one for said data track, each said optical sensor including light sensing means for generating an analog signal voltage, said members being capable of both discrete and continuous motion in both directions, decoding means actuated by said analog signal voltages for determining the incremental and absolute positions of said movable member relative to said stationary member, and whereby said absolute and incremental positions can be determined solely from said system without dependence or any additional information external to said system.

13. The system of claim 12 wherein said light-passing stripes comprise reflecting stripes, reflecting light from said beams to said optical sensors.

14. The system of claim 12 wherein said light-passing stripes are transparent stripes through which said light beams pass en route to said optical sensors.

15. The system of claim 12 wherein there is a single timing track, and its two associated light sources and light sensing means are spaced apart at a predetermined distance to provide serial quadrature.

16. The system of claim 12 wherein there are two timing tracks, staggered with respect to each other to provide said quadrature, each having one said light beam and one said optical sensor associated therewith.

17. The system of claim 12 wherein said band is cylindrical and is supported perpendicular to the plane of motion of said movable member.

18. The system of claim 12 wherein said band is flat and annular and is supported parallel to the plane of motion of said movable member.

19. An optical encoding system for determining the absolute and the incremental positions of a movable member relative to a stationary member, including in combination:

three light sources supported by one said member for emitting three narrow light beams on respective paths, an encoding band supported by the other said member in the paths of said light beams, said band having a timing and incremental encoding track comprising at least one series of alternating light-blocking stripes and light-passing stripes, and a data track comprising a series of absolute position tags alternating with spacers, each said tag being framed by start bits, and a read head supported by said one said member and having three optical sensors, one for each said light beam, two in quadrature with each other for said timing and incremental encoding track, and one for said data track, each said optical sensor including light sensing means for generating an analog signal voltage, and decoding means actuated by said analog signal voltages for determining the incremental and absolute positions of said movable member relative to said stationary member, said decoding means comprising a computer programmed to function as (1) a timing track phase comparator connected to said two timing optical sensors for comparing the phase relationship of their two signal voltages and producing a direction level signal and a clock pulse signal, (2) an up/down counter connected to said direction level and clock pulse signals and having readout means for indicating the current position of said movable member, (3) a left-motion serial shift register connected to said direction level and clock pulse signals and also to said third optical sensor, (4) a right-motion serial shift register connected to said direction level and clock pulse signal and also to said third optical sensor.

(5) two framing gatings, each connected to said clock pulse signal and to one of said shift registers, (6) an absolute position register connected to both said framing gatings, and (7) a position comparator connected to said absolute position register and to said up/down counter.

20. The system of claim 19 wherein said optical sensors send their voltage signals through an operational amplifier and a Schmitt trigger en route from said two optical sensors to said phase comparator and, from said third optical sensor en route to said shift registers.

21. The system of claim 19 whereby said signals from said framing gatings pass, in said computer, through elements functioning as respective decoders and error checking means and from there to elements functioning as an absolute position multiplexer, while en route to said absolute position register.

22. An optical encoding system for determining the absolute and the incremental positions of a movable member relative to a stationary member, including in combination:

three light sources supported by one said member for emitting three narrow light beams on respective paths, an encoding band supported by the other said member in the paths of said light beams, said band having a timing and incremental encoding track comprising at least one series of alternating light-blocking stripes and light-passing stripes, and a data track comprising a series of absolute position tags alternating with spacers, each said tag being framed by start bits, and a read head supported by said one said member and having three optical sensors, one for each said light beam, two in quadrature with each other for said timing and incremental encoding track, and one for said data track, each said optical sensor including light sensing means for generating an analog signal voltage, decoding means actuated by said analog signal voltages for determining the incremental and absolute positions of said movable member relative to said stationary member, and three fault detector means, each connected to some subset of the signals from said three optical sensors and said timing track phase comparator, for producing a fault signal if the signal derived from its respective sensor has by itself failed.

23. An encoding system for determining the absolute and the incremental positions of a movable member relative to a stationary member, including in combination:

three light sources supported by one said member for sending three narrow light beams on respective paths, a continuous circular encoding band supported by the other said member in the paths of said light beams, said band having a timing and incremental encoding track comprising at least one series of alternating light-blocking stripes and light-passing stripes, and a data track comprising a series of absolute position tags alternating with spacers, each said tag being framed by start bits, a read head supported by said one said member and having three optical sensors, one for each said light beam, two in quadrature with each other for said timing and incremental encoding track, and one for said data track, each said optical sensor including light sensing means for generating an analog signal voltage, comparator means connected to said two timing optical sensors for comparing the phase relationship of their two signal voltages and producing a direction level signal and a clock pulse signal, up/down counter means connected to said direction level and clock pulse signals and having readout means for indicating the current position of said movable member, left-motion serial shift register means connected to said direction level and clock pulse signals and also to said third optical sensor, right-motion serial shift register means connected to said direction level and clock pulse signal and also to said third optical sensor, two framing gating means, each connected to said clock pulse signal and to one of said shift register means, absolute position register means connected to both said framing gating means, and position comparator means connected to said absolute position register means and to said up/down counter means.

24. The system of claim 23 wherein said optical sensors send their voltage signals through an operational amplifier and a Schmitt trigger en route from each of said two optical sensors to said phase comparator means and, from said third optical sensor en route to said shift register means.

25. The system of claim 23 whereby said signals from said framing gating means pass through respective decoding means and error checking means and from there to absolute position multiplexer means, while en route to said absolute position register means.

26. The system of claim 23 having first fault detector means connected to the signals from the three optical sensors for producing a fault signal if the signal derived from the first of said two in quadrature sensors has by itself failed, second fault detector means connected to the signals from the three optical sensors for producing a fault signal if the signal derived from the second of said two in quadrature sensors has by itself failed, and third fault detector means connected to said direction level signal, to said clock pulse signal, and to the signal from said optical sensor for said data track, for providing a fault signal if the signal derived from said data track sensor has by itself failed.

27. The system of claim 23 wherein there is a single timing track and its two associated light sources and light sensing means are spaced apart at a predetermined distance to provide said quadrature.

28. The system of claim 23 wherein there are two timing tracks, staggered with respect to each other to provide said quadrature, each having one said light beam and one said optical sensor associated therewith.

29. The system of claim 23 wherein said light-passing stripes comprise reflecting stripes, reflecting light from said beams to said optical sensor.

30. The system of claim 29 wherein said band is supported by said movable member perpendicular to the plane of said movable member and is cylindrical.

31. The system of claim 29 wherein said band is a flat annulus supported by said movable member parallel to the plane of said movable member.

32. The system of claim 23 wherein said light passing stripes are transparent stripes through which said light beams pass en route to said optical sensor.

33. The system of claim 32 wherein said band is cylindrical and is supported by said movable member.

34. The system of claim 32 wherein said band is a flat annulus supported by said movable member.

35. An encoding system for determining the absolute and the incremental positions of a movable member relative to a stationary member, including in combination:
 an encoding band supported by one said member, said band having
 a single timing track for timing and incremental encoding, comprising a series of alternating dark stripes and reflective stipes, and
 a data track comprising a series of absolute position tags alternating with spacers, each said tag being framed by start bits,
 a read head supported by the other said member and having three optical sensors, two for said timing track, being spaced apart to provide quadrature, and one for said data track, each said optical sensor including a light source coupled with light sensing means for generating an analog signal voltage,
 timing track phase comparator means connected to said two timing-track optical sensors for comparing the phase relationship of their two signal voltages and producing a direction level signal and a clock pulse signal,
 up/down counter means connected to said direction level and clock pulse signals and having readout means for indicating the current position of said movable member,
 left-motion serial shift register means connected to said direction level and clock pulse signals and also to said third optical sensor,
 right-motion serial shift register means connected to said direction level and clock pulse signal and also to said third optical sensor,
 two framing gating means, each connected to said clock pulse signal and to one of said shift register means,
 absolute position register means connected to both said framing gatings, and
 position comparator means connected to said absolute position register means and to said up/down counter means.

36. The system of claim 35 wherein said optical sensors send their voltage signals through an operational amplifier and a Schmitt trigger en route from said two optical sensors to said phase comparator means and, from said third optical sensor en route to said shift register means.

37. The system of claim 35 whereby said signals from said framing gating means pass through respective decoding means and error checking means and from there to absolute position multiplexer means, while en route to said absolute position register means.

38. The encoding system of claim 35 having
 a first fault detector circuit connected to the signals from said three optical sensors and producing a fault signal if the signal derived from the first of said two optical sensors for said timing track has by itself failed,
 a second fault detector connected to the signals from said three optical sensors and producing a fault signal if the signal derived from the second of said two optical sensors for said timing track has by itself failed, and
 a third fault detector connected to said direction level signal, to said clock pulse signal, and to the signal from said optical sensor for said data track and providing a fault signal if the signal derived from said data track sensor has by itself failed.

39. The system of claim 35 wherein said band is cylindrical and is supported perpendicular to the plane of said movable member by its said member.

40. The system of claim 35 wherein said band is a flat annulus and is supported parallel to the plane of said movable member by its said member.

41. An encoding system for determining the absolute and the incremental positions of a movable member relative to a stationary member, including in combination:
 an encoding band supported by one said member, said band having
 a single timing track for timing and incremental encoding comprising a series of alternating opaque stripes and transparent stripes, and
 a data track comprising a series of absolute position tags alternating with spacers, each said tag being framed by start bits,
 three light source means supported by the other said member and directing respective beams toward said band,
 a read head supported by said other member and having three optical sensors on the opposite side of said band from said light source means, two for said timing track, being spaced apart to provide quadrature, and one for said data track, each said optical sensor including light sensing means for generating an analog signal voltage,
 timing track phase comparator means connected to said two timing-track optical sensors for comparing the phase relationship of their two signal voltages and producing a direction level signal and a clock pulse signal,
 up/down counter means connected to said direction level and clock pulse signals and having readout means for indicating the current position of said movable member,
 left-motion serial shift register means connected to said direction level and clock pulse signals and also to said third optical sensor,
 right-motion serial shift register means connected to said direction level and clock pulse signal and also to said third optical sensor, two framing gating means, each connected to said clock pulse signal and to one of said shift register means, absolute position register means connected to both said framing gating means, and position comparator means connected to said absolute position register means and to said up/down counter means.

42. The system of claim 41 wherein said optical sensors send their voltage signals through an operational amplifier and a Schmitt trigger en route from said two sensors to said phase comparator means and, from said third optical sensor en route to said shift register means.

43. The system of claim 42 whereby said signals from said framing gating means pass through respective decoding means and error checking means and from there to absolute position multiplexer means, while en route to said absolute position register means.

44. In a system for determining the absolute and the incremental positions of a movable telescope dome of a dome building having a stationary portion, the combination of:

a circular encoding band supported by said movable dome, said band having a timing track for timing and incremental encoding comprising at least one series of narrow stripes all around said band, alternating light-absorbing and light-passing stripes, and a data track comprising a series of absolute position tags alternating with spacers, each said tag being framed by start bits, and a read head supported by said stationary portion of said dome building and having three optical sensors aimed at said band, two for said timing track, being spaced apart a predetermined distance for quadrature, and one for said data track, each said optical sensor including a light-emitting diode coupled with a phototransistor for generating an analog signal voltage from the transmission of the light-emitting diode light from said tracks, said read head being mounted on wheels in rolling contact with said band and mounted to said stationary portion through a parallelogram linkage and spring-urged toward a set distance from said band, so that out-of-roundness of said dome is compensated.

45. The system of claim 44 wherein said read head is pivotally mounted relative to said parallelogram linkage.

46. The system of claim 44 wherein there is a single timing track and its two associated light sources and light sensing means are spaced apart at a predetermined distance to provide said quadrature.

47. The system of claim 44 wherein there are two timing tracks, staggered with respect to each other to provide said quadrature, each having one said light beam and one said optical sensor associated therewith.

48. An optical encoding system for determining the absolute and the incremental positions of a movable member relative to a stationary member, including in combination:

three light source supported by one said member for emitting three narrow light beams on respective paths, an encoding band supported by the other said member in the paths of said light beams, said band having a single timing and incremental encoding track comprising at least one series of alternating light-blocking stripes and light-passing stripes, and a single data track comprising a series of absolute position tags disposed at regular intervals along said data track and alternating with spacers that are identical to each other, each said tag being framed by start bits and being distinctly different from every other said tag and each comprising a serial bit stream for encoding the absolute position corresponding to the location of its tag along said data track, and a read head supported by said one said member and having three non-sweeping optical sensors, one for each said light beam, two in quadrature with each other for said timing and incremental encoding track, and one for said data track, each said optical sensor including light sensing means for generating an analog signal voltage, said members being capable of both discrete and continuous motion in both directions around a circular path, whereby said absolute and incremental positions can be determined solely from said system without dependence or any additional information external to said system.

49. An encoding system for determining the absolute and the incremental positions of a movable telescope dome of a dome building having a stationary portion, including in combination:

an encoding band supported by a generally cylindrical surface of said movable dome around the complete circle thereof, said band having a timing track for timing and incremental encoding comprising a series of narrow stripes all around said band, alternating dark and reflective stripes, and a data track comprising a series of absolute position tags alternating with spacers, each said tag being framed by start bits, and a read head supported by said stationary portion of said dome building and having three optical sensors aimed at said band, two for said timing track, being spaced apart a predetermined distance, and one for said data track, each said optical sensor including a light-emitting diode coupled with a phototransistor for generating an analog signal voltage from the reflection of the light-emitting diode light from said tracks, said read head being mounted to its rigid support through a parallelogram linkage, and spring means urging it toward a set distance from said band, so that out-of-roundness of said dome is compensated.

50. An encoding system for determining the absolute and the incremental positions of a movable telescope dome of a dome building having a stationary portion, including in combination:

an encoding band supported by a generally cylindrical surface of said movable dome around the complete circle thereof, said band having a timing track for timing and incremental encoding comprising a series of narrow stripes all around said band, alternating dark and reflective stripes, and a data track comprising a series of absolute position tags alternating with spacers, each said tag being framed by start bits, and a read head supported by said stationary portion of said dome building and having three optical sensors aimed at said band, two for said timing track, being spaced apart a predetermined distance, and one for said data track, each said optical sensor including a light-emitting diode coupled with a phototransistor for generating an analog signal voltage from the reflection of the light-emitting diode light from said tracks, said read head being mounted on wheels in rolling contact with said cylindrical surface.

51. An encoding system for determining the absolute and the incremental positions of a movable telescope dome of a dome building having a stationary portion, including in combination:

an encoding band supported by a generally cylindrical surface of said movable dome around the complete circle thereof, said band having a timing track for timing and incremental encoding comprising a series of narrow stripes all around said band, alternating dark and reflective stripes, and a data track comprising a series of absolute position tags alternating with spacers, each said tag being framed by start bits, a read head supported by said stationary portion of said dome building and having three optical sensors aimed at said band, two for said timing track, being spaced apart a predetermined distance, and one for said data track, each said optical sensor including a light-emitting diode coupled with a phototransistor for generating an analog signal voltage from the reflection of the light-emitting diode light from said tracks, timing track phase comparator means connected to said two timing-track optical sensors for comparing the phase relationship of their two signal voltages and producing a direction level signal and a clock pulse signal, up/down counter means connected to said direction level and clock pulse signals and having readout means for indicating the current dome position, dome left-motion serial shift register means connected to said direction level and clock pulse signals and also to said third optical sensor, dome right-motion serial shift register means connected to said direction level and clock pulse signal and also to said third optical sensor, two framing gating means, each connected to said clock pulse signal and to one of said shift register means, absolute position register means connected to both said framing gating means, and position comparator means connected to said absolute position register means and to said up/down counter means.

52. The system of claim 51 wherein said optical sensors send their voltage signals through an operational amplifier and a Schmitt trigger en route from said two optical sensors to said phase comparator means and, from said third optical sensor en route to said shift register means.

53. The system of claim 51 whereby said signals from said framing gating means pass through respective decoding means and error checking means and from there to absolute position multiplexer means, while en route to said absolute position register means.

54. The system of claim 51 having first fault detector means connected to the signals from said three optical sensors for producing a fault signal if the signal derived from the first of said two timing track optical sensors has by itself failed, second fault detector means connected to the signals from said three optical sensors for producing a fault signal if the signal derived from the second of said two timing track optical sensors has by itself failed, and third fault detector means connected to said direction level signal, to said clock pulse signal, and to the signal from said optical sensor for said data track, for providing a fault signal if the signal derived from said data track sensor has by itself failed.

55. An encoding system for determining the absolute and the incremental positions of a movable member relative to a stationary member, including in combination:

a circular encoding band on said movable member, said band having a single timing track means for timing and incremental encoding comprising a series of alternating opaque stripes and transparent stripes, and a single data track comprising a series of absolute position tags disposed at regular intervals along said data track and alternating with spacers that are identical to each other, each said tag being framed by start bits and distinctly different from every other said tag and each comprising a serial bit stream for encoding the absolute position corresponding to the location of its tag along said data track, three light source means mounted on said stationary member and directing respective beams toward said band, and a read head secured to said stationary member and having three non-sweeping optical sensors on the opposite side of said band from said light source means, two for said timing track, being spaced apart, and one for said data track, each said optical sensor including light sensing means for generating an analog signal voltage, said members being capable of both discrete and continuous motion in both directions around a circular path, whereby said absolute and incremental positions can be determined solely from said system without dependence or any additional information external to said system.

56. An encoding system for determining the absolute and the incremental positions of a movable member relative to a stationary member, including in combination:

a circular encoding band on said movable member, said band having timing track means for timing and incremental encoding comprising a series of alternating opaque stripes and transparent stripes, and a data track comprising a series of absolute position tags alternating with spacers, each said tag being framed by start bits, three light source means mounted on said stationary member and directing respective beams toward said band, a read head secured to said stationary member and having three optical sensors on the opposite side of said band from said light source means, two for said timing track, being spaced apart, and one for said data track, each said optical sensor including light sensing means for generating an analog signal voltage, timing track phase comparator means connected to said two timing-track-means optical sensors for comparing the phase relationship of their two signal voltages and producing a direction level signal and a clock pulse signal, up/down counter means connected to said direction level and clock pulse signals and having readout means for indicating the current position of said movable member, left-motion serial shift register means connected to said direction level and clock pulse signals and also to said third optical sensor, right-motion serial shift register means connected to said direction level and clock pulse signal and also to said third optical sensor, two framing gating means, each connected to said clock pulse signal and to one of said shift register means, absolute position register means connected to both said framing gating means, and position comparator means connected to said absolute position register means and to said up/down counter means.

57. The system of claim 56 wherein said optical sensors send their voltage signals through an operational amplifier and a Schmitt trigger en route from said two optical sensors to said phase comparator means and, from said third optical sensor en route to said shift register means.

58. The system of claim 56 whereby said signals from said framing gating means pass through respective decoding means and error checking means and from there to absolute position multiplexer means, while en route to said absolute position register means.

59. A method for determining the absolute and the incremental positions of a movable member relative to a stationary member, comprising the steps of:

sending three separate beams of light toward one said member, intercepting said beams by an encoding band secured to the other said member, said band having a timing track for timing and incremental encoding portion comprising a series of narrow alternating light-beam blocking and light-beam passing stripes and a data track comprising a series of absolute position tags alternating with spacers, each said tag being framed by start bits, two of said light beams being directed at spaced-apart loci along said timing track and one directed to a locus along said data track, generating an analog signal voltage from the light from each beam after the interception, two such voltages from said timing track and one from said data track, comparing the phase relationship of the two analog voltages from said timing track and producing direction level signals and clock pulse signals therefrom, counting the clock pulse signals, thereby indicating the current incremental position of said movable member, sending said direction level and clock pulse signals and a logic level derived from the third analog voltage to left-motion serial shift register means, and also to right-motion serial shift register means, framing the output from each said shift register means and sending the resultant output of each to absolute position register means, comparing the absolute position register values with those from said counting step, and resetting said incremental position to match the value contained in the absolute position register means, should they disagree.

60. The method of claim 59 wherein said sending step comprises additionally sending said direction level and clock pulse signals and the signals derived from the step of intercepting said three light beams to a fault detection circuit and there comparing, two at a time, the signals derived from the step of intercepting said three light beams and determining whether the signal derived from any signal from said light beam interception has by itself failed.

61. The method of claim 59 wherein said timing track comprises a single track.

62. The method of claim 59 wherein said timing track comprises two tracks.

63. The method of claim 59 wherein said intercepting step comprises impinging said separate beams of light on said encoding band, said band's having a timing and incremental encoding portion comprising a series of narrow alternating dark and reflective stripes and a data track comprising a series of absolute position tags alternating with spacers.

64. The method of claim 59 wherein said intercepting step comprises sending the three light beams through said band via a timing and incremental encoding portion comprising a series of narrow alternating opaque and transparent stripes and a data track comprising a series of absolute position tags alternating with spacers.

65. A method for encoding the absolute and the incremental positions of a movable member relative to a stationary member, comprising the steps of:

sending three separate beams of light toward a stationary position, intercepting said beams by an encoding band secured to said movable member, said band having a timing track for timing and incremental encoding portion comprising a series of narrow alternating light-beam blocking and light-beam passing stripes and a single data track comprising a series of absolute position tags disposed at regular intervals along said data track and alternating with spacers that are identical to each other, each said tag being framed by start bits and being distinctly different from every other said tag and each comprising a serial bit stream for encoding the absolute position corresponding to the location of its tag along said data track, two of said light beams being directed at spaced-apart loci along said timing track and one directed to a locus along said data track, generating an analog signal voltage from the light from each beam after the interception, two such voltages in quadrature from said timing track and one from said data track, said members being capable of both discrete and continuous motion in both directions around a circular path, and whereby said absolute and incremental positions can be determined solely from said system without dependence or any additional information external to said system.

66. The method of claim 65 wherein said timing track comprises a single track.

67. The method of claim 65 wherein said timing track comprises two tracks.

68. The method of claim 65 wherein said intercepting step comprises impinging said separate beams of light on said encoding band, said band's having a timing and incremental encoding portion comprising a series of narrow alternating dark and reflective stripes and a data track comprising a series of absolute position tags alternating with spacers.

69. The method of claim 65 wherein said intercepting step comprises sending the three light beams through said band via a timing and incremental encoding portion comprising a series of narrow alternating opaque and transparent stripes and a data track comprising a series of absolute position tags alternating with spacers.

* * * * *